US012690382B2

(12) United States Patent
Jun et al.

(10) Patent No.: US 12,690,382 B2
(45) Date of Patent: Jul. 21, 2026

(54) LIGHT EMITTING ELEMENT AND POLYCYCLIC COMPOUND FOR THE SAME

(71) Applicant: Samsung Display Co., Ltd., Yongin-si (KR)

(72) Inventors: Mi Eun Jun, Hwaseong-si (KR); Seran Kim, Suwon-si (KR); Chanseok Oh, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 917 days.

(21) Appl. No.: 17/862,923

(22) Filed: Jul. 12, 2022

(65) Prior Publication Data

US 2023/0141820 A1 May 11, 2023

(30) Foreign Application Priority Data

Oct. 21, 2021 (KR) ........................ 10-2021-0141336

(51) Int. Cl.
*H10K 85/30* (2023.01)
*C07F 5/02* (2006.01)
(Continued)

(52) U.S. Cl.
CPC ........... *H10K 85/322* (2023.02); *C07F 5/027* (2013.01); *C09K 11/06* (2013.01); *H10K 85/346* (2023.02);
(Continued)

(58) Field of Classification Search
CPC ............... H10K 85/322; H10K 85/658; H10K 2101/20; C07F 5/027; C09K 11/06
See application file for complete search history.

(56) References Cited

U.S. PATENT DOCUMENTS

| | | | |
|---|---|---|---|
| 11,299,502 | B2 | 4/2022 | Kim et al. |
| 2021/0122765 | A1 | 4/2021 | Wolohan et al. |

FOREIGN PATENT DOCUMENTS

| | | | |
|---|---|---|---|
| CN | 111574543 | A | 8/2020 |
| CN | 111943966 | A | 11/2020 |

(Continued)

OTHER PUBLICATIONS

Machine-generated English-language translation of CN-114957223-A.*

(Continued)

*Primary Examiner* — Vu A Nguyen
(74) *Attorney, Agent, or Firm* — Womble Bond Dickinson (US) LLP

(57) ABSTRACT

A light emitting element according to an embodiment includes a first electrode, a second electrode disposed on the first electrode, and an emission layer disposed between the first electrode and the second electrode. The emission layer includes a first compound, and at least one of a second compound, a third compound, and a fourth compound. The first compound is represented by Formula 1, the second compound is represented by Formula HT-1, the third com-
(Continued)

pound is represented by Formula ET-1, and the fourth compound is represented by Formula M-b. Accordingly, the light emitting element has decreased driving voltage and improved efficiency.

[Formula 1]

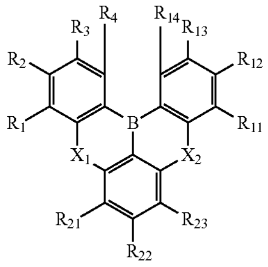

[Formula HT-1]

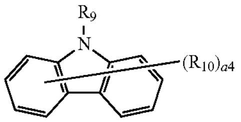

[Formula ET-1]

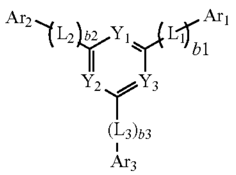

[Formula M-b]

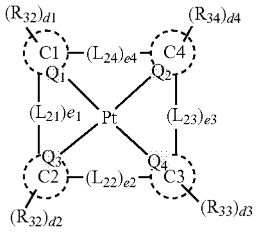

24 Claims, 8 Drawing Sheets

(51) Int. Cl.

| | |
|---|---|
| ***C09K 11/06*** | (2006.01) |
| ***H10K 50/12*** | (2023.01) |
| ***H10K 50/15*** | (2023.01) |
| ***H10K 50/16*** | (2023.01) |
| ***H10K 59/122*** | (2023.01) |
| ***H10K 85/00*** | (2023.01) |
| ***H10K 85/60*** | (2023.01) |
| ***H10K 101/00*** | (2023.01) |
| ***H10K 102/00*** | (2023.01) |

(52) U.S. Cl.

CPC ......... *H10K 85/633* (2023.02); *H10K 85/654* (2023.02); *H10K 85/658* (2023.02); *H10K 85/701* (2023.02); *C09K 2211/1014* (2013.01); *H10K 50/121* (2023.02); *H10K 50/15* (2023.02); *H10K 50/16* (2023.02); *H10K 59/122* (2023.02); *H10K 2101/90* (2023.02); *H10K 2102/351* (2023.02)

(56) References Cited

FOREIGN PATENT DOCUMENTS

| | | | | | |
|---|---|---|---|---|---|
| CN | 112778340 A | | 5/2021 | |
| CN | 112898325 A | | 6/2021 | |
| CN | 114478592 A | * | 5/2022 | .............. C07F 5/027 |
| CN | 114957223 A | * | 8/2022 | ............. C09K 11/06 |
| KR | 10-2019-0127529 | | 11/2019 | |
| KR | 10-2019-0141052 A | | 12/2019 | |
| KR | 10-2021-0052280 | | 5/2021 | |
| KR | 10-2021-0059652 A | | 5/2021 | |
| WO | 2020/135790 A1 | | 7/2020 | |
| WO | 2021/013993 | | 1/2021 | |
| WO | 2021/014001 | | 1/2021 | |

OTHER PUBLICATIONS

Machine-generated English-language translation of CN-114478592-A.*

Anton Pershin et al., “Highly emissive excitons with reduced exchange energy in thermally activated delayed fluorescent molecules”, Nature Communications, 2019, pp. 1-5, vol. 10, Article No. 597.

Korean Notice of Allowance for KR Application No. 10-2021-0141366, dated Jun. 10, 2026, 7 pages.

* cited by examiner

LIGHT EMITTING ELEMENT AND POLYCYCLIC COMPOUND FOR THE SAME

CROSS-REFERENCE TO RELATED APPLICATION(S)

This application claims priority to and benefits of Korean Patent Application No. 10-2021-0141336 under 35 U.S.C. § 119, filed on Oct. 21, 2021 in the Korean Intellectual Property Office, the entire contents of which are incorporated herein by reference.

BACKGROUND

1. Technical Field

The disclosure relates to a light emitting element and a polycyclic compound used therein.

2. Description of the Related Art

Active development continues for an organic electroluminescence display device as an image display device. The organic electroluminescence display device includes a so-called self-luminescent light emitting element in which holes and electrons respectively injected from a first electrode and a second electrode recombine in an emission layer, so that a luminescent material of the emission layer emits light to implement display.

In the application of a light emitting element to an image display device, there is a demand for a light emitting element having high luminous efficiency, and continuous development is required on materials for a light emitting element which are capable of stably achieving such characteristics.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a light emitting element exhibiting excellent luminous efficiency and having a lower driving voltage.

The disclosure also provides a polycyclic compound which is a material for a light emitting element having high efficiency characteristics.

An embodiment provides a light emitting element which may include a first electrode, a second electrode disposed on the first electrode, and an emission layer disposed between the first electrode and the second electrode. The emission layer includes: a first compound represented by Formula 1; and at least one of a second compound represented by Formula HT-1, a third compound represented by Formula ET-1, or a fourth compound represented by Formula M-b.

[Formula 1]

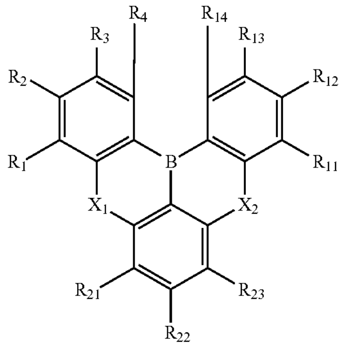

In Formula 1, $X_1$ and $X_2$ may each independently $N(R_0)$, O, or S; $R_0$ may be a hydrogen atom, a deuterium atom, a halogen atom, a substituted or unsubstituted alkyl group having 1 to 20 carbon atoms, a substituted or unsubstituted hydrocarbon ring group having 6 to 60 ring-forming carbon atoms, or a substituted or unsubstituted heteroaryl group having 2 to 60 ring-forming carbon atoms; at least one of $R_1$ to $R_4$, $R_{11}$ to $R_{14}$ and $R_{21}$ to $R_{23}$ may each independently be a group represented by Formula 2; and the remainder of $R_1$ to $R_4$, $R_{11}$ to $R_{14}$ and $R_{21}$ to $R_{23}$ may each independently be a hydrogen atom, a deuterium atom, a halogen atom, a substituted or unsubstituted amine group, a substituted or unsubstituted alkyl group having 1 to 20 carbon atoms, a substituted or unsubstituted hydrocarbon ring group having 6 to 60 ring-forming carbon atoms, or a substituted or unsubstituted heteroaryl group having 2 to 60 ring-forming carbon atoms.

[Formula 2]

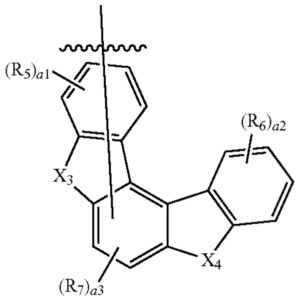

In Formula 2, $X_3$ and $X_4$ may each independently be $N(R_8)$, O, or S; a1 and a2 may each independently be an integer from 0 to 4; a3 may be an integer from 0 to 2; and $R_5$ to $R_8$ may each independently be a hydrogen atom, a deuterium atom, a halogen atom, a substituted or unsubstituted silyl group, a substituted or unsubstituted alkyl group having 1 to 20 carbon atoms, or a substituted or unsubstituted heteroaryl group having 6 to 60 ring-forming carbon atoms.

[Formula HT-1]

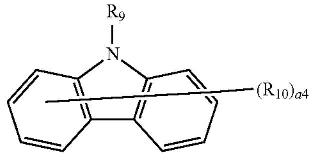

In Formula HT-1, a4 may be an integer from 0 to 8; and $R_9$ and $R_{10}$ may each independently be a hydrogen atom, a deuterium atom, a substituted or unsubstituted aryl group having 6 to 60 ring-forming carbon atoms, or a substituted or unsubstituted heteroaryl group having 2 to 60 ring-forming carbon atoms.

[Formula ET-1]

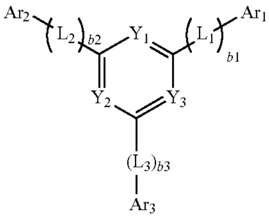

In Formula ET-1, at least one of $Y_1$ to $Y_3$ may be N; the remainder of $Y_1$ to $Y_3$ may each independently be $C(R_a)$; $R_a$ may be a hydrogen atom, a deuterium atom, a substituted or unsubstituted alkyl group having 1 to 20 carbon atoms, a substituted or unsubstituted aryl group having 6 to 60 ring-forming carbon atoms, or a substituted or unsubstituted heteroaryl group having 2 to 60 ring-forming carbon atoms; b1 to b3 may each independently be an integer from 0 to 10; $L_1$ to $L_3$ may each independently be a direct linkage, a substituted or unsubstituted arylene group having 6 to 30 ring-forming carbon atoms, or a substituted or unsubstituted heteroarylene group having 2 to 30 ring-forming carbon atoms; and $Ar_1$ to $Ar_3$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

[Formula M-b]

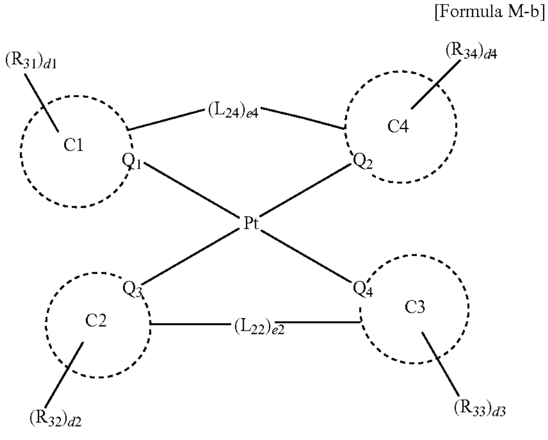

In Formula M-b, $Q_1$ to $Q_4$ may each independently be C or N; C1 to C4 may each independently be a substituted or unsubstituted hydrocarbon ring group having 5 to 30 ring-forming carbon atoms, or a substituted or unsubstituted heterocyclic group having 2 to 30 ring-forming carbon atoms; e1 to 34 may each independently be 0 or 1; $L_{21}$ to $L_{24}$ may each

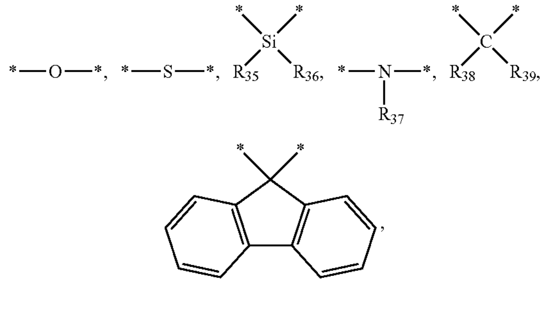

independently be a direct linkage, a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms; d1 to d4 may each independently be an integer from 0 to 4; and $R_{31}$ to $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In an embodiment, the group represented by Formula 2 may be represented by any one of Formula 2-1 to Formula 2-4:

[Formula 2-1]

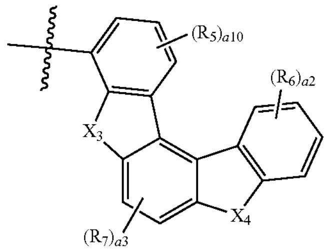

[Formula 2-2]

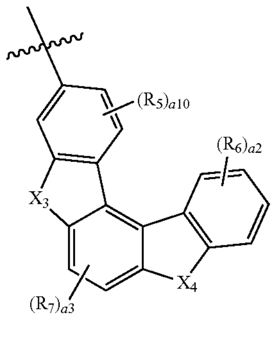

-continued

[Formula 2-3]

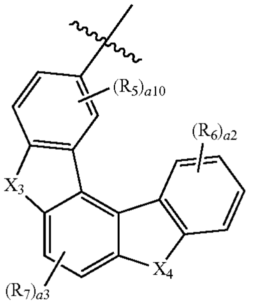

[Formula 2-4]

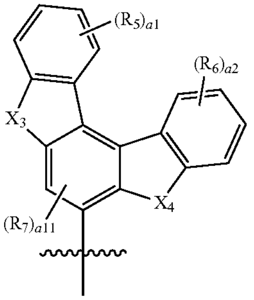

In Formula 2-1 to Formula 2-3, a10 may be an integer from 0 to 3. In Formula 2-4, a11 may be 0 or 1. In Formula 2-1 to Formula 2-4, a1 to a3, $R_5$ to $R_7$, $X_3$ and $X_4$ are each the same as defined in Formula 2.

In an embodiment, the group represented by Formula 2 may be represented by any one of Formula 2-A to Formula 2-F:

[Formula 2-A]

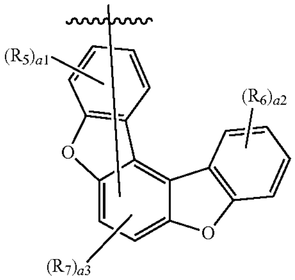

[Formula 2-B]

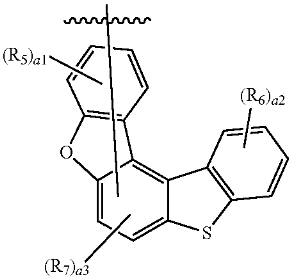

-continued

[Formula 2-C]

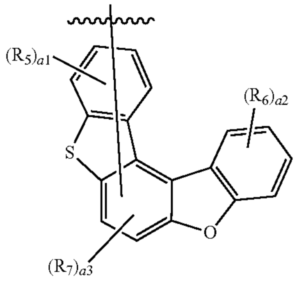

[Formula 2-D]

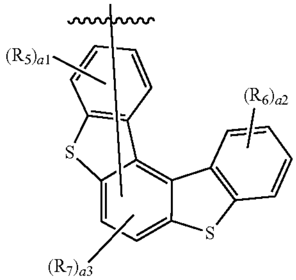

[Formula 2-E]

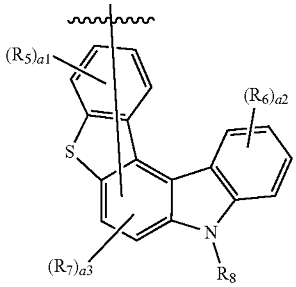

[Formula 2-F]

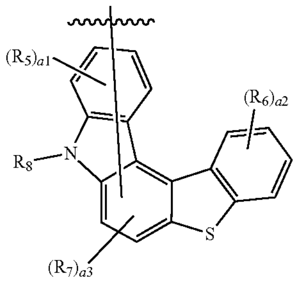

In Formula 2-A to Formula 2-F, a1 to a3 and $R_5$ to $R_8$ are each the same as defined in Formula 2.

In an embodiment, the first compound represented by Formula 1 may be represented by any one of Formula 1-1 to Formula 1-6:

[Formula 1-1]

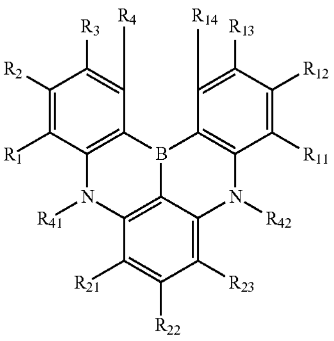

[Formula 1-2]

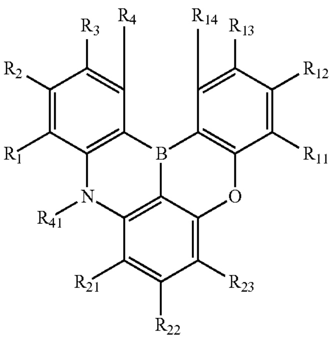

[Formula 1-3]

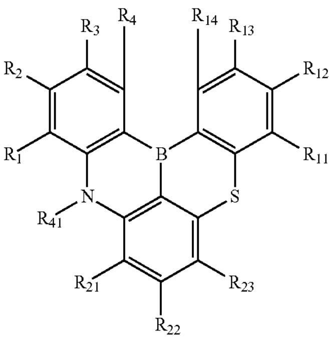

[Formula 1-4]

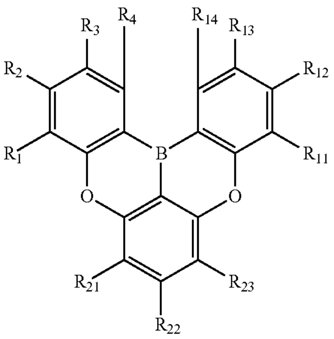

-continued

[Formula 1-5]

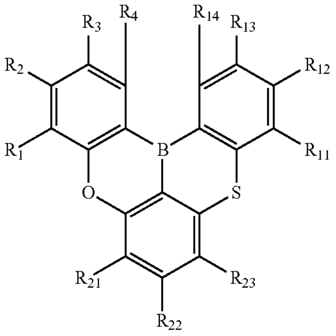

[Formula 1-6]

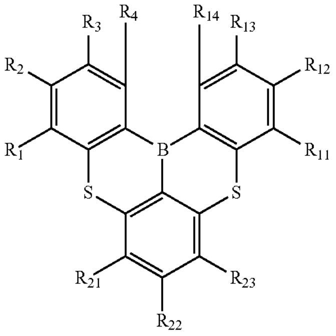

In Formula 1-1 to Formula 1-3, $R_{41}$ and $R_{42}$ may each independently be a hydrogen atom, a deuterium atom, a halogen atom, a substituted or unsubstituted alkyl group having 1 to 20 carbon atoms, a substituted or unsubstituted hydrocarbon ring group having 6 to 60 ring-forming carbon atoms, or a substituted or unsubstituted heteroaryl group having 2 to 60 ring-forming carbon atoms. In Formula 1-1 to Formula 1-6, $R_1$ to $R_4$, $R_{11}$ to $R_{14}$, and $R_{21}$ to $R_{23}$ are each the same as defined in Formula 1.

In an embodiment, $R_{41}$ and $R_{42}$ may each independently be a group represented by any one of R11-1 to R11-6:

R11-1

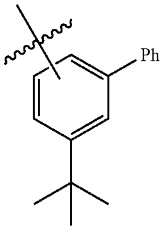

R11-2

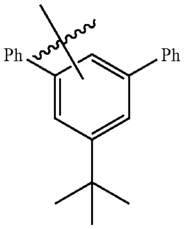

-continued

R11-3

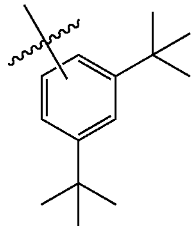

R11-4

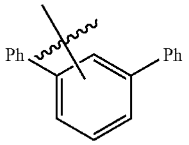

R11-5

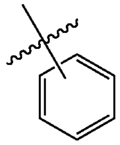

R11-6

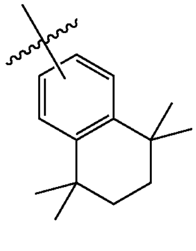

In R11-1, R11-2, and R11-4, Ph is a phenyl group.

In an embodiment, the first compound represented by Formula 1 may be represented by any one of Formula 1-A to Formula 1-C:

[Formula 1-A]

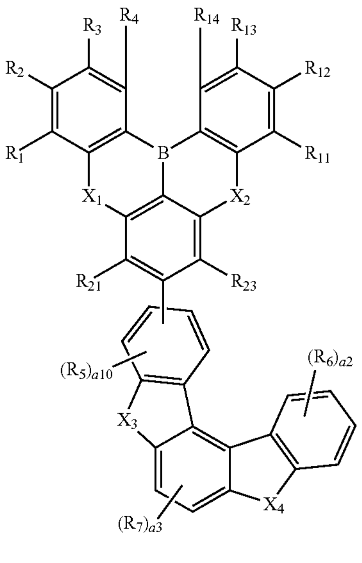

-continued

[Formula 1-B]

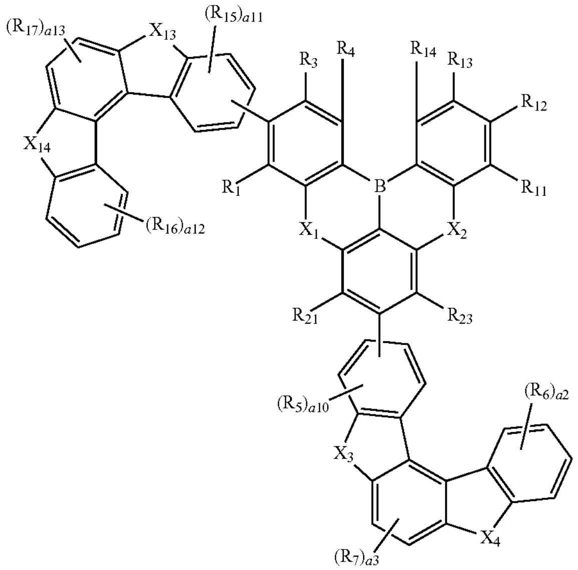

[Formula 1-C]

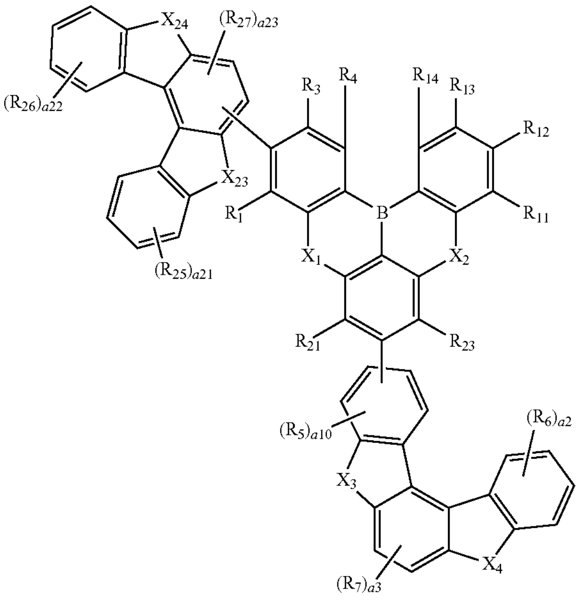

In Formula 1-B, $X_{13}$ and $X_{14}$ may each independently be $N(R_{18})$, O, or S; a11 may be an integer from 0 to 3; a12 may be an integer from 0 to 4; a13 may be an integer from 0 to 2; and $R_{15}$ to $R_{18}$ may each independently be a hydrogen atom, a deuterium atom, a halogen atom, a substituted or unsubstituted silyl group, a substituted or unsubstituted alkyl group having 1 to 20 carbon atoms, or a substituted or unsubstituted aryl group having 6 to 60 ring-forming carbon atoms. In Formula 1-C, $X_{23}$ and $X_{24}$ may each independently be $N(R_{28})$, O, or S; a21 and a22 may each independently be an integer from 0 to 4; a23 may be 0 or 1; and $R_{25}$ to $R_{28}$ may each independently be a hydrogen atom, a deuterium atom, a halogen atom, a substituted or unsubstituted silyl group, a substituted or unsubstituted alkyl group having 1 to 20 carbon atoms, or a substituted or unsubstituted aryl group having 6 to 60 ring-forming carbon atoms. In Formula 1-A to Formula 1-C, a10 may be an integer from 0 to 3; and a2, a3, $R_1$ to $R_7$, $R_{11}$ to $R_{14}$, $R_{21}$, $R_{23}$, and $X_1$ to $X_4$ are each the same as defined in Formula 1.

In an embodiment, $R_5$ to $R_7$ may each independently be a substituted methyl group, an unsubstituted t-butyl group, an unsubstituted triphenylsilyl group, or a substituted or unsubstituted phenyl group.

In an embodiment, the remainder of $R_1$ to $R_4$, $R_{11}$ to $R_{14}$, and $R_{21}$ to $R_{23}$ which are not a group represented by Formula 2 may each independently be a group represented by any one of R1-1 to R1-3:

R1-1

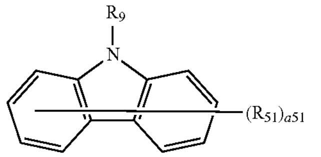

R1-2

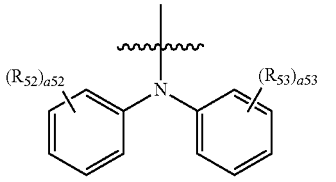

R1-3

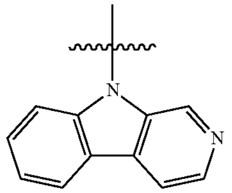

In R1-1, a51 may be an integer from 0 to 8; and $R_{51}$ may be a hydrogen atom, a deuterium atom, a cyano group, or a substituted or unsubstituted alkyl group having 1 to 10 carbon atoms. In R1-2, a52 and a53 may each independently be an integer from 0 to 5; and $R_{52}$ and $R_{53}$ may each independently be a hydrogen atom, a deuterium atom, a cyano group, or a substituted or unsubstituted alkyl group having 1 to 10 carbon atoms.

In an embodiment, at least one of $R_1$ to $R_4$, $R_{11}$ to $R_{14}$, and $R_{21}$ to $R_{23}$ may include a deuterium atom.

In an embodiment, the light emitting element may further include a hole transport region disposed between the first electrode and the emission layer, wherein the hole transport region may include a hole transport compound represented by Formula H-1:

[Formula H-1]

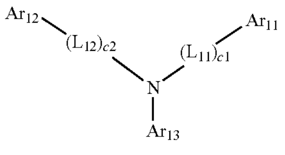

In Formula H-1, c1 and c2 may each independently be an integer from 0 to 10; $L_{11}$ and $L_{12}$ may each independently be a direct linkage, a substituted or unsubstituted arylene group having 6 to 30 ring-forming carbon atoms, or a substituted or unsubstituted heteroarylene group having 2 to 30 ring-forming carbon atoms; $Ar_{11}$ and $Ar_{12}$ may each independently be a substituted or unsubstituted aryl group having 6 to 30 ring-forming carbon atoms, or a substituted or unsubstituted heteroaryl group having 2 to 30 ring-forming carbon atoms; and $Ar_{13}$ may be a substituted or unsubstituted aryl group having 6 to 30 ring-forming carbon atoms.

In an embodiment, the emission layer may include the first compound, the second compound, and the third compound.

In an embodiment, the emission layer may include the first compound, the second compound, the third compound, and the fourth compound.

In an embodiment, the first compound may be selected from Compound Group 1, which is explained below.

In an embodiment, the second compound may be selected from Compound Group 2, which is explained below, the third compound may be selected from Compound Group 3, which is explained below, and the fourth compound may be selected from Compound Group 4, which is explained below, An embodiment provides a polycyclic compound which may be represented by Formula 1.

In an embodiment, the polycyclic compound may have a luminescence center wavelength in a range of about 440 nm to about 480 nm.

In an embodiment, the polycyclic compound represented by Formula 1 may be a thermally activated delayed fluorescence material.

In an embodiment, the polycyclic compound may have an oscillator strength (f) in a range of about 0.25 to about 0.60.

BRIEF DESCRIPTION OF THE DRAWINGS

The accompanying drawings are included to provide a further understanding of the embodiments, and are incorporated in and constitute a part of this specification. The drawings illustrate embodiments of the disclosure and principles thereof. The above and other aspects and features of the disclosure will become more apparent by describing in detail embodiments thereof with reference to the attached drawings, in which.

DETAILED DESCRIPTION OF THE EMBODIMENTS

Figure 1:
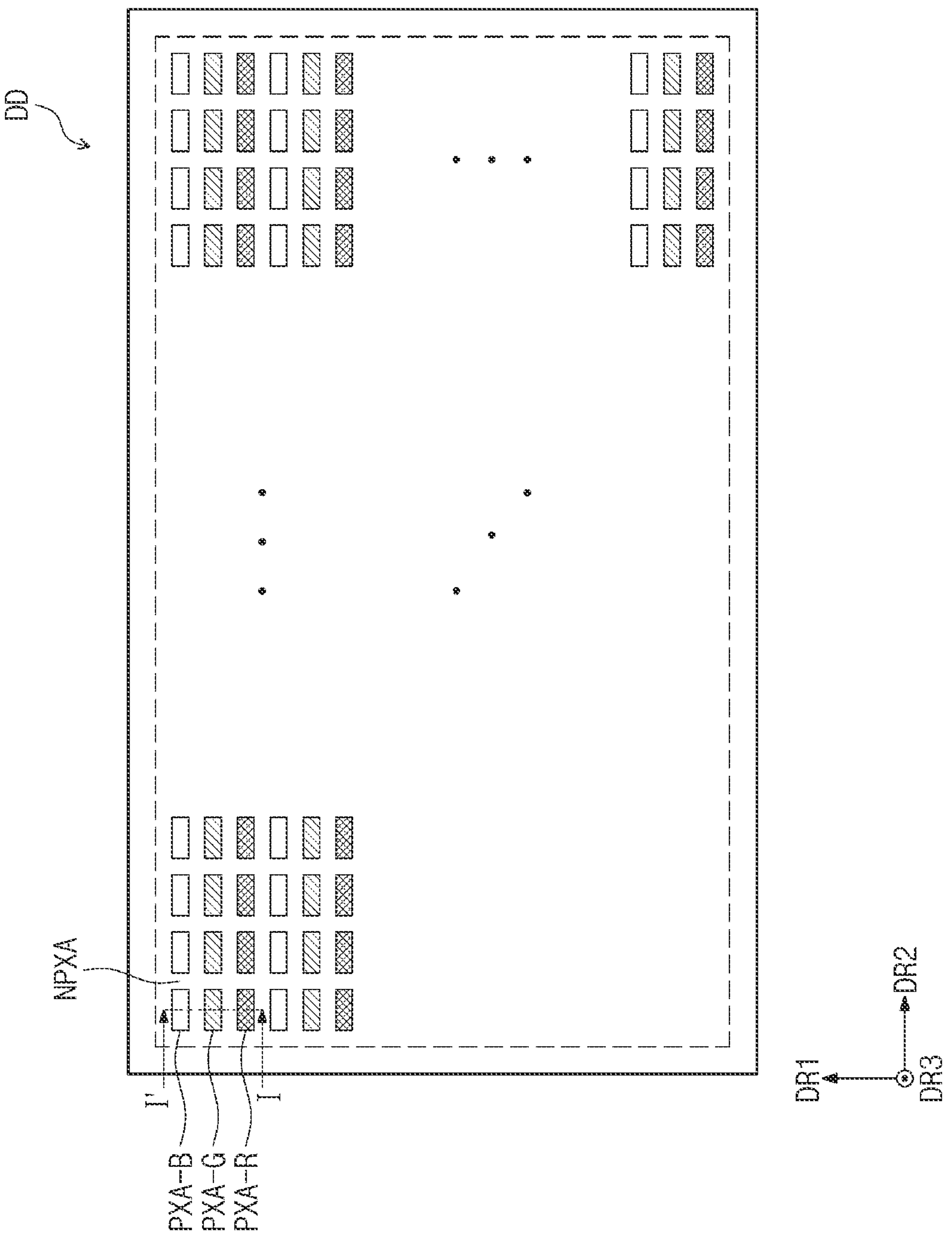
FIG. 1 is a plan view illustrating a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the specification, it will be understood that when an element (or region, layer, part, etc.) is referred to as being “on”, “connected to”, or “coupled to” another element, it can be directly on, connected to, or coupled to the other element, or one or more intervening elements may be present therebetween. In a similar sense, when an element (or region, layer, part, etc.) is described as “covering” another element, it can directly cover the other element, or one or more intervening elements may be present therebetween.

In the specification, when an element is “directly on,” “directly connected to,” or “directly coupled to” another element, there are no intervening elements present. For example, “directly on” may mean that two layers or two elements are disposed without an additional element such as an adhesion element therebetween.

As used herein, the expressions used in the singular such as “a,” “an,” and “the,” are intended to include the plural forms as well, unless the context clearly indicates otherwise.

As used herein, the term “and/or” includes any and all combinations of one or more of the associated listed items. For example, “A and/or B” may be understood to mean “A, B, or A and B.” The terms “and” and “or” may be used in the conjunctive or disjunctive sense and may be understood to be equivalent to “and/or”.

The term “at least one of” is intended to include the meaning of “at least one selected from the group of” for the purpose of its meaning and interpretation. For example, “at least one of A and B” may be understood to mean “A, B, or A and B.” When preceding a list of elements, the term, “at least one of,” modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms “below”, “beneath”, “lower”, “above”, “upper”, or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned “below” or “beneath” another device may be placed “above” another device. Accordingly, the illustrative term “below” may include both the lower and upper positions. The device may also be oriented in other directions and thus the spatially relative terms may be interpreted differently depending on the orientations.

The terms “about” or “approximately” as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, “about” may mean within one or more standard deviations, or within ±20%, ±10%, or ±5% of the stated value.

It should be understood that the terms “comprises,” “comprising,” “includes,” “including,” “have,” “having,” “contains,” “containing,” and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, a light emitting element and a polycyclic compound according to an embodiment will be described with reference to the drawings.

Figure 2:
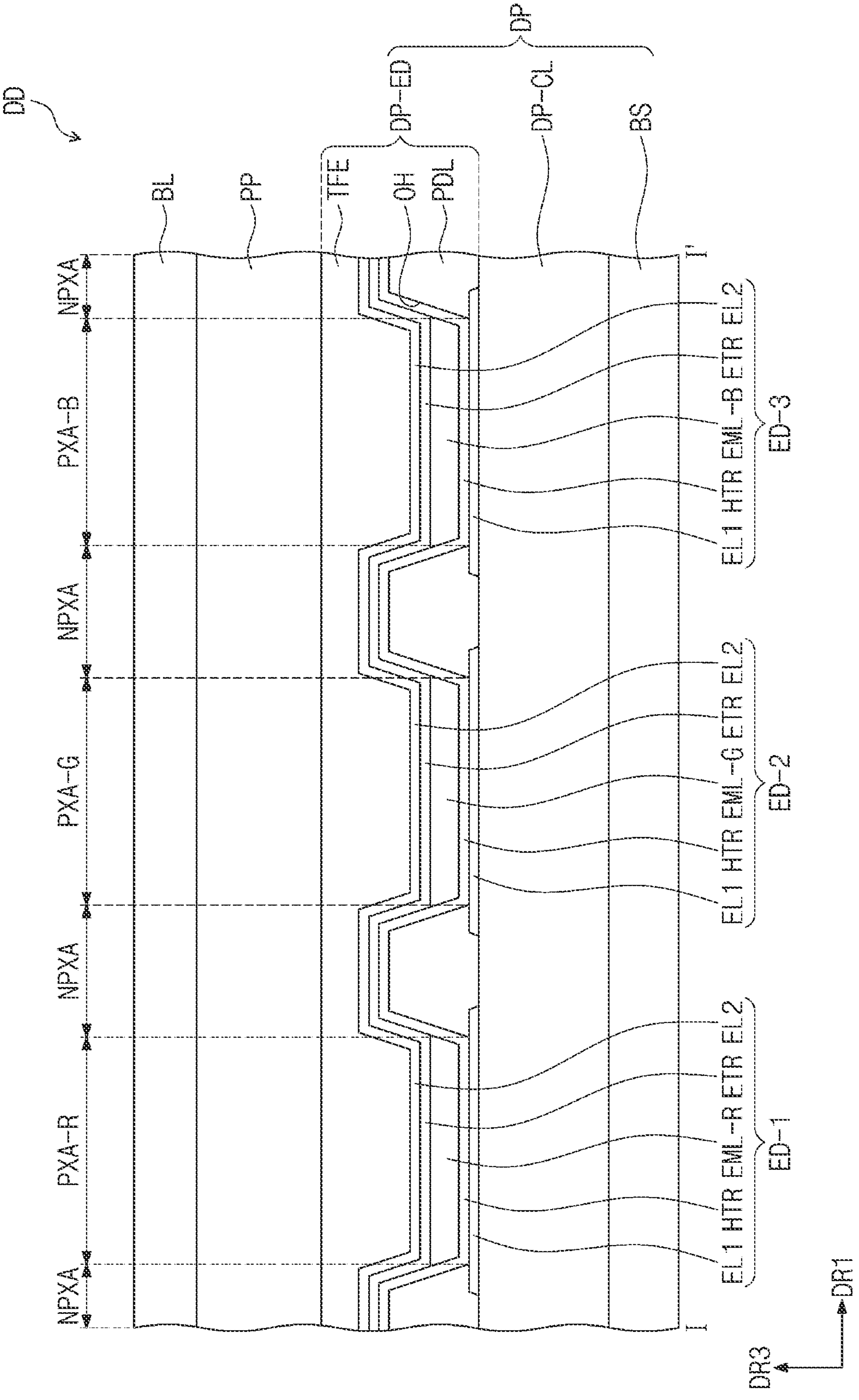
FIG. 2 is a schematic cross-sectional view illustrating a part taken along line I-I' of FIG. 1.

FIG. 1 is a plan view illustrating an embodiment of a display device DD. FIG. 2 is a schematic cross-sectional view of the display device DD of the embodiment. FIG. 2 is a schematic cross-sectional view illustrating a part taken along line I-I' of FIG. 1.

The display device DD may include a display panel DP and an optical layer PP disposed on the display panel DP. The display panel DP may include light emitting elements ED-1, ED-2, and ED-3. The display device DD may include multiples of each of the light emitting elements ED-1, ED-2, and ED-3. The optical layer PP may be disposed on the display panel DP and may control light reflected at the display panel DP from an external light. The optical layer PP may include, for example, a polarization layer or a color filter layer. Although not shown in the drawings, in an embodiment, the optical layer PP may be omitted from the display device DD.

A base substrate BL may be disposed on the optical layer PP. The base substrate BL may provide a base surface on which the optical layer PP is disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawings, in an embodiment, the base substrate BL may be omitted.

The display device DD according to an embodiment may further include a filling layer (not shown). The filling layer (not shown) may be disposed between a display element layer DP-ED and the base substrate BL. The filling layer (not shown) may be an organic material layer. The filling layer (not shown) may include at least one of an acrylic-based resin, a silicone-based resin, or an epoxy-based resin.

The display panel DP may include a base layer BS, a circuit layer DP-CL provided on the base layer BS, and the display element layer DP-ED. The display element layer DP-ED may include a pixel defining film PDL, the light emitting elements ED-1, ED-2, and ED-3 disposed between portions of the pixel defining film PDL, and an encapsulation layer TFE disposed on the light emitting elements ED-1, ED-2, and ED-3.

The base layer BS may provide a base surface on which the display element layer DP-ED is disposed. The base layer BS may be a glass substrate, a metal substrate, a plastic substrate, etc. However, embodiments are not limited thereto, and the base layer BS may include an inorganic layer, an organic layer, or a composite material layer.

In an embodiment, the circuit layer DP-CL may be disposed on the base layer BS, and the circuit layer DP-CL may include transistors (not shown). Each of the transistors (not shown) may include a control electrode, an input electrode, and an output electrode. For example, the circuit layer DP-CL may include a switching transistor and a driving transistor in order to drive the light emitting elements ED-1, ED-2, and ED-3 of the display element layer DP-ED.

Each of the light emitting elements ED-1, ED-2, and ED-3 may have a structure of a light emitting element ED of an embodiment according to FIGS. 3 to 6, which will be described later. Each of the light emitting elements ED-1, ED-2, and ED-3 may include a first electrode EL1, a hole transport region HTR, emission layers EML-R, EML-G, and EML-B, an electron transport region ETR, and a second electrode EL2.

FIG. 2 illustrates an embodiment in which the emission layers EML-R, EML-G, and EML-B of the light emitting elements ED-1, ED-2, and ED-3 are disposed in openings OH defined in the pixel defining film PDL, and the hole transport region HTR, the electron transport region ETR, and the second electrode EL2 are each provided as a common layer for all of the light emitting elements ED-1, ED-2, and ED-3. However, embodiments are not limited thereto. Although not shown in FIG. 2, in an embodiment, the hole transport region HTR and the electron transport region ETR may each be provided by being patterned inside the openings OH defined in the pixel defining film PDL. For example, in an embodiment, the hole transport region HTR, the emission layers EML-R, EML-G, and EML-B, and the electron transport region ETR of the light emitting elements ED-1, ED-2, and ED-3 may each be provided by being patterned through an inkjet printing method.

The encapsulation layer TFE may cover the light emitting elements ED-1, ED-2, and ED-3. The encapsulation layer TFE may seal the display element layer DP-ED. The encapsulation layer TFE may be a thin film encapsulation layer. The encapsulation layer TFE may be formed of a single layer or of multiple layers. The encapsulation layer TFE may include at least one insulation layer. The encapsulation layer TFE according to an embodiment may include at least one inorganic film (hereinafter, an encapsulation-inorganic film). The encapsulation layer TFE according to an embodiment may include at least one organic film (hereinafter, an encapsulation-organic film) and at least one encapsulation-inorganic film.

The encapsulation-inorganic film may protect the display element layer DP-ED from moisture and/or oxygen, and the encapsulation-organic film may protect the display element layer DP-ED from foreign substances such as dust particles. The encapsulation-inorganic film may include silicon nitride, silicon oxynitride, silicon oxide, titanium oxide, aluminum oxide, or the like, but embodiments are not limited thereto. The encapsulation-organic film may include an acrylic-based compound, an epoxy-based compound, or the like. The encapsulation-organic film may include a photopolymerizable organic material, but embodiments are not limited thereto.

The encapsulation layer TFE may be disposed on the second electrode EL2 and may be disposed to fill the openings OH.

Referring to FIGS. 1 and 2, the display device DD may include a non-light emitting region NPXA and light emitting regions PXA-R, PXA-G, and PXA-B. The light emitting regions PXA-R, PXA-G, and PXA-B may each be a region in which light generated by the respective light emitting elements ED-1, ED-2 and ED-3 is emitted. The light emitting regions PXA-R, PXA-G, and PXA-B may be spaced apart from each other in a plan view.

Each of the light emitting regions PXA-R, PXA-G, and PXA-B may be a region separated by the pixel defining film PDL. The non-light emitting regions NPXA may be regions between the adjacent light emitting regions PXA-R, PXA-G, and PXA-B, which correspond to portions of the pixel defining film PDL. For example, in an embodiment, the light emitting regions PXA-R, PXA-G, and PXA-B may each correspond to a pixel. The pixel defining film PDL may separate the light emitting elements ED-1, ED-2, and ED-3. The emission layers EML-R, EML-G, and EML-B of the light emitting elements ED-1, ED-2, and ED-3 may be disposed in openings OH defined in the pixel defining film PDL and separated from each other.

The light emitting regions PXA-R, PXA-G, and PXA-B may be divided into groups according to the color of light generated from the light emitting elements ED-1, ED-2, and ED-3. In the display device DD of an embodiment shown in FIGS. 1 and 2, three light emitting regions PXA-R, PXA-G, and PXA-B which emit red light, green light, and blue light, respectively are illustrated as an example. For example, the display device DD of an embodiment may include a red light emitting region PXA-R, a green light emitting region PXA-G, and a blue light emitting region PXA-B that are separated from each other.

In the display device DD according to an embodiment, the light emitting elements ED-1, ED-2, and ED-3 may emit light having wavelengths different from each other. For example, in an embodiment, the display device DD may include a first light emitting element ED-1 that emits red light, a second light emitting element ED-2 that emits green light, and a third light emitting element ED-3 that emits blue light. For example, the red light emitting region PXA-R, the green light emitting region PXA-G, and the blue light emitting region PXA-B of the display device DD may respectively correspond to the first light emitting element ED-1, the second light emitting element ED-2, and the third light emitting element ED-3.

However, embodiments are not limited thereto, and the first to third light emitting elements ED-1, ED-2, and ED-3 may emit light in a same wavelength range or at least one light emitting element may emit light in a wavelength range different from the others. For example, the first to third light emitting elements ED-1, ED-2, and ED-3 may a11 emit blue light.

The light emitting regions PXA-R, PXA-G, and PXA-B in the display device DD according to an embodiment may be arranged in a stripe configuration. Referring to FIG. 1, the red light emitting regions PXA-R, the green light emitting regions PXA-G, and the blue light emitting regions PXA-B may each be arranged along a second directional axis DR2. In another embodiment, the red light emitting region PXA-R, the green light emitting region PXA-G, and the blue light emitting region PXA-B may be alternately arranged in this order along a first directional axis DR1.

FIGS. 1 and 2 illustrate that all the light emitting regions PXA-R, PXA-G, and PXA-B have a similar area, but embodiments are not limited thereto. Thus, the light emitting regions PXA-R, PXA-G, and PXA-B may have different areas from each other according to a wavelength range of the emitted light. The areas of the light emitting regions PXA-R, PXA-G, and PXA-B may be areas in a plan view that are defined by the first directional axis DR1 and the second directional axis DR2.

An arrangement form of the light emitting regions PXA-R, PXA-G, and PXA-B is not limited to the feature illustrated in FIG. 1, and the order in which the red light emitting region PXA-R, the green light emitting region PXA-G, and the blue light emitting region PXA-B are arranged may be provided in various combinations according to the display quality characteristics which are required for the display device DD. For example, the arrangement form of the light emitting regions PXA-R, PXA-G, and PXA-B may be a PENTILE™ configuration or a Diamond Pixel™ configuration.

In an embodiment, the areas of the light emitting regions PXA-R, PXA-G, and PXA-B may be different in size from each other. For example, in an embodiment, an area of the green light emitting region PXA-G may be smaller than an area of the blue light emitting region PXA-B, but embodiments are not limited thereto.

Hereinafter, FIGS. 3 to 6 are schematic cross-sectional views illustrating light emitting elements according to embodiments. Each of the light emitting elements ED according to embodiments may include a first electrode EL1, a hole transport region HTR, an emission layer EML, an electron transport region ETR, and a second electrode EL2 that are stacked in that order.

Figure 3:
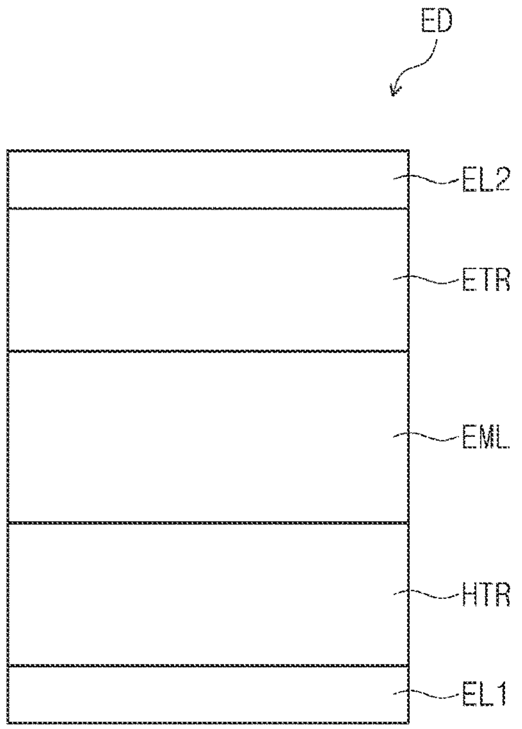
FIG. 3 is a schematic cross-sectional view illustrating a light emitting element of an embodiment.
Figure 4:
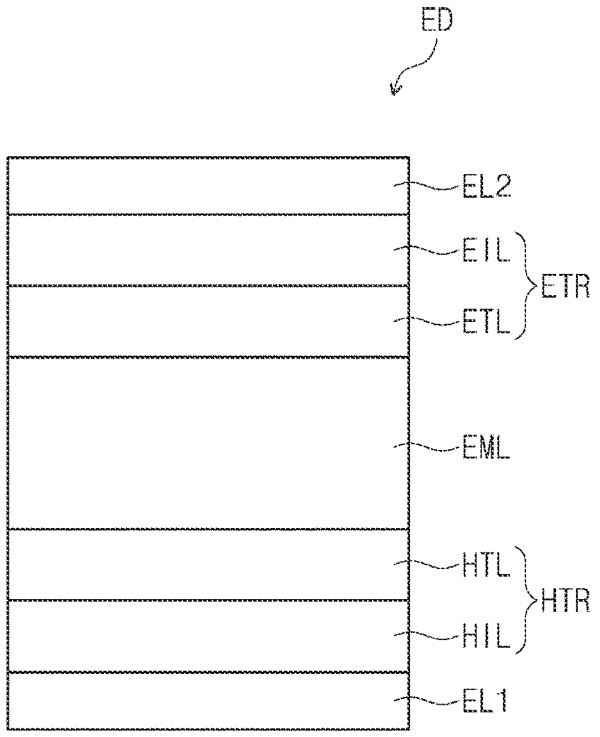
FIG. 4 is a schematic cross-sectional view illustrating a light emitting element of an embodiment.
Figure 5:
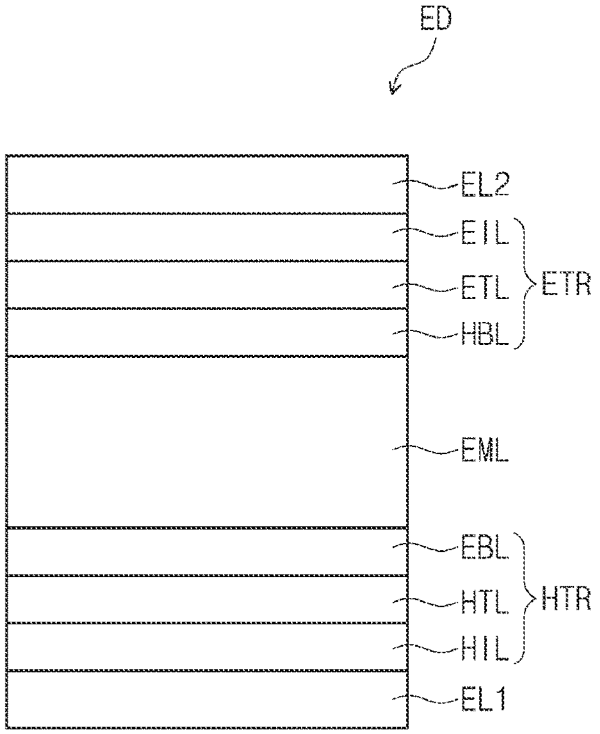
FIG. 5 is a schematic cross-sectional view illustrating a light emitting element of an embodiment.
Figure 6:
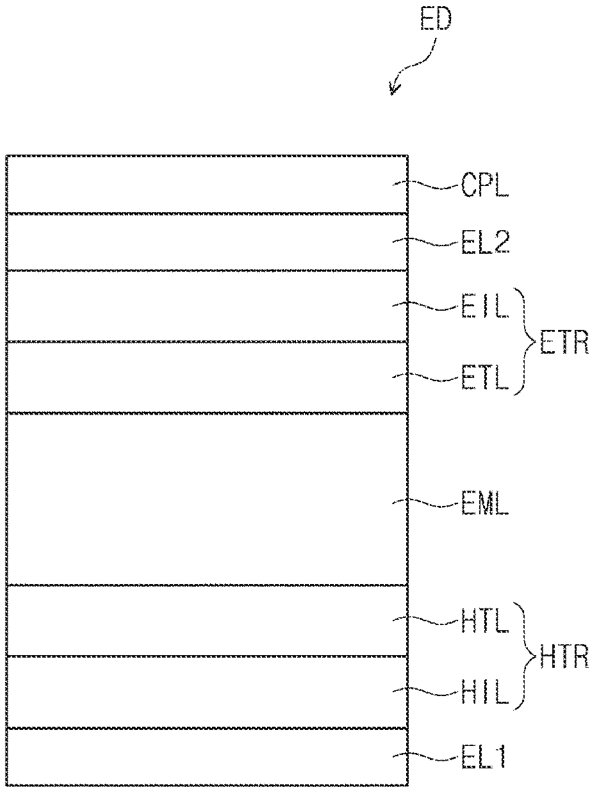
FIG. 6 is a schematic cross-sectional view illustrating a light emitting element of an embodiment.

In comparison to FIG. 3, FIG. 4 illustrates a schematic cross-sectional view of a light emitting element ED of an embodiment, in which a hole transport region HTR includes a hole injection layer HIL and a hole transport layer HTL, and an electron transport region ETR includes an electron injection layer EIL and an electron transport layer ETL. In comparison to FIG. 3, FIG. 5 illustrates a schematic cross-sectional view of a light emitting element ED of an embodiment, in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. In comparison to FIG. 4, FIG. 6 illustrates a schematic cross-sectional view of a light emitting element ED of an embodiment including a capping layer CPL disposed on a second electrode EL2.

In an embodiment, the emission layer EML may include a first compound including a pentacyclic fused ring containing a boron atom as a ring-forming atom. The emission layer EML may further include at least one of a second compound, a third compound, or a fourth compound. The second compound may include a substituted or unsubstituted carbazole group. The third compound may include a hexagonal ring containing at least one nitrogen atom as a ring-forming atom. The fourth compound may be a platinum-containing compound.

In the specification, the term "substituted or unsubstituted" may mean a group that is substituted or unsubstituted with at least one substituent selected from the group consisting of a deuterium atom, a halogen atom, a cyano group, a nitro group, an amine group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. Each of the substituents listed above may itself be substituted or unsubstituted. For example, a biphenyl group may be interpreted as an aryl group, or may be interpreted as a phenyl group substituted with a phenyl group.

In the specification, the term "bonded to an adjacent group to form a ring" may mean a group that is bonded to an adjacent group to form a substituted or unsubstituted hydrocarbon ring, or a substituted or unsubstituted heterocycle. The hydrocarbon ring may be an aliphatic hydrocarbon ring or an aromatic hydrocarbon ring. The heterocycle may be an aliphatic heterocycle or an aromatic heterocycle. The hydrocarbon ring and the heterocycle may each independently be monocyclic or polycyclic. A ring that is formed by the bonding of adjacent groups to each other may itself be connected to another ring to form a spiro structure.

In the specification, the term "adjacent group" may mean a substituent substituted for an atom which is directly linked to an atom substituted with a corresponding substituent, another substituent substituted for an atom which is substituted with a corresponding substituent, or a substituent sterically positioned at the nearest position to a corresponding substituent. For example, two methyl groups in 1,2-dimethylbenzene may be interpreted as "adjacent groups" to each other, and two ethyl groups in 1,1-diethylcyclopentane may be interpreted as "adjacent groups" to each other. For example, two methyl groups in 4,5-dimethylphenanthrene may be interpreted as "adjacent groups" to each other.

In the specification, examples of a halogen atom may include a fluorine atom, a chlorine atom, a bromine atom, or an iodine atom.

In the specification, an alkyl group may be a linear, a branched, or a cyclic type. The number of carbon atoms in the alkyl group may be 1 to 50, 1 to 30, 1 to 20, 1 to 10, or 1 to 6. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but embodiments are not limited thereto.

In the specification, a hydrocarbon ring group may be any functional group or substituent derived from an aliphatic hydrocarbon ring or from a ring in which an aliphatic hydrocarbon ring group and an aromatic hydrocarbon ring are fused. The number of ring-forming carbon atoms in the hydrocarbon ring group may be 5 to 60, 5 to 30, or 5 to 30.

In the specification, an aryl group may be any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but embodiments are not limited thereto.

In the specification, a heterocyclic group may be any functional group or substituent derived from a ring including at least one of B, O, N, P, Si, or Se as a heteroatom. The heterocyclic group may be an aliphatic heterocyclic group or an aromatic heterocyclic group. The aromatic heterocyclic group may be a heteroaryl group. The aliphatic heterocycle and the aromatic heterocycle may each independently be monocyclic or polycyclic.

In case that the heterocyclic group includes two or more heteroatoms, the two or more heteroatoms may be the same as or different from each other. The heterocyclic group may be a monocyclic heterocyclic group or a polycyclic heterocyclic group, and the heterocyclic group may be a heteroaryl group. The number of ring-forming carbon atoms in the heterocyclic group may be 2 to 60, 2 to 30, 2 to 20, or 2 to 10.

In the specification, an aliphatic heterocyclic group may include at least one of B, O, N, P, Si, or S as a heteroatom. The number of ring-forming carbon atoms in the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group etc., but embodiments are not limited thereto.

In the specification, a heteroaryl group may include at least one of B, O, N, P, Si, or S as a heteroatom. In case that the heteroaryl group contains two or more heteroatoms, the two or more heteroatoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but embodiments are not limited thereto.

In the specification, the above description of the aryl group may be applied to an arylene group except that the arylene group is a divalent group. The above description of the heteroaryl group may be applied to a heteroarylene group except that the heteroarylene group is a divalent group.

In the specification, a fluorenyl group may be substituted, and two substituents may be bonded to each other to form a spiro structure. Examples of substituted fluorenyl groups are as follows. However, embodiments are not limited thereto.

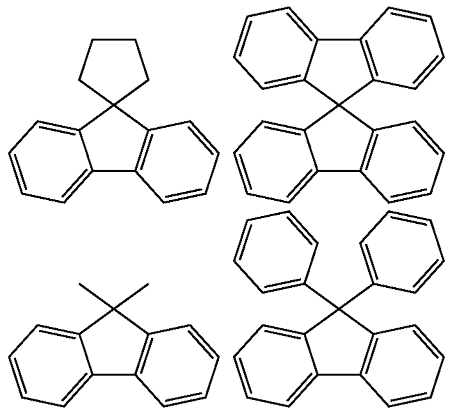

In the specification, a silyl group may be an alkylsilyl group or an arylsilyl group. Examples of the silyl group may include a trimethylsilyl group, a triethylsilyl group, a t-butyldimethylsilyl group, an ethyldimethylsilyl group, a propyldimethylsilyl group, a triphenylsilyl group, a diphenylsilyl group, a phenylsilyl group, etc., but embodiments are not limited thereto.

In the specification, a thio group may be an alkylthio group or an arylthio group. The thio group may be a sulfur atom that is bonded to an alkyl group or an aryl group as defined above. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, but embodiments are not limited thereto.

In the specification, an oxy group may be an oxygen atom that is bonded to an alkyl group or an aryl group as defined above. The oxy group may be an alkoxy group or an aryl oxy group. The alkoxy group may be a linear chain, a branched chain, or a ring chain. The number of carbon atoms in the alkoxy group is not specifically limited, but may be, for example, 1 to 20 or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc., but embodiments are not limited thereto.

In the specification, the number of carbon atoms in an amine group is not specifically limited, but may be 1 to 30. The amine group may be an alkyl amine group or an aryl amine group. Examples of the amine group may include a methylamine group, a dimethylamine group, a phenylamine group, a diphenylamine group, a naphthylamine group, a 9-methyl-anthracenylamine group, a triphenylamine group, etc., but embodiments are not limited thereto.

In the specification, a direct linkage may be a single bond.

In the specification, the symbols

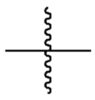

and ——— * each represents a bonding site to a neighboring atom.

In an embodiment, the emission layer EML may include a first compound. The first compound may be a polycyclic compound of an embodiment, and the polycyclic compound may be represented by Formula 1:

[Formula 1]

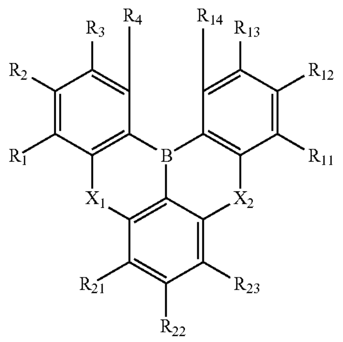

In Formula 1, $X_1$ and $X_2$ may each independently be $N(R_0)$, O, or S. $X_1$ and $X_2$ may be the same as or different from each other. The polycyclic compound of an embodiment may contain B and at least one of N, O, or S as ring-forming atoms.

In Formula 1, $R_0$ may be a hydrogen atom, a deuterium atom, a halogen atom, a substituted or unsubstituted alkyl group having 1 to 20 carbon atoms, a substituted or unsubstituted hydrocarbon ring group having 6 to 60 ring-forming carbon atoms, or a substituted or unsubstituted heteroaryl group having 2 to 60 ring-forming carbon atoms. For example, $R_0$ may be a substituted or unsubstituted phenyl group or a substituted tetrahydronaphthyl group. When $R_0$ is a substituted tetrahydronaphthyl group, the benzene ring of the tetrahydronaphthyl group may be bonded to the nitrogen atom.

In Formula 1, at least one of $R_1$ to $R_4$, $R_{11}$ to $R_{14}$, and $R_{21}$ to $R_{23}$ may each independently be a group represented by Formula 2, and the remainder of $R_1$ to $R_4$, Ru to $R_{14}$, and $R_{21}$ to $R_{23}$ may each independently be a hydrogen atom, a deuterium atom, a halogen atom, a substituted or unsubstituted amine group, a substituted or unsubstituted alkyl group having 1 to 20 carbon atoms, a substituted or unsubstituted hydrocarbon ring group having 6 to 60 ring-forming carbon atoms, or a substituted or unsubstituted heteroaryl group having 2 to 60 ring-forming carbon atoms.

For example, at least one of $R_1$ to $R_4$, $R_{11}$ to $R_{14}$, and $R_{21}$ to $R_{23}$ may include a deuterium atom. As another example, at least one a $R_1$ to $R_4$, $R_{11}$ to $R_{14}$, and $R_{21}$ to $R_{23}$ may be substituted with a deuterium atom.

In an embodiment, at least one of $R_1$ to $R_4$, $R_{11}$ to $R_{14}$, and $R_{21}$ to $R_{23}$ may be a pentacyclic group in which two pentagonal rings and three hexagonal rings are fused. The two pentagonal rings may contain N, O, or S as a ring-forming atom, and the three hexagonal rings may be benzene rings.

[Formula 2]

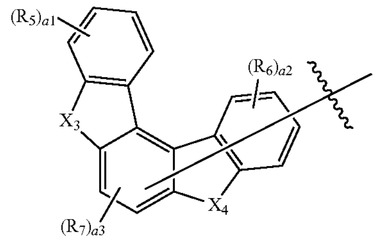

In Formula 2, $X_3$ and $X_4$ may each independently be $N(R_8)$, O, or S.

In Formula 2, a1 and a2 may each independently be an integer from 0 to 4, and a3 may be an integer from 0 to 2. When a1 is 2 or more, multiple $R_5$ groups may be the same as each other or at least one may be different from the others. When a2 is 2 or more, multiple $R_6$ groups may be the same as each other or at least one may be different from the others. When a3 is 2, two $R_7$ groups may be the same as or different from each other.

In Formula 2, $R_5$ to $R_8$ may each independently be a hydrogen atom, a deuterium atom, a halogen atom, a substituted or unsubstituted silyl group, a substituted or unsubstituted alkyl group having 1 to 20 carbon atoms, or a substituted or unsubstituted aryl group having 6 to 60 ring-forming carbon atoms. In an embodiment, $R_5$ to $R_7$ may each independently be a substituted methyl group, an unsubstituted t-butyl group, an unsubstituted triphenylsilyl group, or a substituted or unsubstituted phenyl group. For example, $R_8$ may be a substituted or unsubstituted phenyl group, and when $R_8$ is a substituted phenyl group, the substituted phenyl group may contain a t-butyl group or a phenyl group as a substituent. However, this is only an example, and embodiments are not limited thereto.

In an embodiment, the group represented by Formula 2 may be represented by any one of Formula 2-1 to Formula 2-4. Formula 2-1 to Formula 2-4 each represent a case where the linking position of Formula 2 that is linked to Formula 1 is specified. Formula 2-1 to Formula 2-3 represent a case where a hexagonal ring at an end of the group represented by Formula 2 is a part linked to Formula 1. For example, Formula 2-1 to Formula 2-3 represent a case where the hexagonal ring containing $R_5$ in Formula 2 is a part linked to Formula 1. Formula 2-4 represents a case where the hexagonal ring between the two pentagonal rings in the group represented by Formula 2 is a part linked to Formula 1. For example, Formula 2-4 represents a case where the hexagonal ring containing $R_7$ in Formula 2 is a part linked to Formula 1.

[Formula 2-1]

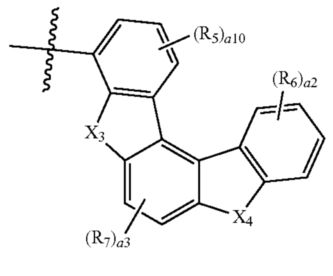

-continued

[Formula 2-2]

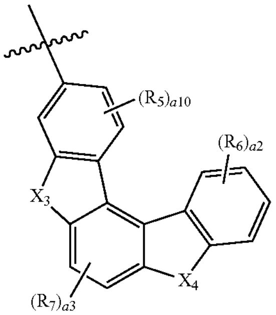

[Formula 2-3]

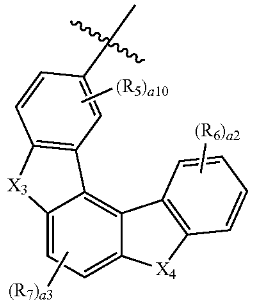

[Formula 2-4]

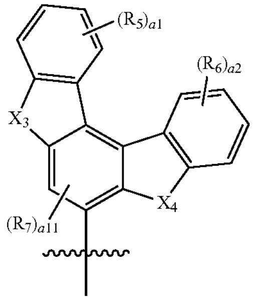

In Formula 2-1 to Formula 2-4, a1 to a3, $R_5$ to $R_7$, $X_3$, and $X_4$ are each the same as defined in Formula 2. In Formula 2-1 to Formula 2-3, a10 may be an integer from 0 to 3. When a10 is 2 or more, multiple $R_5$ groups may be the same as each other or at least one may be different from the others. In Formula 2-4, a11 may be 0 or 1. For example, when Formula 2 is represented by Formula 2-4, $X_3$ and $X_4$ may be oxygen atoms.

In an embodiment, the group represented by Formula 2 may be represented by any one of Formula 2-A to Formula 2-F. Formula 2-A represents a case where $X_3$ and $X_4$ in Formula 2 are oxygen atoms. Formula 2-B represents a case where $X_3$ is an oxygen atom and $X_4$ is a sulfur atom. Formula 2-C represents a case where $X_3$ is a sulfur atom and $X_4$ is an oxygen atom. Formula 2-D represents a case where $X_3$ and $X_4$ are sulfur atoms. Formula 2-E represents a case where $X_3$ is a sulfur atom and $X_4$ is a nitrogen atom. Formula 2-F represents a case where $X_3$ is a nitrogen atom and $X_4$ is a sulfur atom.

[Formula 2-A]

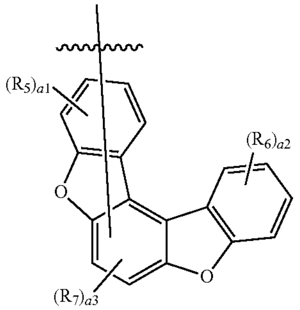

[Formula 2-B]

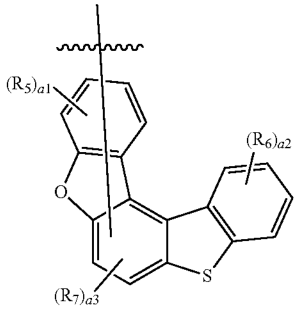

[Formula 2-C]

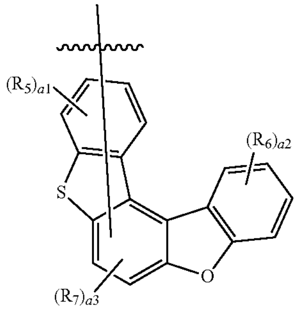

[Formula 2-D]

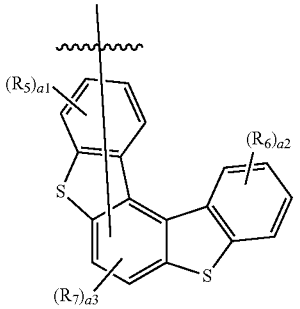

[Formula 2-E]

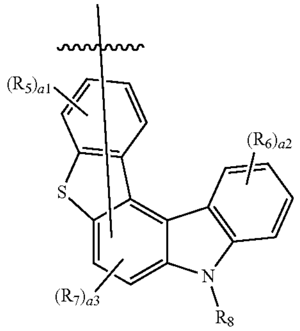

-continued

[Formula 2-F]

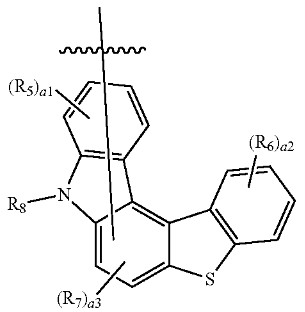

In Formula 2-A to Formula 2-F, a1 to a3 and $R_5$ to $R_8$ are each the same as defined in Formula 2. For example, when the group represented by Formula 2 is represented by any one of Formula 2-B to Formula 2-F, in Formula 2-B to Formula 2-F, the part linked to Formula 1 may be a ring containing $R_5$. Formula 2-B to Formula 2-F may contain at least one sulfur atom as a ring-forming atom of a pentagonal ring.

In an embodiment, the polycyclic compound represented by Formula 1 may be represented by any one of Formula 1-1 to Formula 1-6. Formula 1-1 represents a case where $X_1$ and $X_2$ in Formula 1 are nitrogen atoms. Formula 1-2 represents a case where in Formula 1, $X_1$ is a nitrogen atom and $X_2$ is an oxygen atom. Formula 1-3 represents a case where in Formula 1, $X_1$ is a nitrogen atom and $X_2$ is a sulfur atom. Formula 1-4 represents a case where $X_1$ and $X_2$ in Formula 1 are oxygen atoms. Formula 1-5 represents a case where in Formula 1, $X_1$ is an oxygen atom and $X_2$ is a sulfur atom. Formula 1-6 represents a case where $X_1$ and $X_2$ in Formula 1 are sulfur atoms.

[Formula 1-1]

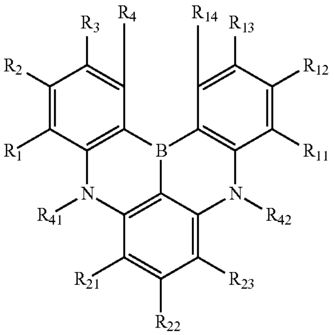

[Formula 1-2]

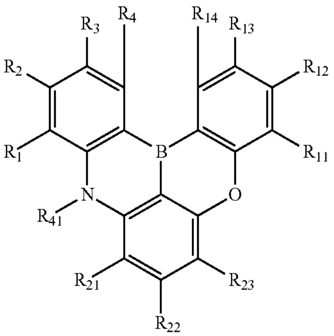

-continued

[Formula 1-3]

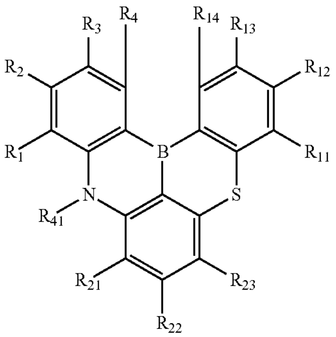

[Formula 1-4]

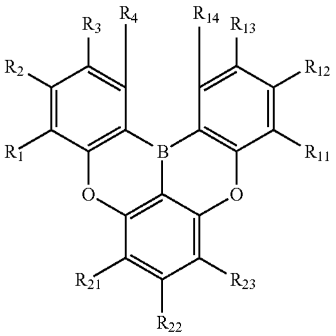

[Formula 1-5]

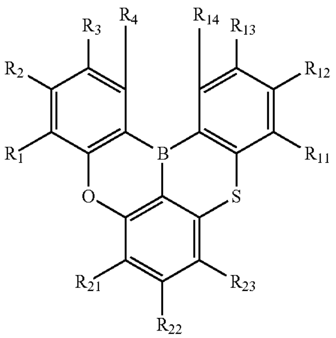

[Formula 1-6]

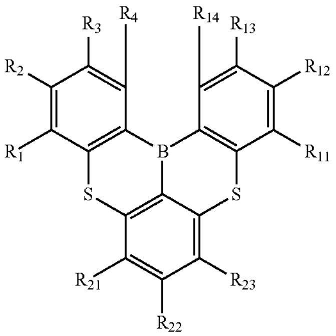

In Formula 1-1 to Formula 1-6, $R_1$ to $R_4$, $R_{11}$ to $R_{14}$, and $R_{21}$ to $R_{23}$ are each the same as defined in Formula 1. In Formula 1-1 to Formula 1-3, $R_{41}$ and $R_{42}$ may each independently be a hydrogen atom, a deuterium atom, a halogen atom, a substituted or unsubstituted alkyl group having 1 to 20 carbon atoms, a substituted or unsubstituted hydrocarbon ring group having 6 to 60 ring-forming carbon atoms, or a substituted or unsubstituted heteroaryl group having 2 to 60 ring-forming carbon atoms.

For example, $R_{41}$ and $R_{42}$ may each independently be a substituted or unsubstituted phenyl group, or a substituted tetrahydronaphthyl group. In an embodiment, $R_{41}$ and $R_{42}$ may each independently be a group represented by any one of R11-1 to R11-6. R11-1 to R11-4 each represent a substituted phenyl group. R11-5 represents an unsubstituted phenyl group, and R11-6 represents a substituted tetrahydronaphthyl group.

R11-1

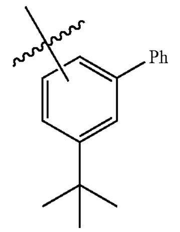

R11-2

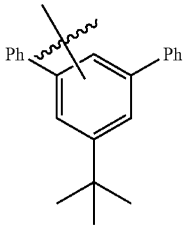

R11-3

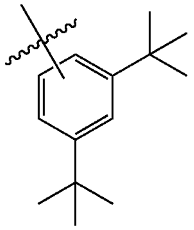

R11-4

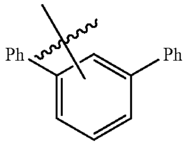

R11-5

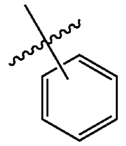

R11-6

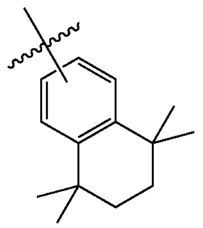

In R11-1, R11-2, and R11-4, Ph is a phenyl group. R11-1 represents a phenyl group substituted with one t-butyl group and one phenyl group. R11-2 represents a phenyl group substituted with two phenyl groups and one t-butyl group. R11-3 represents a phenyl group substituted with two t-butyl groups. R11-4 represents a phenyl group substituted with two phenyl groups. R11-6 represents a tetrahydronaphthyl group substituted with four methyl groups.

In an embodiment, the polycyclic compound represented by Formula 1 may be represented by any one of Formula 1-A to Formula 1-C. Formula 1-A represents a case where $R_{22}$ in Formula 1 is a group represented by Formula 2. Formula 1-B and Formula 1-C represent a case where $R_2$ in Formula 1 and $R_{22}$ in Formula 2 are each a group represented by Formula 2. Formula 1-B and Formula 1-C has a difference of the linking position of Formula 2 at $R_2$. Formula 1-B represents a case where a hexagonal ring at the end of Formula 2 is linked to Formula 1. Formula 1-C represents a case where a hexagonal ring between the two pentagonal rings in Formula 2 is linked to Formula 1.

[Formula 1-A]

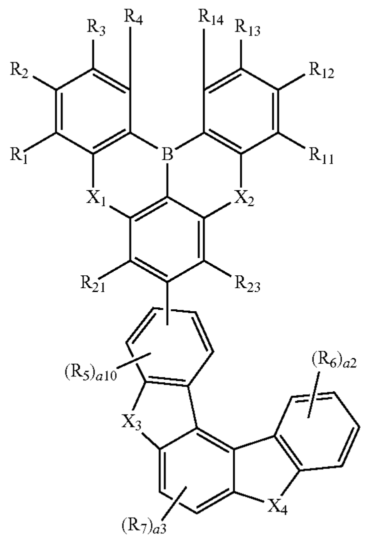

[Formula 1-B]

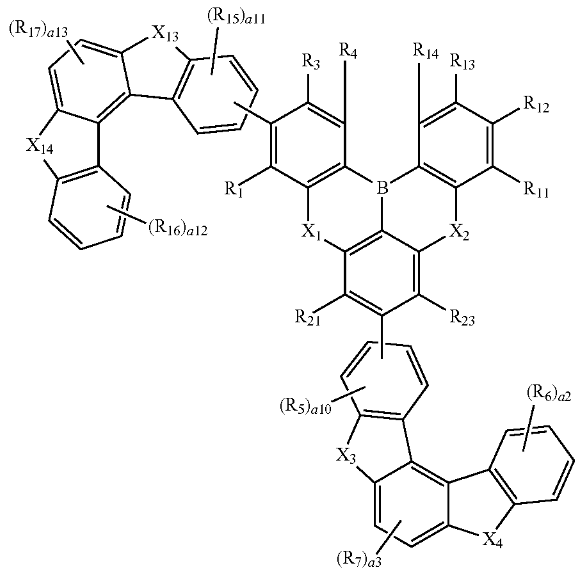

-continued

[Formula 1-C]

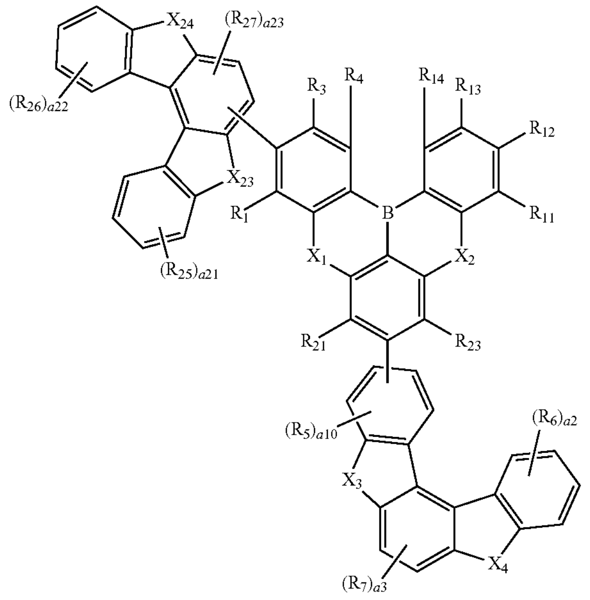

In Formula 1-A to Formula 1-C, $R_1$ to $R_7$, $R_{11}$ to $R_{14}$, and $R_{21}$, $R_{23}$, and $X_1$ to $X_4$ are each the same as defined in Formula 1. In Formula 1-A to Formula 1-C, a10 may be an integer from 0 to 3. When a10 is 2 or more, multiple $R_5$ groups may be the same as each other or at least one may be different from the others.

In Formula 1-B, $X_{13}$ and $X_{14}$ may each independently be $N(R_{18})$, O, or S. In Formula 1-B, a11 may be an integer from 0 to 3, a12 may be an integer from 0 to 4, and a13 may be an integer from 0 to 2. When a11 is 2 or more, multiple $R_{15}$ groups may be the same as each other or at least one may be different from the others. When a12 is 2 or more, multiple Rib groups may be the same as each other or at least one may be different from the others. When a13 is 2, the two $R_{17}$ groups may be the same as or different from each other.

In Formula 1-B, $R_{15}$ to $R_{18}$ may each independently be a hydrogen atom, a deuterium atom, a halogen atom, a substituted or unsubstituted silyl group, a substituted or unsubstituted alkyl group having 1 to 20 carbon atoms, or a substituted or unsubstituted aryl group having 6 to 60 ring-forming carbon atoms. For example, $R_{17}$ may be a phenyl group substituted with a deuterium atom.

In Formula 1-C, $X_{23}$ and $X_{24}$ may each independently be $N(R_{28})$, O, or S. For example, $X_{23}$ and $X_{24}$ may be O.

In Formula 1-C, a21 and a22 may each independently be an integer from 0 to 4, and a23 may be 0 or 1. When a21 is 2 or more, multiple $R_{25}$ groups may be the same as each other or at least one may be different from the others. When a22 is 2 or more, multiple $R_{26}$ groups may be the same as each other or at least one may be different from the others.

In Formula 1-C, $R_{25}$ to $R_{28}$ may each independently be a hydrogen atom, a deuterium atom, a halogen atom, a substituted or unsubstituted silyl group, a substituted or unsubstituted alkyl group having 1 to 20 carbon atoms, or a substituted or unsubstituted aryl group having 6 to 60 ring-forming carbon atoms.

In an embodiment, the polycyclic compound represented by Formula 1-A may be represented by any one of Formula 1-A1 to Formula 1-A3. Formula 1-A1 to Formula 1-A3 each represent a case where the linking position of the hexagonal ring containing $R_5$ in Formula 1-A is different.

[Formula 1-A1]

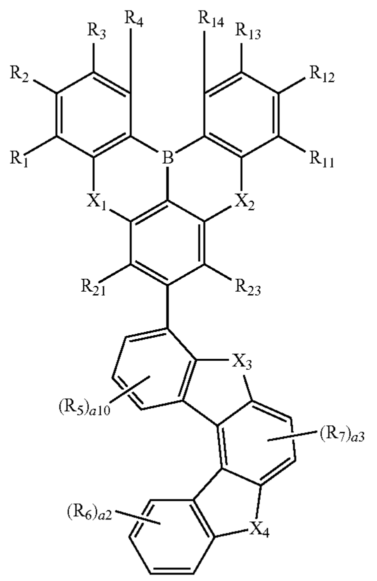

[Formula 1-A2]

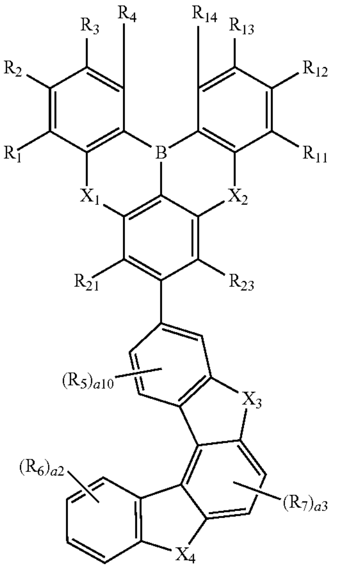

-continued

[Formula 1-A3]

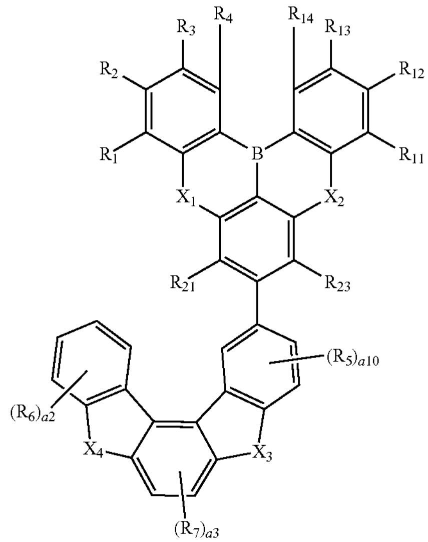

Formula 1-A1 may represent a case where $R_{21}$ in Formula 1 is a group represented by Formula 2-1. Formula 1-A2 may represent a case where $R_{21}$ in Formula 1 is a group represented by Formula 2-2. Formula 1-A3 may represent a case where $R_{21}$ in Formula 1 is a group represented by Formula 2-3. In Formula 1-A1 to Formula 1-A3, $R_1$ to $R_7$, $R_{11}$ to $R_{14}$, $R_{21}$, $R_{23}$, and $X_1$ to $X_4$ are each the same as defined in Formula 1-A.

In an embodiment, the polycyclic compound represented by Formula 1-B may be represented by any one of Formula 1-B1 to Formula 1-B3. Formula 1-B1 to Formula 1-B3 each represent a case where the linking position of the hexagonal ring containing $R_{15}$ in Formula 1-B is different.

[Formula 1-B1]

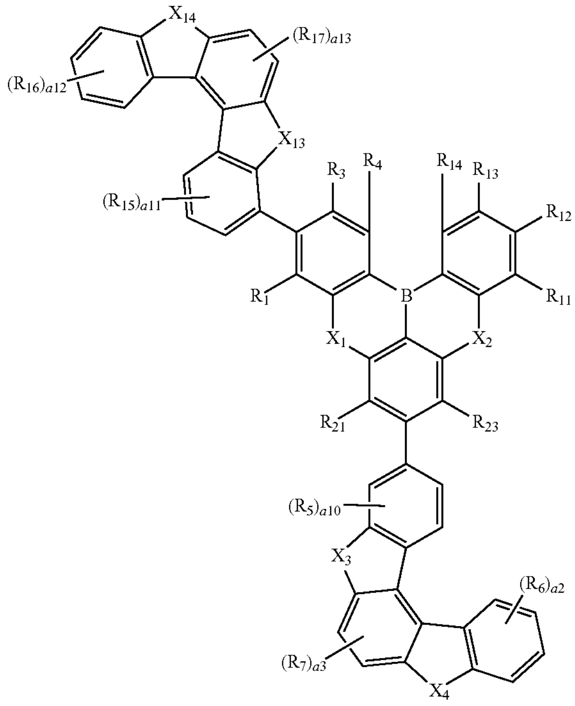

-continued

[Formula 1-B2]

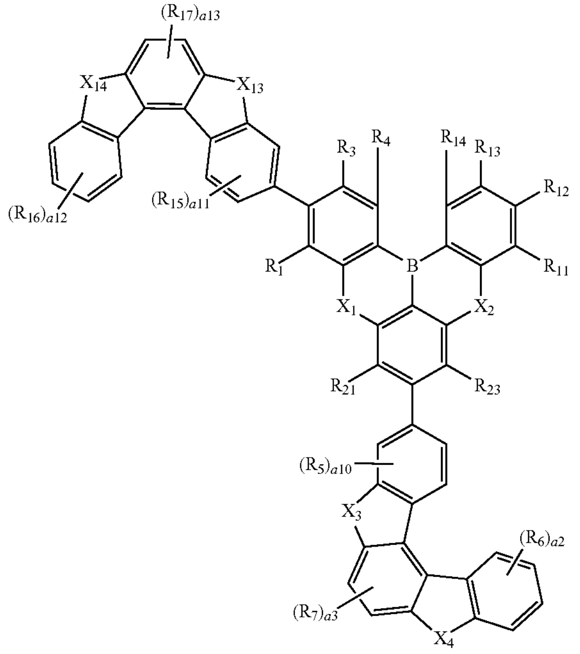

[Formula 1-B3]

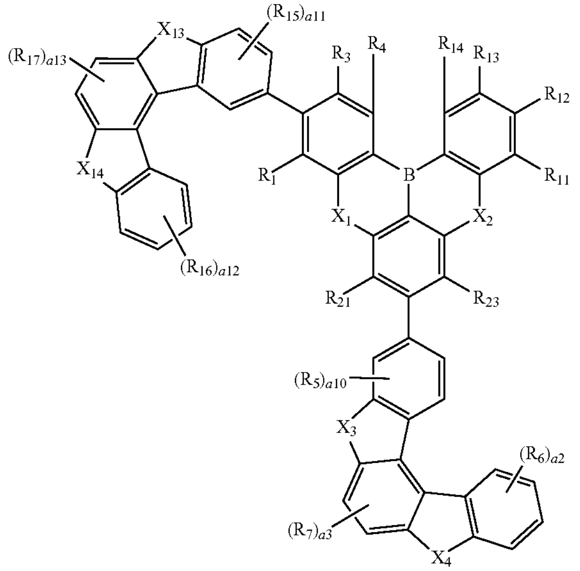

Formula 1-B1 may represent a case where $R_{22}$ in Formula 1 is a group represented by Formula 2-2 and $R_2$ in Formula 1 a group is represented by Formula 2-1. Formula 1-B2 may represent a case where $R_2$ and $R_{22}$ in Formula 1 are each independently a group represented by Formula 2-2. Formula 1-B3 may represent a case where $R_{22}$ in Formula 1 is a group represented by Formula 2-2 and $R_2$ in Formula 1 is a group represented by Formula 2-3. In Formula 1-B1 to Formula 1-B3, a2, a3, a10 to a13, $R_1$, $R_3$ to $R_7$, $R_{11}$ to $R_{14}$, $R_{21}$, $R_{23}$, $X_1$ to $X_4$, $X_{13}$, and $X_{14}$ are each the same as defined in Formula 1-B.

In an embodiment, in Formula 1, the remainder of $R_1$ to $R_4$, $R_{11}$ to $R_{14}$, and $R_{21}$ to $R_{23}$ which are not a group represented by Formula 2 may each independently be a group represented by any one of R1-1 to R1-3. R1-1 represents a substituted or unsubstituted carbazole group, and R1-2 represents a substituted or unsubstituted diphenyl amine group. R1-3 represents 9H-pyrido[3,4-b]indole.

R1-1

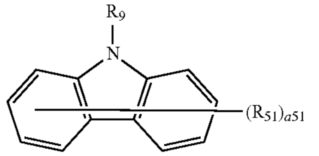

R1-2

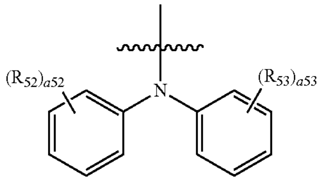

R1-3

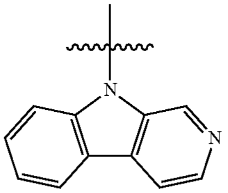

In R1-1, a51 may be an integer from 0 to 8. When a51 is 2 or more, multiple $R_{51}$ groups may be the same as each other or at least one may be different from the others. In R1-1, $R_{51}$ may be a hydrogen atom, a deuterium atom, a cyano group, or a substituted or unsubstituted alkyl group having 1 to 10 carbon atoms.

In R1-2, a52 and a53 may each independently be an integer from 0 to 5. When a52 is 2 or more, multiple $R_{52}$ groups may be the same as each other or at least one may be different from the others. When a53 is 2 or more, multiple $R_{53}$ groups may be the same as each other or at least one may be different from the others. In R1-2, $R_{52}$ and $R_{53}$ may each independently be a hydrogen atom, a deuterium atom, a cyano group, or a substituted or unsubstituted alkyl group having 1 to 10 carbon atoms.

In an embodiment, the group represented by R1-1 may be represented by any one of R1-1a to R1-1e. R1-1a represents an unsubstituted carbazole group, and R1-1b represents a carbazole group substituted with deuterium atoms and a cyano group. R1-1c represents a carbazole group substituted with t-butyl groups, and R1-1d represents a carbazole group substituted with deuterium atoms. R1-1e represents a carbazole group substituted with cyano groups. In R1-1b and R1-1d, D is a deuterium atom.

R1-1a

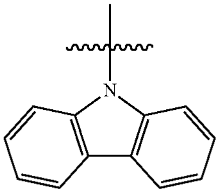

-continued

R1-1b

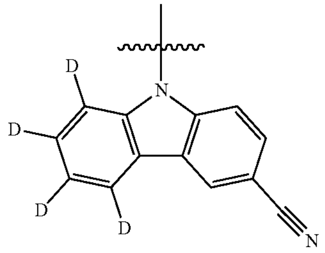

R1-1c

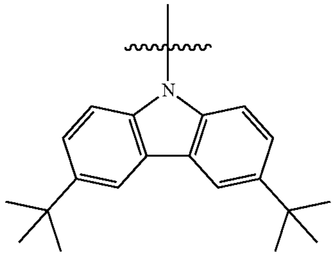

R1-1d

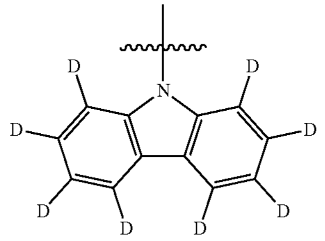

R1-1e

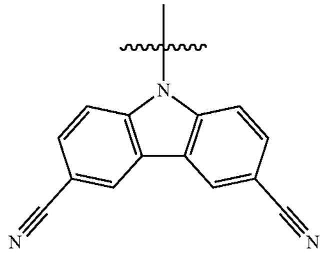

In an embodiment, the group represented by R1-2 may be represented by any one of R1-1a to R1-2d. R1-2a represents an unsubstituted diphenyl amine group, and R1-2b represents a diphenyl amine group substituted with a cyano group. R1-2c represents a diphenyl amine group substituted with t-butyl groups, and R1-2d represents a diphenyl amine group substituted with deuterium atoms. In R1-2d, D is a deuterium atom.

R1-2a

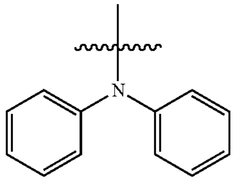

-continued
R1-2b
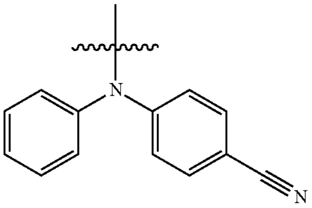
R1-2c
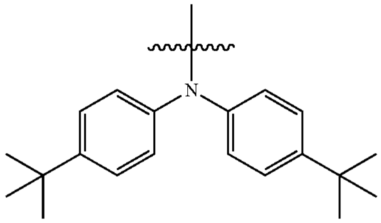
R1-2d
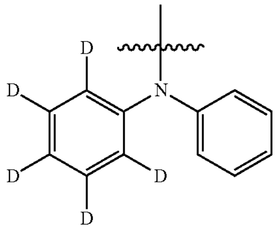
In an embodiment, the polycyclic compound may be any one selected from Compound Group 1. The light emitting element ED of an embodiment may include any one selected from Compound Group 1:
[Compound Group 1]
1
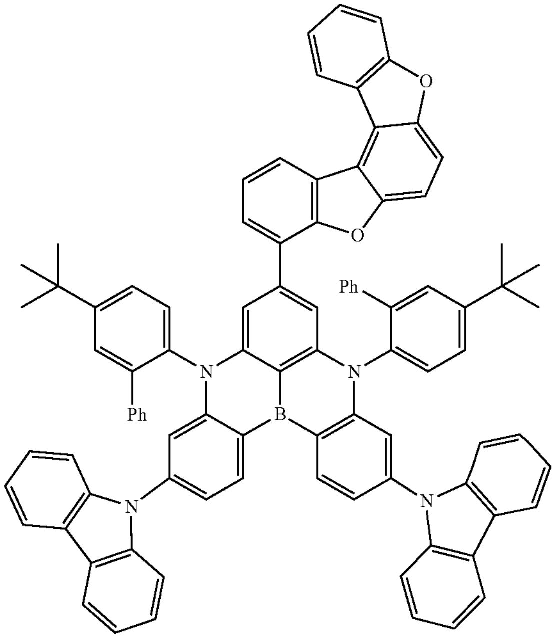
-continued
2
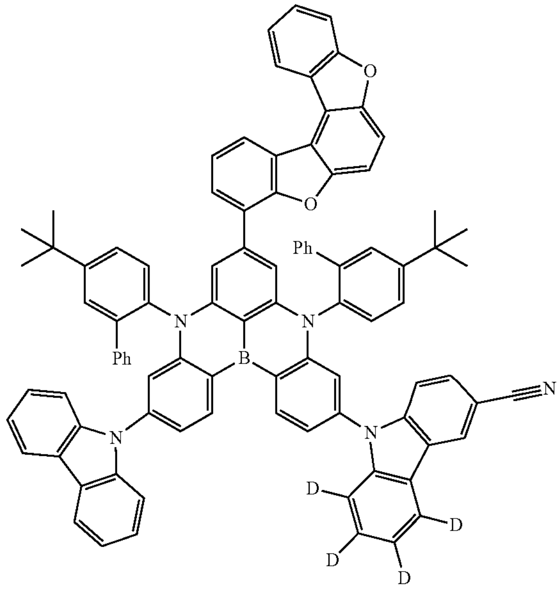
3
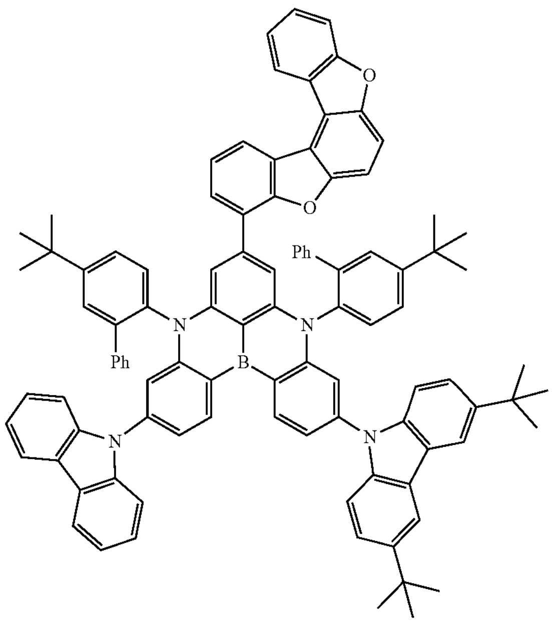

4
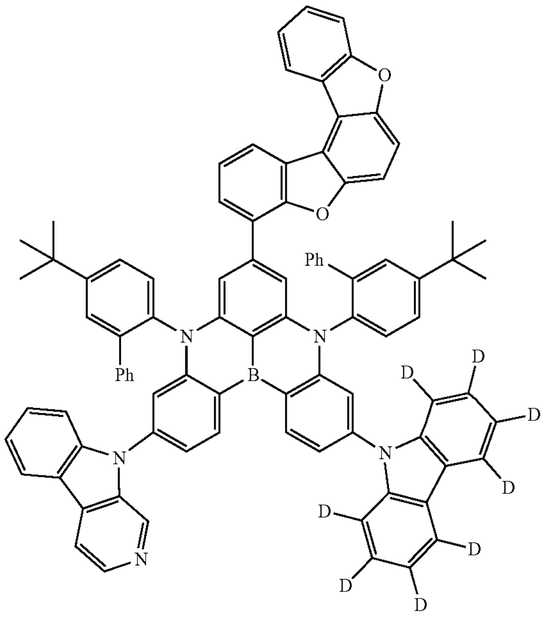
5
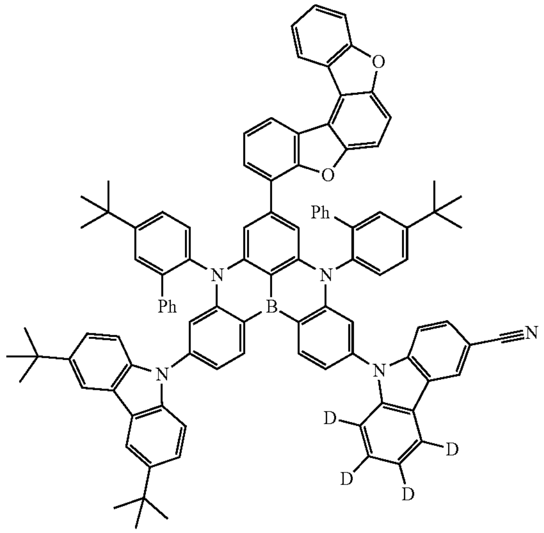
6
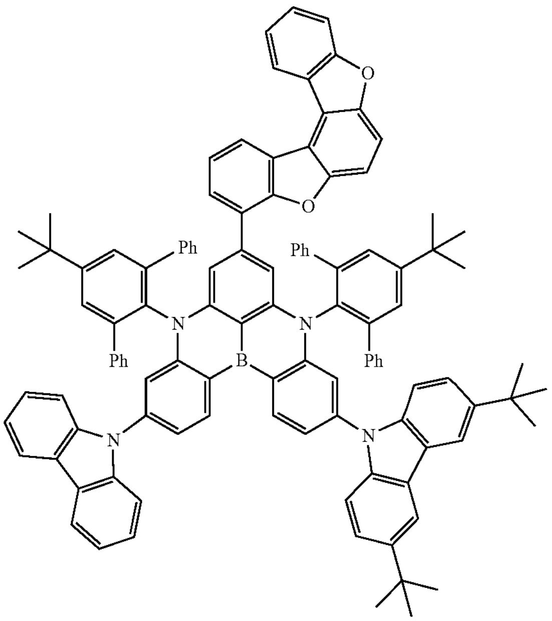
7
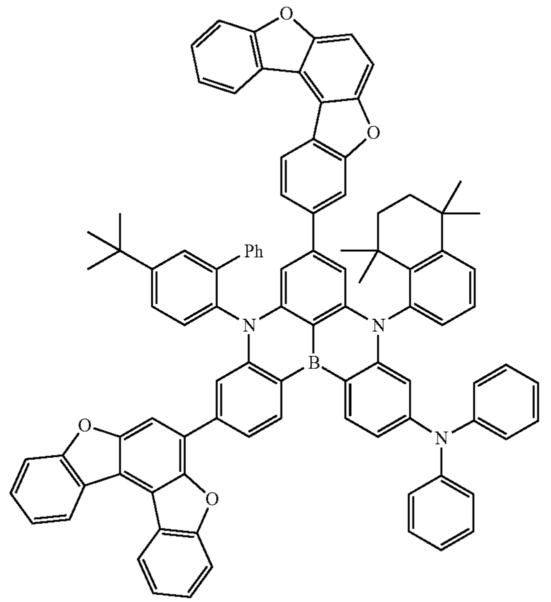

-continued
8
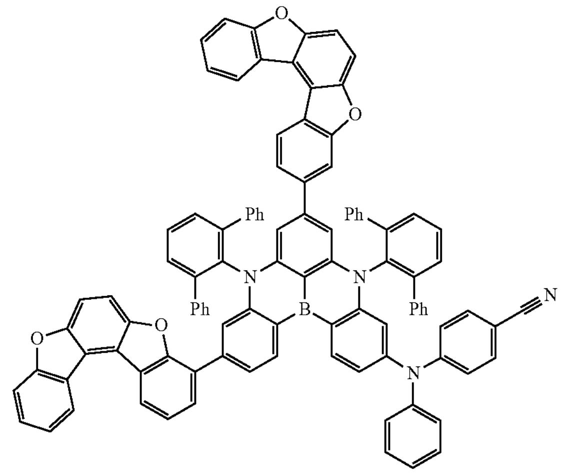
9
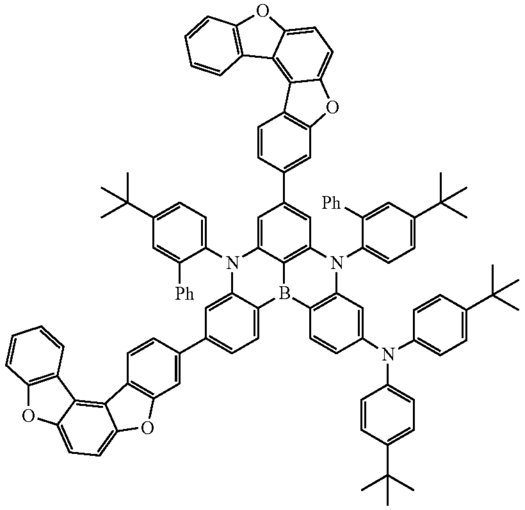
10
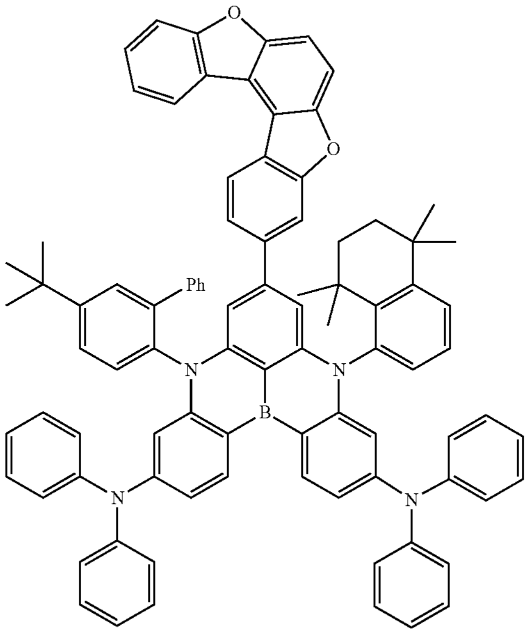
-continued
11
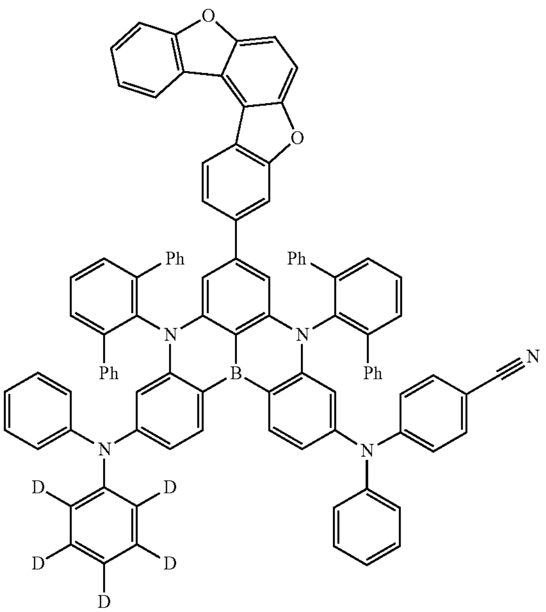
12
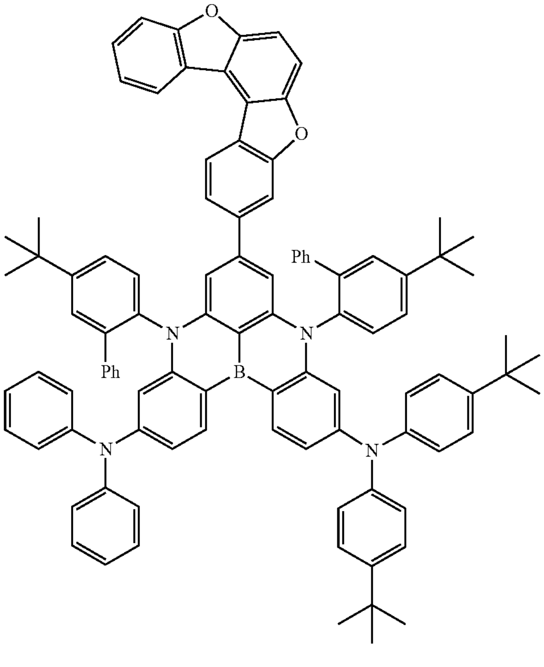

-continued
13
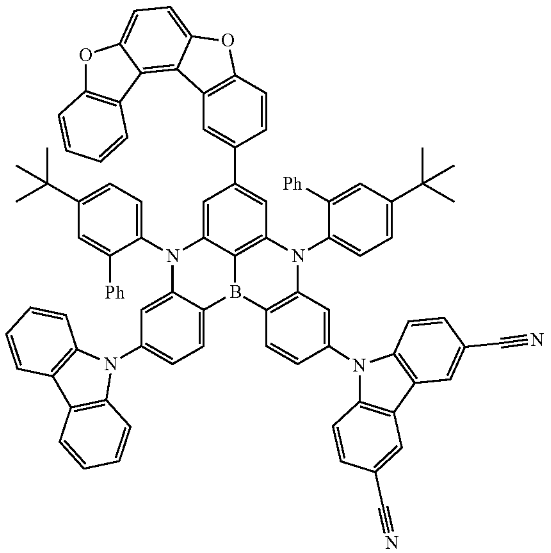
14
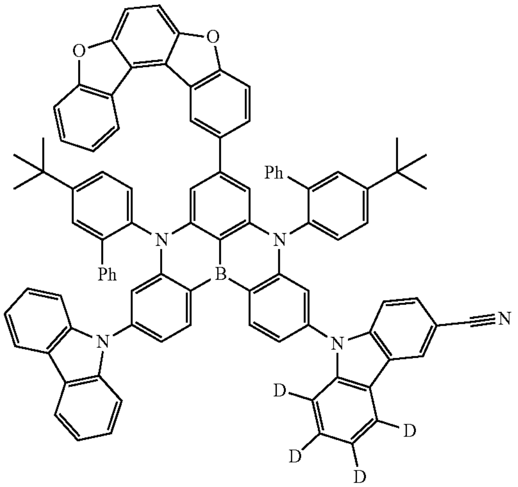
15
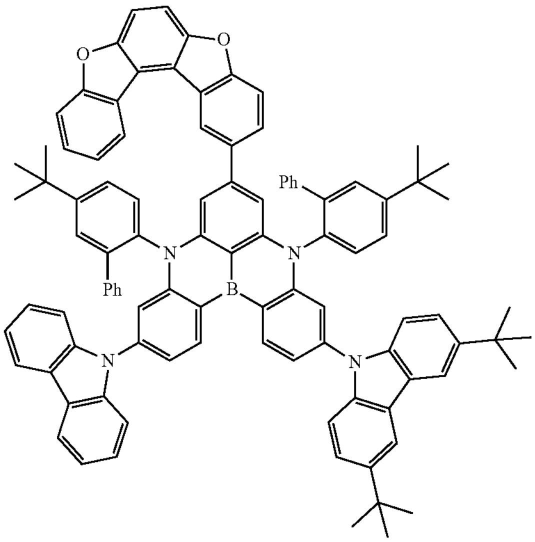
-continued
16
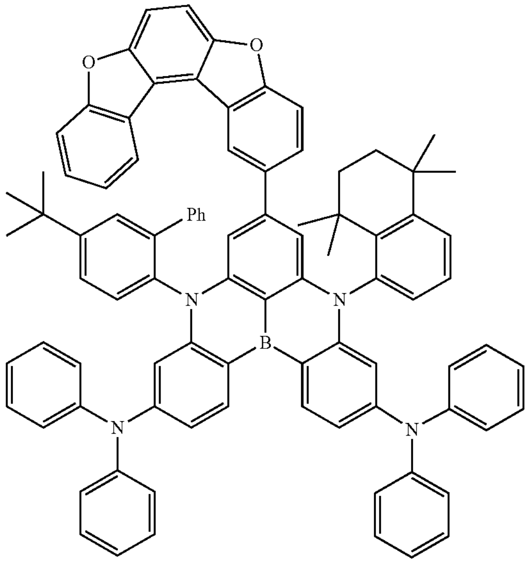
17
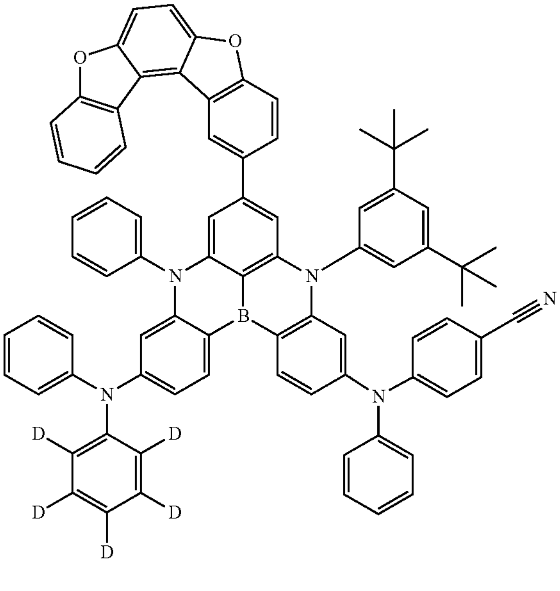

-continued
18
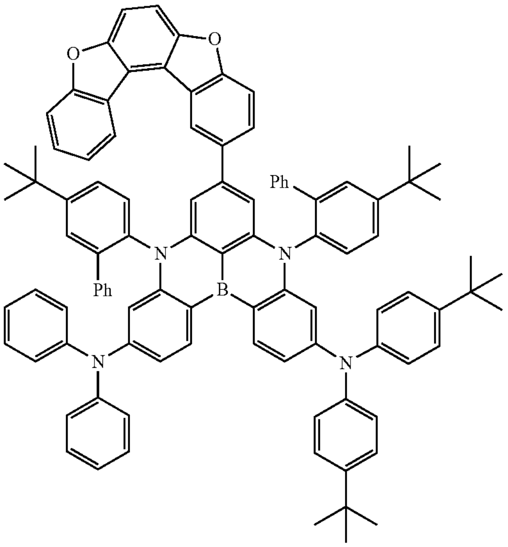
19
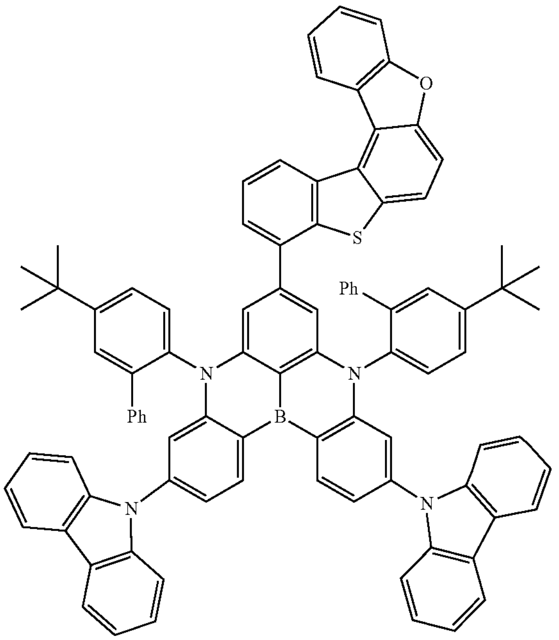
-continued
20
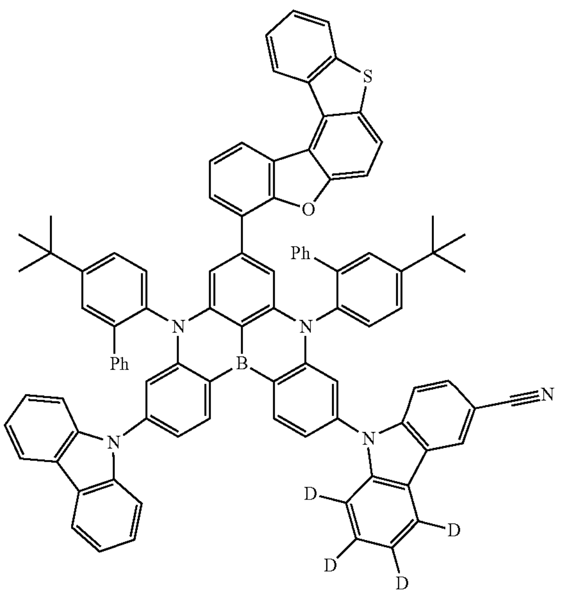
21
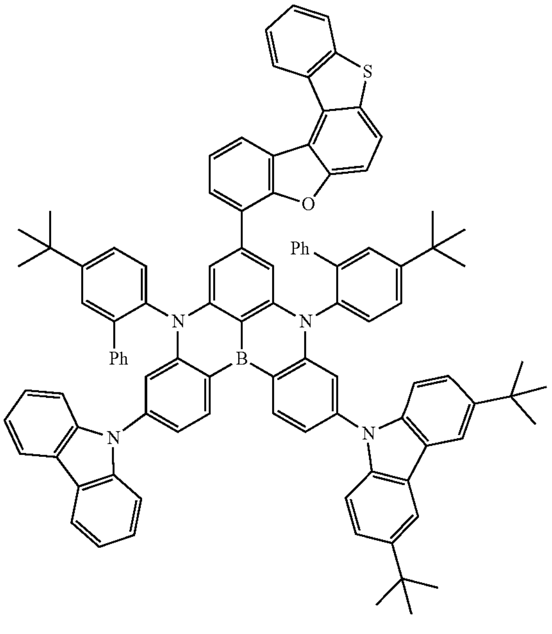

22
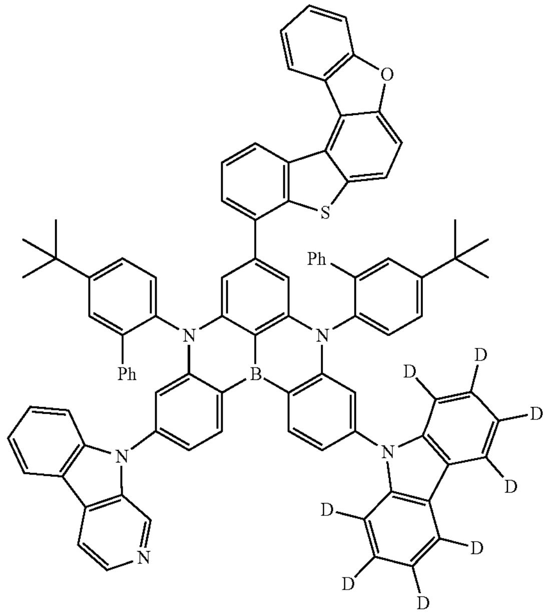
23
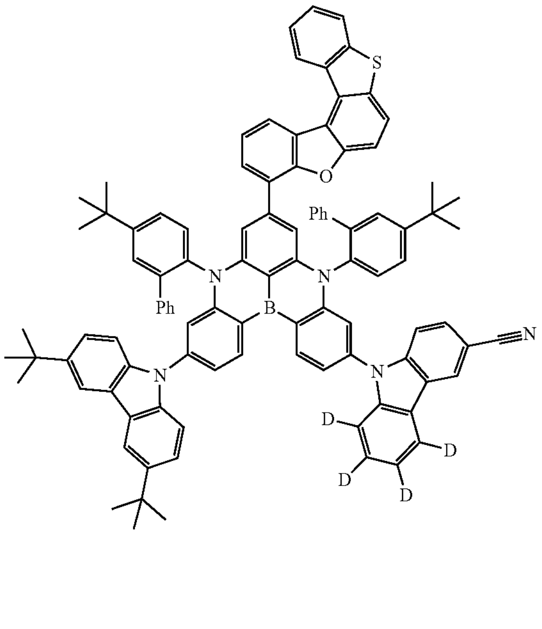
24
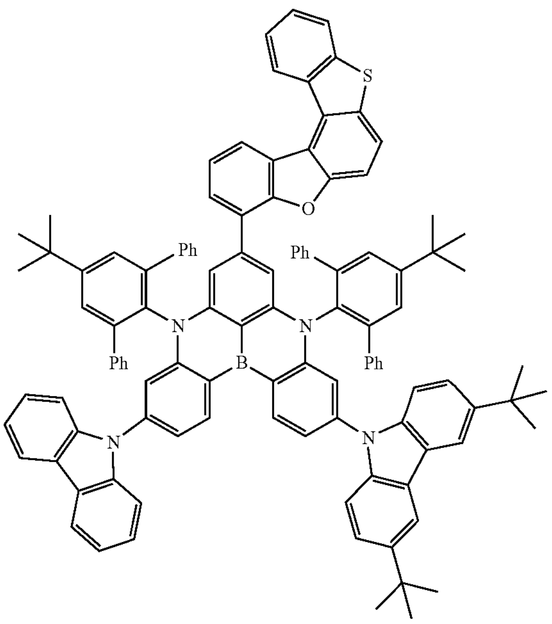
25
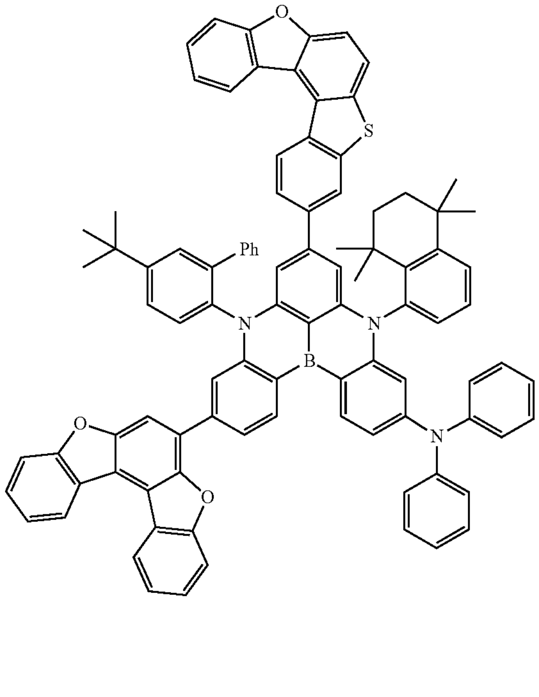

-continued
26
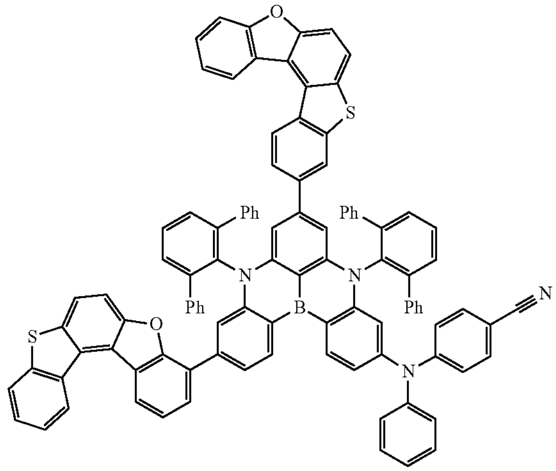
27
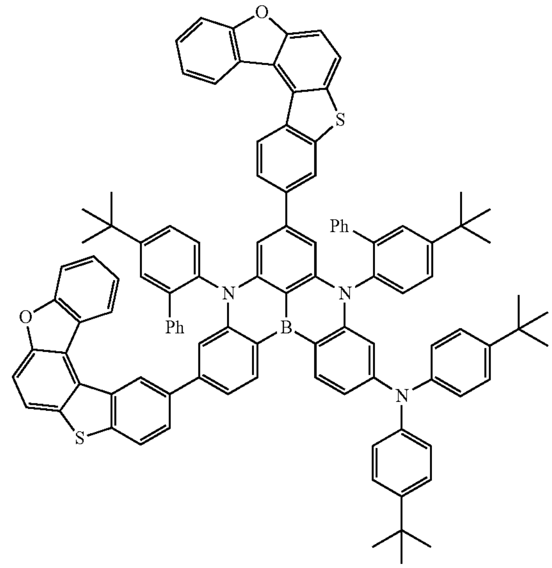
-continued
28
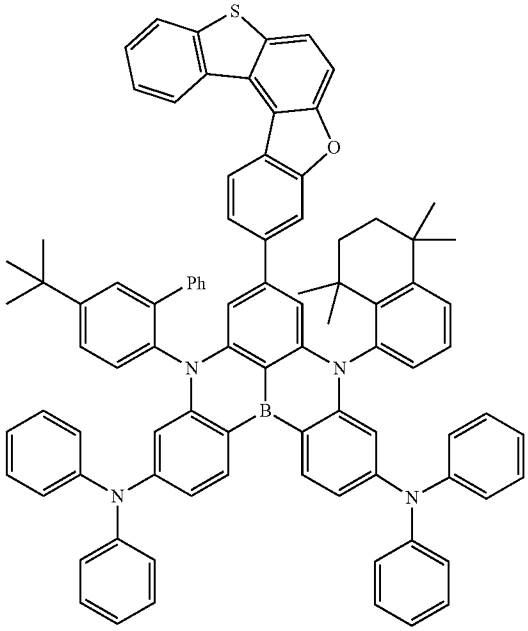
29
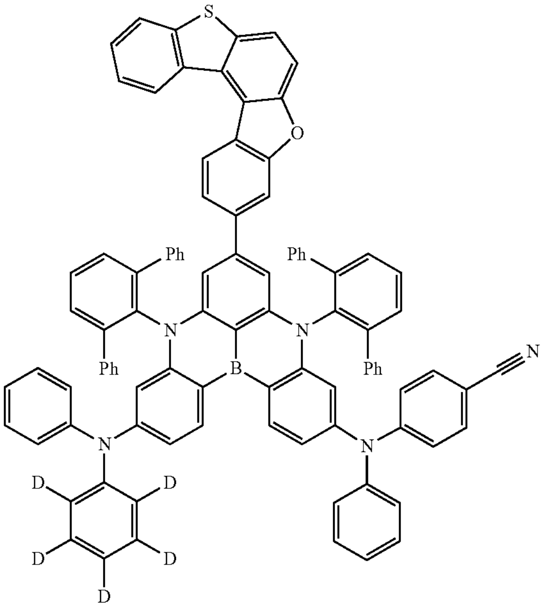

-continued
30
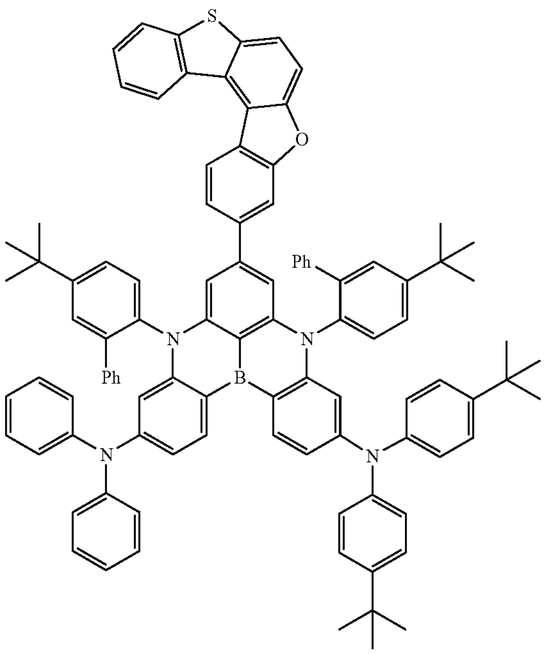
31
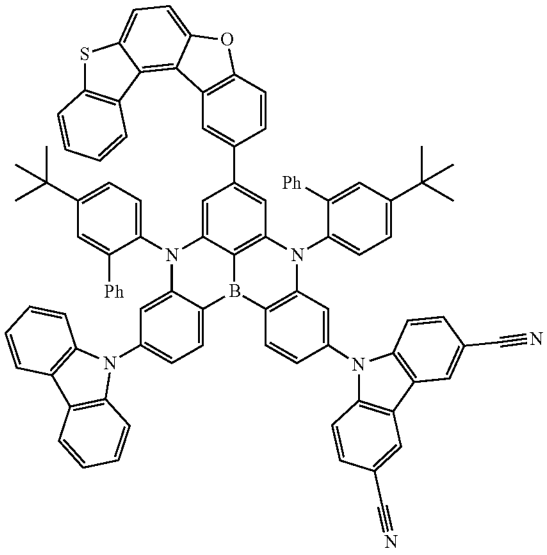
-continued
32
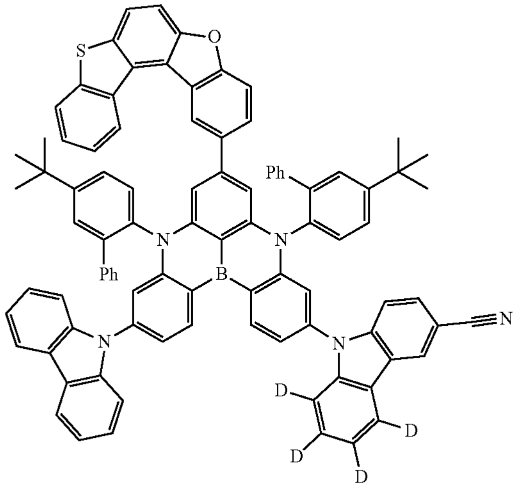
33
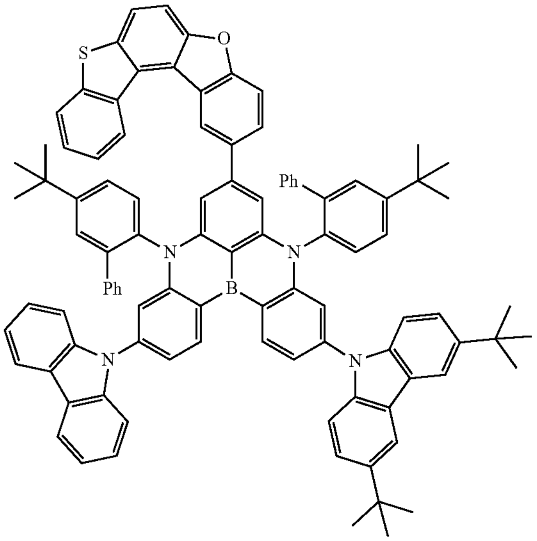
34
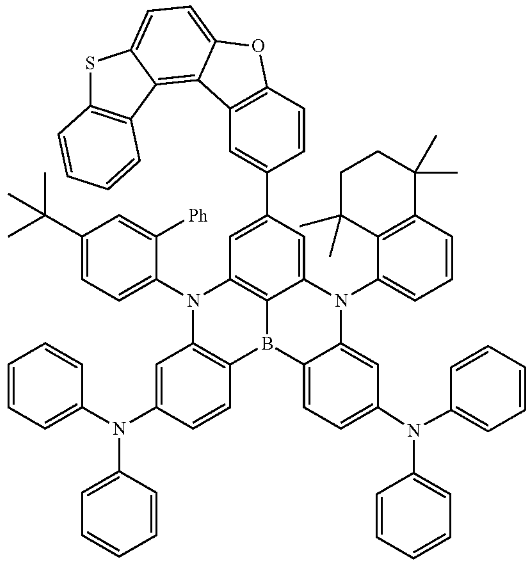

-continued
35
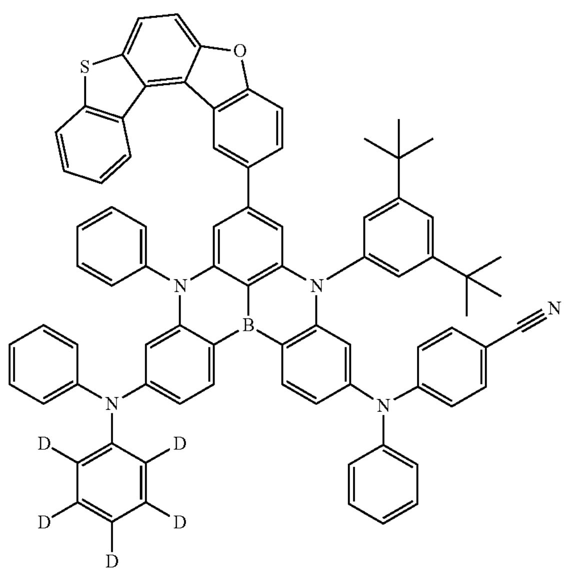
36
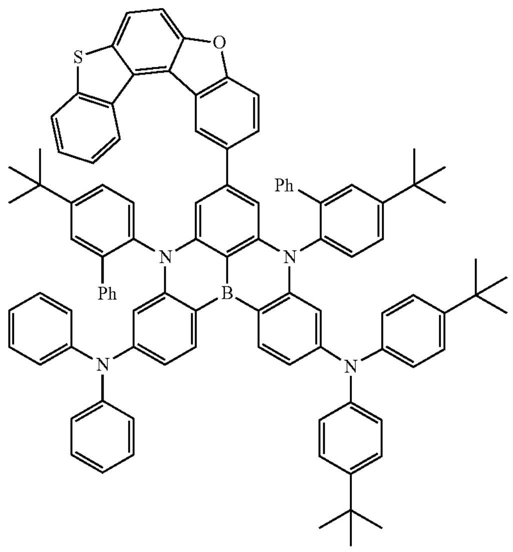
-continued
37
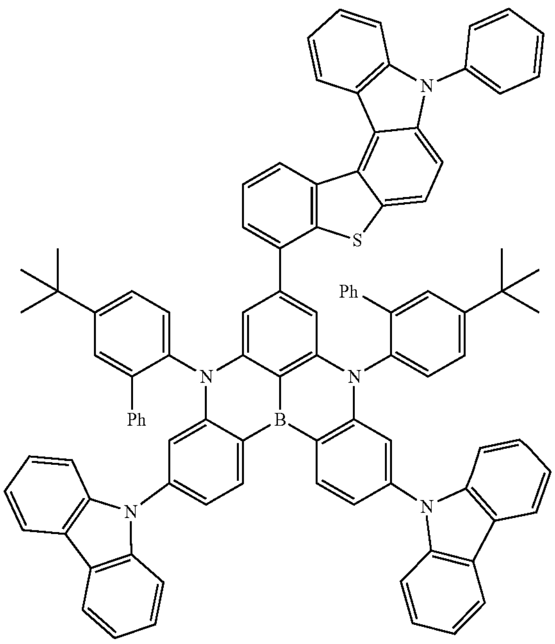
38
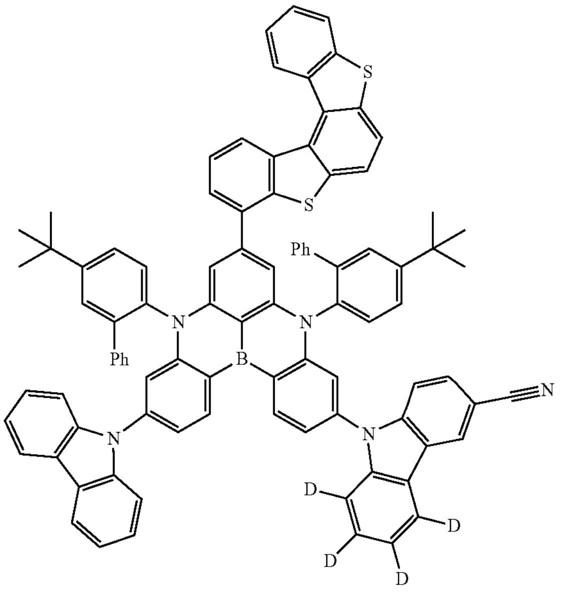

-continued
39
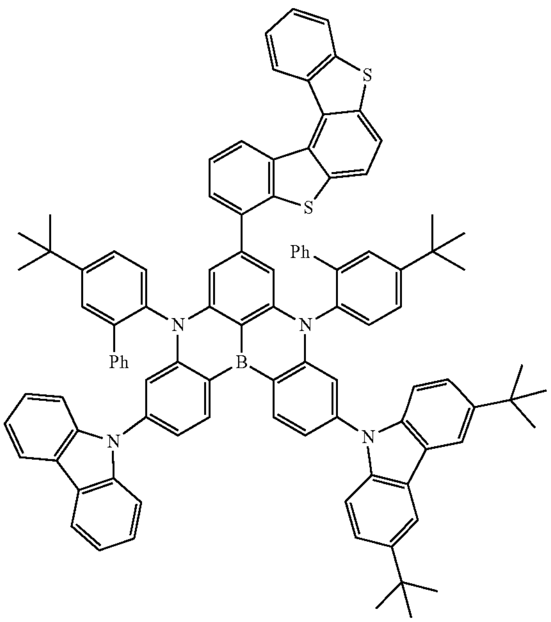
40
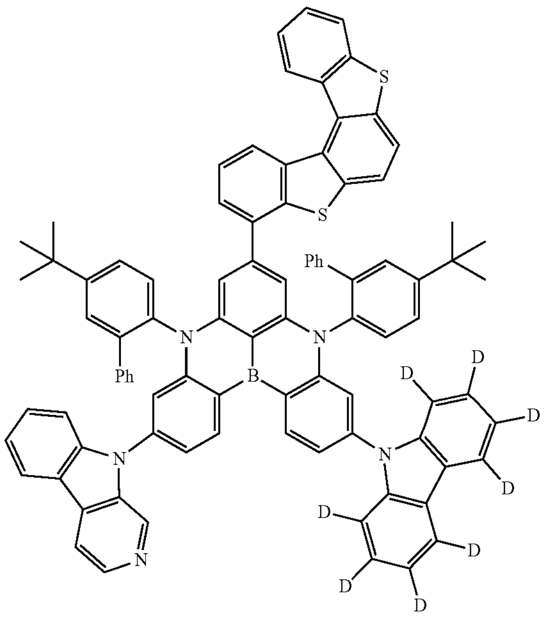
-continued
41
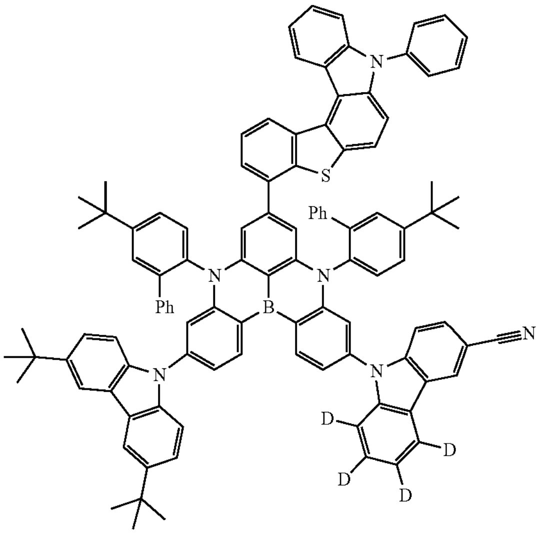
42
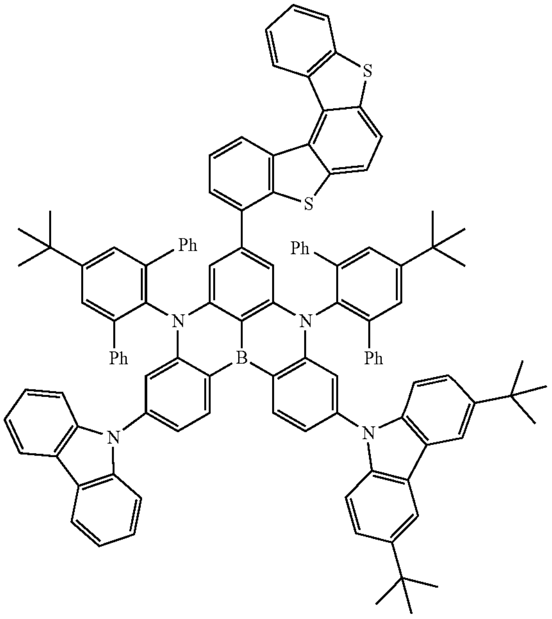

-continued
43
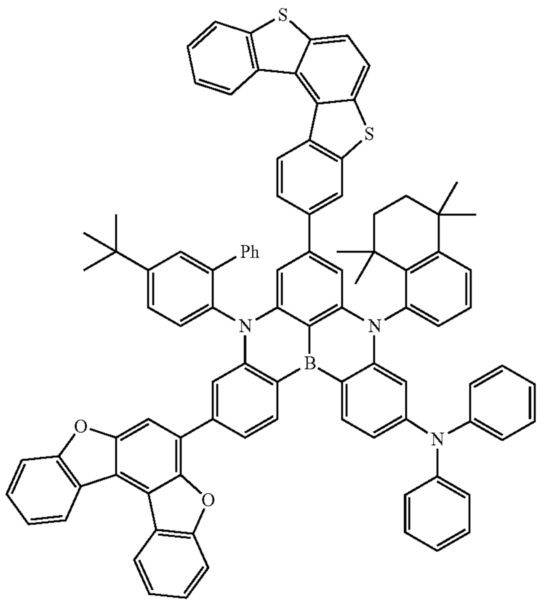
44
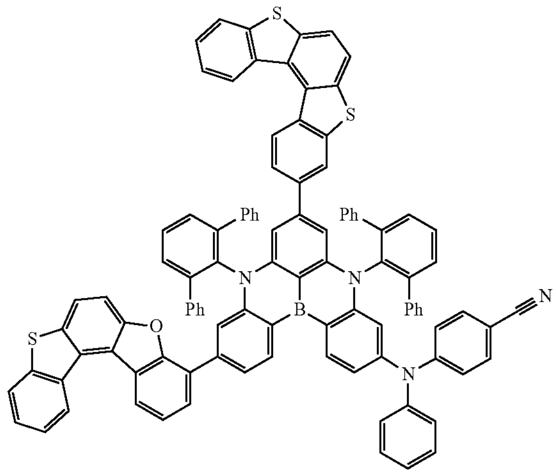
45
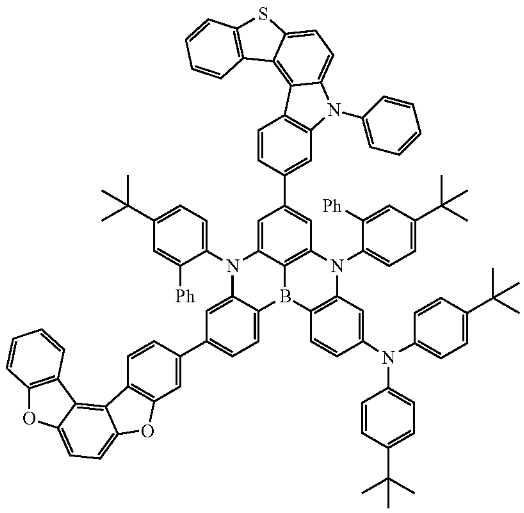
-continued
46
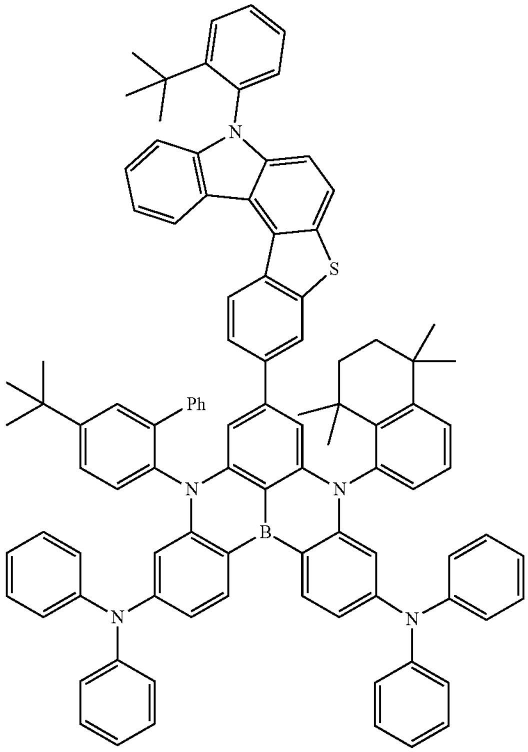
47
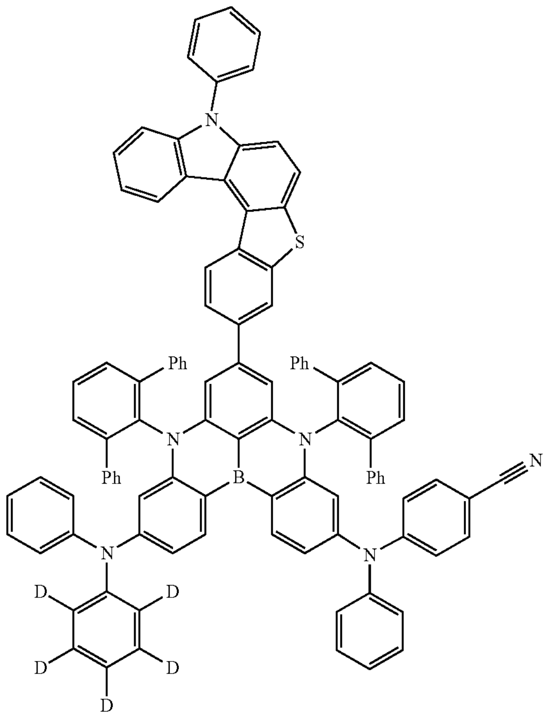

-continued
48
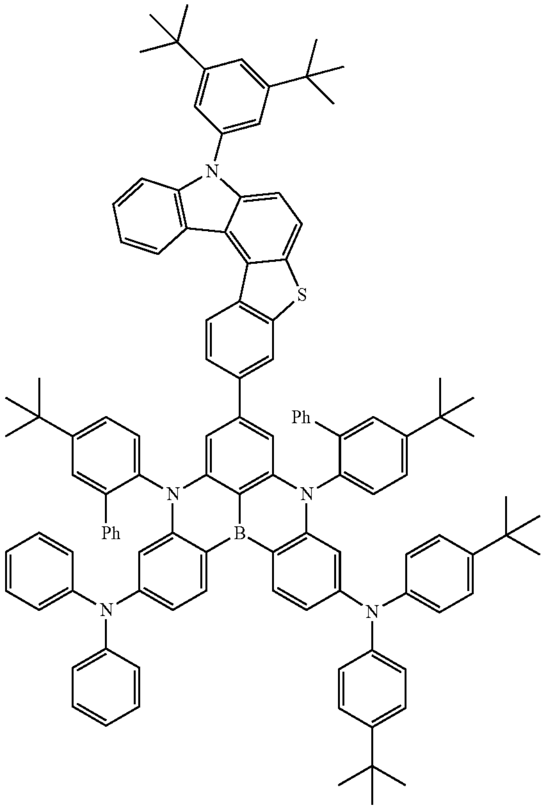
49
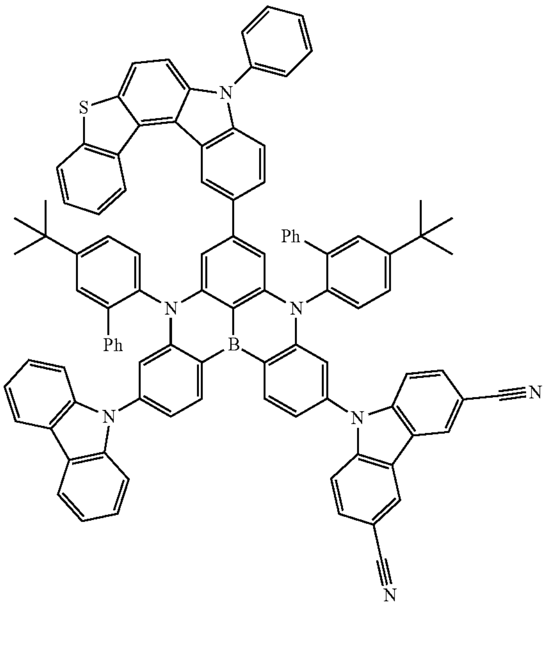
-continued
50
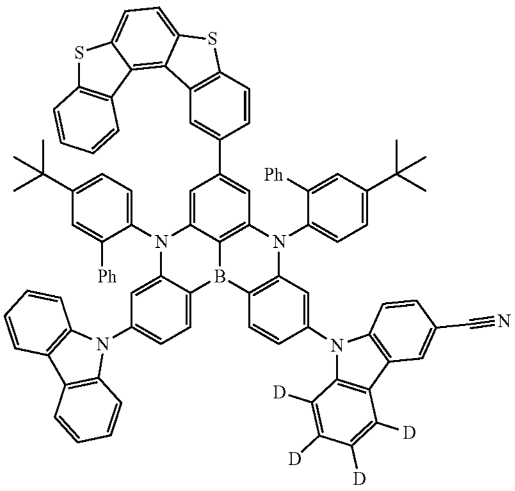
51
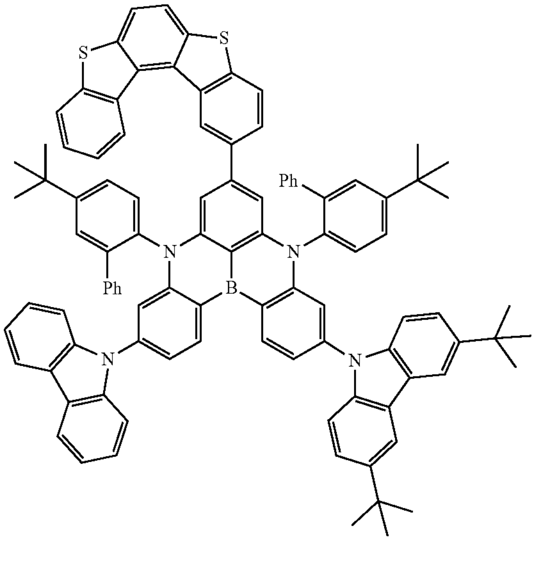

-continued
52
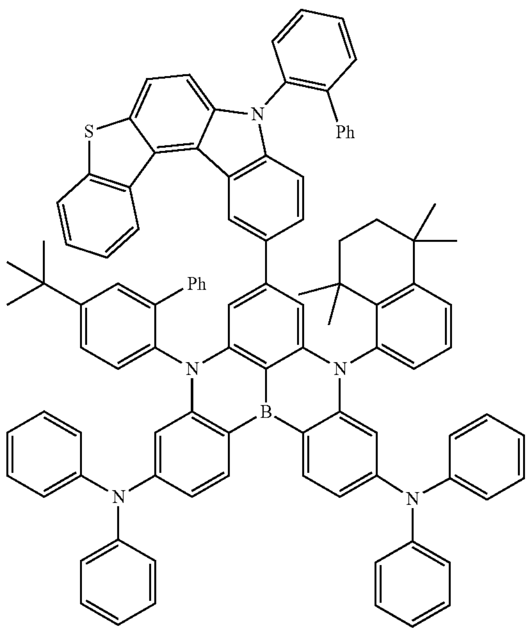
-continued
54
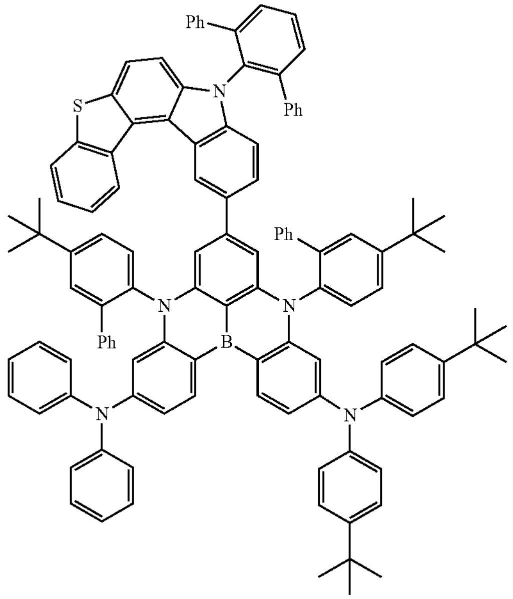
53
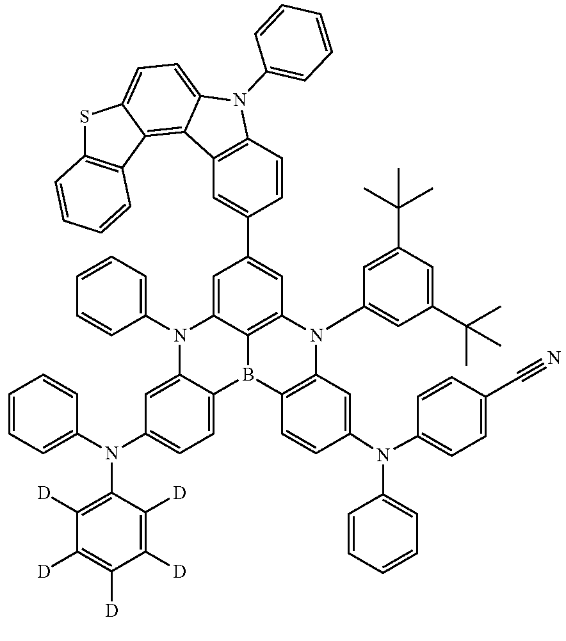
55
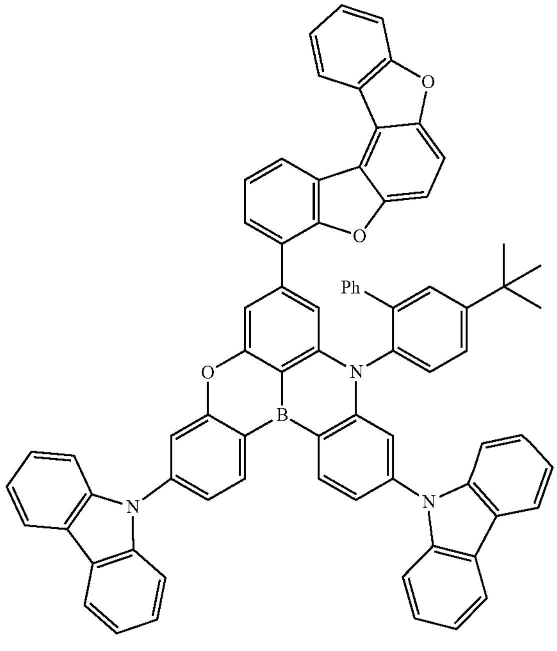

-continued
56
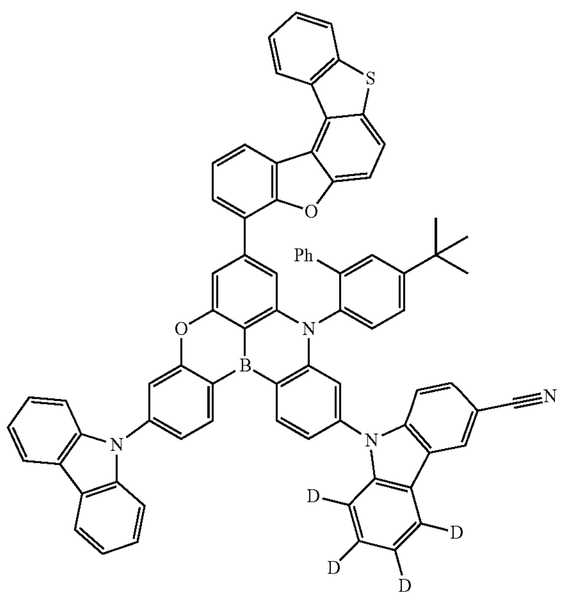
57
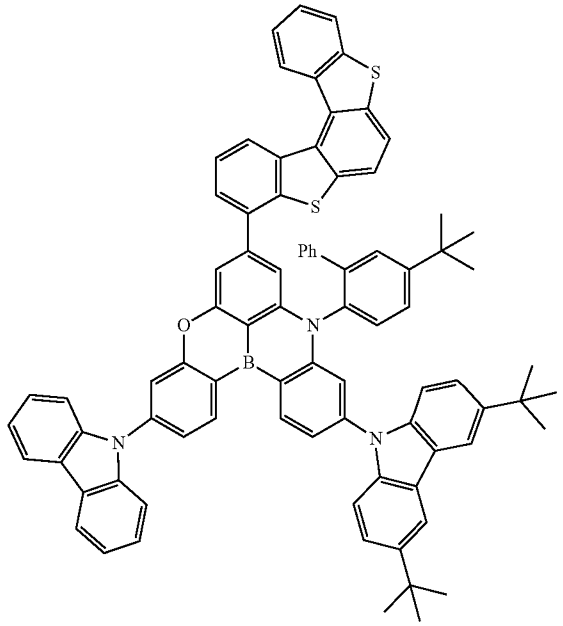
-continued
58
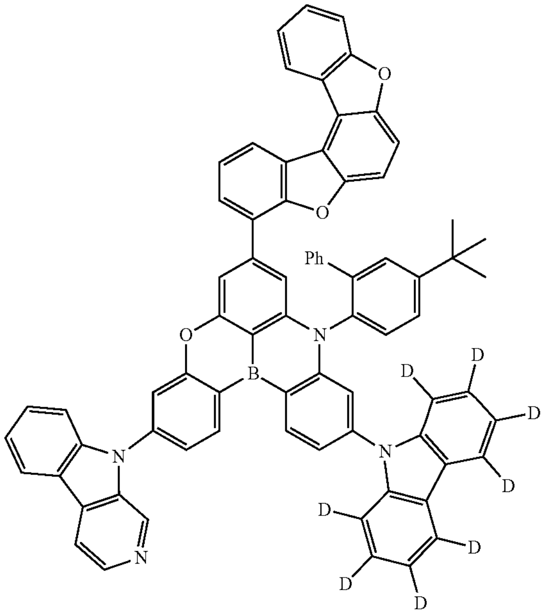
59
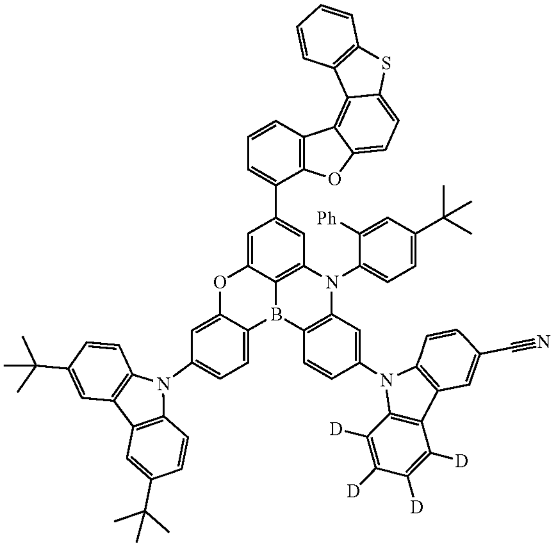

60
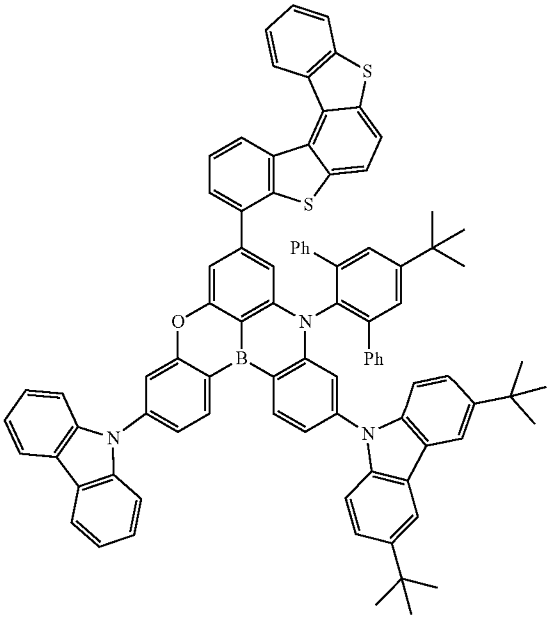
61
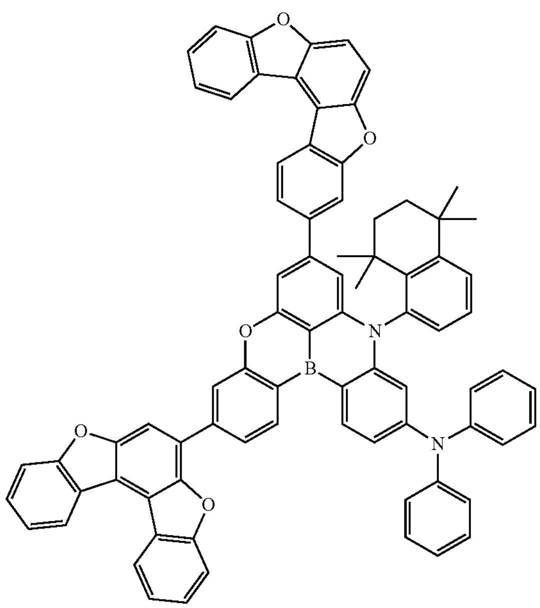
62
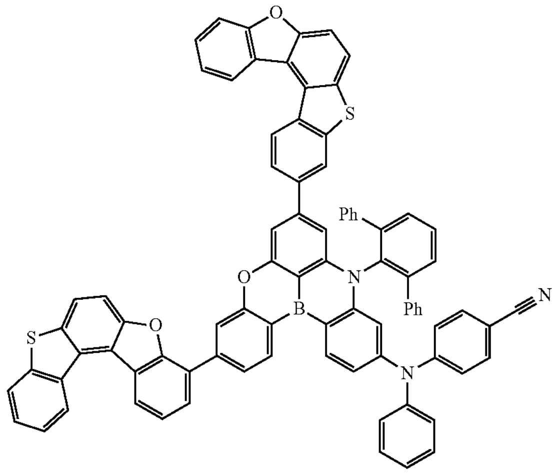
63
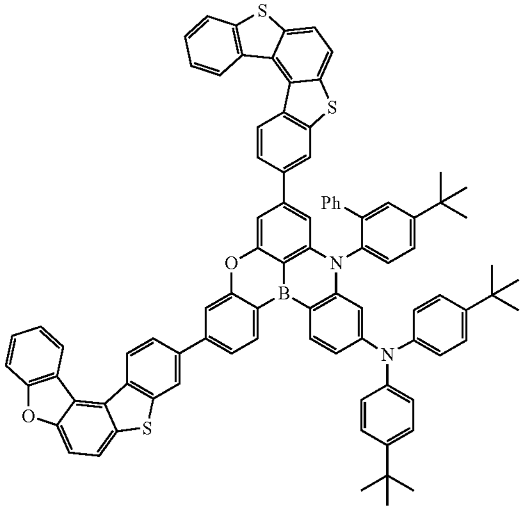
64
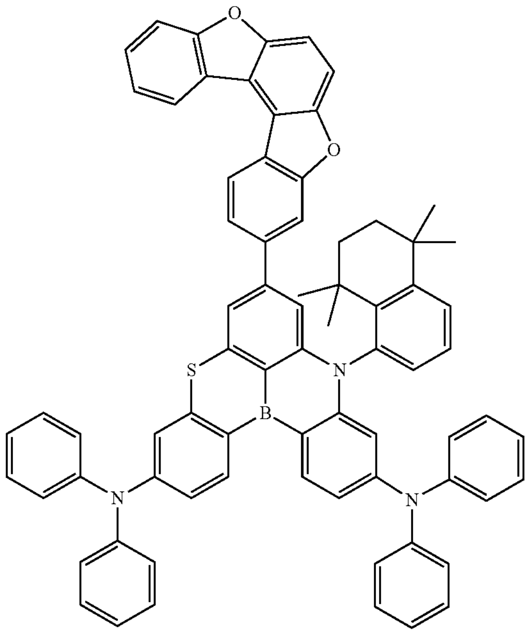

-continued
65
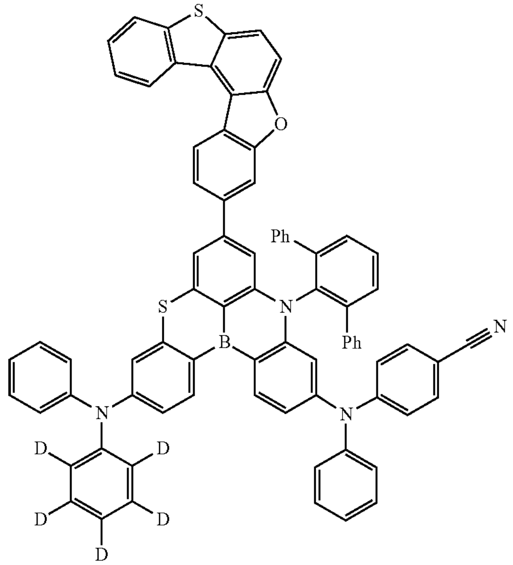
66
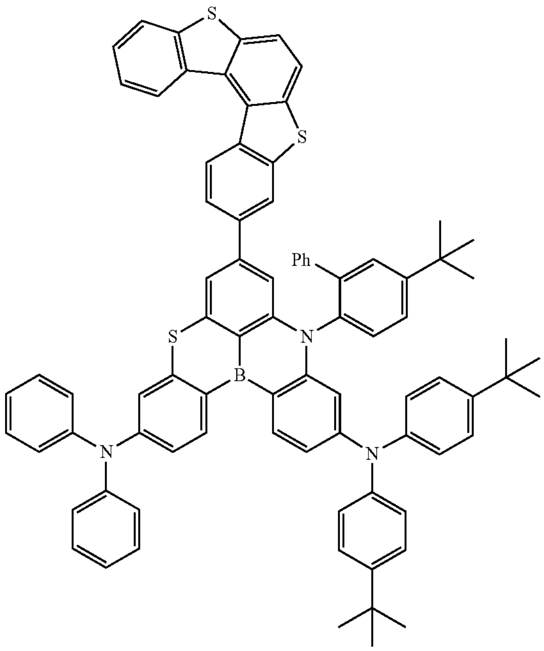
-continued
67
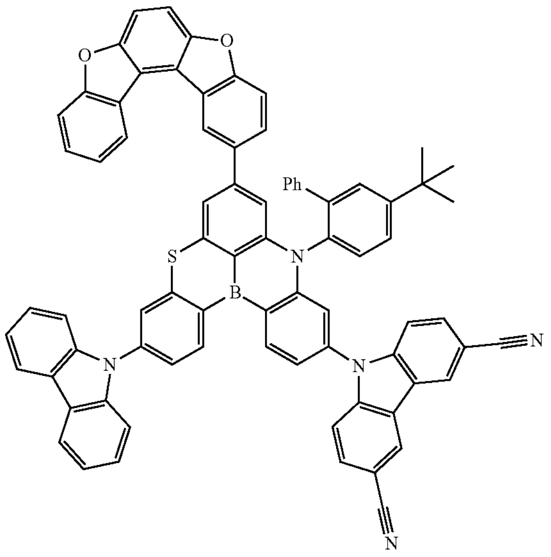
68
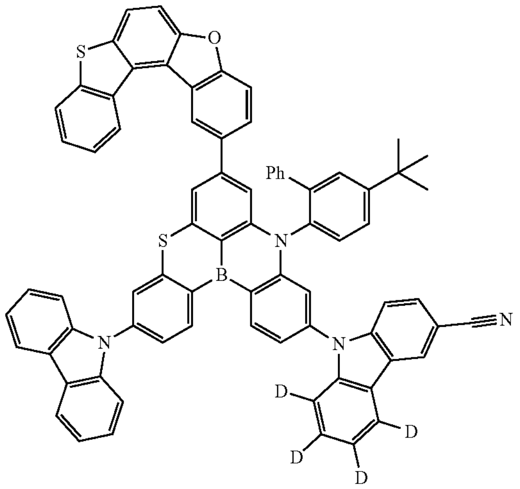
69
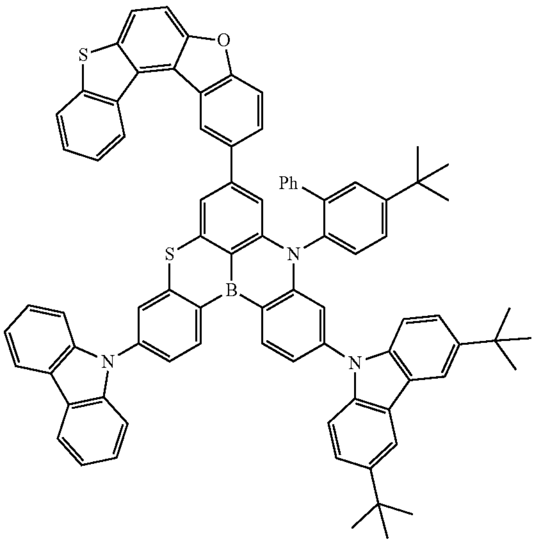

-continued
70
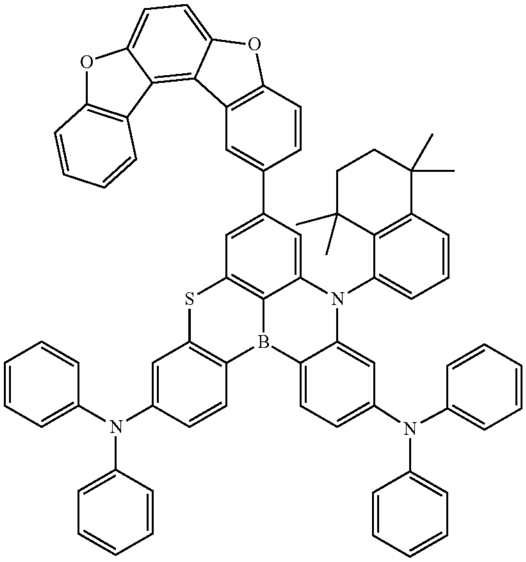
71
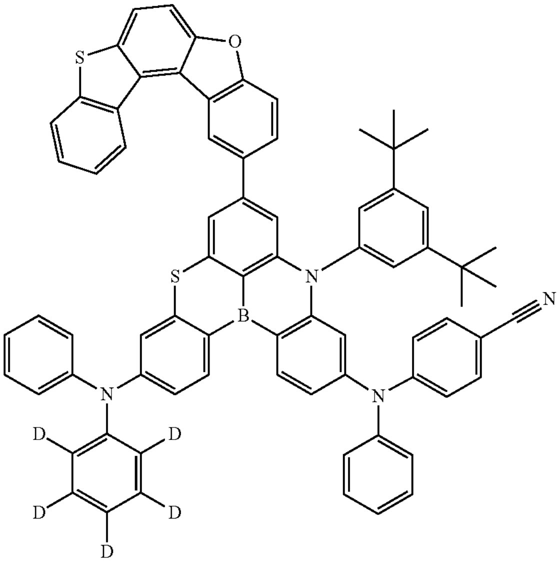
-continued
72
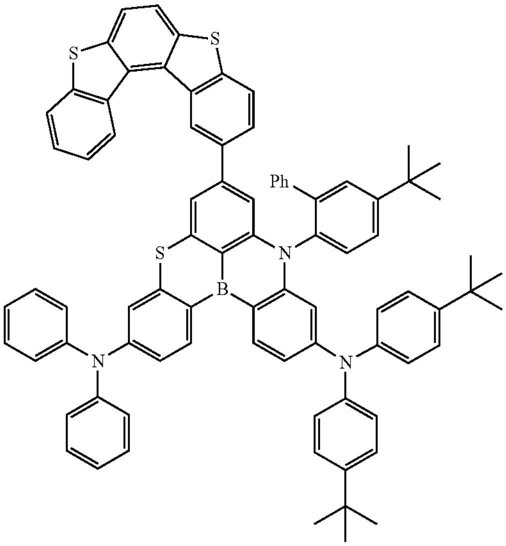
73
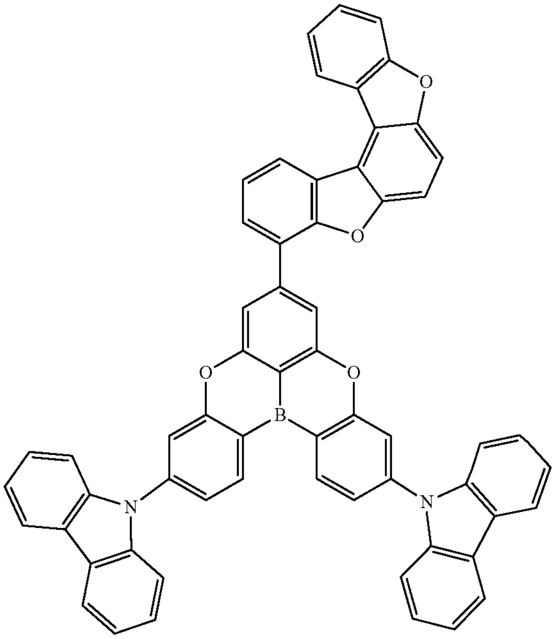

-continued
74
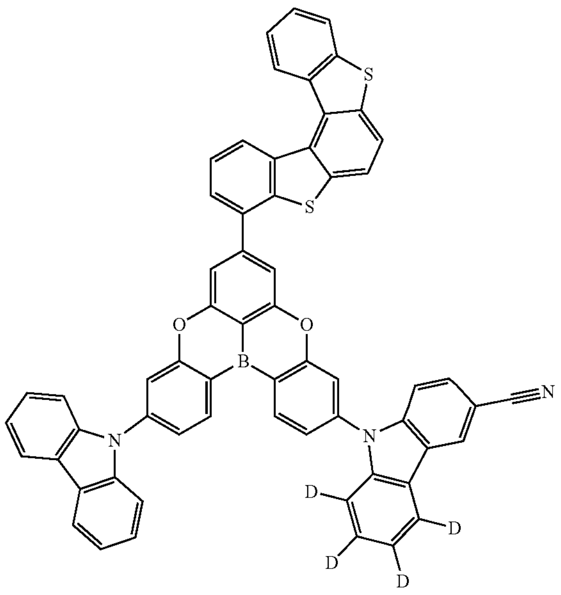
75
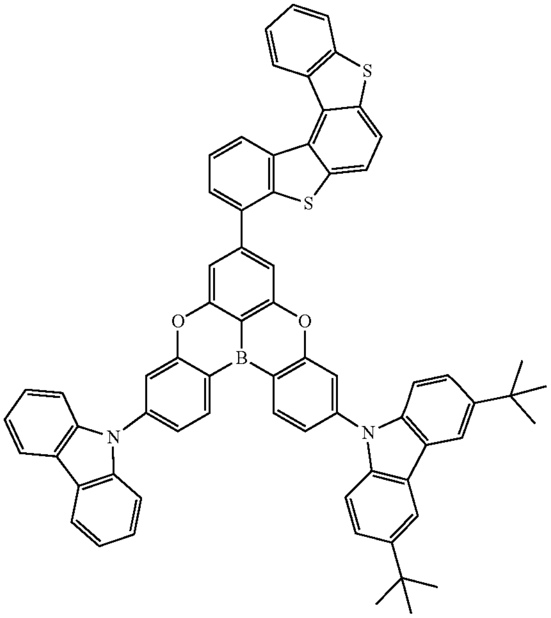
-continued
76
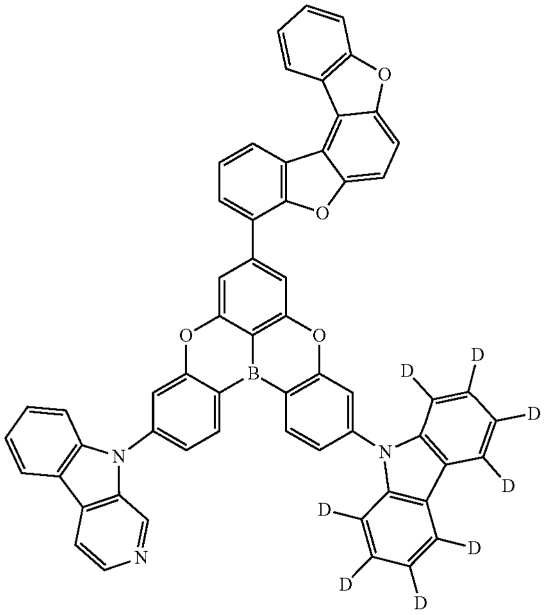
77
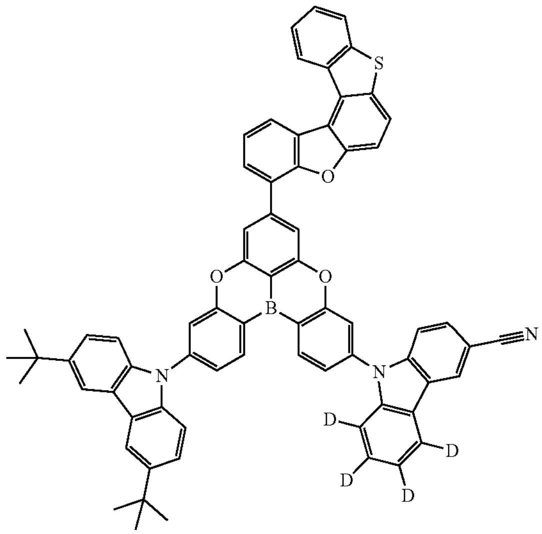

-continued
78
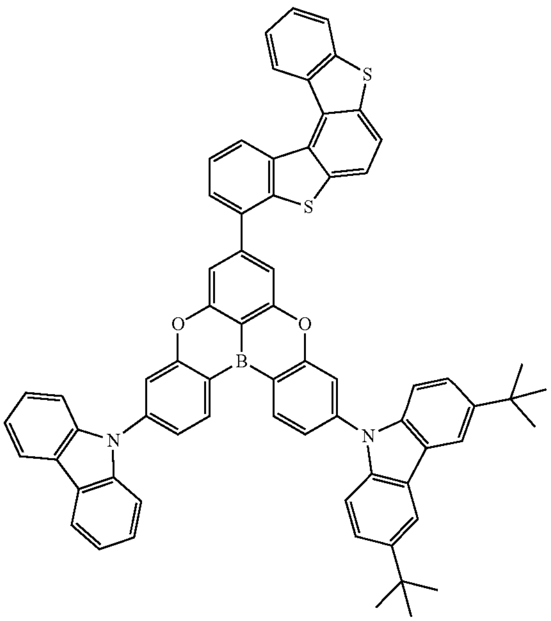
79
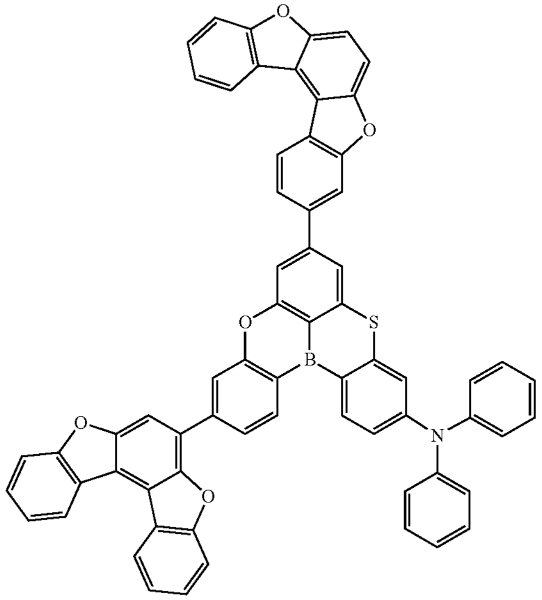
-continued
80
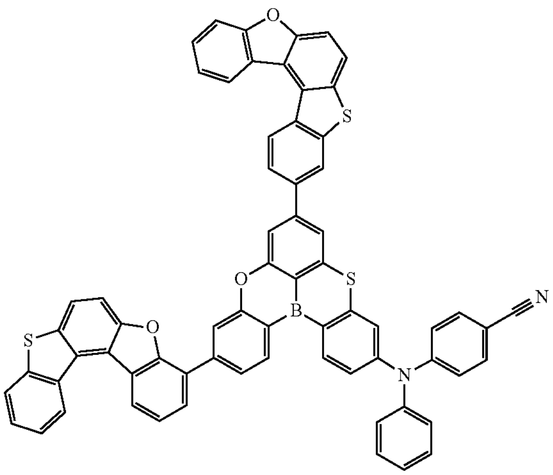
81
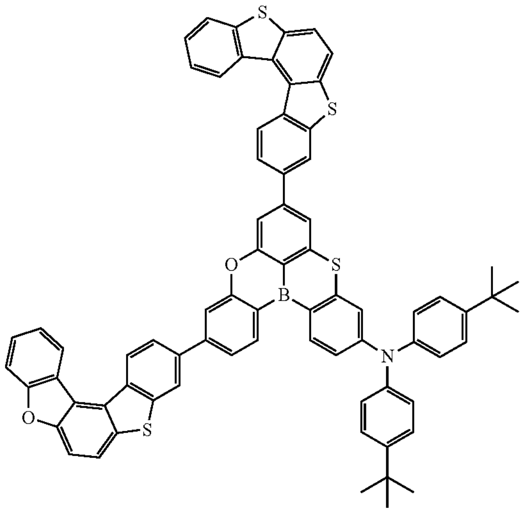

-continued
82
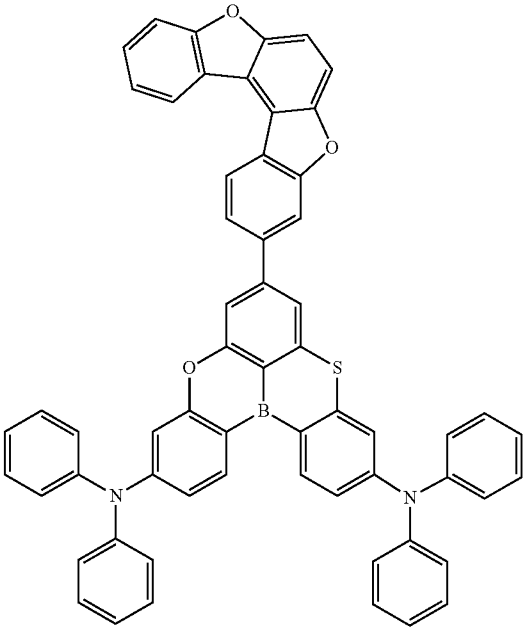
83
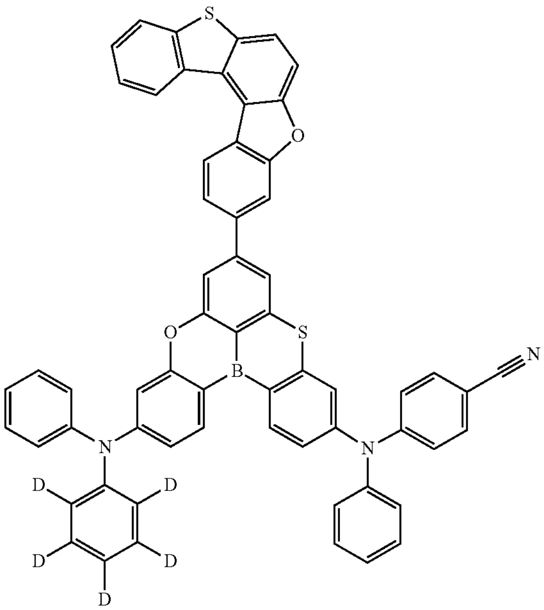
-continued
84
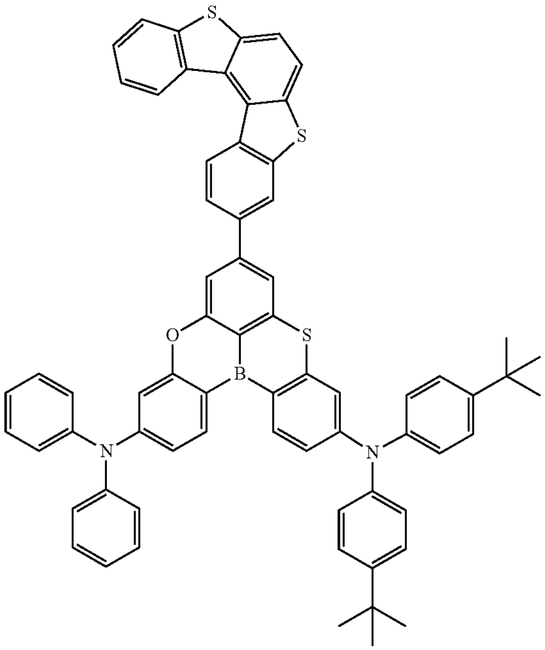
85
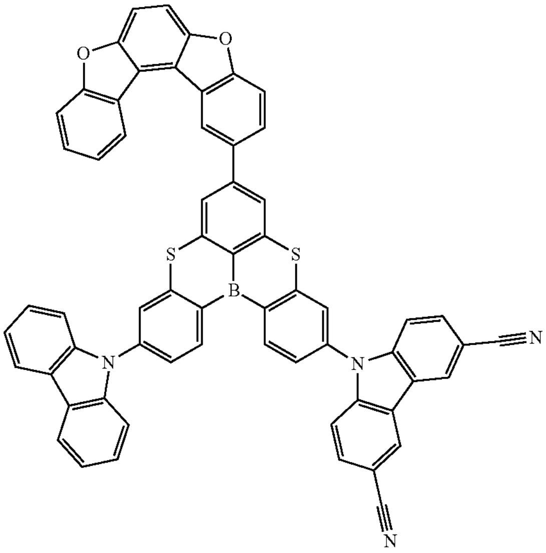

-continued
86
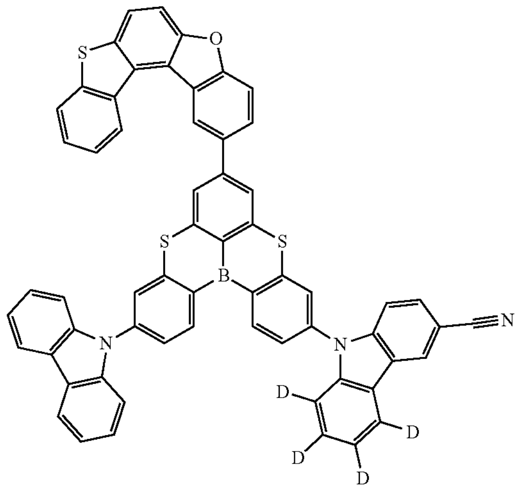
87
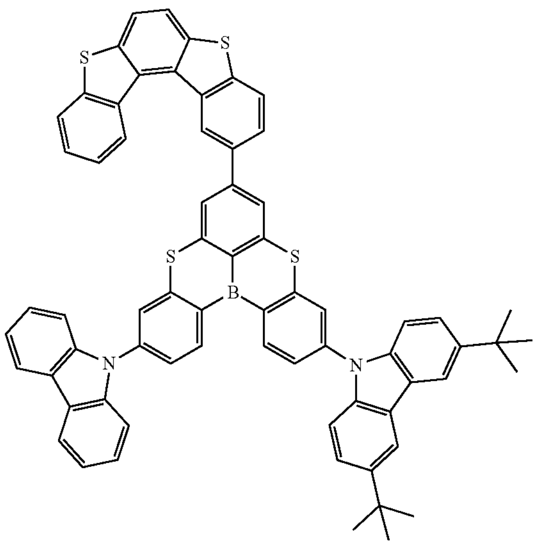
88
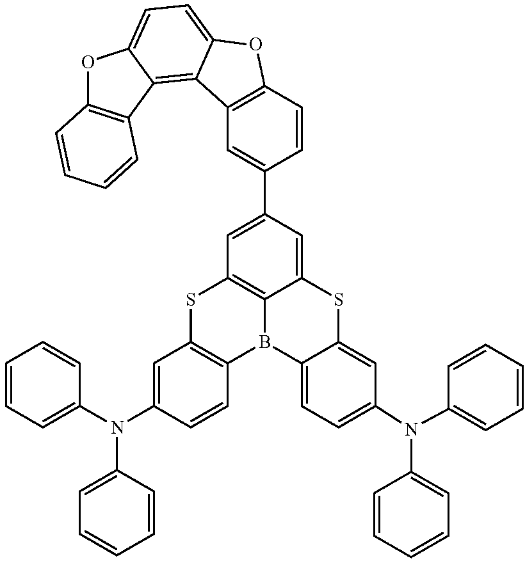
-continued
89
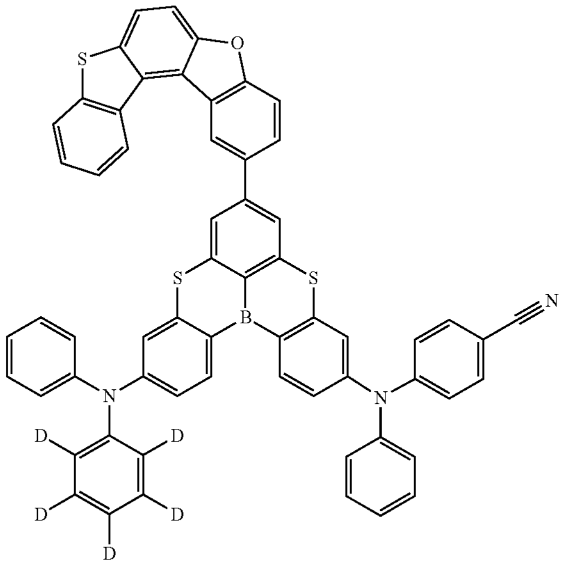
90
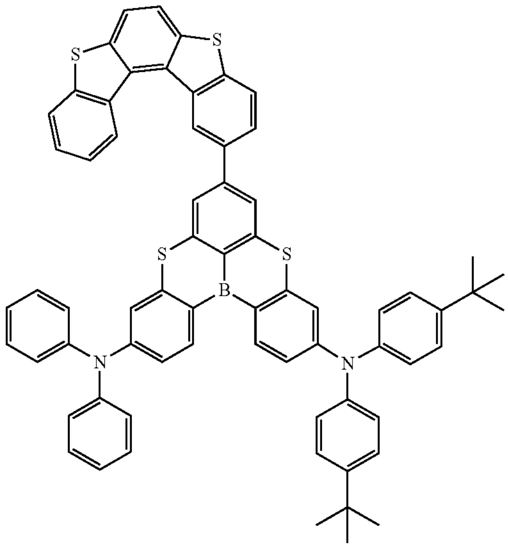

-continued
91
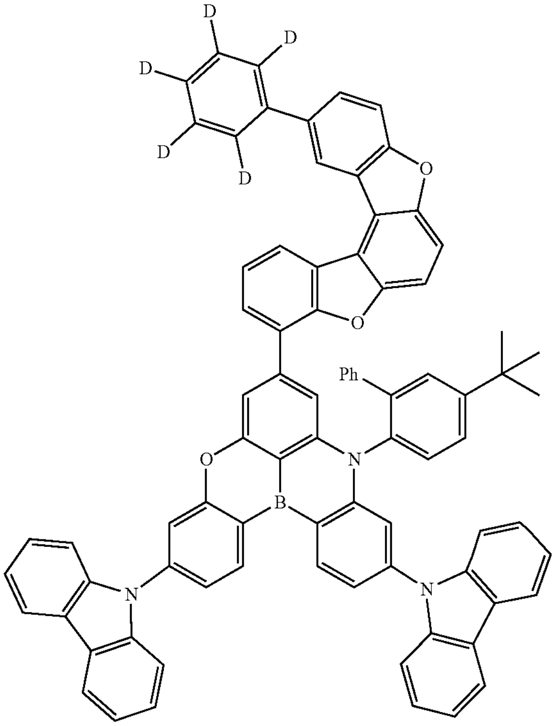
92
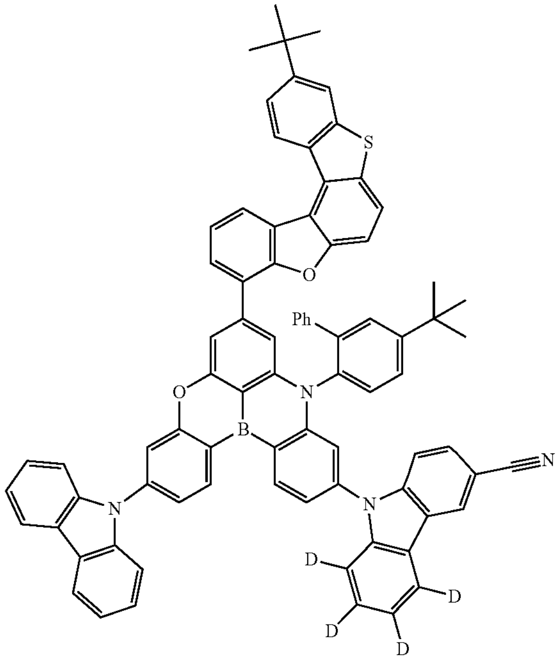
-continued
93
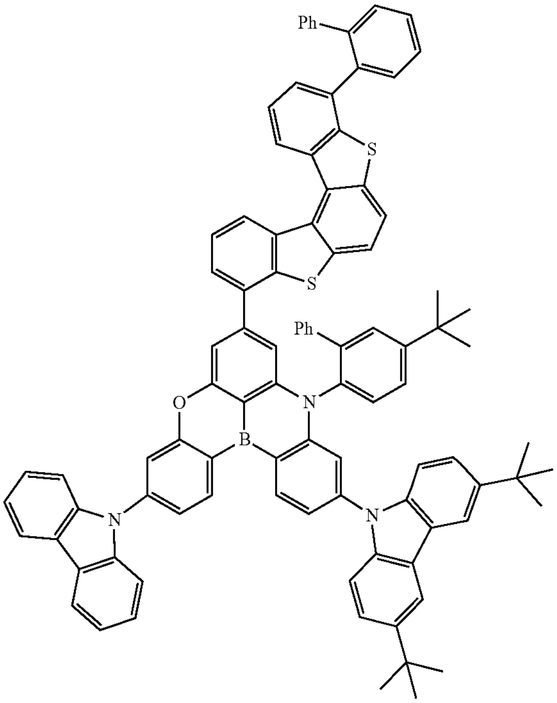
94
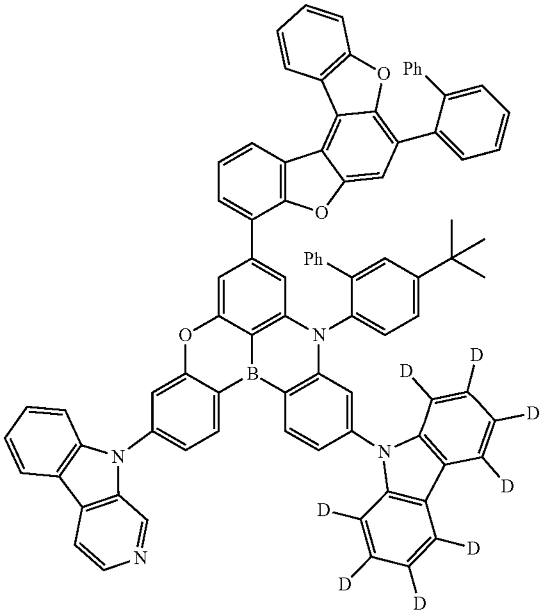

-continued
95
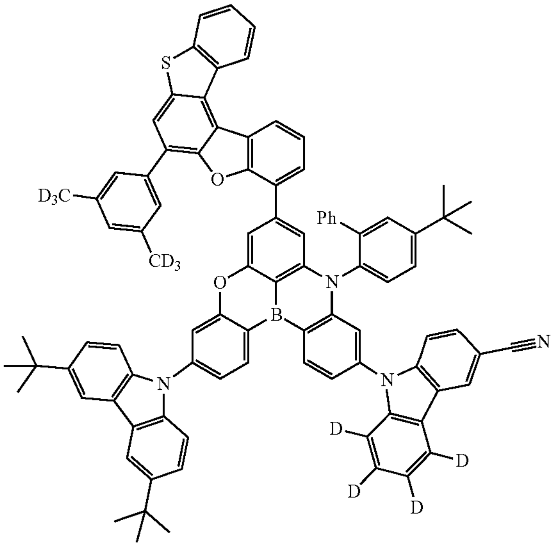
96
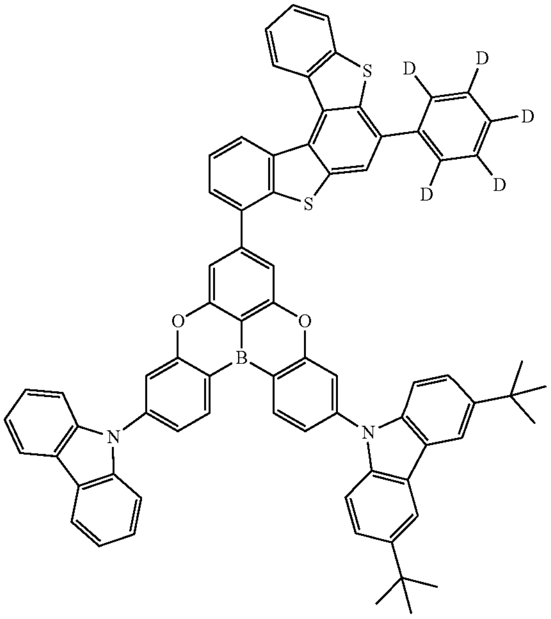
-continued
97
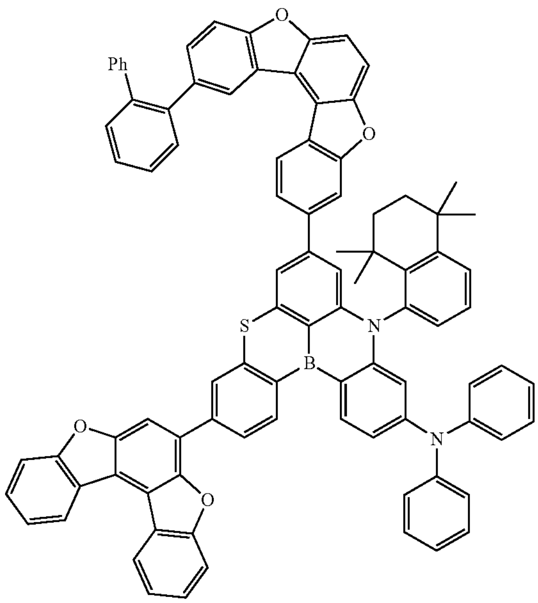
98
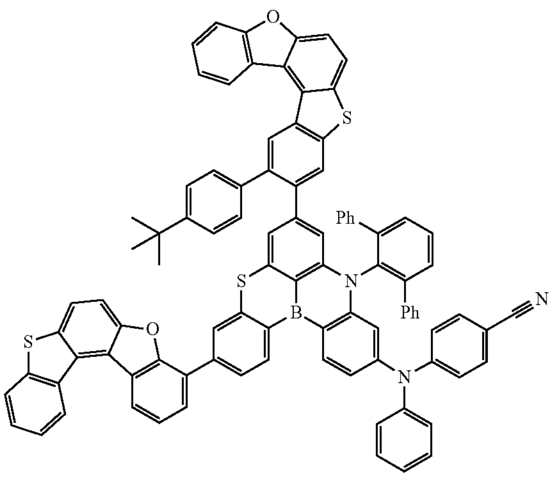

-continued
99
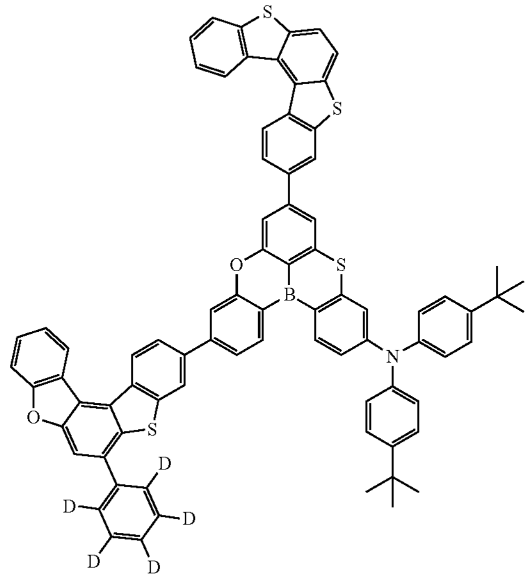
100
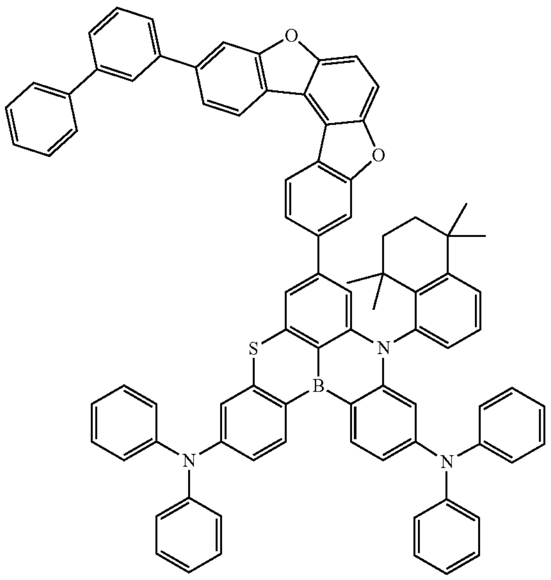
-continued
101
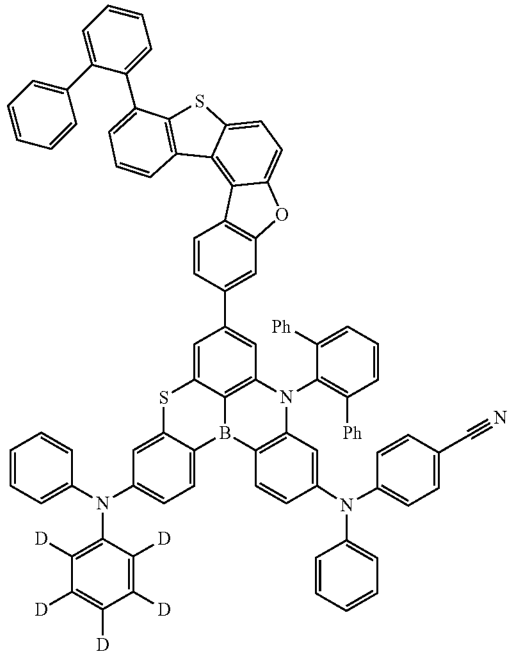
102
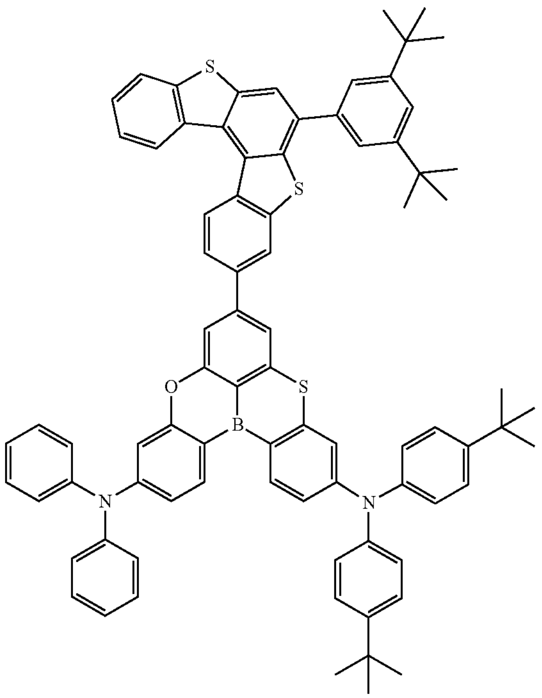

-continued
103
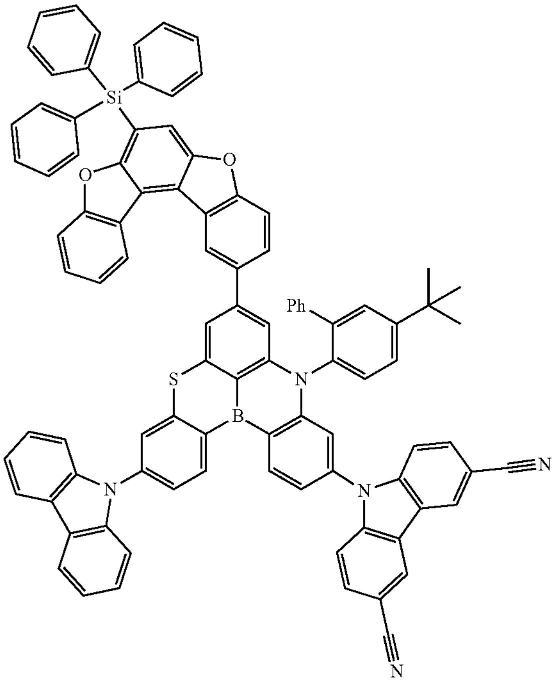
104
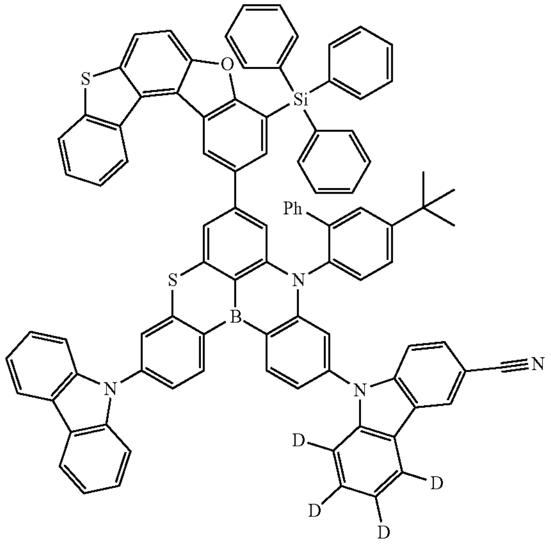
-continued
105
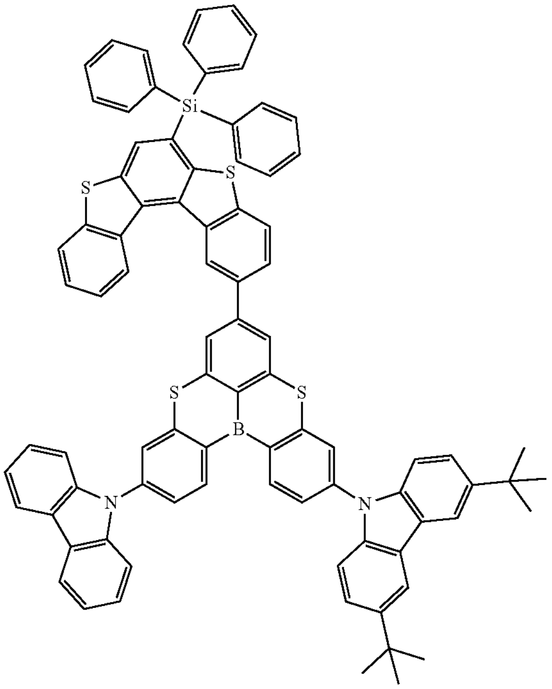
106
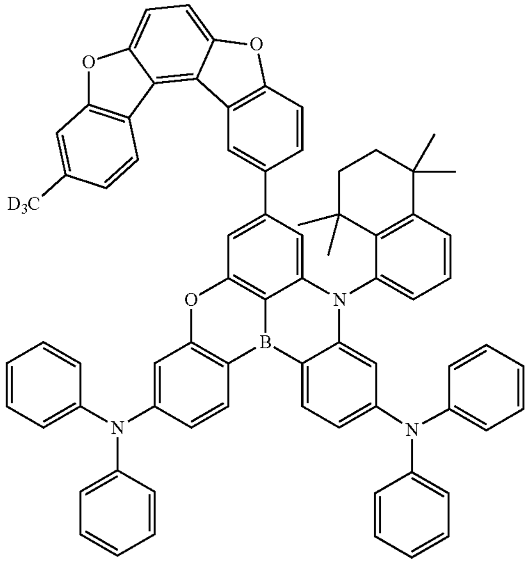

-continued

107

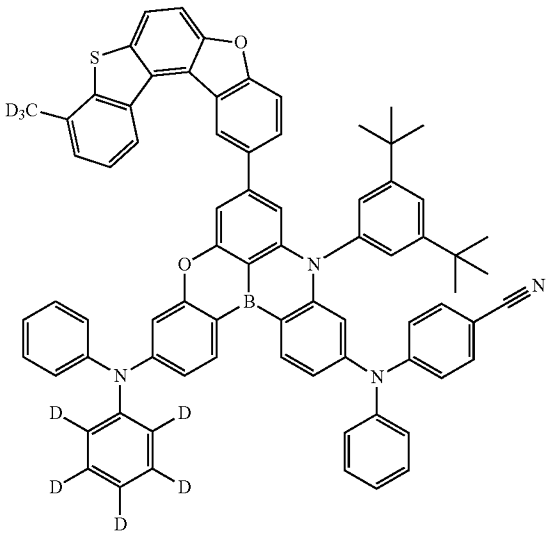

108

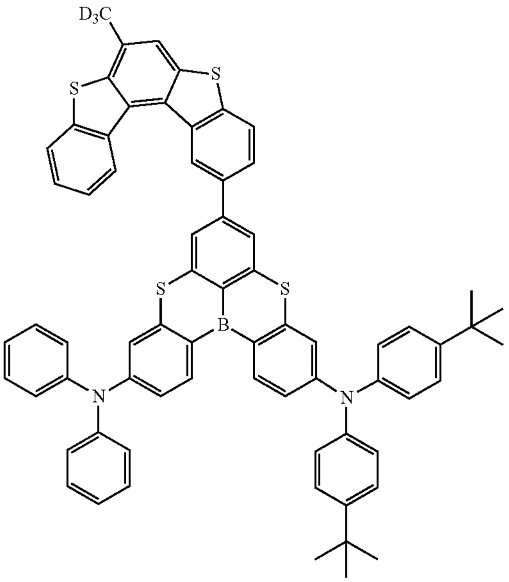

In Compound Group 1, D is a deuterium atom, and Ph is a phenyl group.

For the polycyclic compound of an embodiment, a pentacyclic group in which two pentagonal rings and three hexagonal rings are fused may be linked to a pentacyclic fused ring containing B as a ring-forming atom. The two pentagonal rings in the pentacyclic group may contain N, O, or S as a ring-forming atom. The pentacyclic fused ring containing B as a ring-forming atom may be represented by Formula 1 and the pentacyclic group may be represented by Formula 2.

For the polycyclic compound of an embodiment, electron density is concentrated on the pentacyclic fused ring containing B as a ring-forming atom due to the steric structure of the pentacyclic group in which two pentagonal rings and three hexagonal rings are fused, and thus multiple resonances may be stabilized. Due to the steric structure of the pentacyclic group, the polycyclic compound of an embodiment may exhibit a large value of the oscillator strength (f).

The polycyclic compound of an embodiment may have an oscillator strength in a range of about 0.25 to about 0.60. Accordingly, the light emitting element ED including the polycyclic compound of an embodiment may exhibit excellent luminous efficiency. The light emitting element ED including the polycyclic compound of an embodiment may have a decrease in driving voltage.

The polycyclic compound of an embodiment is a multi-resonance (MR) type of delayed fluorescence material, and may have a full width of half maximum (FWHM) equal to or less than about 25 nm. The polycyclic compound having a narrow FWHM equal to or less than about 25 nm may exhibit a large value of the oscillator strength.

In the light emitting element ED of an embodiment, the emission layer EML may emit delayed fluorescence. The emission layer EML may emit thermally activated delayed fluorescence (TADF).

The polycyclic compound of an embodiment may be a thermally activated delayed fluorescence material. The polycyclic compound may emit blue light, and the polycyclic compound may have a luminescence center wavelength in a range of about 440 nm to about 480 nm.

In an embodiment, the emission layer EML may include the polycyclic compound of an embodiment as a dopant. For example, the emission layer EML in the light emitting element ED of an embodiment may include a host for emitting delayed fluorescence and a dopant for emitting delayed fluorescence, and may include the above-described polycyclic compound of an embodiment as a dopant for emitting delayed fluorescence. The emission layer EML may include at least one of the polycyclic compounds in Compound Group 1 as described above as a thermally activated delayed fluorescent dopant.

In an embodiment, the emission layer EML may include a second compound represented by Formula HT-1. For example, the second compound may be used as a hole transport host material of the emission layer EML.

[Formula HT-1]

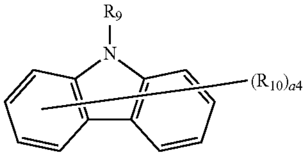

In Formula HT-1, a4 may be an integer from 0 to 8. When a4 is 2 or more, multiple $R_{10}$ groups may be the same as each other or at least one may be different from the others. In Formula HT-1, $R_9$ and $R_{10}$ may each independently be a hydrogen atom, a deuterium atom, a substituted or unsubstituted aryl group having 6 to 60 ring-forming carbon atoms, or a substituted or unsubstituted heteroaryl group having 2 to 60 ring-forming carbon atoms. For example, $R_9$ may be a substituted phenyl group, an unsubstituted dibenzofuran group, or a substituted fluorenyl group. $R_{10}$ may be a substituted or unsubstituted carbazole group.

In an embodiment, the second compound may be any one selected from Compound Group 2. The light emitting element ED of an embodiment may include any one selected from Compound Group 2:

[Compound Group 2]

HT1

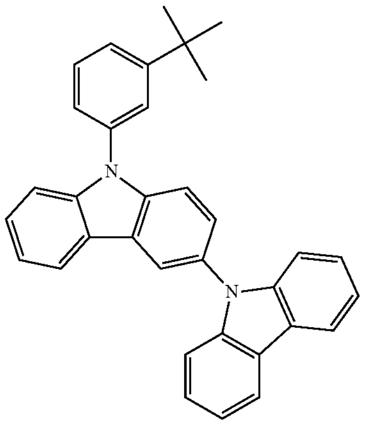

HT2

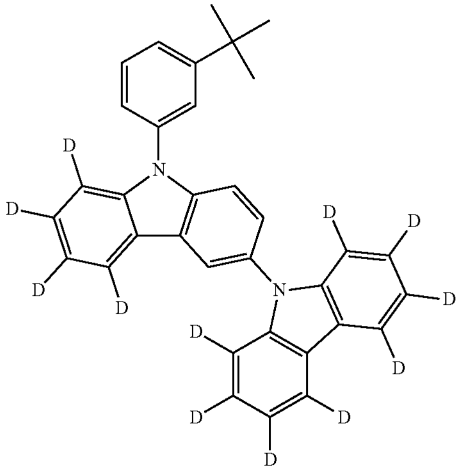

HT3

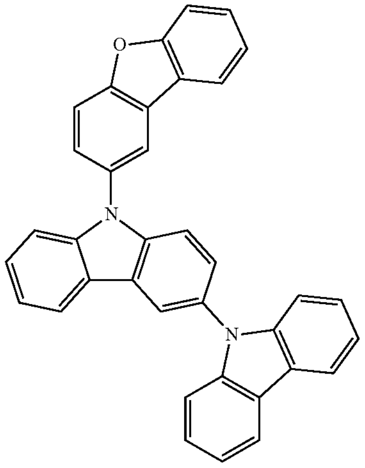

-continued

HT4

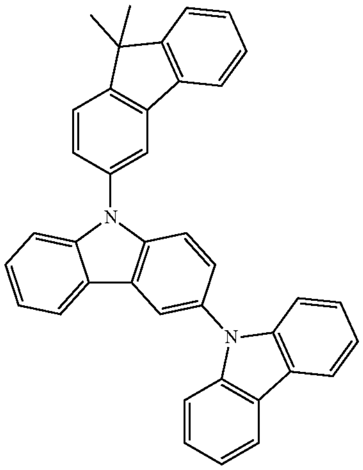

In an embodiment, the emission layer EML may include a third compound represented by Formula ET-1. For example, the third compound may be used as an electron transport host material of the emission layer EML.

[Formula ET-1]

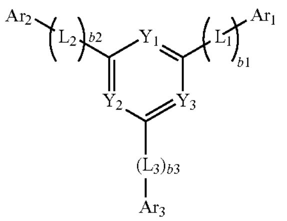

In Formula ET-1, at least one of $Y_1$ to $Y_3$ may be N, and the remainder of $Y_1$ to $Y_3$ may be $C(R_a)$, and $R_a$ may be a hydrogen atom, a deuterium atom, a substituted or unsubstituted alkyl group having 1 to 20 carbon atoms, a substituted or unsubstituted aryl group having 6 to 60 ring-forming carbon atoms, or a substituted or unsubstituted heteroaryl group having 2 to 60 ring-forming carbon atoms.

In Formula ET-1, b1 to b3 may each independently be an integer from 0 to 10. In Formula ET-1, $L_1$ to $L_3$ may each independently be a direct linkage, a substituted or unsubstituted arylene group having 6 to 30 ring-forming carbon atoms, or a substituted or unsubstituted heteroarylene group having 2 to 30 ring-forming carbon atoms.

In Formula ET-1, $Ar_1$ to $Ar_3$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. For example, $Ar_1$ to $Ar_3$ may each independently be a substituted or unsubstituted phenyl group, or a substituted or unsubstituted carbazole group.

In an embodiment, the third compound may be any one selected from Compound Group 3. The light emitting element ED of an embodiment may include any one selected from Compound Group 3:

[Compound Group 3]

ET1

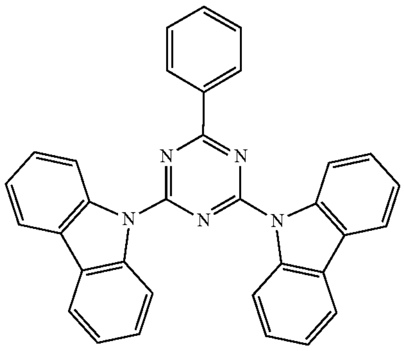

ET2

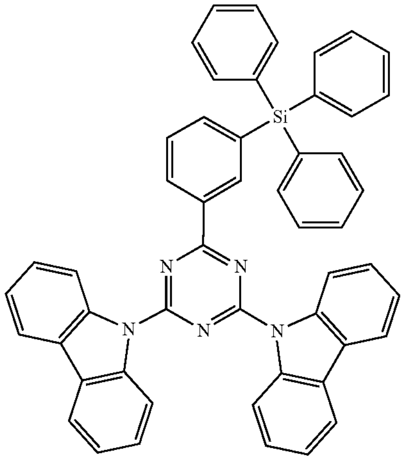

ET3

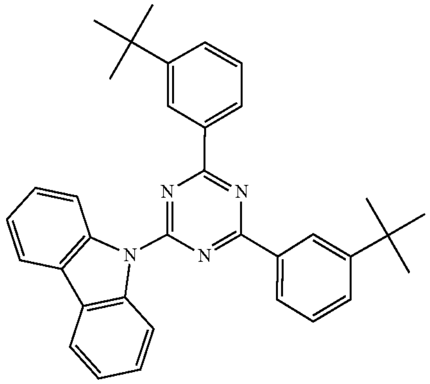

For example, the emission layer EML may include the second compound and the third compound, and the second compound and the third compound may form an exciplex. In the emission layer EML, an exciplex may be formed by the hole transport host and the electron transport host. A triplet energy of the exciplex formed by the hole transport host and the electron transport host may correspond to a difference between a lowest unoccupied molecular orbital (LUMO) energy level of the electron transport host and a highest occupied molecular orbital (HOMO) energy level of the hole transport host.

For example, an absolute value of the triplet energy (T1) of the exciplex formed by the hole transport host and the electron transport host may be in a range of about 2.4 eV to about 3.0 eV. The triplet energy of the exciplex may be a value smaller than an energy gap of each host material. The exciplex may have a triplet energy equal to or less than about 3.0 eV that is an energy gap between the hole transport host and the electron transport host.

In an embodiment, the emission layer EML may include a fourth compound represented by Formula M-b. For example, the fourth compound may be used as a phosphorescent sensitizer of the emission layer EML. Energy may be transferred from the fourth compound to the first compound, thereby emitting light.

[Formula M-b]

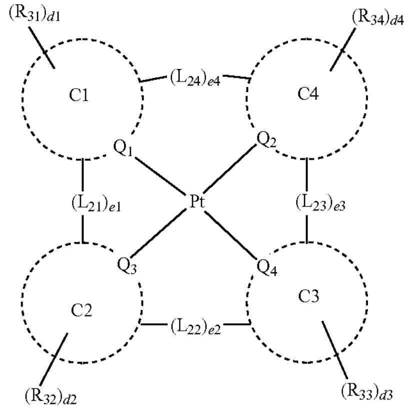

In Formula M-b, $Q_1$ to $Q_4$ may each independently be C or N, and C1 to C4 may each independently be a substituted or unsubstituted hydrocarbon ring group having 5 to 30 ring-forming carbon atoms, or a substituted or unsubstituted heterocyclic group having 2 to 30 ring-forming carbon atoms.

In Formula M-b, e1 to e4 may each independently be 0 or 1, and $L_{21}$ to $L_{24}$ may each independently be a direct linkage,

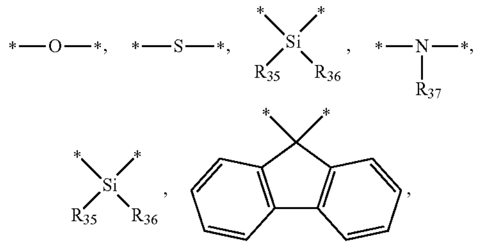

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms.

In Formula M-b, d1 to d4 may each independently be an integer from 0 to 4. When d1 is 2 or more, multiple $R_{31}$ groups may be the same as each other or at least one may be different from the others. When d2 is 2 or more, multiple $R_{32}$ groups may be the same as each other or at least one may be different from the others. When d3 is 2 or more, multiple $R_{33}$ groups may be the same as each other or at least one may be different from the others. When d4 is 2 or more, multiple $R_{34}$ groups may be the same as each other or at least one may be different from the others.

In Formula M-b, $R_{31}$ to $R_{39}$ may each independently be a hydrogen atom, a deuterium atom, a halogen atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In an embodiment, the fourth compound may be any one selected from Compound Group 4. The light emitting element ED of an embodiment may include any one selected from Compound Group 4:

[Compound Group 4]

PS1

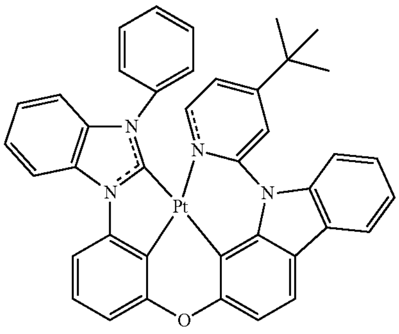

PS2

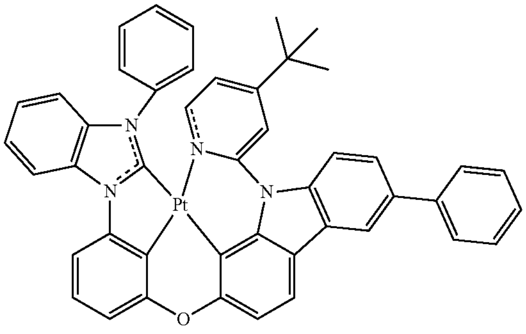

PS3

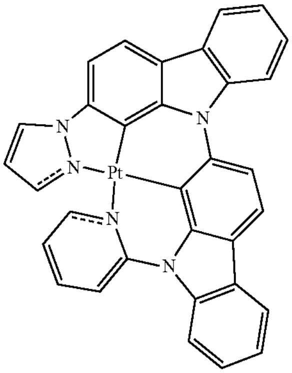

-continued

PS4

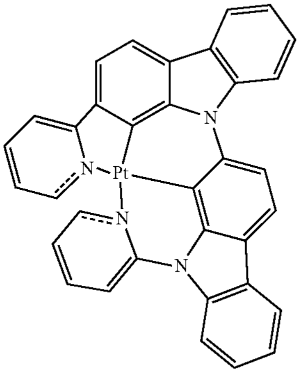

PS5

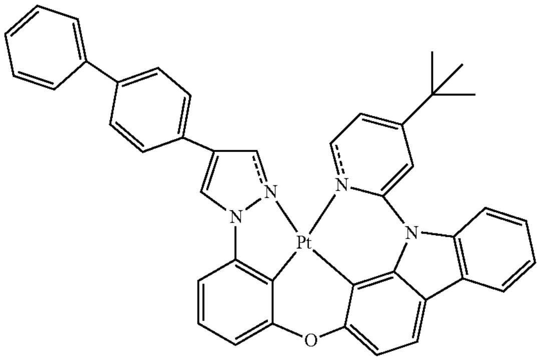

PS6

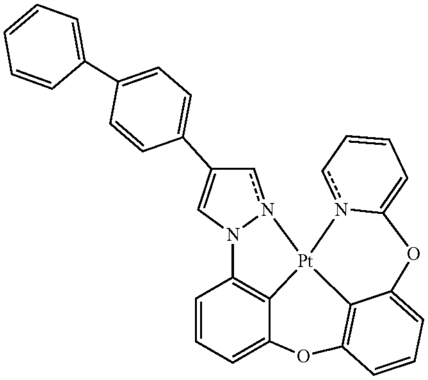

PS7

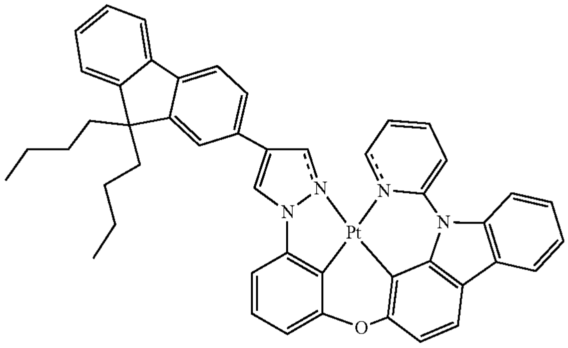

-continued

PS8

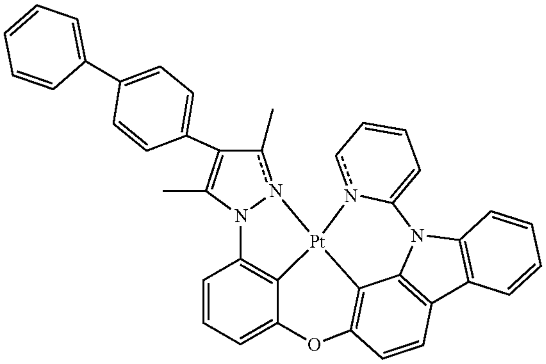

PS9

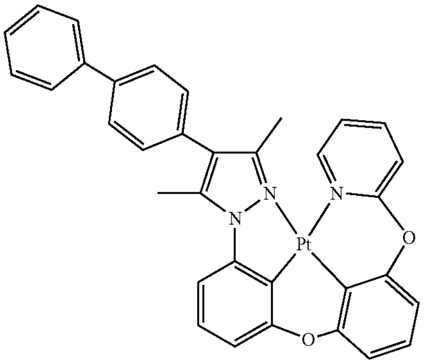

PS10

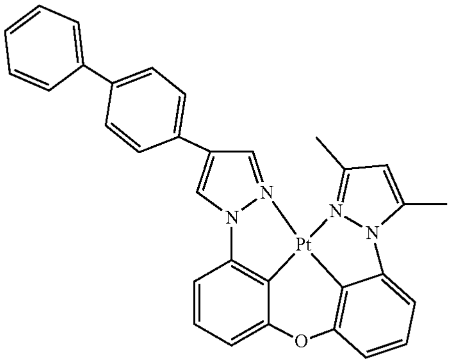

PS11

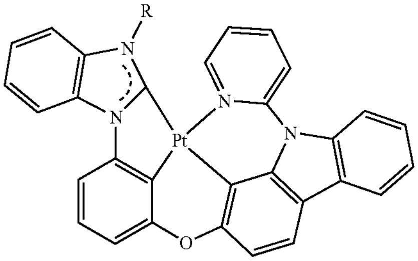

PS12

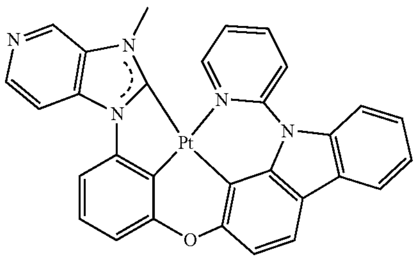

-continued

PS13

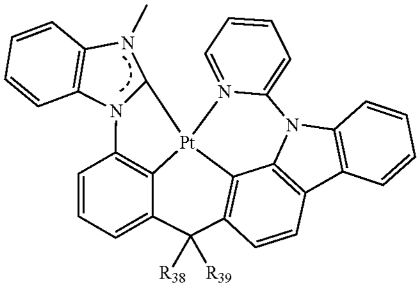

In Compound Group 4, R, $R_{38}$, and $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML of an embodiment may include the first compound and at least one of the second compound, the third compound, or the fourth compound. In an embodiment, the emission layer EML may include the first compound, the second compound, and the third compound. In the emission layer EML, the second compound and the third compound may form an exciplex, and energy may be transferred from the exciplex to the first compound, thereby emitting light.

In another embodiment, the emission layer EML may include the first compound, the second compound, the third compound, and the fourth compound. In the emission layer EML, the second compound and the third compound may form an exciplex, and energy may be transferred from the exciplex to the fourth compound and the first compound, thereby emitting light. However, this is only an example, and the compounds included in the emission layer EML are not limited thereto.

The emission layer EML may have a thickness in a range of about 100 Å to about 1,000 Å. For example, the emission layer EML may have a thickness in a range of about 100 Å to about 300 Å. The emission layer EML may be a layer formed of a single material, a layer formed of different materials, or a structure having multiple layers formed of different materials.

The emission layer EML may further include a material of the related art as a host material. For example, the emission layer EML may include, as a host material, at least one of bis(4-(9H-carbazol-9-yl)phenyl)diphenylsilane (BCPDS), (4-(1-(4-(diphenylamino)phenyl)cyclohexyl)phenyl)diphenyl-phosphine oxide (POPCPA), bis[2-(diphenylphosphino)phenyl]ether oxide (DPEPO), 4,4'-bis(N-carbazolyl)-1,1'-biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), or 1,3,5-tris(1-phenyl-1H-benzo[d]imidazole-2-yl)benzene (TPBi). However, embodiments are not limited thereto. For example, tris(8-hydroxyquinolino)aluminum ($Alq_3$), 9,10-di(naphthalene-2-yl)anthracene (ADN), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), etc. may be used as a host material.

In the light emitting element ED of an embodiment, the emission layer EML may include an anthracene derivative, a pyrene derivative, a fluoranthene derivative, a chrysene derivative, a dihydrobenzanthracene derivative, or a triphenylene derivative. For example, the emission layer EML may include an anthracene derivative or a pyrene derivative.

In the light emitting element ED of an embodiment, the emission layer EML may include a host and a dopant. The emission layer EML may include a compound represented by Formula E-1. The compound represented by Formula E-1 may be used as a fluorescent host material.

[Formula E-1]

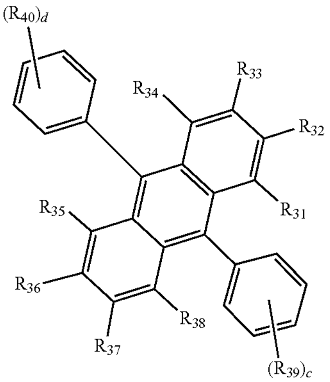

In Formula E-1, $R_{31}$ to $R_{40}$ may each independently be a hydrogen atom, a deuterium atom, a halogen atom, a substituted or unsubstituted silyl group, a substituted or unsubstituted thio group, a substituted or unsubstituted oxy group, a substituted or unsubstituted alkyl group having 1 to 10 carbon atoms, a substituted or unsubstituted alkenyl group having 2 to 10 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. For example, $R_{31}$ to $R_{40}$ may be bonded to an adjacent group to form a saturated hydrocarbon ring or an unsaturated hydrocarbon ring, a saturated heterocycle, or an unsaturated heterocycle.

In Formula E-1, c and d may each independently be an integer from 0 to 5.

The compound represented by Formula E-1 may be any one selected from Compound E1 to Compound E19:

E1

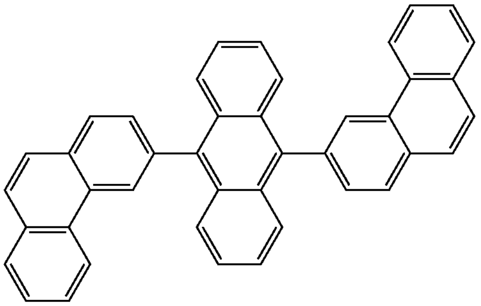

-continued

E2

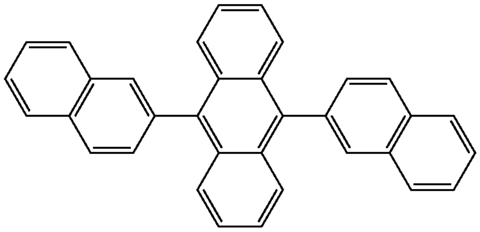

E3

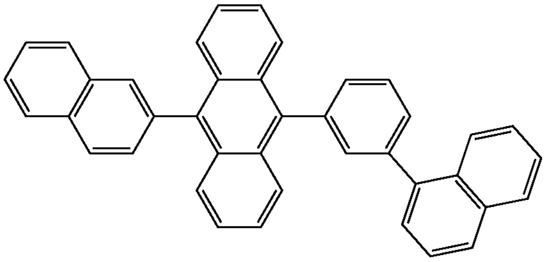

E4

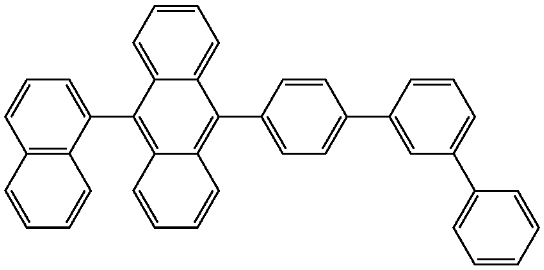

E5

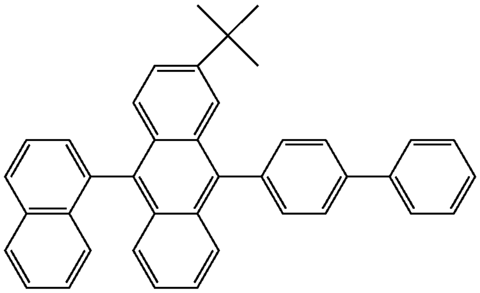

E6

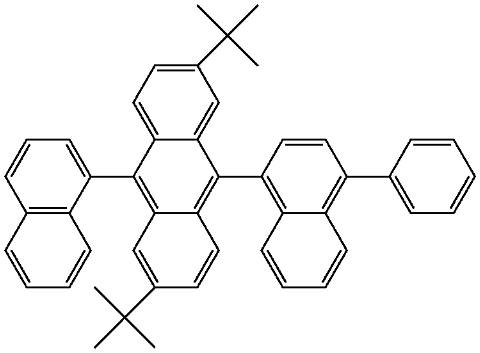

-continued
E7
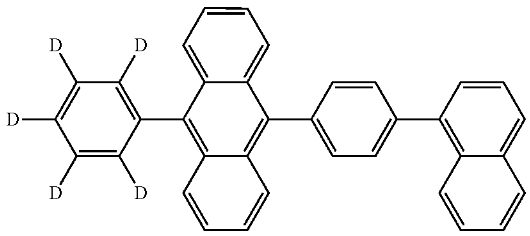
E8
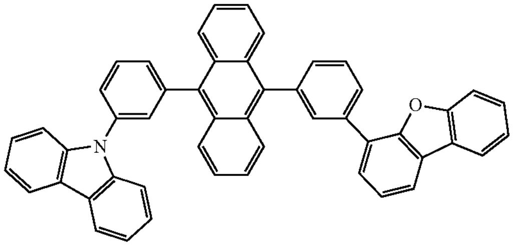
E9
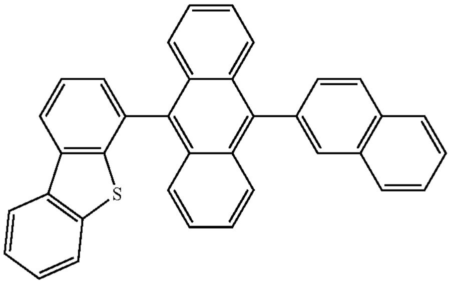
E10
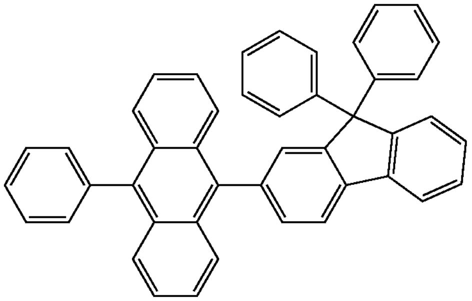
E11
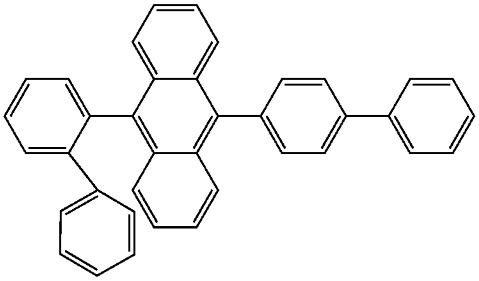
-continued
E12
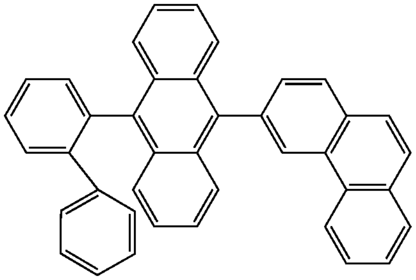
E13
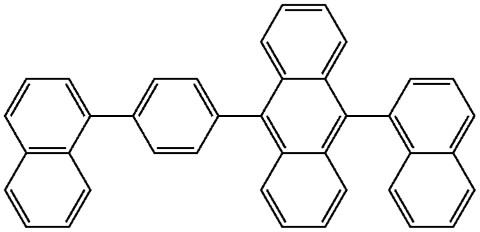
E14
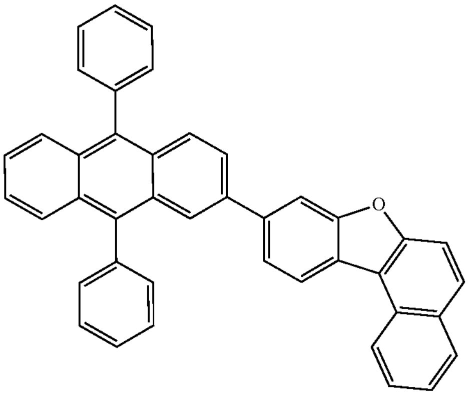
E15
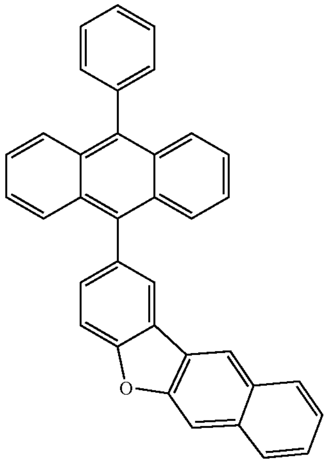

-continued

E16

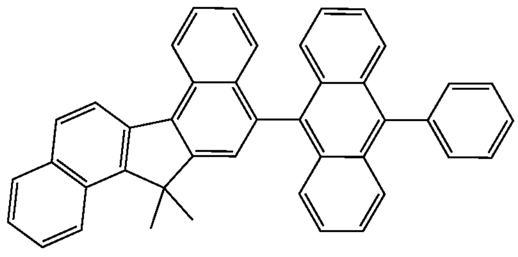

E17

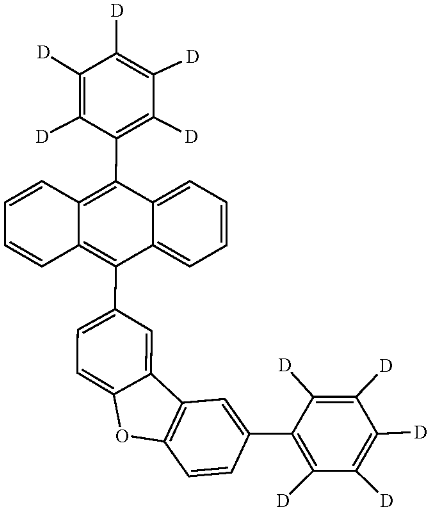

E18

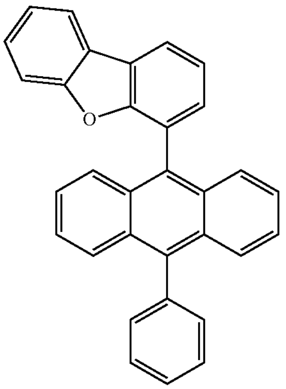

E19

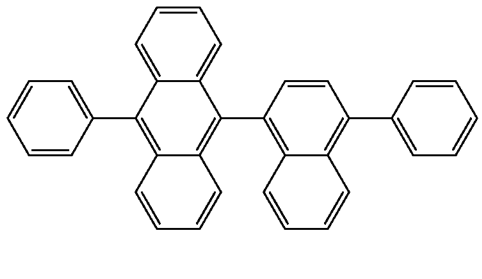

In an embodiment, the emission layer EML may include a compound represented by Formula E-2a or Formula E-2b. The compound represented by Formula E-2a or Formula E-2b may be used as a phosphorescent host material.

[Formula E-2a]

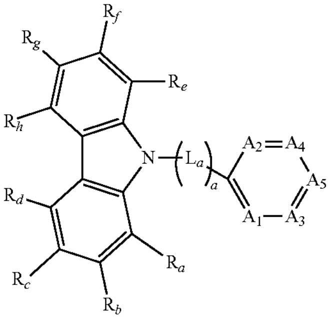

In Formula E-2a, a may be an integer from 0 to 10, and $L_a$ may be a direct linkage, a substituted or unsubstituted arylene group having 6 to 30 ring-forming carbon atoms, or a substituted or unsubstituted heteroarylene group having 2 to 30 ring-forming carbon atoms. When a is 2 or more, multiple $L_a$ groups may each independently be a substituted or unsubstituted arylene group having 6 to 30 ring-forming carbon atoms, or a substituted or unsubstituted heteroarylene group having 2 to 30 ring-forming carbon atoms.

In Formula E-2a, $A_1$ to $A_5$ may each independently be N or $C(R_i)$. In Formula E-2a, $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. For example, $R_a$ to $R_i$ may be bonded to an adjacent group to form a hydrocarbon ring or a heterocycle containing N, O, S, etc. as a ring-forming atom.

In Formula E-2a, two or three of $A_1$ to A5 may be N, and the remainder of $A_1$ to A5 may be $C(R_i)$.

[Formula E-2b]

$$(Cbz1) \text{-} (L_b)_b \text{-} (Cbz2)$$

In Formula E-2b, Cbz1 and Cbz2 may each independently be an unsubstituted carbazole group, or a carbazole group substituted with an aryl group having 6 to 30 ring-forming carbon atoms. In Formula E-2b, $L_b$ may be a direct linkage, a substituted or unsubstituted arylene group having 6 to 30 ring-forming carbon atoms, or a substituted or unsubstituted heteroarylene group having 2 to 30 ring-forming carbon atoms. In Formula E-2b, b may be an integer from 0 to 10. When b is 2 or more, multiple $L_b$ groups may each independently be a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be any one selected from Compound Group E-2. However, the compounds listed in Compound Group E-2 are only examples, and the compound represented by Formula E-2a or Formula E-2b is not limited to Compound Group E-2.

[Compound Group E-2]
E-2-1
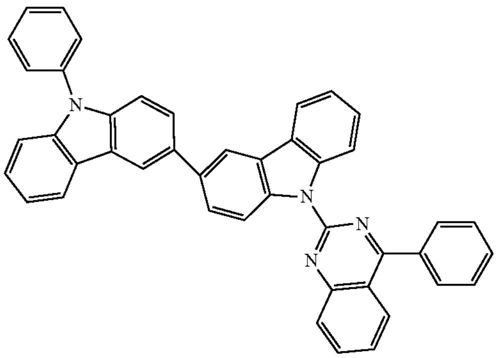
E-2-2
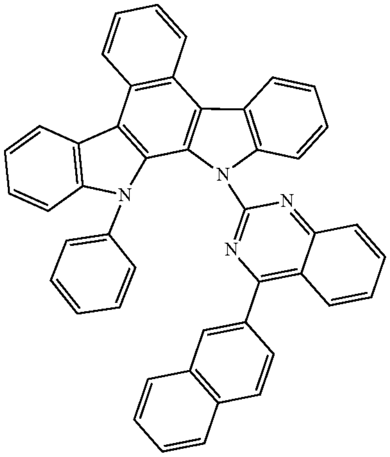
E-2-3
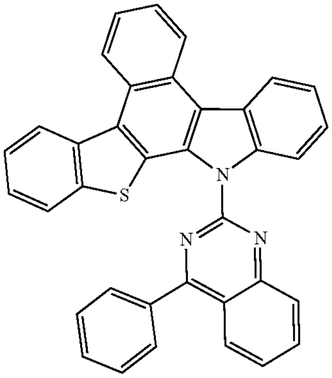
-continued
E-2-4
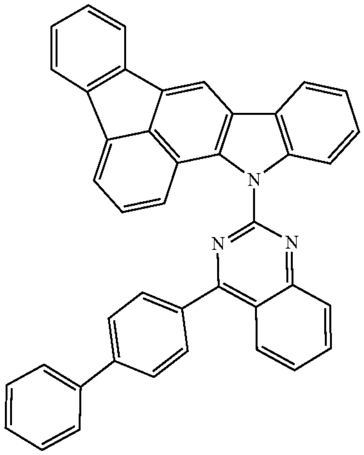
E-2-5
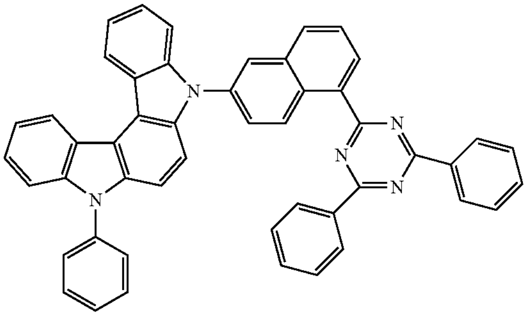
E-2-6
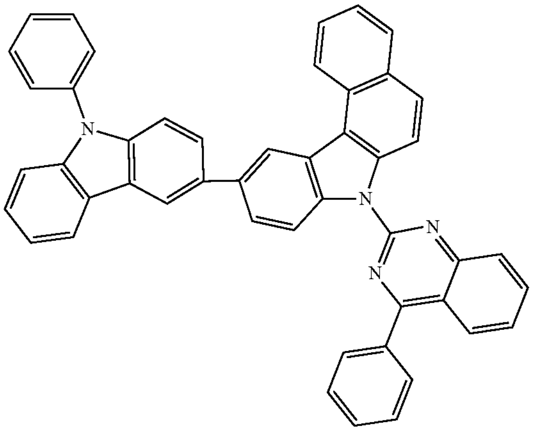

-continued
E-2-7
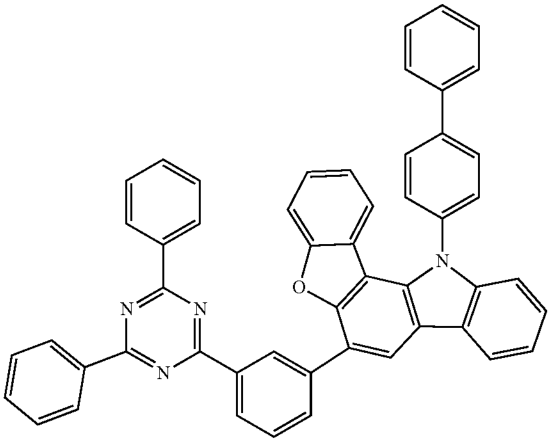
E-2-8
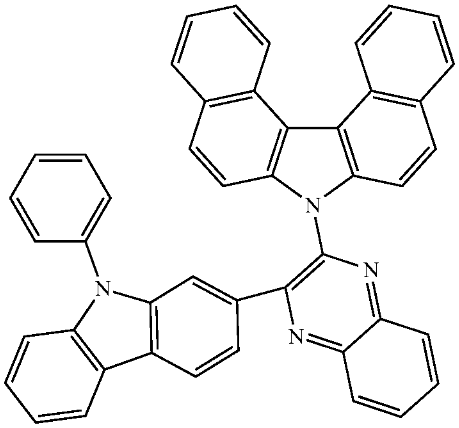
E-2-9
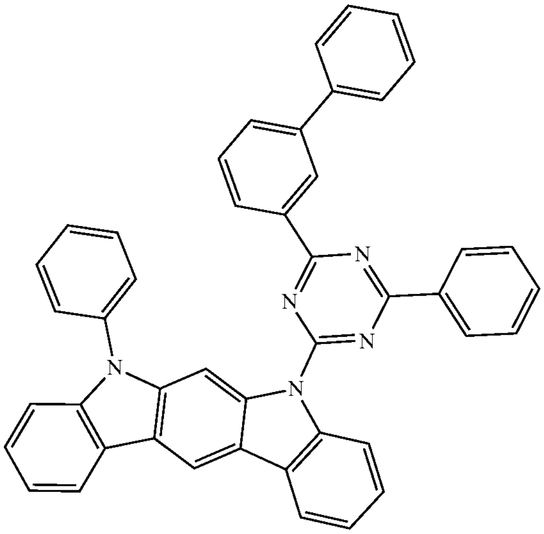
-continued
E-2-10
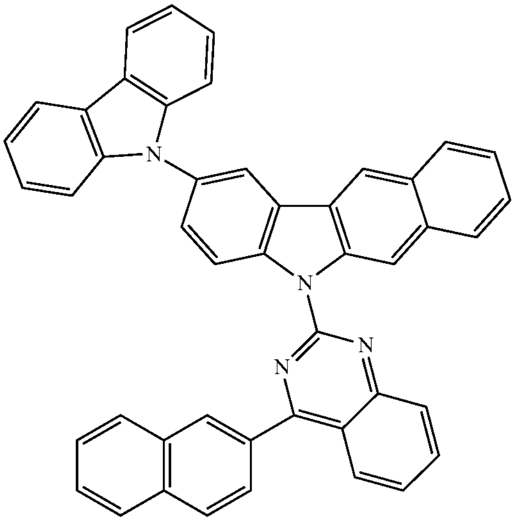
E-2-11
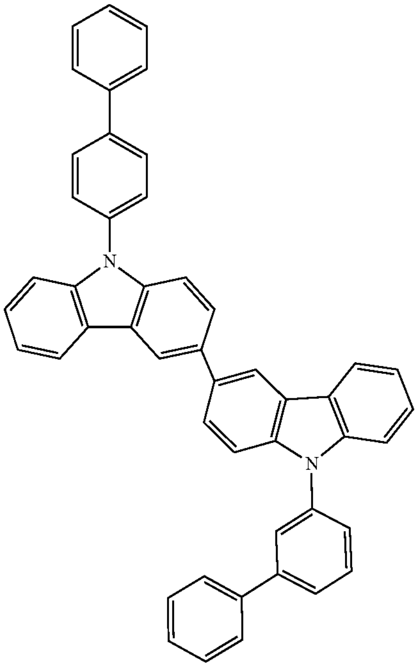
E-2-12
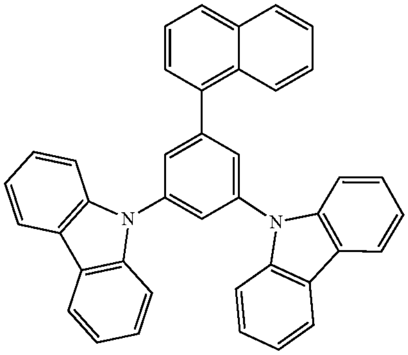

-continued
E-2-13
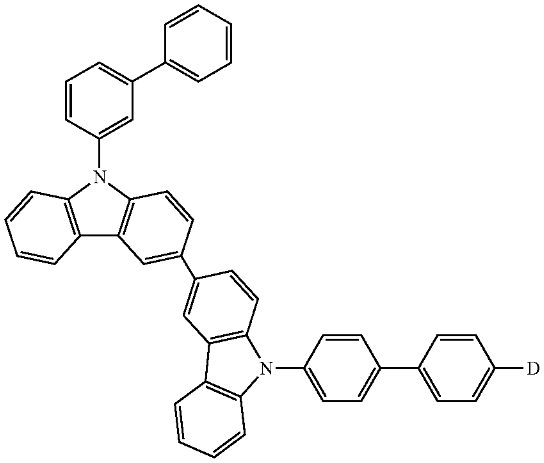
E-2-14
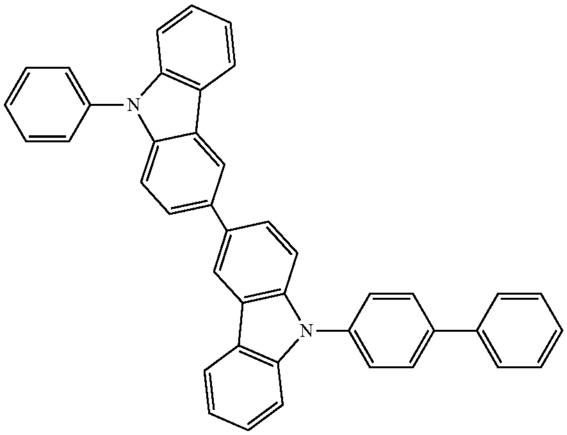
E-2-15
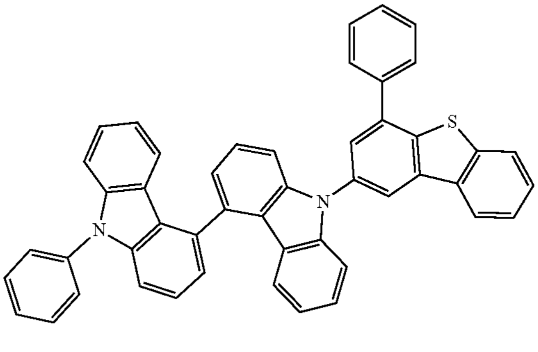
-continued
E-2-16
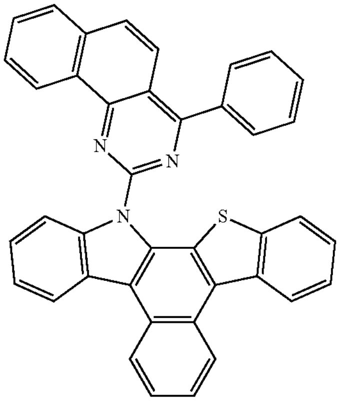
E-2-17
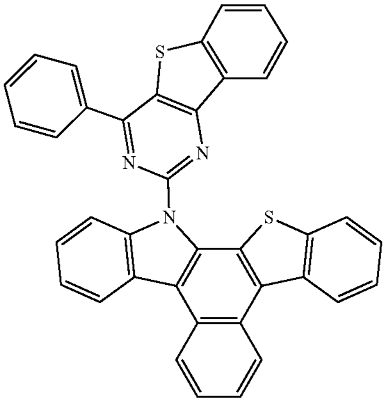
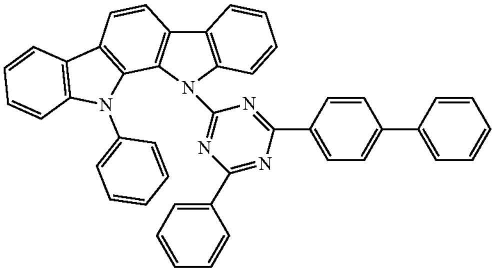
E-2-19
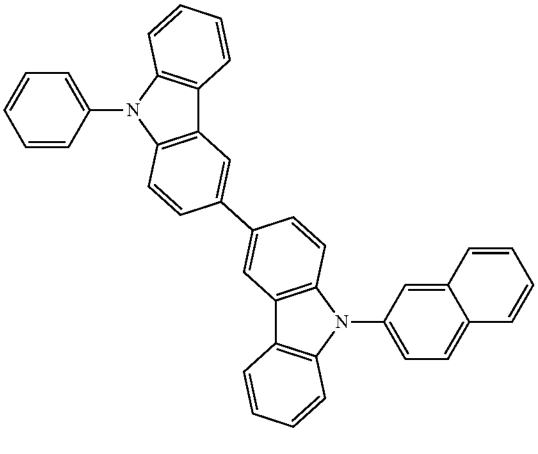

-continued

E-2-20

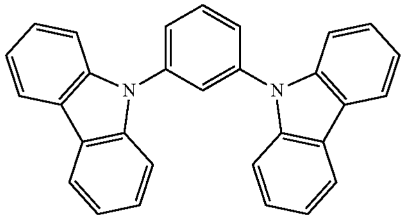

E-2-21

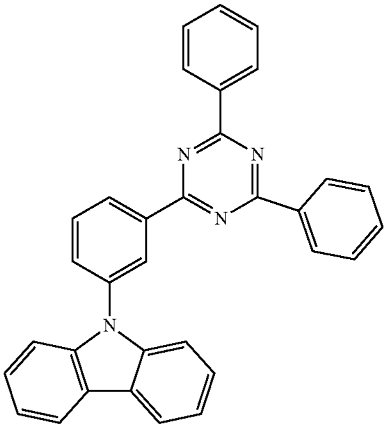

E-2-22

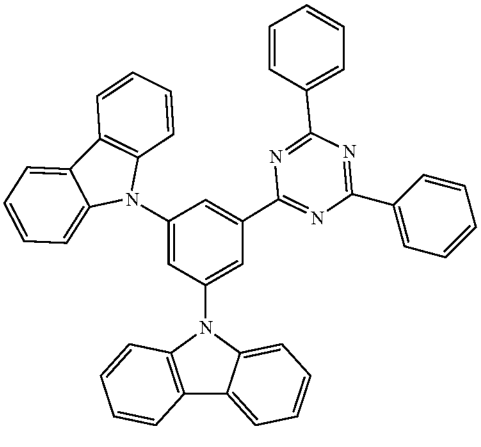

E-2-23

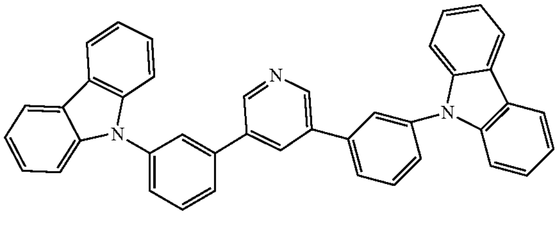

-continued

E-2-24

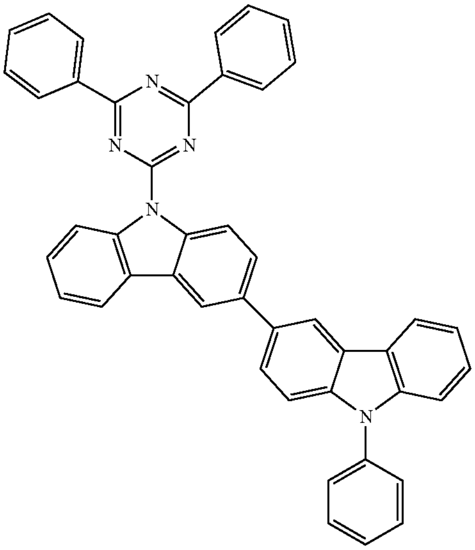

The emission layer EML may include a compound represented by Formula M-a. The compound represented by Formula M-a may be used as a phosphorescent dopant.

[Formula M-a]

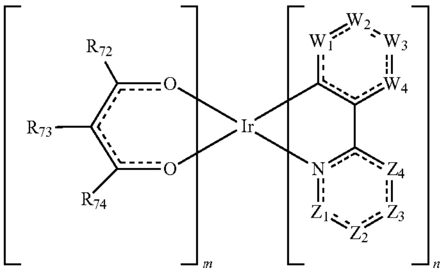

In Formula M-a, $W_1$ to $W_4$ and $Z_1$ to $Z_4$ may each independently be $C(R_{71})$ or N, and $R_{71}$ to $R_{74}$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In Formula M-a, m may be 0 or 1, and n may be 2 or 3. In Formula M-a, when m is 0, n may be 3, and when m is 1, n may be 2.

The compound represented by Formula M-a may be any one selected from Compound M-a1 to Compound M-a25. However, Compounds M-a1 to M-a25 are only examples, and the compound represented by Formula M-a is not limited to Compounds M-a1 to M-a25.

M-a1
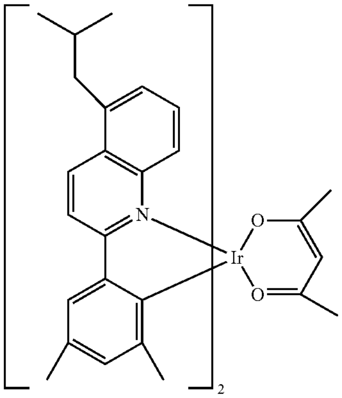
M-a2
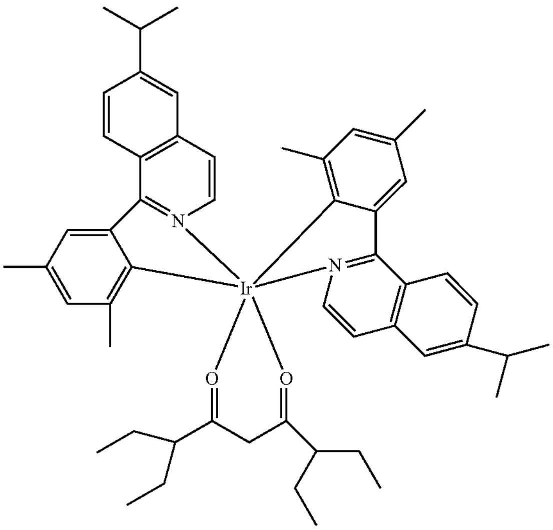
M-a3
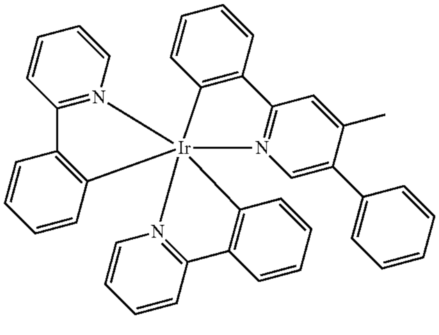
M-a4
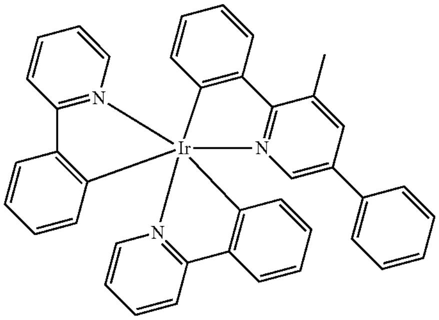
-continued
M-a5
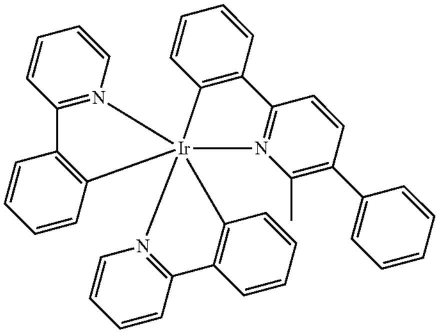
M-a6
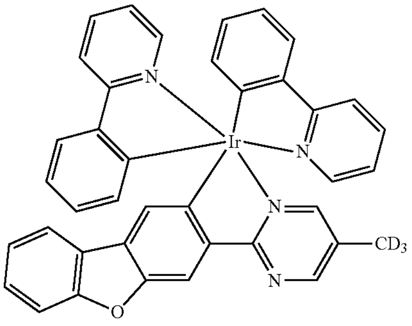
M-a7
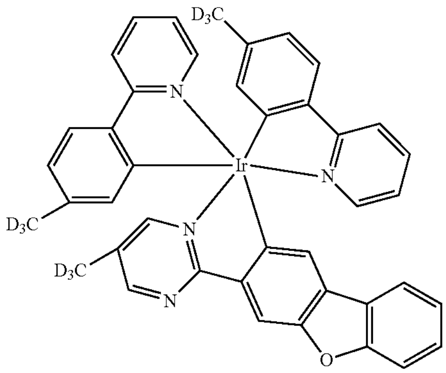
M-a8
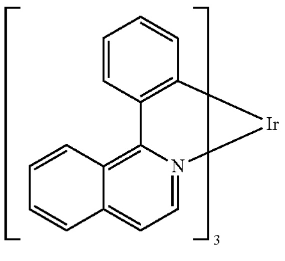
M-a9
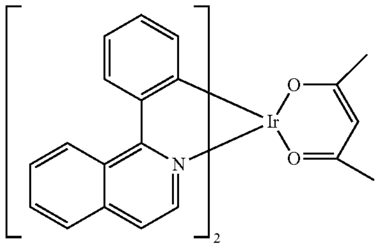

-continued
M-a10
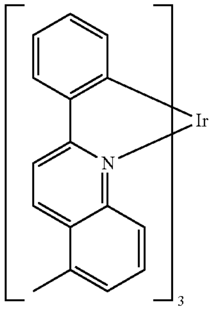
M-a11
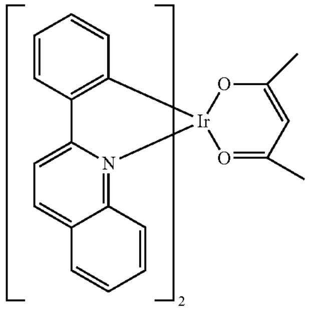
M-a12
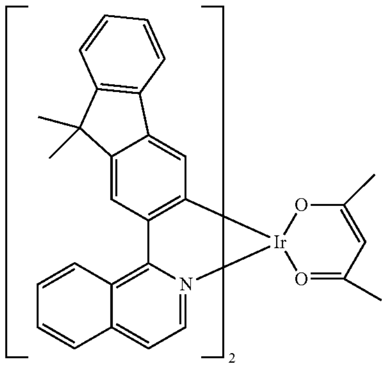
M-a13
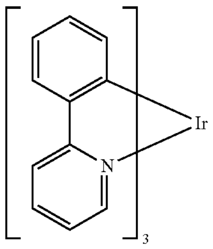
M-a14
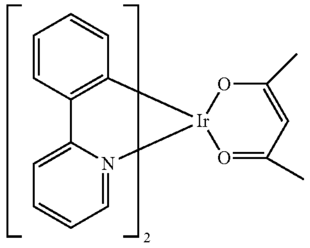
-continued
M-a15
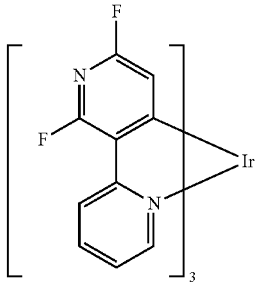
M-a16
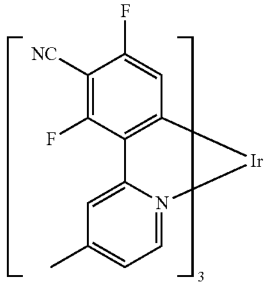
M-a17
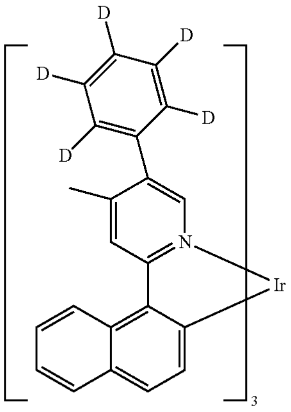
M-a18
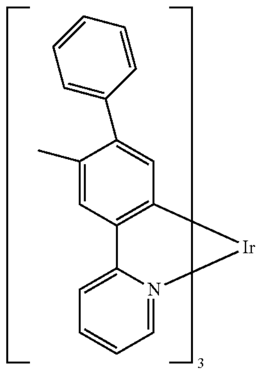

-continued

M-a19

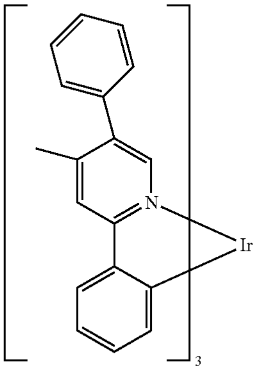

M-a20

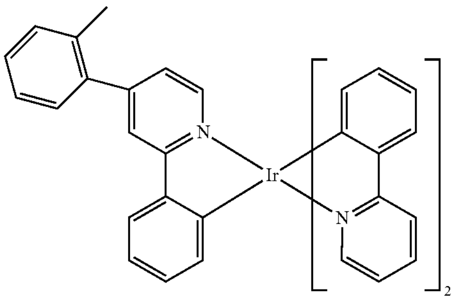

M-a21

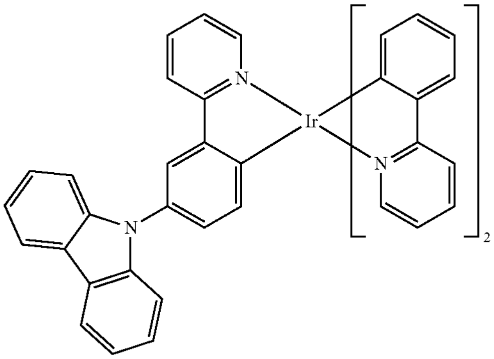

M-a22

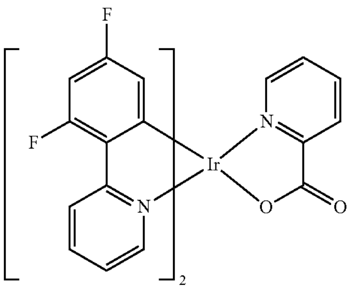

M-a23

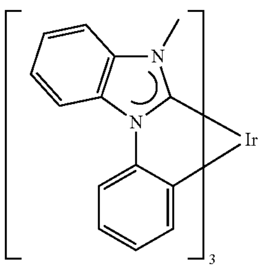

-continued

M-a24

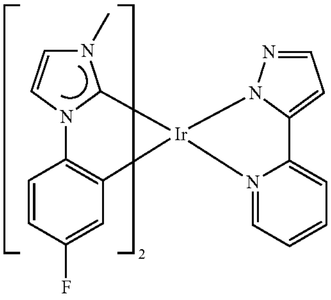

M-a25

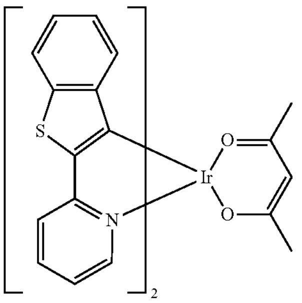

Compound M-a1 and Compound M-a2 may be used as a red dopant material, and Compound M-a3 to Compound M-a7 may be used as a green dopant material.

The emission layer EML may include a compound represented by Formula F-a or Formula F-b. The compound represented by Formula F-a or Formula F-b may be used as a fluorescent dopant material.

[Formula F-a]

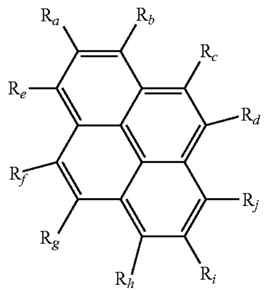

In Formula F-a, two of $R_a$ to may each independently be substituted with a group represented by $*\!-\!NAr_1Ar_2$. The remainder of $R_a$ to $R_j$ which are not substituted with the group represented by $*\!-\!NAr_1Ar_2$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In the group represented by $*\!-\!NAr_1Ar_2$, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. For example, at least one of $Ar_1$ or $Ar_2$ may be a heteroaryl group containing O or S as a ring-forming atom.

[Formula F-b]

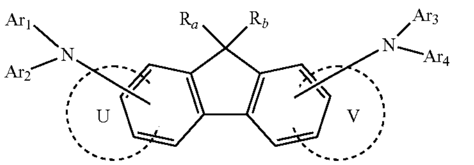

In Formula F-b, $R_a$ and $R_b$ may each independently be a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In Formula F-b, $Ar_1$ to $Ar_4$ may each independently be a substituted or unsubstituted aryl group having 6 to 30 ring-forming carbon atoms, or a substituted or unsubstituted heteroaryl group having 2 to 30 ring-forming carbon atoms.

In Formula F-b, U and V may each independently be a substituted or unsubstituted hydrocarbon ring having 5 to 30 ring-forming carbon atoms, or a substituted or unsubstituted heterocycle having 2 to 30 ring-forming carbon atoms.

In Formula F-b, the number of rings represented by U and V may each independently be 0 or 1. For example, in Formula F-b, when the number of U or V is 1, a fused ring may be present at a part indicated by U or V, and when the number of U or V is 0, a fused ring may be present at the part indicated by U or V. When the number of U is 0 and the number of V is 1, or when the number of U is 1 and the number of V is 0, a fused ring having a fluorene core of Formula F-b may be a cyclic compound having four rings. When the number of U and V is each 0, a fused ring having a fluorene core of Formula F-b may be a cyclic compound having three rings. When the number of U and V is each 1, a fused ring having a fluorene core of Formula F-b may be a cyclic compound having five rings.

In an embodiment, the emission layer EML may include a dopant material of the related art, such as styryl derivatives (e.g., 1,4-bis[2-(3-N-ethylcarbazolyl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi), 4,4'-bis[2-(4-(N,N-diphenylamino)phenyl)vinyl]biphenyl(DPAVBi), perylene and the derivatives thereof (e.g., 2,5,8,11-tetra-t-butylperylene (TBP)), pyrene and the derivatives thereof (e.g., 1,1-dipyrene, 1,4-dipyrenylbenzene, 1,4-bis(N,N-diphenylamino)pyrene), etc.

The emission layer EML may include a phosphorescent dopant material of the related art. For example, a metal complex containing iridium (Ir), platinum (Pt), osmium (Os), aurum (Au), titanium (Ti), zirconium (Zr), hafnium (Hf), europium (Eu), terbium (Tb), or thulium (Tm) may be used as a phosphorescent dopant. For example, iridium(III) bis(4,6-difluorophenylpyridinato-N,C2')picolinate (Flrpic), bis(2,4-difluorophenylpyridinato)-tetrakis(1-pyrazolyl)borate iridium(III) (Fir6), or platinum octaethyl porphyrin (PtOEP) may be used as a phosphorescent dopant. However, embodiments are not limited thereto.

Referring to FIGS. 3 to 6 again, the first electrode EL1 has conductivity. The first electrode EL1 may be formed of a metal material, a metal alloy, or a conductive compound. The first electrode EL1 may be an anode or a cathode. However, embodiments are not limited thereto. For example, the first electrode EL1 may be a pixel electrode. The first electrode EL1 may be a transmissive electrode, a transflective electrode, or a reflective electrode. The first electrode EL1 may include at least one of Ag, Mg, Cu, Al, Pt, Pd, Au, Ni, Nd, Ir, Cr, Li, Ca, LiF, Mo, Ti, W, In, Sn, Zn, an oxide thereof, a compound thereof, or a mixture thereof.

When the first electrode EL1 is a transmissive electrode, the first electrode EL1 may include a transparent metal oxide such as indium tin oxide (ITO), indium zinc oxide (IZO), zinc oxide (ZnO), or indium tin zinc oxide (ITZO). When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca (a stacked structure of LiF and Ca), LiF/Al (a stacked structure of LiF and Al), Mo, Ti, W, a compound thereof, or a mixture thereof (e.g., a mixture of Ag and Mg). In another embodiment, the first electrode EL1 may have a multilayer structure including a reflective film or a transflective film formed of the above-described materials, and a transmissive conductive film formed of ITO, IZO, ZnO, ITZO, etc. For example, the first electrode EL1 may have a three-layer structure of ITO/Ag/ITO, but embodiments are not limited thereto. The first electrode EL1 may include the above-described metal materials, combinations of at least two metal materials of the above-described metal materials, oxides of the above-described metal materials, or the like. A thickness of the first electrode EL1 may be in a range of about 700 Å to about 10,000 Å. For example, the thickness of the first electrode EL1 may be in a range of about 1,000 Å to about 3,000 Å.

The hole transport region HTR may be provided on the first electrode EL1. The hole transport region HTR may include at least one of a hole injection layer HIL, a hole transport layer HTL, a buffer layer (not shown), an emission-auxiliary layer (not shown), or an electron blocking layer EBL. A thickness of the hole transport region HTR may be, for example, in a range of about 50 Å to about 15,000 Å.

The hole transport region HTR may be a layer formed of a single material, a layer formed of different materials, or a structure including multiple layers formed of different materials.

For example, the hole transport region HTR may have a single layer structure of a hole injection layer HIL or a hole transport layer HTL, or may have a single layer structure formed of a hole injection material and a hole transport material. In other embodiments, the hole transport region HTR may have a single layer structure formed of different materials, or may have a structure in which a hole injection layer HIL/hole transport layer HTL, a hole injection layer HIL/hole transport layer HTL/buffer layer (not shown), a hole injection layer HIL/buffer layer (not shown), a hole transport layer HTL/buffer layer (not shown), or a hole injection layer HIL/hole transport layer HTL/electron blocking layer EBL are stacked in its respective stated order from the first electrode EL1, but embodiments are not limited thereto.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole transport region HTR may include a compound represented by Formula H-1:

[Formula H-1]

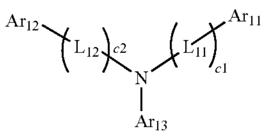

In Formula H-1, c1 and c2 may each independently be an integer from 0 to 10. In Formula H-1, $L_{11}$ and $L_{12}$ may each independently be a direct linkage, a substituted or unsubstituted arylene group having 6 to 30 ring-forming carbon atoms, or a substituted or unsubstituted heteroarylene group having 2 to 30 ring-forming carbon atoms.

In Formula H-1, $Ar_{11}$ and $Ar_{12}$ may each independently be a substituted or unsubstituted aryl group having 6 to 30 ring-forming carbon atoms, or a substituted or unsubstituted heteroaryl group having 2 to 30 ring-forming carbon atoms. In Formula H-1, $Ar_{13}$ may be a substituted or unsubstituted aryl group having 6 to 30 ring-forming carbon atoms.

In an embodiment, the compound represented by Formula H-1 may be a monoamine compound. In another embodiment, the compound represented by Formula H-1 may be a diamine compound in which at least one of $Ar_1$ to $Ar_2$ includes an amine group as a substituent. In still another embodiment, the compound represented by Formula H-1 may be a carbazole-based compound in which at least one of $Ar_1$ or $Ar_2$ includes a substituted or unsubstituted carbazole group, or a fluorene-based compound in which at least one of $Ar_1$ or $Ar_2$ includes a substituted or unsubstituted fluorene group.

The compound represented by Formula H-1 may be any one selected from Compound Group H. However, the compounds listed in Compound Group H are only examples, and the compounds represented by Formula H-1 are not limited to Compound Group H:

[Compound Group H ]

H-1-1

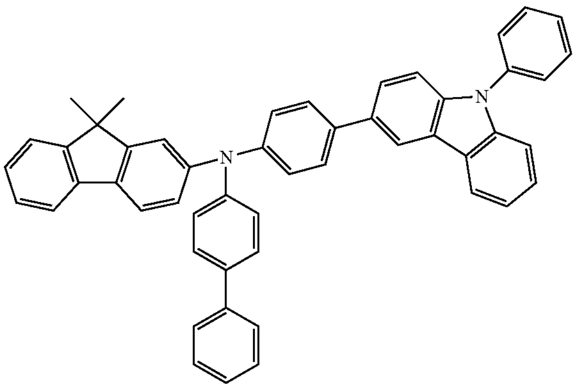

-continued

H-1-2

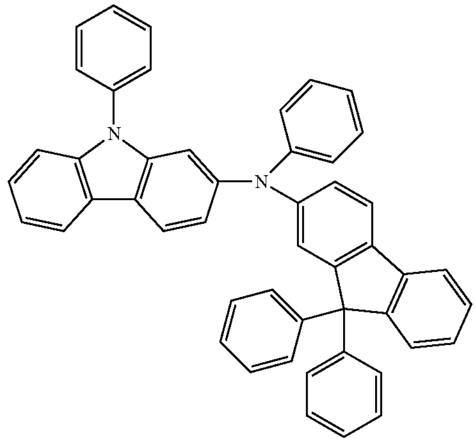

H-1-3

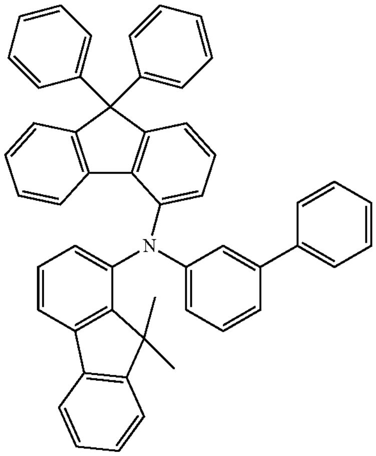

H-1-4

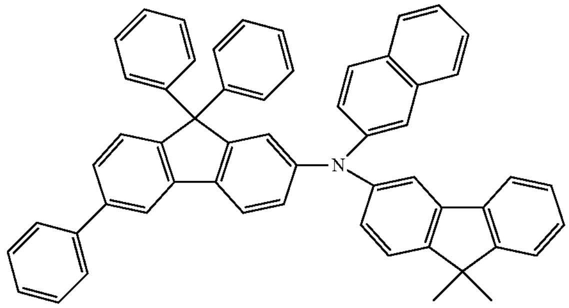

H-1-5

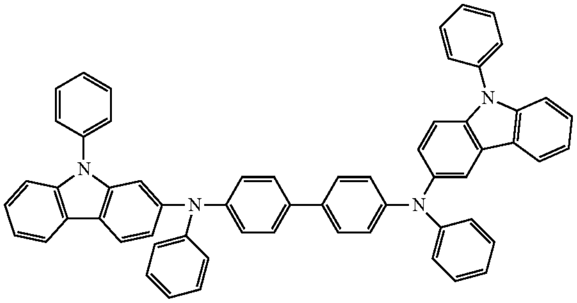

-continued
H-1-6
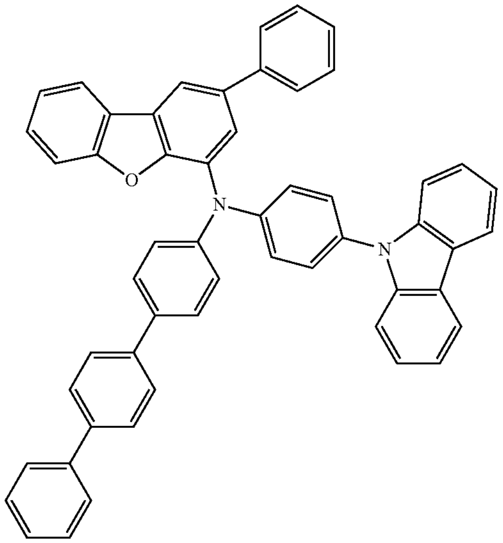
H-1-7
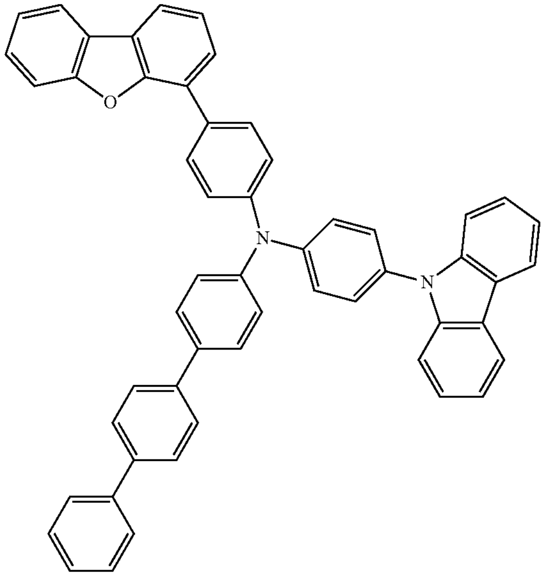
H-1-8
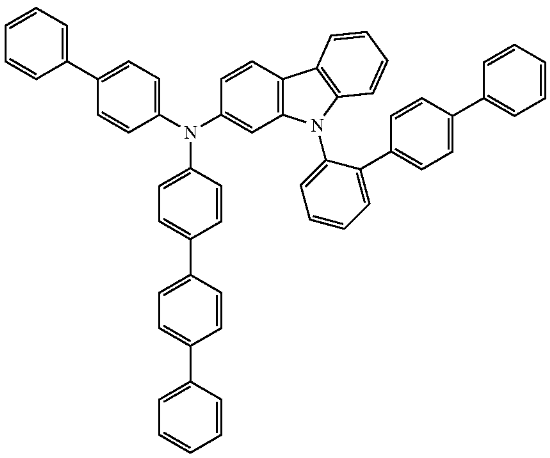
-continued
H-1-9
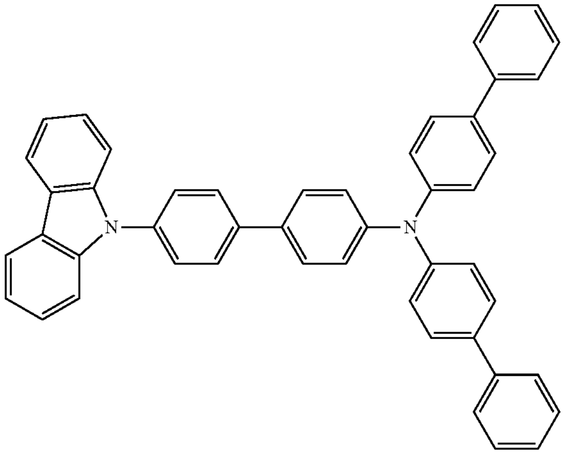
H-1-10
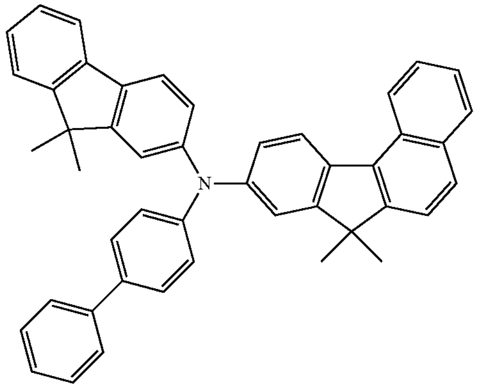
H-1-11
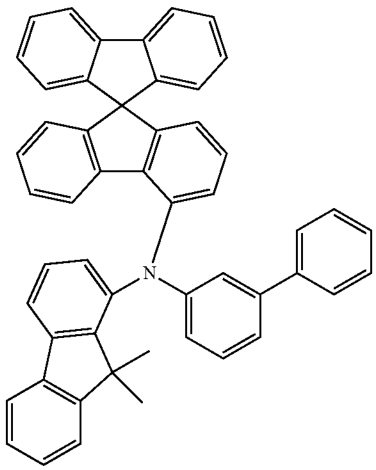

-continued
H-1-12
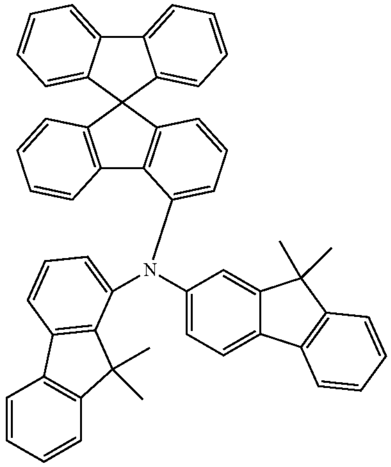
H-1-13
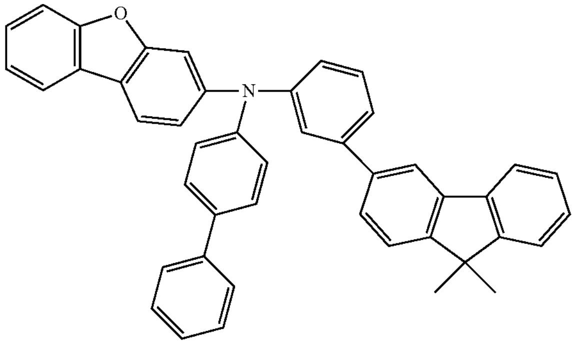
H-1-14
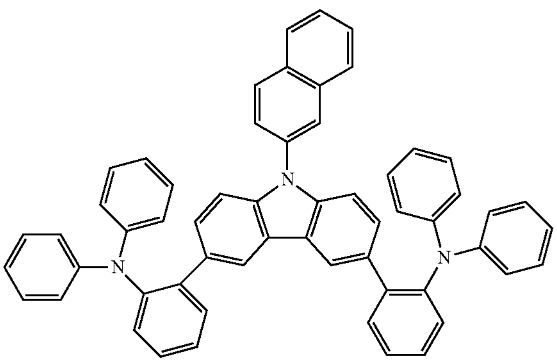
-continued
H-1-15
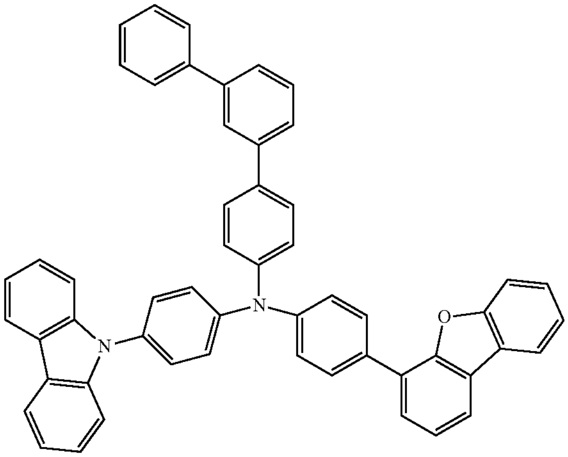
H-1-16
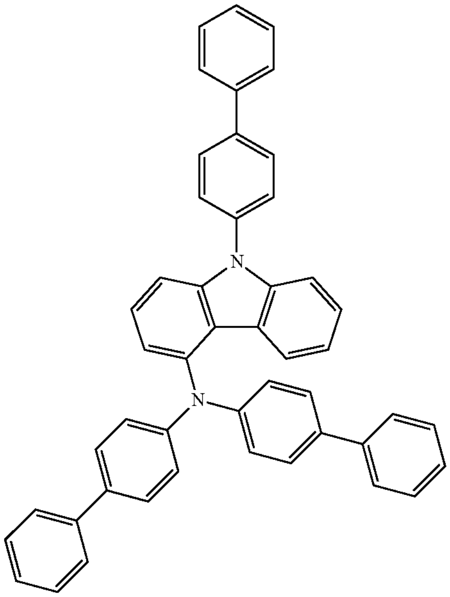
H-1-17
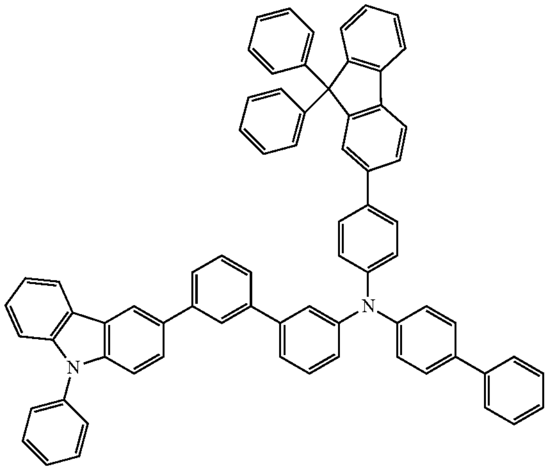

-continued

H-1-18

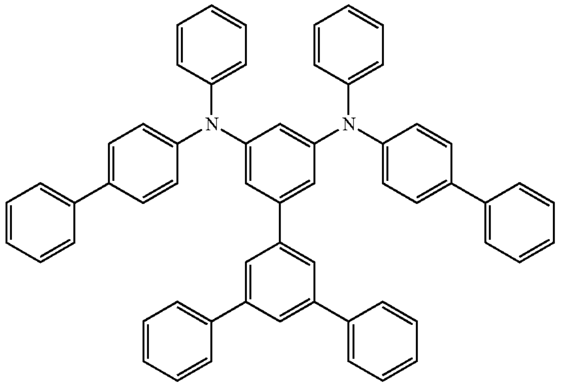

H-1-19

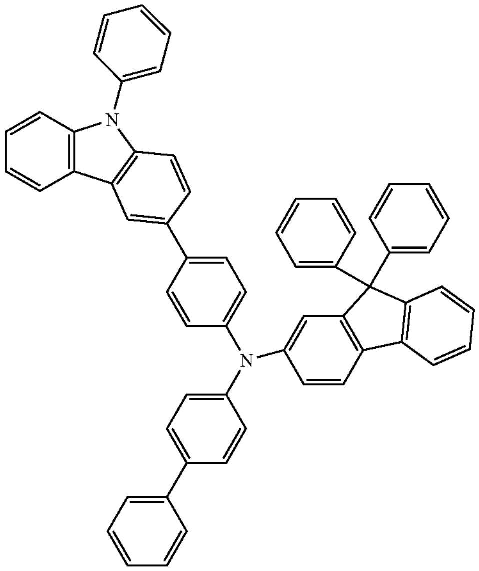

The hole transport region HTR may further include a phthalocyanine compound such as copper phthalocyanine; $N^1$,$N^{1'}$-([1,1'-biphenyl]-4,4'-diyl)bis($N^1$-phenyl-$N^4$,$N^4$-di-m-tolylbenzene-1,4-diamine) (DNTPD), 4,4',4"-[tris(3-methylphenyl)phenylamino]triphenylamine (m-MTDATA), 4,4',4"-tris(N,N-diphenyl amino)triphenylamine (TDATA), 4,4',4"-tris[N(2-naphthyl)-N-phenyl amino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], dipyrazino[2,3-f: 2',3'-h]quinoxaline-2,3,6,7,10,11-hexacarbonitrile (HATCN), etc.

The hole transport region HTR may include carbazole derivatives such as N-phenyl carbazole and polyvinyl carbazole, fluorene derivatives, N,N'-bis(3-methylphenyl)-N, N'-diphenyl-[1,1-biphenyl]-4,4'-diamine (TPD), triphenylamine derivatives such as 4,4',4"-tris(N-carbazolyl) triphenylamine (TCTA), N,N'-di(naphthalene-1-yl)-N,N'-diphenyl-benzidine (NPB), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 9-(4-tert-butylphenyl)-3,6-bis(triphenylsilyl)-9H-carbazole (CzSi), 9-phenyl-9H-3,9'-bicarbazole (CCP), 1,3-bis(N-carbazolyl) benzene (mCP), 1,3-bis(1,8-dimethyl-9H-carbazol-9-yl) benzene (mDCP), etc.

The hole transport region HTR may include the above-described compounds of the hole transport region in at least one of a hole injection layer HIL, a hole transport layer HTL, or an electron blocking layer EBL.

A thickness of the hole transport region HTR may be in a range of about 100 Å to about 10,000 Å. For example, the thickness of the hole transport region HTR may be in a range of about 100 Å to about 5,000 Å. When the hole transport region HTR includes a hole injection layer HIL, the hole injection layer HIL may have, for example, a thickness in a range of about 30 Å to about 1,000 Å. When the hole transport region HTR includes a hole transport layer HTL, the hole transport layer HTL may have a thickness in a range of about 30 Å to about 1,000 Å. When the hole transport region HTR includes an electron blocking layer EBL, the electron blocking layer EBL may have a thickness in a range of about 10 Å to about 1,000 Å. If the thicknesses of the hole transport region HTR, the hole injection layer HIL, the hole transport layer HTL, and the electron blocking layer EBL satisfy the above-described ranges, satisfactory hole transport properties may be achieved without a substantial increase in driving voltage.

The hole transport region HTR may further include a charge generating material to increase conductivity, in addition to the above-described materials. The charge generating material may be dispersed uniformly or non-uniformly in the hole transport region HTR. The charge generating material may be, for example, a p-dopant. The p-dopant may include at least one of a halogenated metal compound, a quinone derivative, a metal oxide, or a cyano group-containing compound, but embodiments are not limited thereto. For example, the p-dopant may include a metal halide compound such as CuI and RbI, a quinone derivative such as tetracyanoquinodimethane (TCNQ) and 2,3,5,6-tetrafluoro-7,7'8,8-tetracyanoquinodimethane (F4-TCNQ), a metal oxide such as tungsten oxide and molybdenum oxide, a cyano group-containing compound such as dipyrazino[2,3-f: 2',3'-h] quinoxaline-2,3,6,7,10,11-hexacarbonitrile (HATCN), 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9), etc., but embodiments are not limited thereto.

As described above, the hole transport region HTR may further include at least one of a buffer layer (not shown), an emission-auxiliary layer (not shown), or an electron blocking layer EBL in addition to the hole injection layer HIL and the hole transport layer HTL. The buffer layer (not shown) may compensate for a resonance distance according to a wavelength of light emitted from the emission layer EML and may thus increase light emission efficiency. A material that may be included in the hole transport region HTR may be used as a material included in the buffer layer (not shown). The electron blocking layer EBL may prevent electrons from being injected from the electron transport region ETR to the hole transport region HTR. The emission-auxiliary layer (not shown) may improve charge balance between holes and electrons. When the hole transport region HTR includes an electron blocking layer EBL, the electron blocking layer EBL may include the function of an emission-auxiliary layer.

The electron transport region ETR is disposed on the emission layer EML. The electron transport region ETR may include at least one of a hole blocking layer HBL, an electron transport layer ETL, or an electron injection layer EIL, but embodiments are not limited thereto.

The electron transport region ETR may be a layer formed of a single material, a layer formed of different materials, or a structure including multiple layers formed of different materials.

For example, the electron transport region ETR may have a single layer structure of an electron injection layer EIL or an electron transport layer ETL, or may have a single layer structure formed of an electron injection material and an electron transport material. In other embodiments, the electron transport region ETR may have a single layer structure formed of different materials, or may have a structure in which an electron transport layer ETL/electron injection layer EIL, or a hole blocking layer HBL/electron transport layer ETL/electron injection layer EIL are stacked in its respective stated order from the emission layer EML, but embodiments are not limited thereto. The electron transport region ETR may have a thickness, for example, in a range of about 1,000 Å to about 1,500 Å.

The electron transport region ETR may be formed by using various methods such as a vacuum deposition method, a spin coating method, a cast method, a Langmuir-Blodgett (LB) method, an inkjet printing method, a laser printing method, a laser induced thermal imaging (LITI) method, etc.

The electron transport region ETR may include the third compound as described above. The third compound may be represented by Formula ET-1.

The electron transport region ETR may include an anthracene-based compound. However, embodiments are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris (3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate ($Bebq_2$), 9,10-di(naphthalene-2-yl) anthracene (ADN), 1,3-Bis[3,5-di(pyridin-3-yl)phenyl] benzene (BmPyPhB), or a mixture thereof.

The electron transport region ETR may include a metal halide such as LiF, NaCl, CsF, RbCl, RbI, CuI, or KI, a lanthanide metal such as Yb, or a co-deposited material of the metal halide and the lanthanide metal. For example, the electron transport region ETR may include KI:Yb, RbI:Yb, LiF:Yb, etc. as a co-deposited material. The electron transport region ETR may be formed of a metal oxide such as $Li_2O$ or BaO, or 8-hydroxyl-lithium quinolate (Liq), etc., but embodiments are not limited thereto. The electron transport region ETR may also be formed of a mixture material of an electron transport material and an insulating organometallic salt. The organometallic salt may be a material having an energy band gap equal to or greater than about 4 eV. For example, the organometallic salt may include a metal acetate, a metal benzoate, a metal acetoacetate, a metal acetylacetonate, or a metal stearate.

The electron transport region ETR may further include at least one of 2,9-dimethyl-4,7-diphenyl-1,10-phenanthroline (BCP), diphenyl(4-(triphenyl silyl)phenyl)phosphine oxide (TSP01), or 4,7-diphenyl-1,10-phenanthroline (Bphen) in addition to the above-described materials, but embodiments are not limited thereto.

The electron transport region ETR may include the above-described compounds of the electron transport region in at least one of an electron injection layer EIL, an electron transport layer ETL, or a hole blocking layer HBL.

When the electron transport region ETR includes an electron transport layer ETL, the electron transport layer ETL may have a thickness in a range of about 100 Å to about 1,000 Å. For example, the electron transport layer ETL may have a thickness in a range of about 150 Å to about 500 Å. If the thickness of the electron transport layer ETL satisfies the aforementioned range, satisfactory electron transport characteristics may be obtained without a substantial increase in driving voltage. When the electron transport region ETR includes an electron injection layer EIL, the electron injection layer EIL may have a thickness in a range of about 1 Å to about 100 Å. For example, the electron injection layer EIL may have a thickness in a range of about 3 Å to about 90 Å. If the thickness of the electron injection layer EIL satisfies the above-described range, satisfactory electron injection characteristics may be obtained without a substantial increase in driving voltage.

The second electrode EL2 is provided on the electron transport region ETR. The second electrode EL2 may be a common electrode. The second electrode EL2 may be a cathode or an anode, but embodiments are not limited thereto. For example, when the first electrode EL1 is an anode, the second electrode EL2 may be a cathode, and when the first electrode EL1 is a cathode, the second electrode EL2 may be an anode. The second electrode EL2 may include at least one of Ag, Mg, Cu, A1, Pt, Pd, Au, Ni, Nd, Ir, Cr, Li, Ca, LiF, Mo, Ti, W, In, Sn, Zn, an oxide thereof, a compound thereof, or a mixture thereof.

The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, a compound thereof, or a mixture thereof (e.g., AgMg, AgYb, or MgYb). In another embodiment, the second electrode EL2 may have a multilayer structure including a reflective film or a transflective film formed of the above-described materials, and a transmissive conductive film formed of ITO, IZO, ZnO, ITZO, etc. For example, the second electrode EL2 may include the above-described metal materials, combinations of at least two metal materials of the above-described metal materials, oxides of the above-described metal materials, or the like.

Although not shown in the drawings, the second electrode EL2 may be electrically connected to an auxiliary electrode. If the second electrode EL2 is electrically connected to the auxiliary electrode, the resistance of the second electrode EL2 may decrease.

In an embodiment, the light emitting element ED may further include a capping layer CPL disposed on the second electrode EL2. The capping layer CPL may be a multilayer or a single layer.

In an embodiment, the capping layer CPL may include an organic layer or an inorganic layer. For example, when the capping layer CPL include an inorganic material, the inorganic material may include an alkaline metal compound (for example, LiF), an alkaline earth metal compound (for example, $MgF_2$), SiON, $SiN_x$, SiOy, etc.

For example, when the capping layer CPL includes an organic material, the organic material may include α-NPD, NPB, TPD, m-MTDATA, $Alq_3$, CuPc, N4,N4,N4',N4'-tetra (biphenyl-4-yl)biphenyl-4,4'-diamine (TPD15), 4,4',4"-tris (carbazol-9-yl)triphenylamine (TCTA), etc., or may include an epoxy resin, or an acrylate such as methacrylate. However, embodiments are not limited thereto, and the capping layer CPL may include at least one of Compounds P1 to P5:

P1

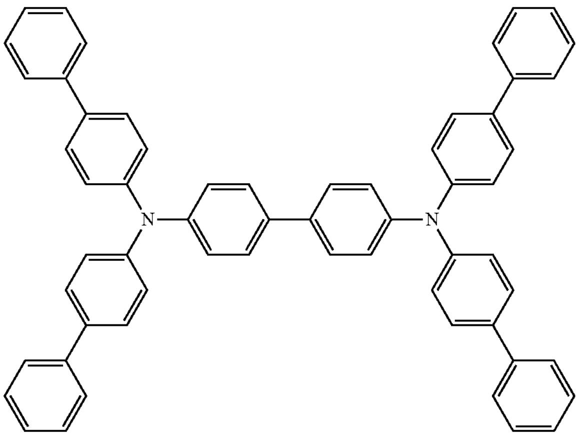

P2

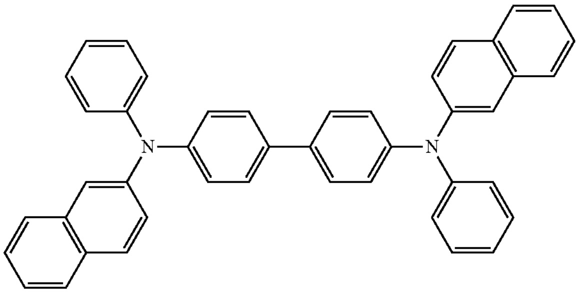

P3

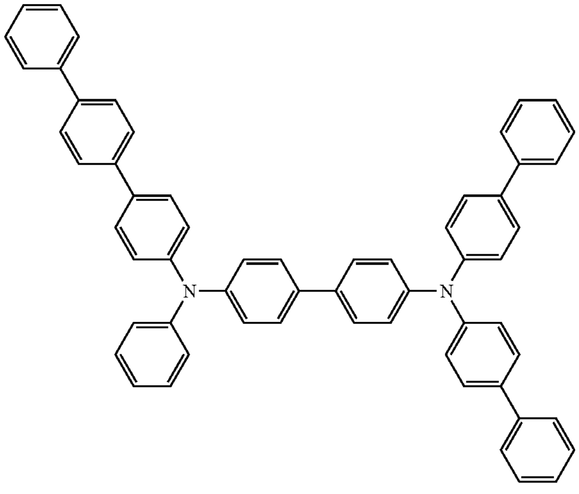

-continued

P4

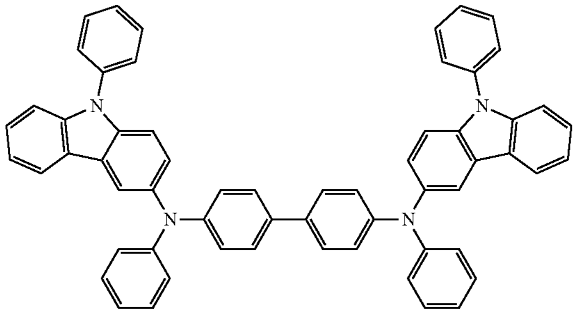

P5

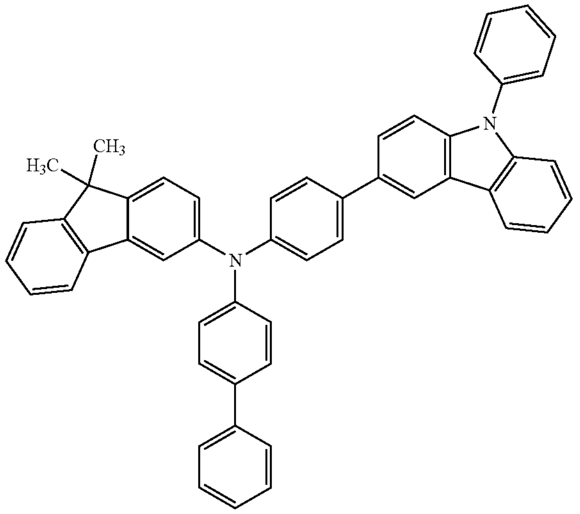

A refractive index of the capping layer CPL may be equal to or greater than about 1.6. For example, the refractive index of the capping layer CPL may be equal to or greater than about 1.6 with respect to light in a wavelength range of about 550 nm to about 660 nm.

FIGS. 7 to 10 each are a schematic cross-sectional view of a display device according to an embodiment. Hereinafter, in describing the display devices of embodiments with reference to FIGS. 7 to 10, the features which overlap with the description of FIGS. 1 to 6 will not be described again, but the differing features will be described.

Figure 7:
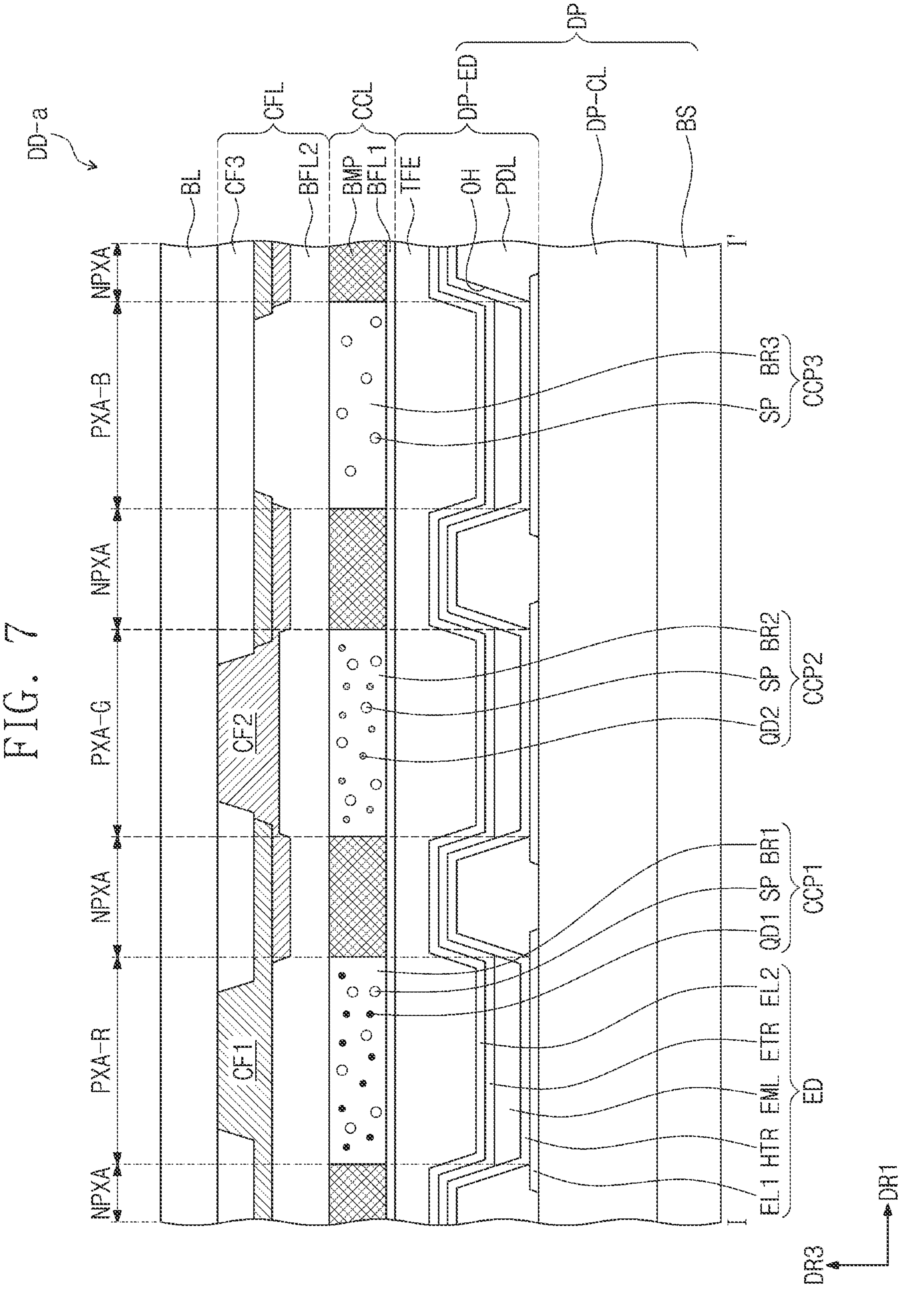
FIG. 7 is a schematic cross-sectional view illustrating a display device according to an embodiment.

Referring to FIG. 7, a display device DD according to an embodiment may include a display panel DP including a display element layer DP-ED, a light control layer CCL disposed on the display panel DP, and a color filter layer CFL.

In an embodiment illustrated in FIG. 7, the display panel DP may include a base layer BS, a circuit layer DP-CL provided on the base layer BS, and the display element layer DP-ED, and the display element layer DP-ED may include a light emitting element ED.

The light emitting element ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. A structure of the light emitting element ED illustrated in FIG. 7 may be the same as a structure of a light emitting element according to FIGS. 3 to 6.

Referring to FIG. 7, the emission layer EML in the display device DD-a may be disposed in an opening OH defined in a pixel defining film PDL. For example, the emission layer EML which is divided by the pixel defining film PDL and provided corresponding to each of the light emitting regions PXA-R, PXA-G, and PXA-B may emit light in a same wavelength range. In the display device DD-a of an embodiment, the emission layer EML may emit blue light. Although not shown in the drawings, in an embodiment, the emission layer EML may be provided as a common layer for all of the light emitting regions PXA-R, PXA-G, and PXA-B.

The light control layer CCL may be disposed on the display panel DP. The light control layer CCL may include a light conversion body. The light conversion body may be a quantum dot, a phosphor, or the like. The light conversion body may convert the wavelength of a provided light, and may emit the resulting light. For example, the light control layer CCL may be a layer containing a quantum dot or a layer containing a phosphor.

The light control layer CCL may include light control parts CCP1, CCP2, and CCP3. The light control parts CCP1, CCP2, and CCP3 may be spaced apart from each other.

Referring to FIG. 7, dividing patterns BMP may be disposed between the light control parts CCP1, CCP2, and CCP3 which are spaced apart from each other, but embodiments are not limited thereto. FIG. 7 illustrates that the dividing patterns BMP do not overlap the light control parts CCP1, CCP2, and CCP3, but at least a portion of the edges of the light control parts CCP1, CCP2, and CCP3 may overlap the dividing patterns BMP.

The light control layer CCL may include a first light control part CCP1 containing a first quantum dot QD1 which converts first color light provided from the light emitting element ED into second color light, a second light control part CCP2 containing a second quantum dot QD2 which converts the first color light into third color light, and a third light control part CCP3 which transmits the first color light.

In an embodiment, the first light control part CCP1 may provide red light that is the second color light, and the second light control part CCP2 may provide green light that is the third color light. The third light control part CCP3 may provide blue light by transmitting the blue light that is the first color light provided from the light emitting element ED. For example, the first quantum dot QD1 may be a red quantum dot, and the second quantum dot QD2 may be a green quantum dot.

The quantum dot may be selected from a Group II-VI compound, a Group III-VI compound, a Group compound, a Group III-V compound, a Group III-II-V compound, a Group IV-VI compound, a Group IV element, a Group IV compound, or a combination thereof.

The Group II-VI compound may be selected from: a binary compound selected from the group consisting of CdSe, CdTe, CdS, ZnS, ZnSe, ZnTe, ZnO, HgS, HgSe, HgTe, MgSe, MgS, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof; or any combination thereof.

The Group III-VI compound may include: a binary compound such as $In_2S_3$ and $In_2Se_3$; a ternary compound such as $InGaS_3$ and $InGaSe_3$; or any combination thereof.

The Group compound may be selected from: a ternary compound selected from the group consisting of AgInS, $AgInS_2$, CuInS, $CuInS_2$, $AgGaS_2$, $CuGaS_2$ $CuGaO_2$, $AgGaO_2$, $AgAlO_2$, and a mixture thereof; a quaternary compound such as $AgInGaS_2$ and $CuInGaS_2$; or any combination thereof.

The Group III-V compound may be selected from: a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof; a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof; or any combination thereof. The Group III-V compound may further include a Group II metal. For example, InZnP, etc. may be selected as a Group III-II-V compound.

The Group IV-VI compound may be selected from: a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; a quaternary compound selected from the group consisting of SnPbSSe, SnPbSeTe, SnPbSTe, and a mixture thereof; or any combination thereof. The Group IV element may be selected from the group consisting of Si, Ge, and a mixture thereof. The Group IV compound may be a binary compound selected from the group consisting of SiC, SiGe, and a mixture thereof.

A binary compound, a ternary compound, or a quaternary compound may be present in a particle at a uniform concentration distribution, or may be present in a particle at a partially different concentration distribution. In an embodiment, a quantum dot may have a core/shell structure in which a quantum dot surrounds another quantum dot. A quantum dot having a core/shell structure may have a concentration gradient in which the concentration of an element that is present in the shell decreases toward the core.

In embodiments, a quantum dot may have a core-shell structure including a core containing nanocrystals and a shell surrounding the core. The shell of the quantum dot may serve as a protection layer that prevents chemical deformation of the core so as to maintain semiconductor properties, and/or may serve as a charging layer that imparts electrophoretic properties to the quantum dot. The shell may be a single layer or a multilayer. An example of the shell of the quantum dot may include a metal oxide, a non-metal oxide, a semiconductor compound, or a combination thereof.

For example, the metal oxide or the non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$, but embodiments are not limited thereto.

The semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments are not limited thereto.

The quantum dot may have a full width of half maximum (FWHM) of a light emission wavelength spectrum equal to or less than about 45 nm. For example, the quantum dot may have a FWHM of a light emission wavelength spectrum equal to or less than about 40 nm. For example, the quantum dot may have a FWHM of a light emission wavelength spectrum equal to or less than about 30 nm. Color purity or color reproducibility may be improved in the above ranges. Light emitted through a quantum dot may be emitted in all directions, so that a wide viewing angle may be improved.

The form of a quantum dot may be any form that is used in the related art, without limitation. For example, the quantum dot may have a spherical shape, a pyramidal shape, a multi-arm shape, or a cubic shape, or the quantum dot may be in the form of nanoparticles, nanotubes, nanowires, nanofibers, nanoparticles, etc.

The quantum dot may control the color of emitted light according to a particle size thereof, and accordingly, the quantum dot may have various emission colors such as blue, red, and green.

The light control layer CCL may further include a scatterer SP. The first light control part CCP1 may include the first quantum dot QD1 and the scatterer SP, the second light control part CCP2 may include the second quantum dot QD2 and the scatterer SP, and the third light control part CCP3 may not include a quantum dot but may include the scatterer SP.

The scatterer SP may be inorganic particles. For example, the scatterer SP may include at least one of $TiO_2$, ZnO, $Al_2O_3$, $SiO_2$, or hollow silica. The scatterer SP may include any one of $TiO_2$, ZnO, $Al_2O_3$, $SiO_2$, or hollow silica, or may be a mixture of at least two materials selected from $TiO_2$, ZnO, $Al_2O_3$, $SiO_2$, and hollow silica.

The first light control part CCP1, the second light control part CCP2, and the third light control part CCP3 may each include base resins BR1, BR2, and BR3 in which the quantum dots QD1 and QD2 and the scatterer SP are dispersed. In an embodiment, the first light control part CCP1 may include the first quantum dot QD1 and the scatterer SP dispersed in a first base resin BR1, the second light control part CCP2 may include the second quantum dot QD2 and the scatterer SP dispersed in a second base resin BR2, and the third light control part CCP3 may include the scatterer SP dispersed in a third base resin BR3. The base resins BR1, BR2, and BR3 may each be a medium in which the quantum dots QD1 and QD2 and the scatterer SP are dispersed, and may be formed of various resin compositions, which may be generally referred to as a binder. For example, the base resins BR1, BR2, and BR3 may each independently be acrylic-based resins, urethane-based resins, silicone-based resins, epoxy-based resins, etc. The base resins BR1, BR2, and BR3 may each be transparent resins. In an embodiment, the first base resin BR1, the second base resin BR2, and the third base resin BR3 may be the same as or different from each other.

The light control layer CCL may include a barrier layer BFL1. The barrier layer BFL1 may prevent the penetration of moisture and/or oxygen (hereinafter, referred to as 'moisture/oxygen'). The barrier layer BFL1 may block the light control parts CCP1, CCP2 and CCP3 from being exposed to moisture/oxygen. The barrier layer BFL1 may cover the light control parts CCP1, CCP2, and CCP3. A barrier layer BFL2 may be provided between the light control parts CCP1, CCP2, and CCP3 and a color filter layer CFL.

The barrier layers BFL1 and BFL2 may include at least one inorganic layer. For example, the barrier layers BFL1 and BFL2 may each include an inorganic material. For example, the barrier layers BFL1 and BFL2 may include a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride, a metal thin film which secures transmittance, etc. The barrier layers BFL1 and BFL2 may each further include an organic layer. The barrier layers BFL1 and BFL2 may each be formed of a single layer or of multiple layers.

In the display device DD-a of an embodiment, the color filter layer CFL may be disposed on the light control layer CCL. In an embodiment, the color filter layer CFL may be directly disposed on the light control layer CCL. For example, the barrier layer BFL2 may be omitted.

The color filter layer CFL may include filters CF1, CF2, and CF3. The color filter layer CFL may include a first filter CF1 that transmits second color light, a second filter CF2 that transmits third color light, and a third filter CF3 that transmits first color light. For example, the first filter CF1 may be a red filter, the second filter CF2 may be a green filter, and the third filter CF3 may be a blue filter. The filters CF1, CF2, and CF3 may each include a polymeric photosensitive resin and a pigment or dye. The first filter CF1 may include a red pigment or dye, the second filter CF2 may include a green pigment or dye, and the third filter CF3 may include a blue pigment or dye. However, embodiments are not limited thereto, and the third filter CF3 may not include a pigment or dye. The third filter CF3 may include a polymeric photosensitive resin and may not include a pigment or dye. The third filter CF3 may be transparent. The third filter CF3 may be formed of a transparent photosensitive resin.

In an embodiment, the first filter CF1 and the second filter CF2 may each be a yellow filter. The first filter CF1 and the second filter CF2 may not be separated but may be provided as one filter. The first to third filters CF1, CF2, and CF3 may be disposed corresponding to the red light emitting region PXA-R, the green light emitting region PXA-G, and the blue light emitting region PXA-B, respectively.

A base substrate BL may be disposed on the color filter layer CFL. The base substrate BL may provide a base surface on which the color filter layer CFL, the light control layer CCL, and the like are disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawings, in an embodiment, the base substrate BL may be omitted.

Figure 8:
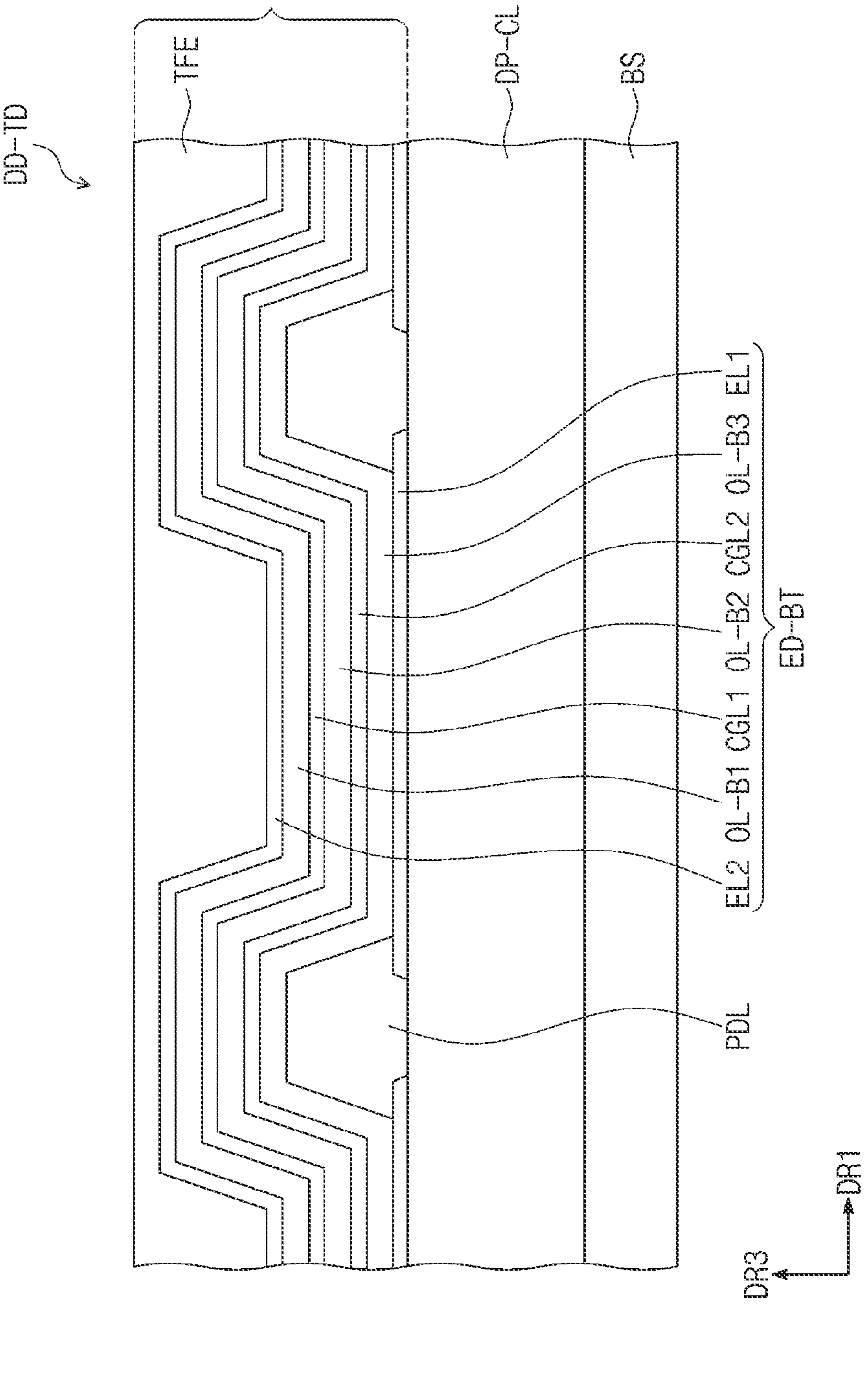
FIG. 8 is a schematic cross-sectional view illustrating a display device according to an embodiment.

FIG. 8 is a schematic cross-sectional view illustrating a portion of a display device according to an embodiment. FIG. 8 illustrates a schematic cross-sectional view of a part corresponding to the display panel DP of FIG. 7.

In the display device DD-TD of an embodiment, the light emitting element ED-BT may include light emitting structures OL-B1, OL-B2, and OL-B3. The light emitting element ED-BT may include a first electrode EL1 and a second electrode EL2 which face each other, and the light emitting structures OL-B1, OL-B2, and OL-B3 stacked in a thickness direction between the first electrode EL1 and the second electrode EL2. The light emitting structures OL-B1, OL-B2, and OL-B3 may each include an emission layer EML (FIG. 7) and a hole transport region HTR and an electron transport region ETR disposed with the emission layer EML (FIG. 7) therebetween.

For example, the light emitting element ED-BT included in the display device DD-TD of an embodiment may be a light emitting element having a tandem structure and including multiple emission layers.

In an embodiment illustrated in FIG. 8, light emitted from each of the light emitting structures OL-B1, OL-B2, and OL-B3 may a11 be blue light. However, embodiments are not limited thereto, and light respectively emitted from the light emitting structures OL-B1, OL-B2, and OL-B3 may have wavelength ranges different from each other. For example, the light emitting element ED-BT including the light emitting structures OL-B1, OL-B2, and OL-B3 which emit light having wavelength ranges different from each other may emit white light.

Charge generation layers CGL1 and CGL2 may be disposed between neighboring light emitting structures OL-B1, OL-B2, and OL-B3. The charge generation layers CGL1 and CGL2 may each independently include a p-type charge generation layer and/or an n-type charge generation layer.

Figure 9:
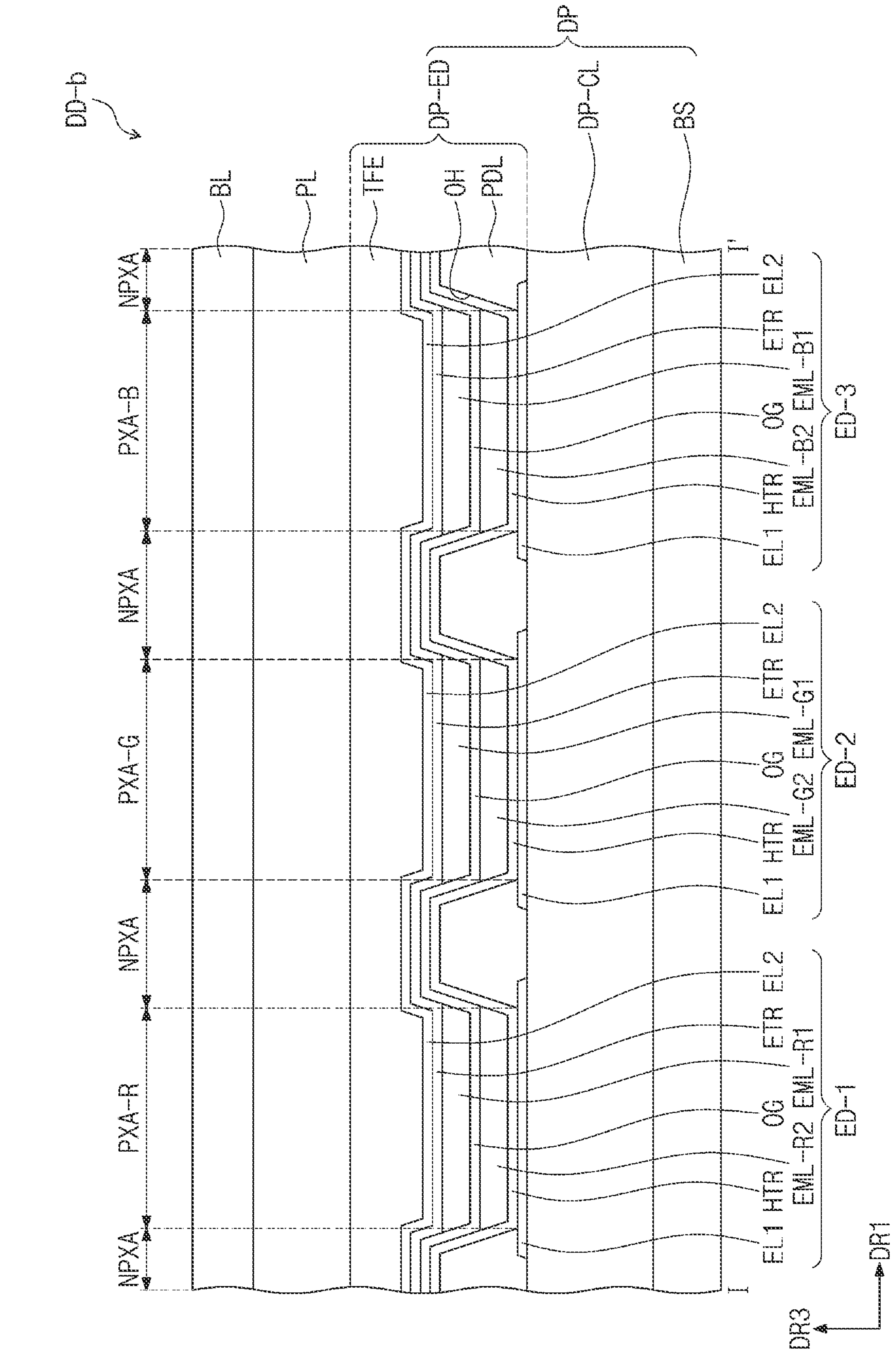
FIG. 9 is a schematic cross-sectional view illustrating a display device according to an embodiment.

Referring to FIG. 9, a display device DD-b may include light emitting elements ED-1, ED-2, and ED-3 which each include two emission layers that are stacked. In contrast to the display device DD shown in FIG. 2, FIG. 9 illustrates that two emission layers are provided in each of the first to third light emitting elements ED-1, ED-2, and ED-3. In each of the first to third light emitting elements ED-1, ED-2, and ED-3, the two emission layers may emit light in a same wavelength region.

The first light emitting element ED-1 may include a first red emission layer EML-R1 and a second red emission layer EML-R2. The second light emitting element ED-2 may include a first green emission layer EML-G1 and a second green emission layer EML-G2. The third light emitting element ED-3 may include a first blue emission layer EML-B1 and a second blue emission layer EML-B2. An emission auxiliary part OG may be disposed between the first red emission layer EML-R1 and the second red emission layer EML-R2, between the first green emission layer EML-G1 and the second green emission layer EML-G2, and between the first blue emission layer EML-B1 and the second blue emission layer EML-B2.

The emission auxiliary part OG may be a single layer or a multilayer. The emission auxiliary part OG may include a charge generation layer. For example, the emission auxiliary part OG may include an electron transport region, a charge generation layer, and a hole transport region that are stacked in that order. The emission auxiliary part OG may be provided as a common layer for all of the first to third light emitting elements ED-1, ED-2, and ED-3. However, embodiments are not limited thereto, and the emission auxiliary part OG may be provided by being patterned within the openings OH defined in the pixel defining film PDL.

The first red emission layer EML-R1, the first green emission layer EML-G1, and the first blue emission layer EML-B1 may each be disposed between the electron transport region ETR and the emission auxiliary part OG. The second red emission layer EML-R2, the second green emission layer EML-G2, and the second blue emission layer EML-B2 may each be disposed between the emission auxiliary part OG and the hole transport region HTR.

For example, the first light emitting element ED-1 may include the first electrode EL1, the hole transport region HTR, the second red emission layer EML-R2, the emission auxiliary part OG, the first red emission layer EML-R1, the electron transport region ETR, and the second electrode EL2, stacked in that order. The second light emitting element ED-2 may include the first electrode EL1, the hole transport region HTR, the second green emission layer EML-G2, the emission auxiliary part OG, the first green emission layer EML-G1, the electron transport region ETR, and the second electrode EL2, stacked in that order. The third light emitting element ED-3 may include the first electrode EL1, the hole transport region HTR, the second blue emission layer EML-B2, the emission auxiliary part OG, the first blue emission layer EML-B1, the electron transport region ETR, and the second electrode EL2, stacked in that order.

An optical auxiliary layer PL may be disposed on the display element layer DP-ED. The optical auxiliary layer PL may include a polarizing layer. The optical auxiliary layer PL may be disposed on the display panel DP and may control light reflected at the display panel DP from an external light. Although not shown in the drawings, in an embodiment, the optical auxiliary layer PL may be omitted from the display device DD-b.

Figure 10:
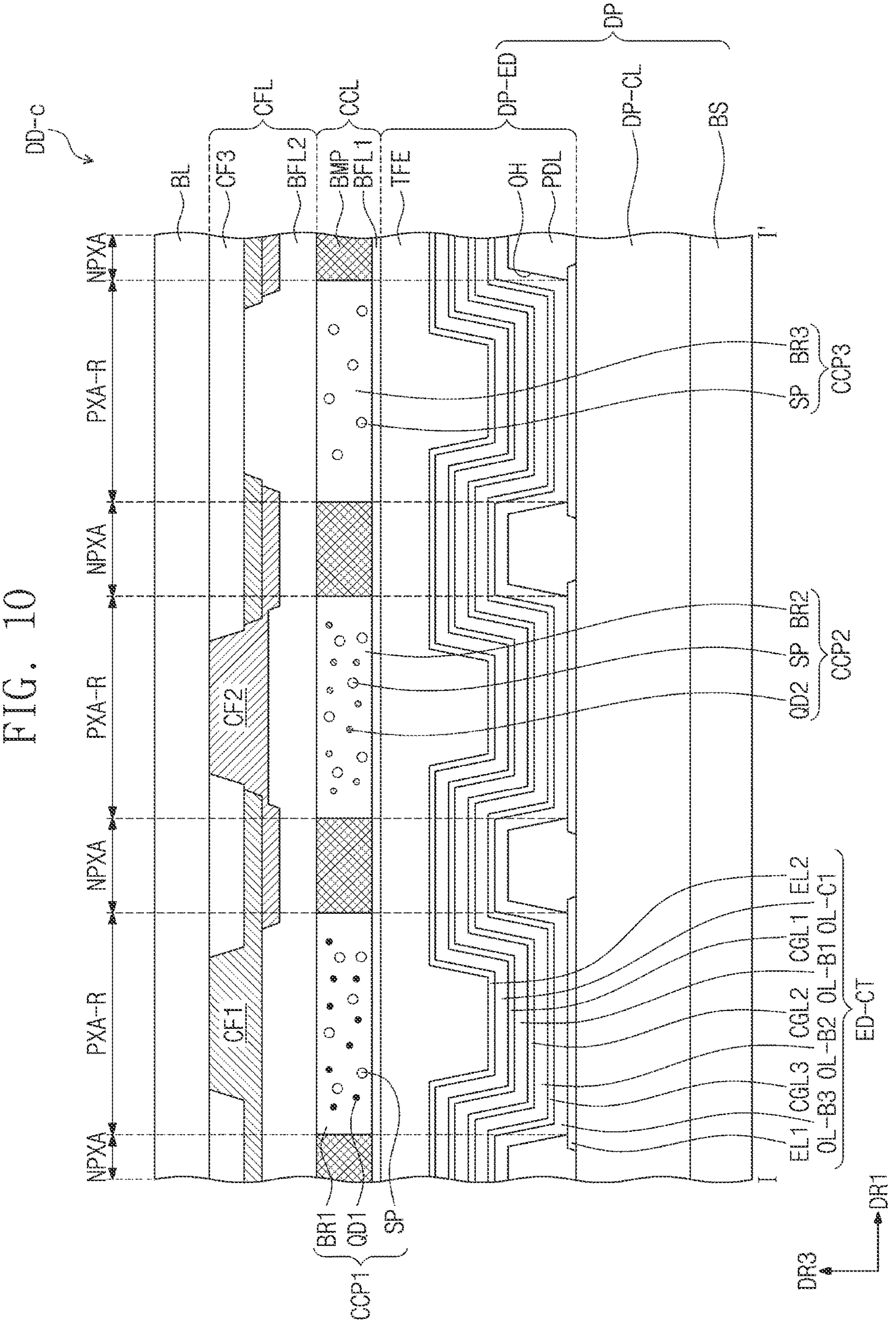
FIG. 10 is a schematic cross-sectional view illustrating a display device according to an embodiment.

In contrast to FIGS. 7 and 8, FIG. 10 illustrates a display device DD-c that is different at least in that it includes four light emitting structures OL-B1, OL-B2, OL-B3, and OL-C1. A light emitting element ED-CT may include a first electrode EL1 and a second electrode EL2 which face each other, and first to fourth light emitting structures OL-B1, OL-B2, OL-B3, and OL-C1 that are stacked in a thickness direction between the first electrode EL1 and the second electrode EL2. Charge generation layers CGL1, CGL2, and CGL3 may be disposed between the first to fourth light emitting structures OL-B1, OL-B2, OL-B3, and OL-C1. Among the four light emitting structures, the first to third light emitting structures OL-B1, OL-B2, and OL-B3 may each emit blue light, and the fourth light emitting structure OL-C1 may emit green light. However, embodiments are not limited thereto, and the first to fourth light emitting structures OL-B1, OL-B2, OL-B3, and OL-C1 may emit light in wavelength regions that are different from each other.

Hereinafter, a polycyclic compound according to an embodiment and a light emitting element according to an embodiment will be described in detail with reference to the Examples and to the Comparative Examples. The Examples described below are only provided as illustrations to assist in understanding the disclosure, and the scope thereof is not limited thereto.

Examples

1. Synthesis of Polycyclic Compound of Example

A synthesis method of the polycyclic compound according to an embodiment will be described in detail by illustrating synthesis methods of Compounds 18, 27, 51, 57, 81, and 91. In the following descriptions, the synthesis method of the polycyclic compound is provided as an example, but the synthesis method of the compound according to an embodiment is not limited to the Examples below. A yield in the following synthesis methods is that the mole number of used reactants (1 eq) is divided by the mole number of an obtained compound. The mole number of the obtained compound is that the mass of the obtained compound is divided by the molecular weight of the obtained compound.

(1) Synthesis of Compound 18

Polycyclic Compound 18 according to an example may be synthesized by, for example, the steps shown in Reaction Scheme 1:

[Reaction Scheme 1]
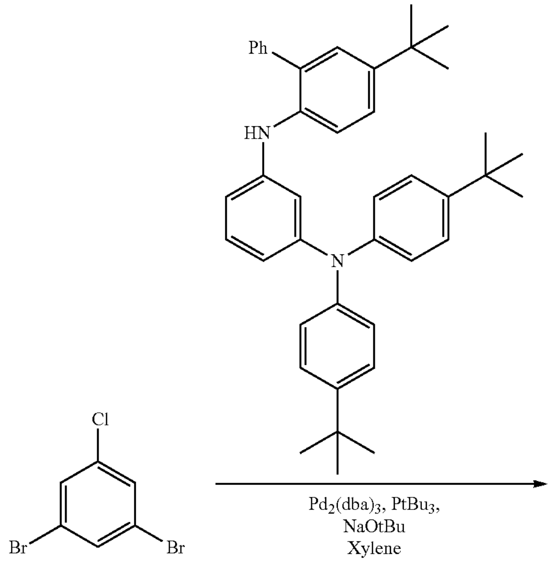
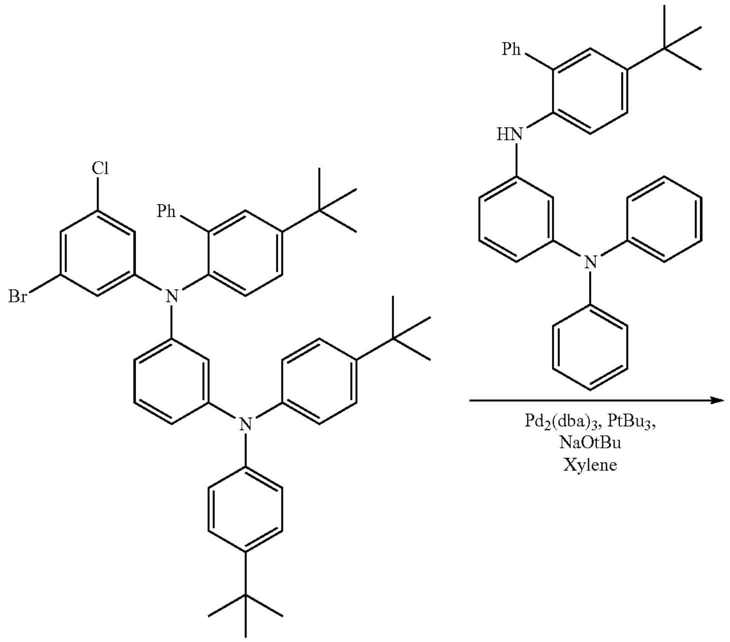
18-11

-continued
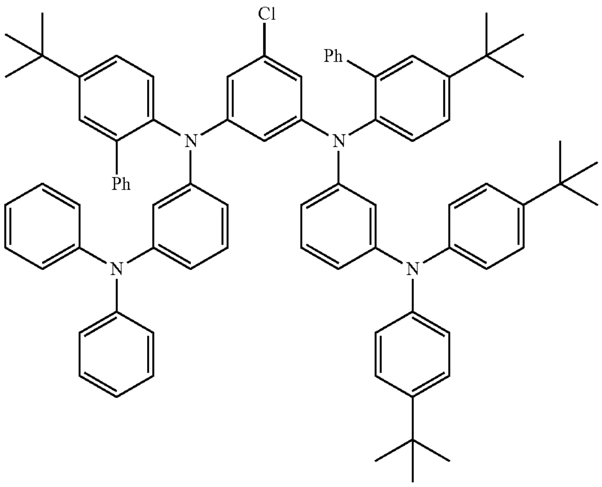
18-2
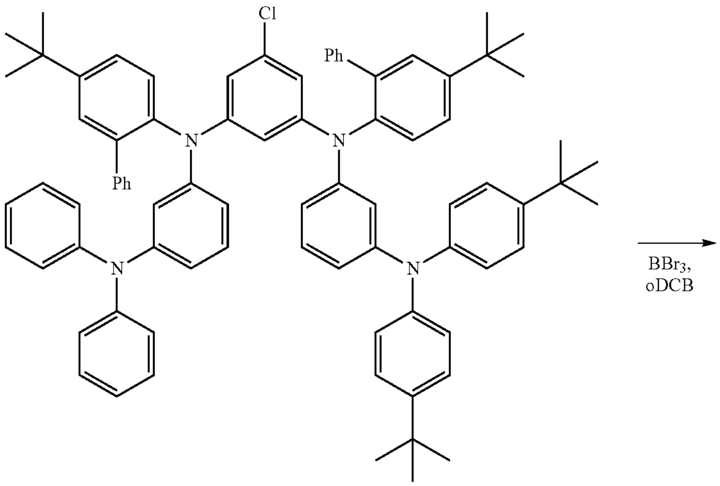
18-2
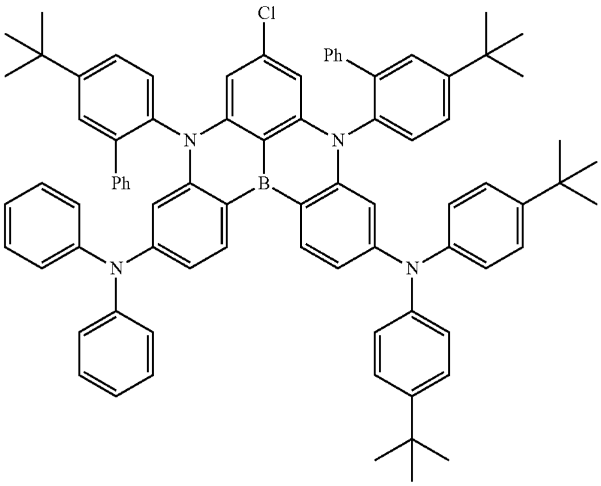
18-3

-continued

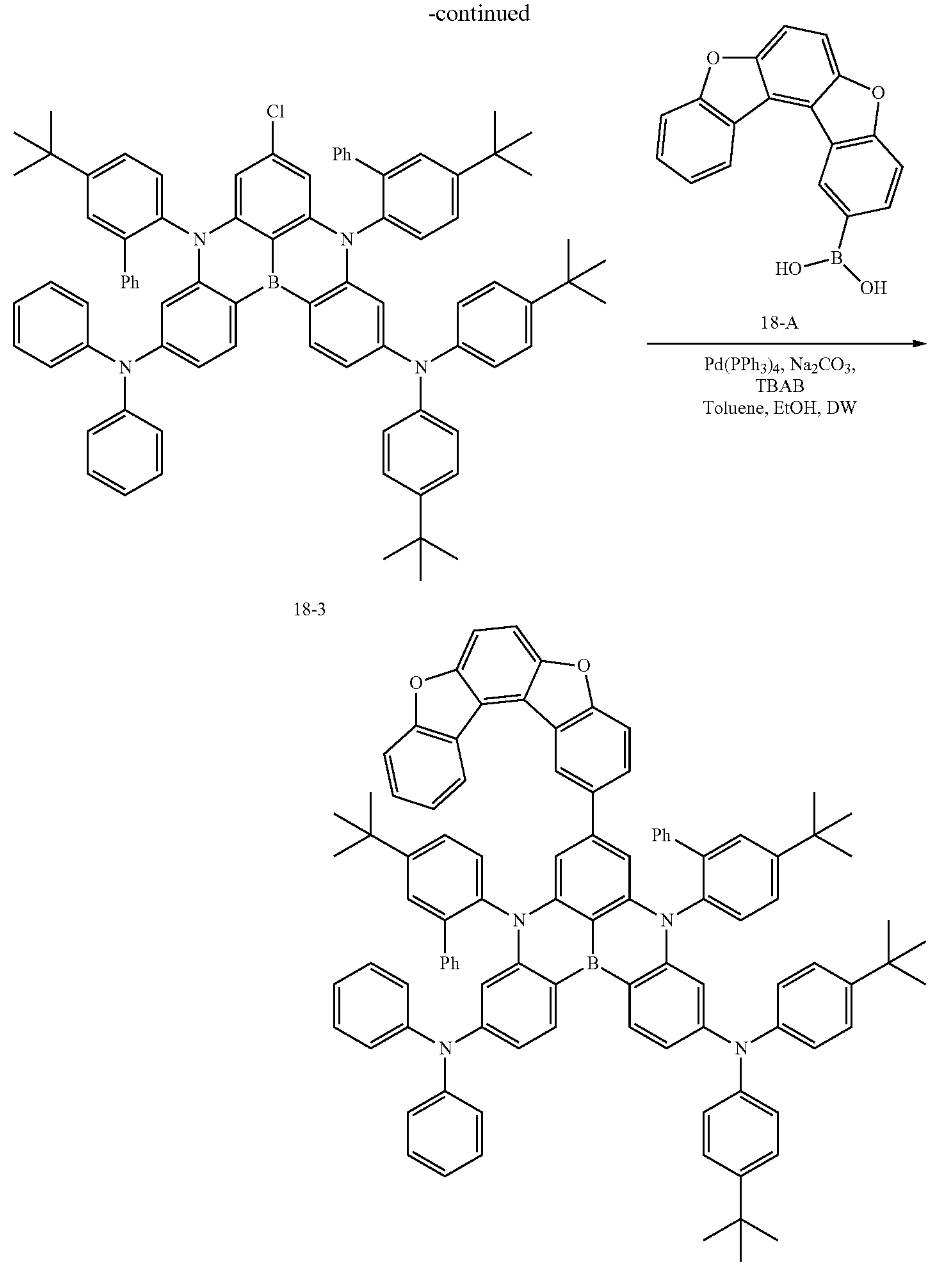

18-3

18

<Synthesis of Intermediate 18-1>

1,3-dibromo-5-chlorobenzene (1 eq), N1-(5-(tert-butyl)-[1,1'-biphenyl]-2-yl)-N3,N3-bis(4-(tert-butyl)phenyl)benzene-1,3-diamine (1 eq), tris(dibenzylideneacetone)dipalladium(0) ($Pd_2(dba)_3$, 0.05 eq), tri-tert-butylphosphine ($PtBu_3$, 0.1 eq), and sodium tert-butoxide (NaOtBu, 3 eq) were dissolved in o-xylene, and were stirred in a nitrogen atmosphere at about 90° C. for about 20 hours. After being cooled, the resultant mixture was dried under reduced pressure, and the o-xylene was removed. The resulting product was washed with ethyl acetate and water to obtain organic layers. The obtained organic layers were dried over magnesium sulfate ($MgSO_4$), and dried under reduced pressure. The resulting product was purified and recrystallized by column chromatography (dichloromethane:n-hexane) to obtain Intermediate 18-1. (yield: 56%)

<Synthesis of Intermediate 18-2>

Intermediate 18-1 (1 eq), N1-(5-(tert-butyl)-[1,1'-biphenyl]-2-yl)-N3,N3-diphenylbenzene-1,3-diamine (1 eq), $Pd_2(dba)_3$ (0.05 eq), $PtBu_3$ (0.1 eq), and NaOtBu (3 eq) were dissolved in o-xylene, and were stirred in a nitrogen atmosphere at about 140° C. for about 20 hours. After being cooled, the resultant mixture was dried under reduced pressure, and the o-xylene was removed. The resulting product was washed with ethyl acetate and water to obtain organic layers. The obtained organic layers were dried over magnesium sulfate ($MgSO_4$), and dried under reduced pressure. The resulting product was purified and recrystallized by column chromatography (dichloromethane:n-hexane) to obtain Intermediate 18-2. (yield: 72%)

<Synthesis of Intermediate 18-3>

Intermediate 18-2 (1 eq) was dissolved in ortho dichlorobenzene (oDCB), and the flask was cooled in nitrogen to about 0° C., followed by slow injection (dropping) of $BBr_3$ (2.5 eq) dissolved in oDCB. After dropping was completed, the temperature was elevated to about 190° C., and the mixture was stirred for about 24 hours. After the flask was cooled to about 0° C., triethylamine was slowly dropped to the flask until heating stopped to quench the reaction, and hexane was added to the flask, thereby extracting solids. The extracted solids were obtained by filtration. The obtained solids were purified with silica filtration, and purified again through recrystallization in dichloromethane/hexane (MC/Hex) to obtain Intermediate 18-3. Intermediate 18-3 was finally purified by column chromatography (dichloromethane:n-hexane) (yield: 8%)

<Synthesis of Compound 18>

Intermediate 18-3 (1 eq), Intermediate 18-A (1.1 eq), $Pd(PPh_3)_4$ (0.1 eq), TABA (0.1 eq), and $Na_2CO_3$ (2 eq) were dissolved in a solution (toluene:ethanol:distilled water=5:1:2 by volume ratio), and were stirred in a nitrogen atmosphere at about 110° C. for about 20 hours. After being cooled, the resulting product was washed with ethyl acetate and water to obtain organic layers. The obtained organic layers were dried over magnesium sulfate ($MgSO_4$), and dried under reduced pressure. The resulting product was purified and recrystallized by column chromatography (dichloromethane:n-hexane) to obtain Compound 18. Compound 18 was finally purified by sublimation purification. (post sublimation yield: 34%)

(2) Synthesis of Compound 27

Polycyclic Compound 27 according to an example may be synthesized by, for example, the steps shown in Reaction Scheme 2:

[Reaction Scheme 2]

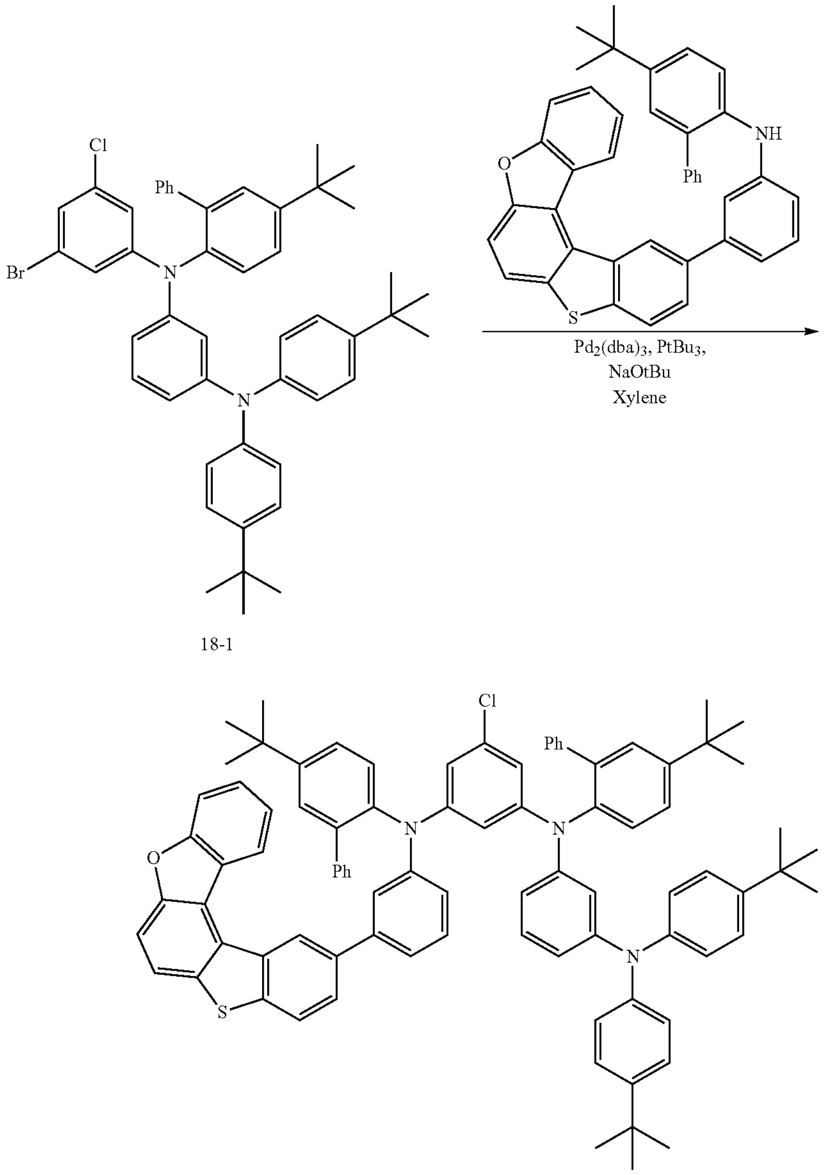

18-1

27-1

-continued
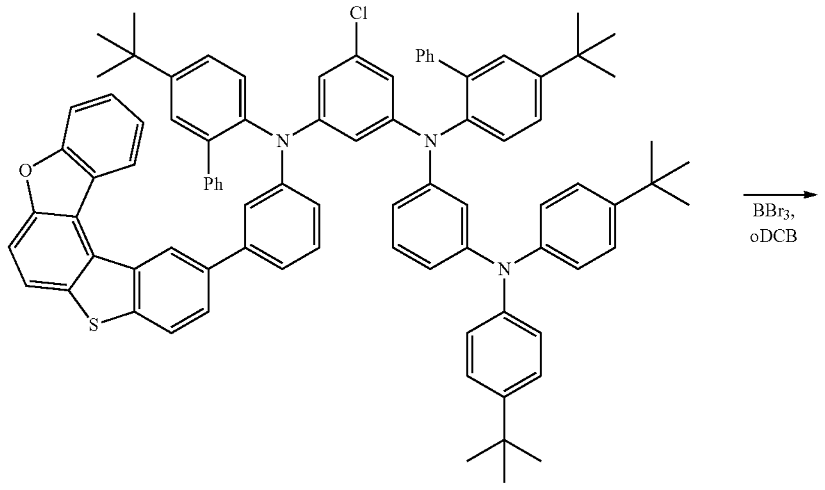
27-1
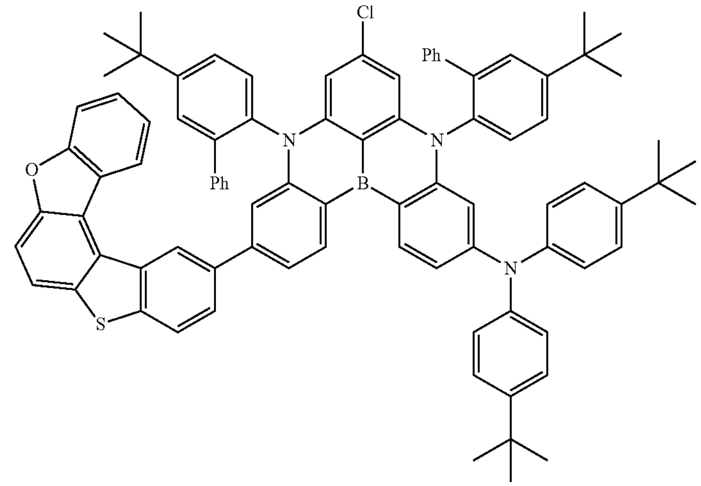
27-2
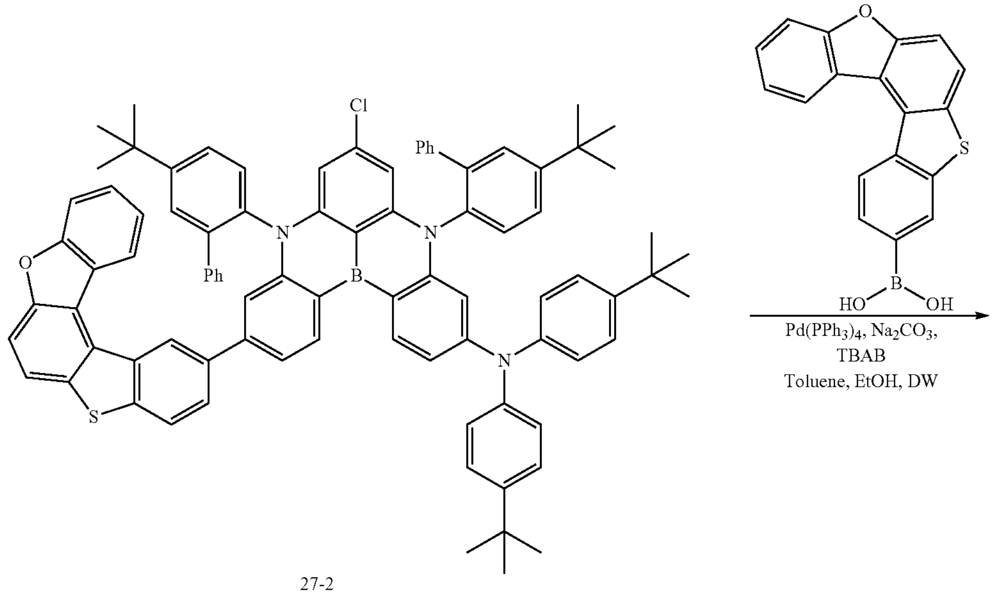
27-2

-continued

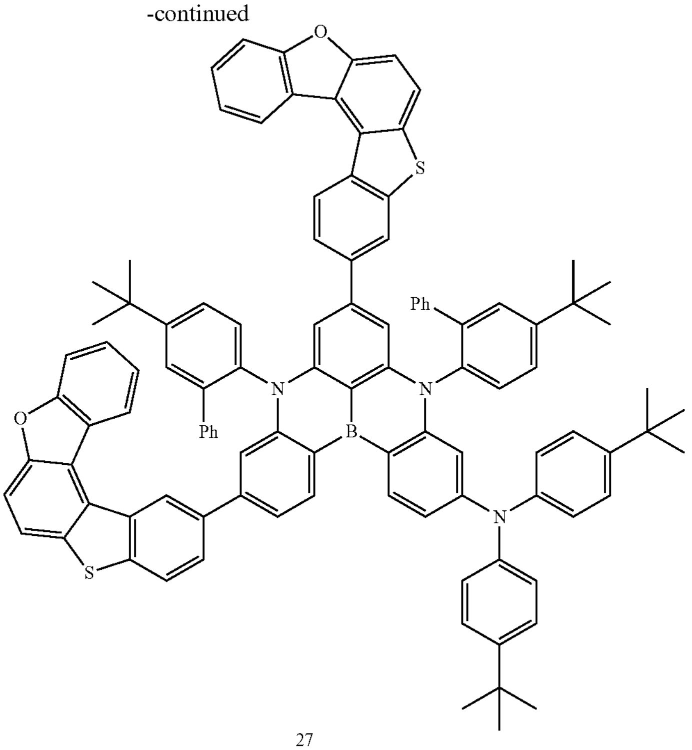

27

<Synthesis of Intermediate 27-1>

Intermediate 18-1 (1 eq), N-(3-(benzo[b]benzo[4,5]thieno[3,2-e]benzofuran-11-yl)phenyl)-5-(tert-butyl)-[1,1'-biphenyl]-2-amine (1 eq), $Pd_2(dba)_3$ (0.05 eq), $PtBu_3$ (0.1 eq), and NaOtBu (3 eq) were dissolved in o-xylene, and were stirred in a nitrogen atmosphere at about 140° C. for about 20 hours. After being cooled, the resultant mixture was dried under reduced pressure, and the o-xylene was removed. The resulting product was washed with ethyl acetate and water to obtain organic layers. The obtained organic layers were dried over magnesium sulfate ($MgSO_4$), and dried under reduced pressure. The resulting product was purified and recrystallized by column chromatography (dichloromethane:n-hexane) to obtain Intermediate 27-1. (yield: 65%)

<Synthesis of Intermediate 27-2>

Intermediate 27-1 (1 eq) was dissolved in oDCB, and the flask was cooled in nitrogen to about 0° C., followed by slow injection (dropping) of $BBr_3$ (2.5 eq) dissolved in oDCB. After dropping was completed, the temperature was elevated to about 190° C., and the mixture was stirred for about 24 hours. After cooling to about 0° C., triethylamine was slowly dropped to the flask until heating stopped to quench the reaction, and hexane was added to the flask and extracted solids. The extracted solids were obtained by filtration. The obtained solids were purified with silica filtration, and purified again through recrystallization in MC/Hex to obtain Intermediate 27-2. Intermediate 27-2 was finally purified by column chromatography (dichloromethane:n-hexane) (yield: 5%)

<Synthesis of Compound 27>

Intermediate 27-2 (1 eq), benzo[b]benzo[4,5]thieno[3,2-e]benzofuran-10-ylboronic acid (1.1 eq), $Pd(PPh_3)_4$ (0.1 eq), TABA (0.1 eq), and $Na_2CO_3$ (2 eq) were dissolved in a solution (toluene:ethanol:distilled water=5:1:2 by volume ratio), and were stirred in a nitrogen atmosphere at about 110° C. for about 20 hours. After being cooled, the resulting product was washed with ethyl acetate and water to obtain organic layers. The obtained organic layers were dried over magnesium sulfate ($MgSO_4$), and dried under reduced pressure. The resulting product was purified and recrystallized by column chromatography (dichloromethane:n-hexane) to obtain Compound 27. Compound 27 was finally purified by sublimation purification. (post sublimation yield: 42%)

(3) Synthesis of Compound 51

Polycyclic Compound 51 according to an example may be synthesized by, for example, the steps shown in Reaction Scheme 3:

[Reaction Scheme 3]
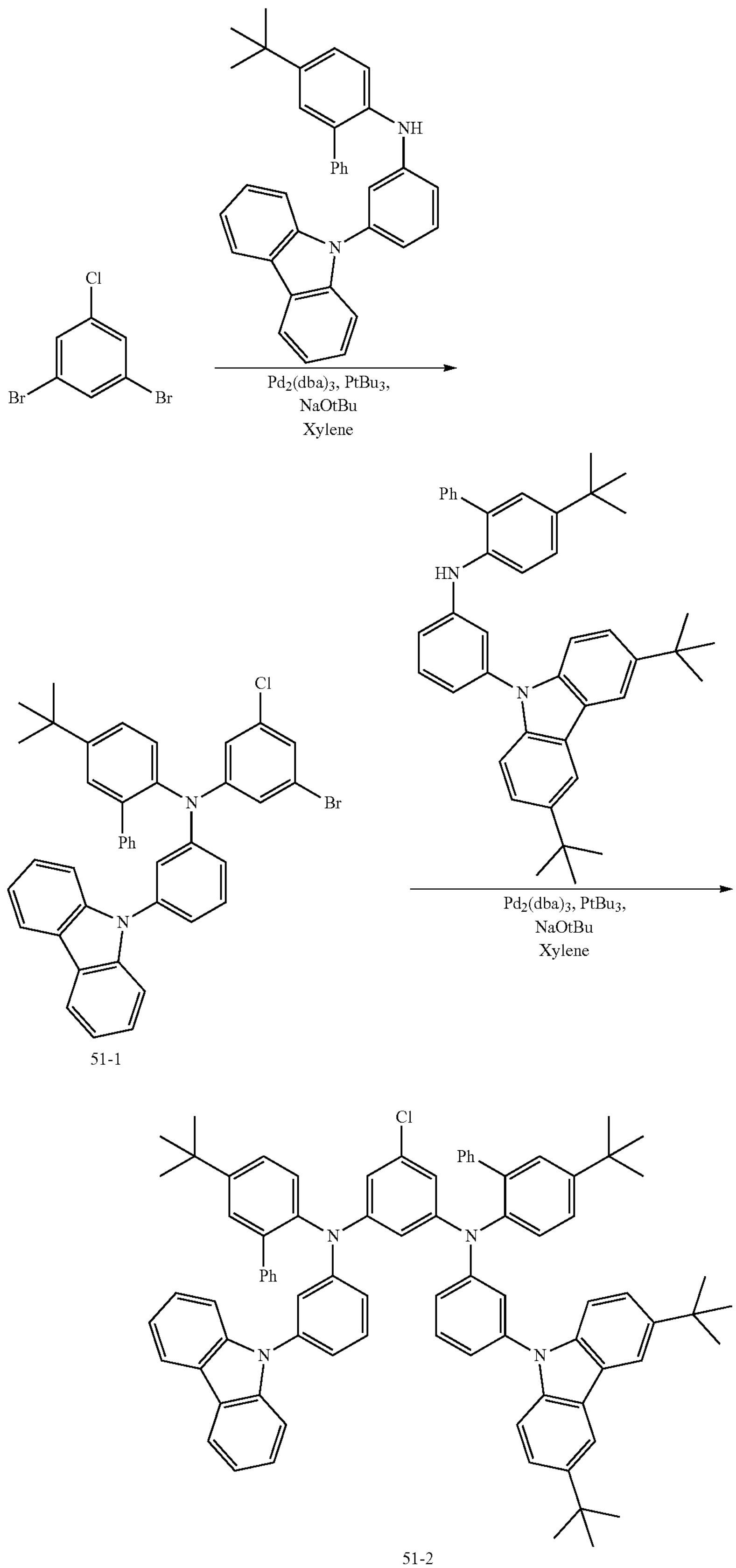
51-1
51-2

-continued
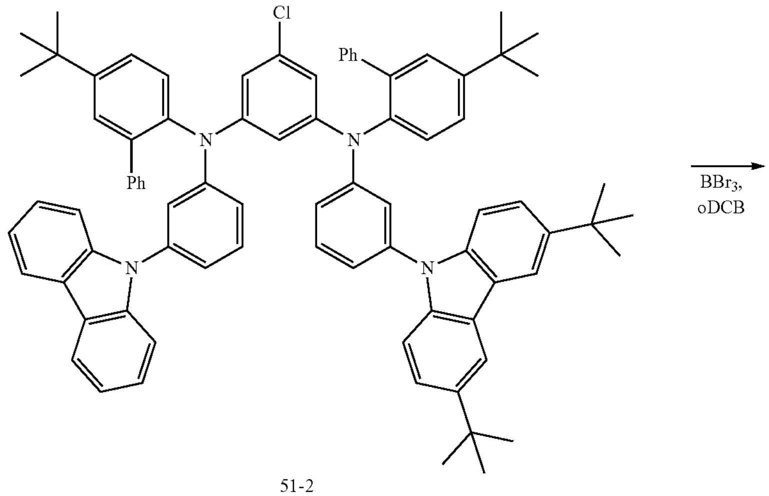
51-2
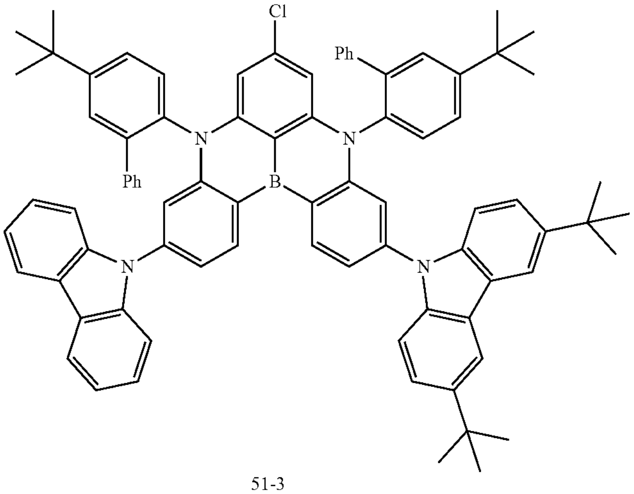
51-3
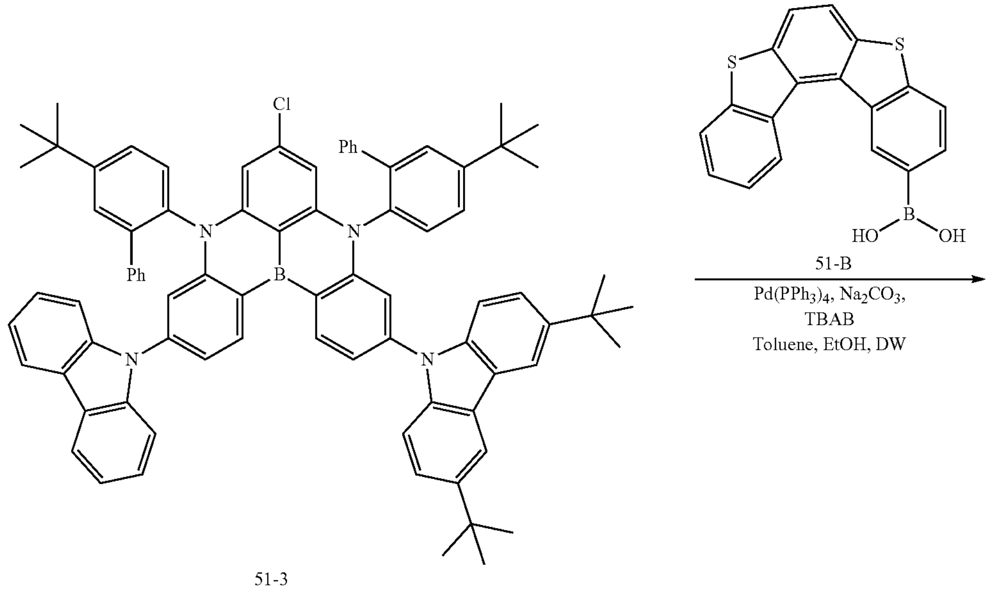
51-3

-continued

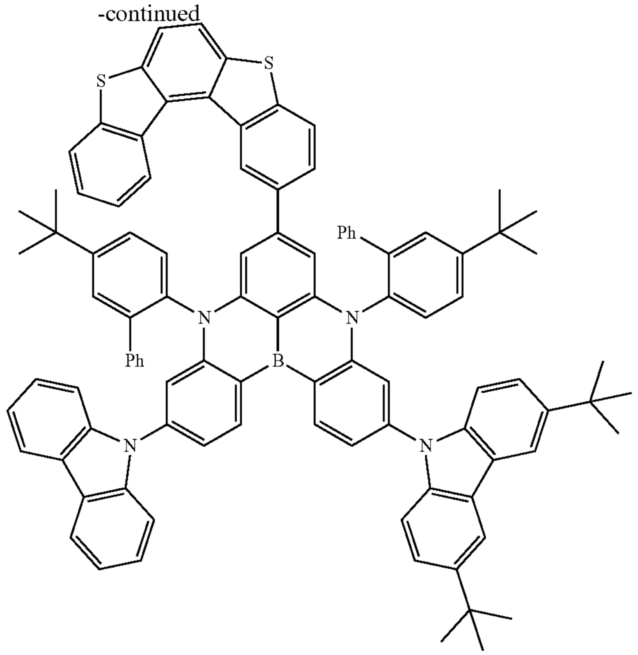

51

<Synthesis of Intermediate 51-1>

1,3-dibromo-5-chlorobenzene (1 eq), -(3-(9H-carbazol-9-yl)phenyl)-5-(tert-butyl)-[1,1'-biphenyl]-2-amine (1 eq), $Pd_2(dba)_3$ (0.05 eq), $PtBu_3$ (0.1 eq), and NaOtBu (3 eq) were dissolved in o-xylene, and were stirred in a nitrogen atmosphere at about 90° C. for about 20 hours. After being cooled, the resultant mixture was dried under reduced pressure, and the o-xylene was removed. The resulting product was washed with ethyl acetate and water to obtain organic layers. The obtained organic layers were dried over magnesium sulfate ($MgSO_4$), and dried under reduced pressure. The resulting product was purified and recrystallized by column chromatography (dichloromethane:n-hexane) to obtain Intermediate 51-1. (yield: 63%)

<Synthesis of Intermediate 51-2>

Intermediate 51-1 (1 eq), 5-(tert-butyl)-N-(3-(3,6-di-tert-butyl-9H-carbazol-9-yl)phenyl)-[1,1'-biphenyl]-2-amine (1 eq), $Pd_2(dba)_3$ (0.05 eq), $PtBu_3$ (0.1 eq), and NaOtBu (3 eq) were dissolved in o-xylene, and were stirred in a nitrogen atmosphere at about 110° C. for about 20 hours. After being cooled, the resultant mixture was dried under reduced pressure, and the o-xylene was removed. The resulting product was washed with ethyl acetate and water to obtain organic layers. The obtained organic layers were dried over magnesium sulfate ($MgSO_4$), and dried under reduced pressure. The resulting product was purified and recrystallized by column chromatography (dichloromethane:n-hexane) to obtain Intermediate 51-2. (yield: 65%)

<Synthesis of Intermediate 51-3>

Intermediate 51-2 (1 eq) was dissolved in oDCB, and the flask was cooled in nitrogen to about 0° C., followed by slow injection (dropping) of $BBr_3$ (2.5 eq) dissolved in oDCB. After dropping was completed, the temperature was elevated to about 190° C., and the mixture was stirred for about 24 hours. After cooling to about 0° C., triethylamine was slowly dropped to the flask until heating stopped to quench the reaction, and hexane was added to the flask and extracted solids. The extracted solids were obtained by filtration. The obtained solids were purified with silica filtration, and purified again through recrystallization in MC/Hex to obtain Intermediate 51-3. Intermediate 51-3 was finally purified by column chromatography (dichloromethane:n-hexane) (yield: 9%)

<Synthesis of Compound 51>

Intermediate 51-3 (1 eq), Intermediate 51-B (1.1 eq), $Pd(PPh_3)_4$ (0.1 eq), TABA (0.1 eq), and $Na_2CO_3$ (2 eq) were dissolved in a solution (toluene:ethanol:distilled water=5:1:2 by volume ratio), and were stirred in a nitrogen atmosphere at about 110° C. for about 20 hours. After being cooled, the resulting product was washed with ethyl acetate and water to obtain organic layers. The obtained organic layers were dried over magnesium sulfate ($MgSO_4$), and dried under reduced pressure. The resulting product was purified and recrystallized by column chromatography (dichloromethane:n-hexane) to obtain Compound 51. Compound 51 was finally purified by sublimation purification. (post sublimation yield: 51%)

(4) Synthesis of Compound 57

Polycyclic Compound 57 according to an example may be synthesized by, for example, the steps shown in Reaction Scheme 4:

[Reaction Scheme 4]
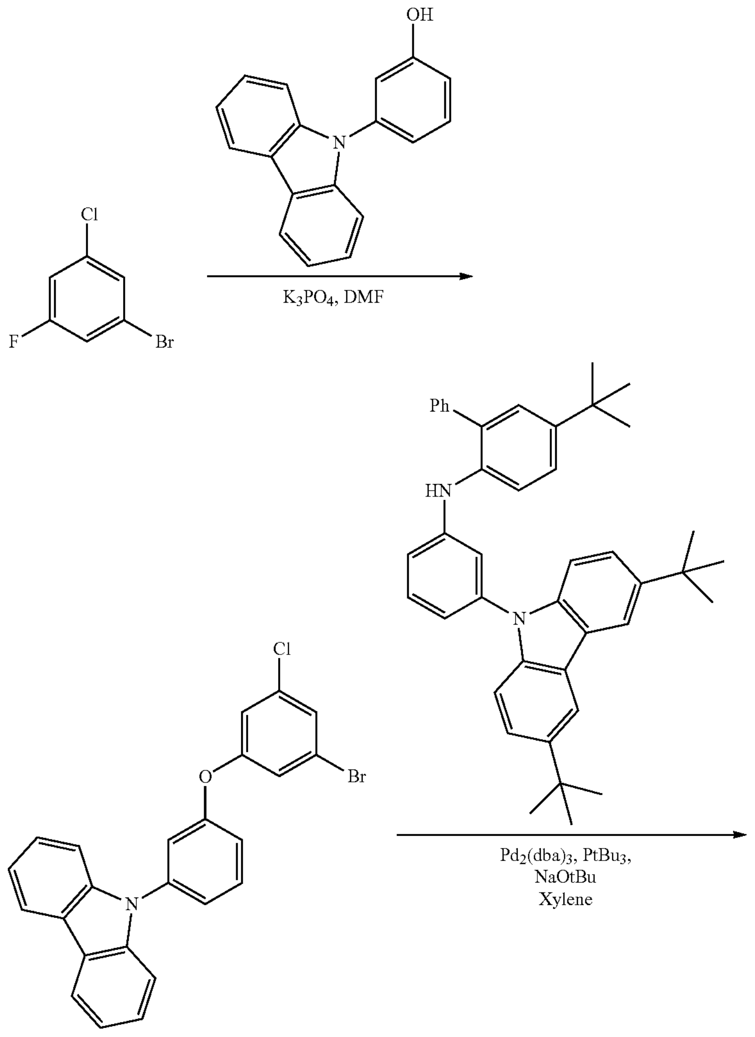
57-1
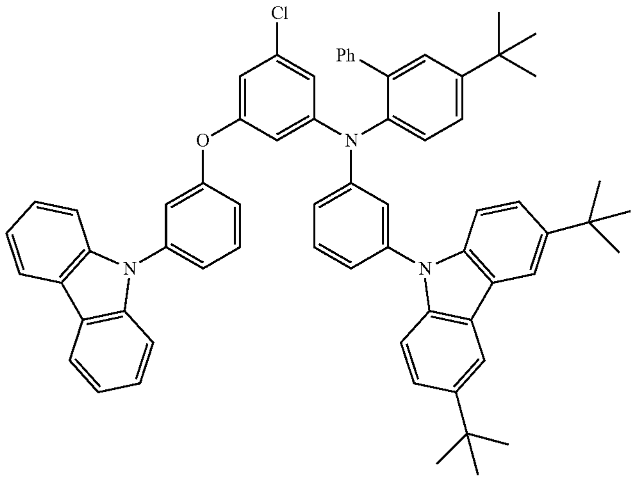
57-2

-continued
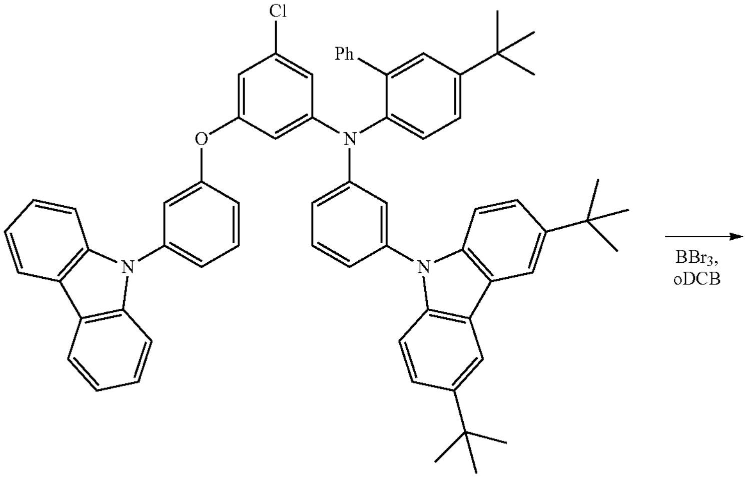
57-2
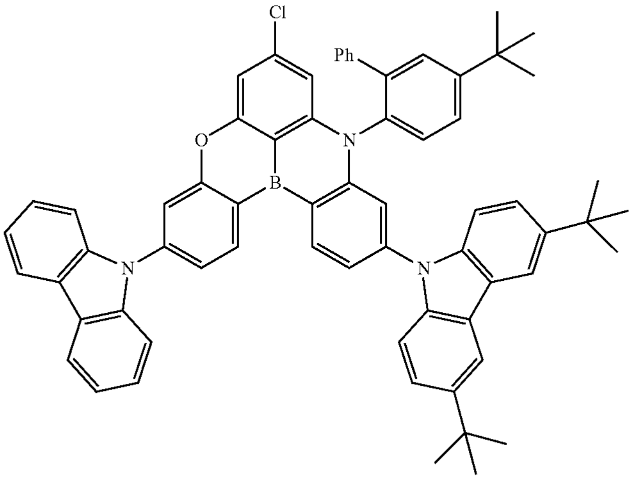
57-3
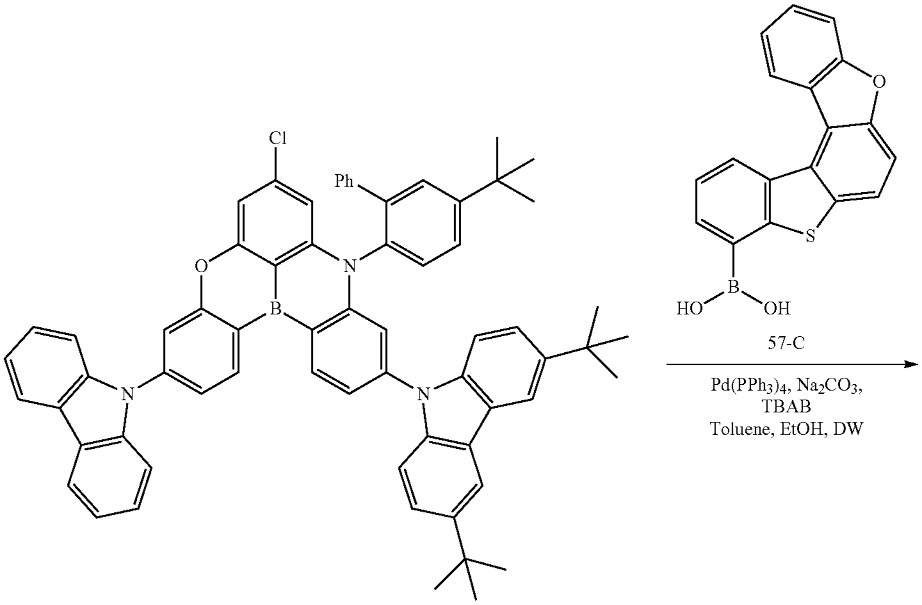
57-3

-continued

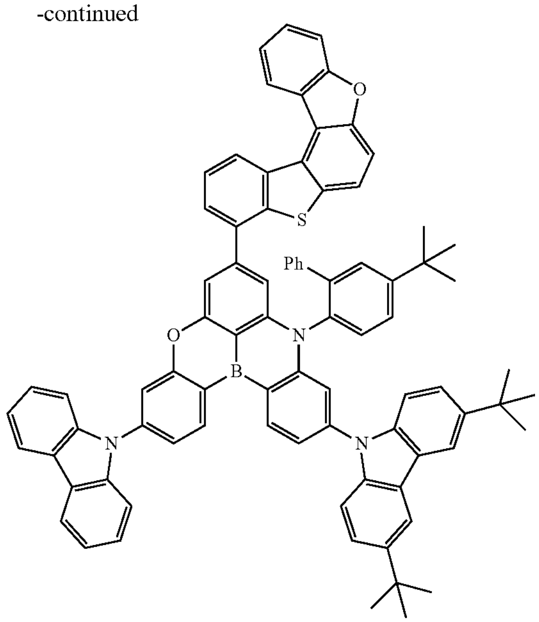

57

<Synthesis of Intermediate 57-1>

1-bromo-3-chloro-5-fluorobenzene (1 eq), 3-(9H-carbazol-9-yl)phenol (2 eq), and potassium phosphate tribasic ($K_3PO_4$) were dissolved in dimethylformamide (DMF), and were stirred in a nitrogen atmosphere at about 150° C. for about 20 hours. After the resultant mixture was cooled, the DMF was removed under reduced pressure. The resulting product was washed with ethyl acetate and water to obtain organic layers. The obtained organic layers were dried over magnesium sulfate ($MgSO_4$), and dried under reduced pressure. The resulting product was purified and recrystallized by column chromatography (dichloromethane:n-hexane) to obtain Intermediate 57-1. (yield: 66%)

<Synthesis of Intermediate 57-2>

Intermediate 57-1 (1 eq), 5-(tert-butyl)-N-(3-(3,6-di-tert-butyl-9H-carbazol-9-yl)phenyl)-[1,1'-biphenyl]-2-amine (1 eq), $Pd_2(dba)_3$ (0.05 eq), $PtBu_3$ (0.1 eq), and NaOtBu (2 eq) were dissolved in o-xylene, and were stirred in a nitrogen atmosphere at about 110° C. for about 20 hours. After being cooled, the resultant mixture was dried under reduced pressure, and the o-xylene was removed. The resulting product was washed with ethyl acetate and water to obtain organic layers. The obtained organic layers were dried over magnesium sulfate ($MgSO_4$), and dried under reduced pressure. The resulting product was purified and recrystallized by column chromatography (dichloromethane:n-hexane) to obtain Intermediate 57-2. (yield: 64%)

<Synthesis of Intermediate 57-3>

Intermediate 57-2 (1 eq) was dissolved in oDCB, and the flask was cooled in nitrogen to about 0° C., followed by slow injection (dropping) of $BBr_3$ (2.5 eq) dissolved in oDCB. After dropping was completed, the temperature was elevated to about 190° C., and the mixture was stirred for about 24 hours. After cooling to about 0° C., triethylamine was slowly dropped to the flask until heating stopped to quench the reaction, and hexane was added to the flask and extracted solids. The extracted solids were obtained by filtration. The obtained solids were purified with silica filtration, and purified again through recrystallization in MC/Hex to obtain Intermediate 57-3. Intermediate 57-3 was finally purified by column chromatography (dichloromethane:n-hexane) (yield: 7%)

<Synthesis of Compound 57>

Intermediate 57-3 (1 eq), Intermediate 57-C (1.1 eq), $Pd(PPh_3)_4$ (0.1 eq), TABA (0.1 eq), and $Na_2CO_3$ (2 eq) were dissolved in a solution (toluene:ethanol:distilled water=5:1:2 by volume ratio), and were stirred in a nitrogen atmosphere at about 110° C. for about 20 hours. After being cooled, the resulting product was washed with ethyl acetate and water to obtain organic layers. The obtained organic layers were dried over magnesium sulfate ($MgSO_4$), and dried under reduced pressure. The resulting product was purified and recrystallized by column chromatography (dichloromethane:n-hexane) to obtain Compound 57. Compound 57 was finally purified by sublimation purification. (post sublimation yield: 43%)

(5) Synthesis of Compound 81

Polycyclic Compound 81 according to an example may be synthesized by, for example, the steps shown in Reaction Scheme 5:

[Reaction Scheme 5]
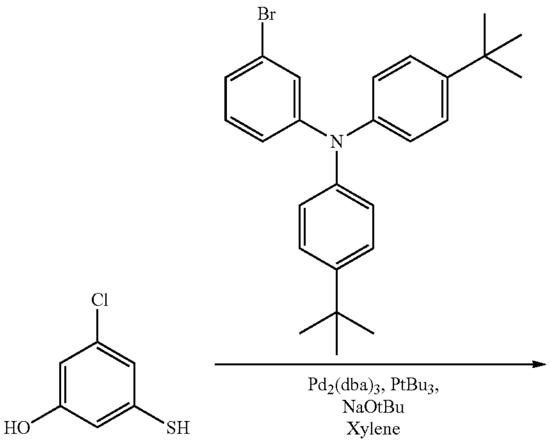
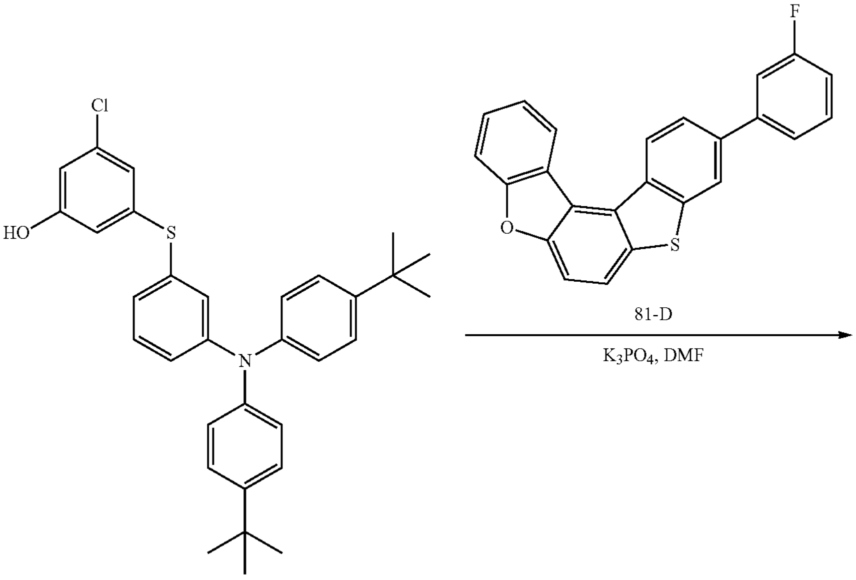
81-1
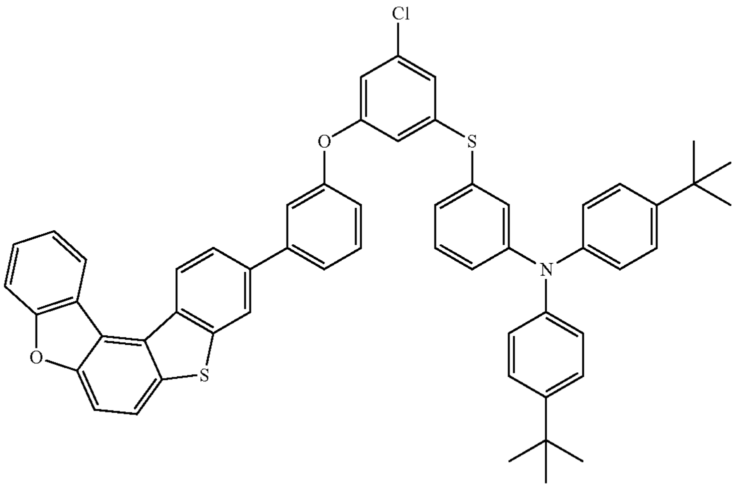
81-2

-continued
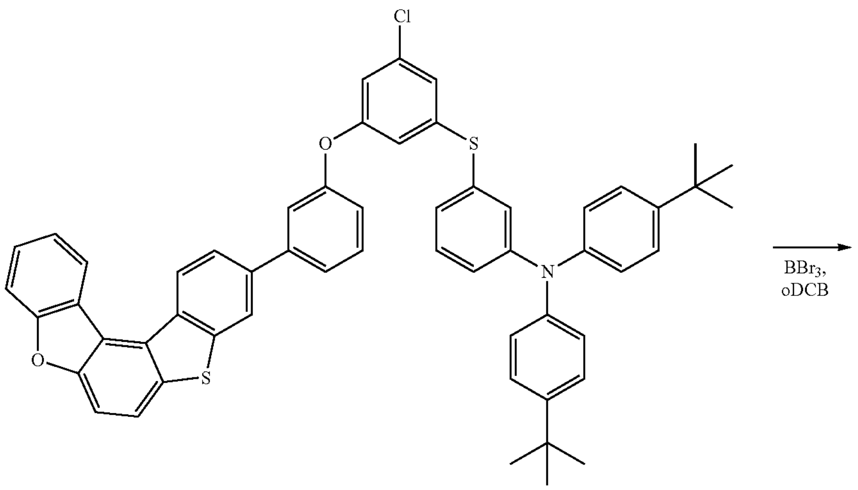
81-2
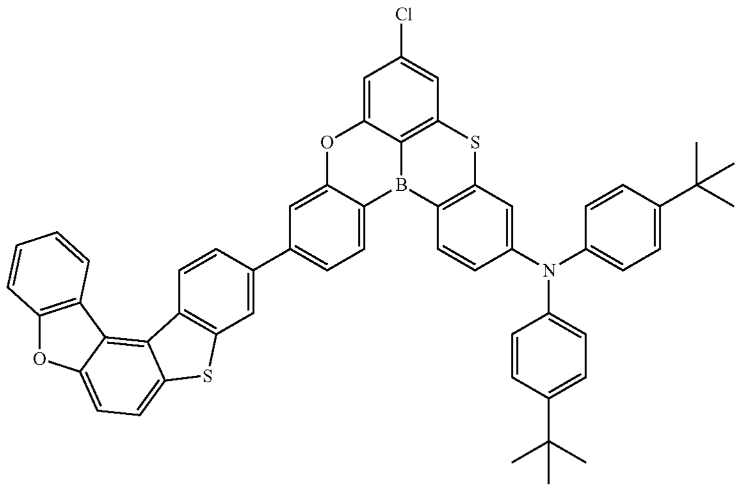
81-3
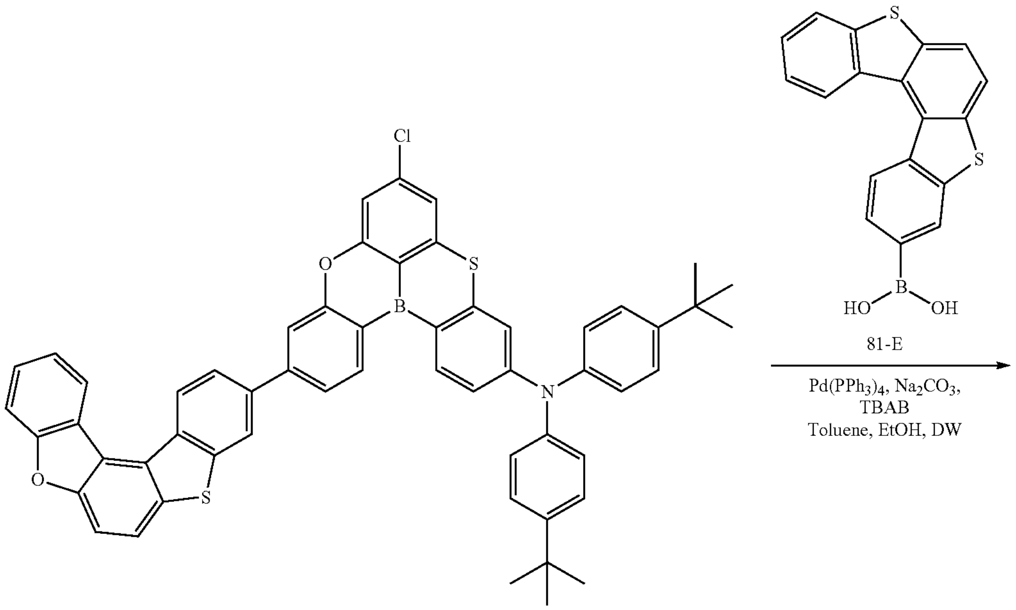
81-3

-continued

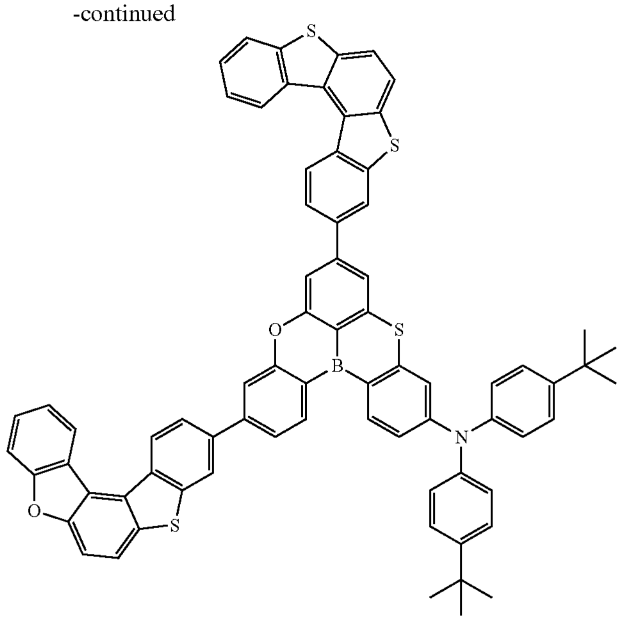

81

<Synthesis of Intermediate 81-1>

3-chloro-5-mercaptophenol (1 eq), 3-bromo-N,N-bis(4-(tert-butyl)phenyl)aniline (1 eq), $Pd_2(dba)_3$ (0.05 eq), $PtBu_3$ (0.1 eq), and NaOtBu (2 eq) were dissolved in o-xylene, and were stirred in a nitrogen atmosphere at about 140° C. for about 20 hours. After being cooled, the resultant mixture was dried under reduced pressure, and the o-xylene was removed. The resulting product was washed with ethyl acetate and water to obtain organic layers. The obtained organic layers were dried over magnesium sulfate ($MgSO_4$), and dried under reduced pressure. The resulting product was purified and recrystallized by column chromatography (dichloromethane:n-hexane) to obtain Intermediate 81-1. (yield: 41%)

<Synthesis of Intermediate 81-2>

Intermediate 81-1 (1 eq), Intermediate 81-D (2 eq), and $K_3PO_4$ were dissolved in DMF, and were stirred in a nitrogen atmosphere at about 150° C. for about 20 hours. After the resultant mixture was cooled, the DMF was removed under reduced pressure. The resulting product was washed with ethyl acetate and water to obtain organic layers. The obtained organic layers were dried over magnesium sulfate ($MgSO_4$), and dried under reduced pressure. The resulting product was purified and recrystallized by column chromatography (dichloromethane:n-hexane) to obtain Intermediate 81-2. (yield: 62%)

<Synthesis of Intermediate 81-3>

Intermediate 81-2 (1 eq) was dissolved in oDCB, and the flask was cooled in nitrogen to about 0° C., followed by slow injection (dropping) of $BBr_3$ (2.5 eq) dissolved in oDCB. After dropping was completed, the temperature was elevated to about 190° C., and the mixture was stirred for about 24 hours. After cooling to about 0° C., triethylamine was slowly dropped to the flask until heating stopped to quench the reaction, and hexane was added to the flask and extracted solids. The extracted solids were obtained by filtration. The obtained solids were purified with silica filtration, and purified again through recrystallization in MC/Hex to obtain Intermediate 81-3. Intermediate 81-3 was finally purified by column chromatography (dichloromethane:n-hexane) (yield: 6%)

<Synthesis of Compound 81>

Intermediate 81-3 (1 eq), Intermediate 81-E (1.1 eq), $Pd(PPh_3)_4$ (0.1 eq), TABA (0.1 eq), and $Na_2CO_3$ (2 eq) were dissolved in a solution (toluene:ethanol:distilled water=5:1:2 by volume ratio), and were stirred in a nitrogen atmosphere at about 110° C. for about 20 hours. After being cooled, the resulting product was washed with ethyl acetate and water to obtain organic layers. The obtained organic layers were dried over magnesium sulfate ($MgSO_4$), and dried under reduced pressure. The resulting product was purified and recrystallized by column chromatography (dichloromethane:n-hexane) to obtain Compound 81. Compound 81 was finally purified by sublimation purification. (post sublimation yield: 41%)

(6) Synthesis of Compound 91

Polycyclic Compound 91 according to an example may be synthesized by, for example, the steps shown in Reaction Scheme 6:

[Reaction Scheme 6]
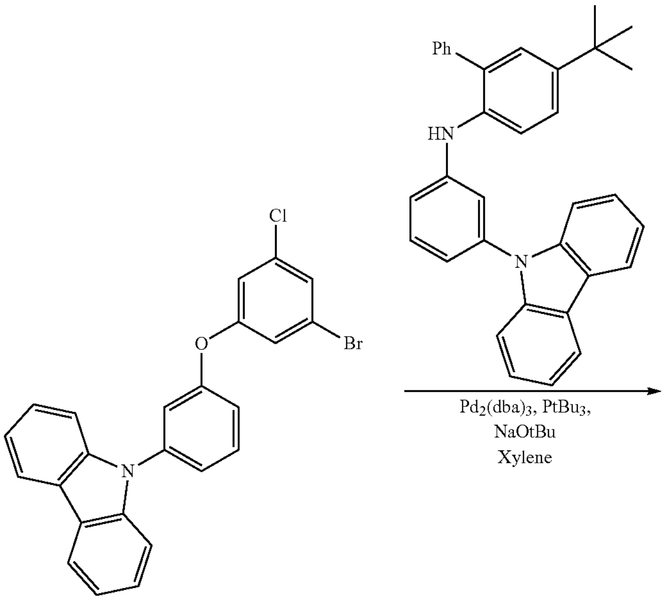
57-1
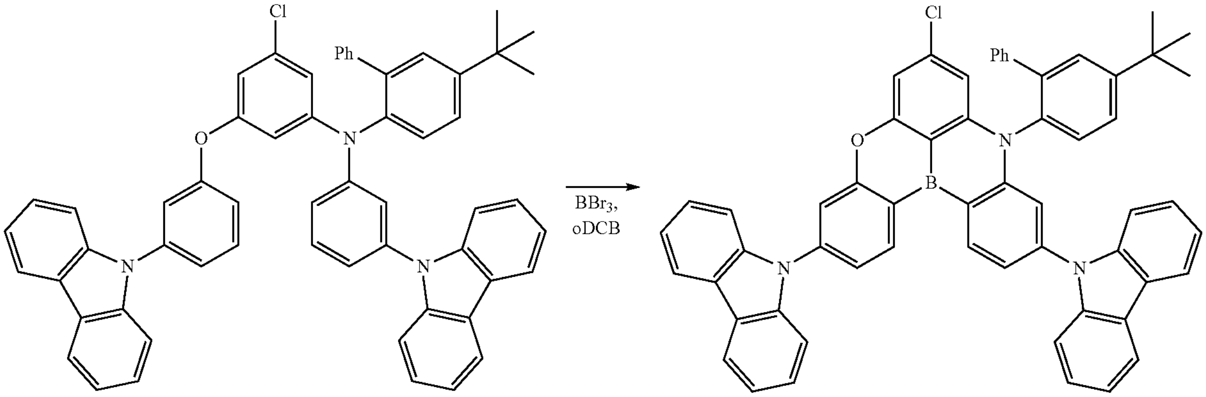
91-1 91-2

-continued

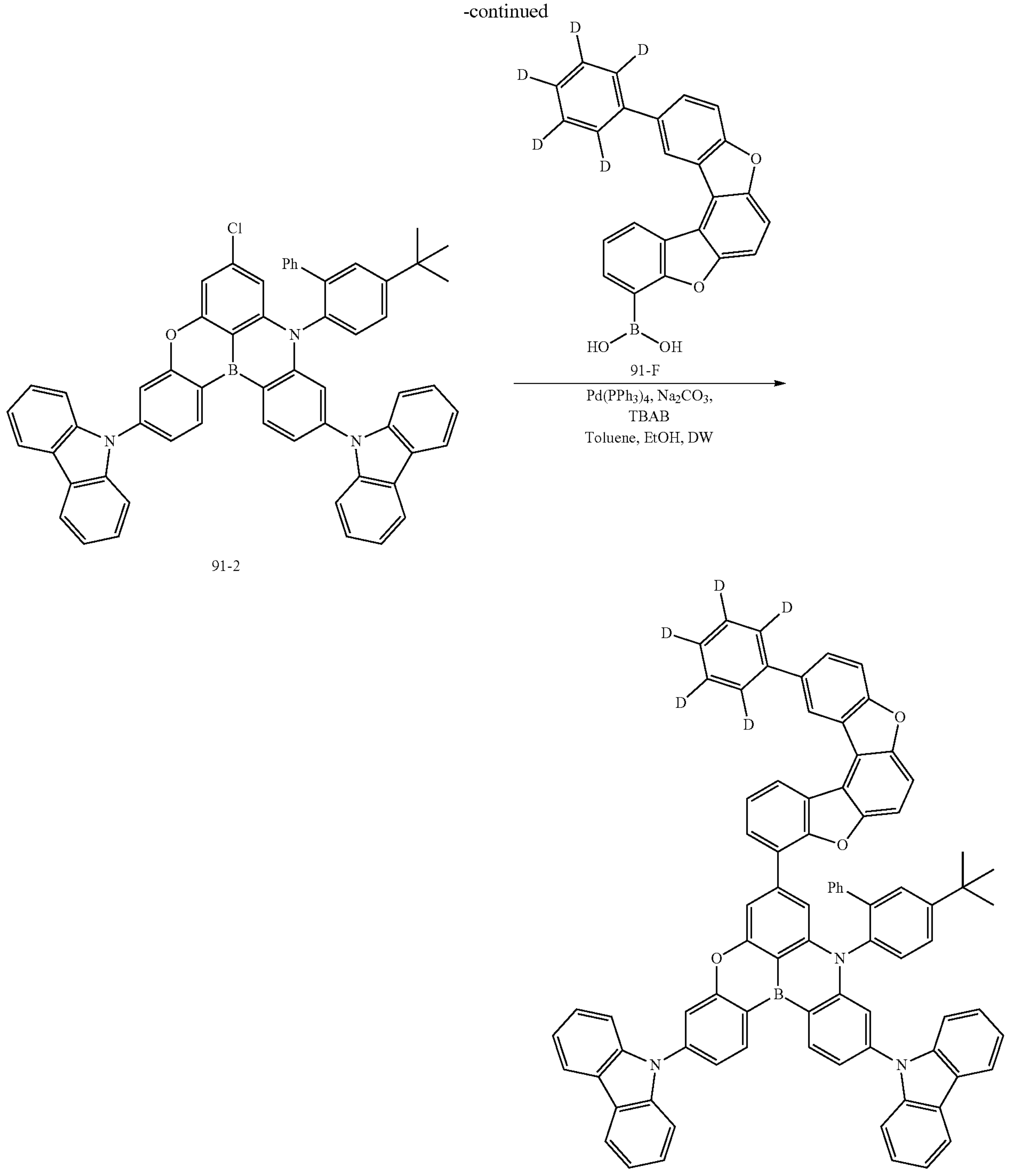

91-2

91-F

91

<Synthesis of Intermediate 91-1>

Intermediate 57-1 (1 eq), N-(3-(9H-carbazol-9-yl)phenyl)-5-(tert-butyl)-[1,1'-biphenyl]-2-amine (1 eq), $Pd_2(dba)_3$ (0.05 eq), $PtBu_3$ (0.1 eq), and NaOtBu (2 eq) were dissolved in o-xylene, and were stirred in a nitrogen atmosphere at about 140° C. for about 20 hours. After being cooled, the resultant mixture was dried under reduced pressure, and the o-xylene was removed. The resulting product was washed with ethyl acetate and water to obtain organic layers. The obtained organic layers were dried over magnesium sulfate ($MgSO_4$), and dried under reduced pressure. The resulting product was purified and recrystallized by column chromatography (dichloromethane:n-hexane) to obtain Intermediate 91-1. (yield: 41%)

<Synthesis of Intermediate 91-2>

Intermediate 91-1 (1 eq) was dissolved in oDCB, and the flask was cooled in nitrogen to about 0° C., followed by slow injection (dropping) of $BBr_3$ (2.5 eq) dissolved in oDCB. After dropping was completed, the temperature was elevated to about 190° C., and the mixture was stirred for about 24 hours. After cooling to about 0° C., triethylamine was slowly dropped to the flask until heating stopped to quench the reaction, and hexane was added to the flask and extracted solids. The extracted solids were obtained by filtration. The obtained solids were purified with silica filtration, and purified again through recrystallization in MC/Hex to obtain Intermediate 91-2. Intermediate 91-2 was finally purified by column chromatography (dichloromethane:n-hexane) (yield: 7%)

<Synthesis of Compound 91>

Intermediate 91-2 (1 eq), Intermediate 91-F (1.1 eq), $Pd(PPh_3)_4$ (0.1 eq), TABA (0.1 eq), and $Na_2CO_3$ (2 eq) were dissolved in a solution (toluene:ethanol:distilled water=5:1:2 by volume ratio), and were stirred in a nitrogen atmosphere at about 110° C. for about 20 hours. After being cooled, the resulting product was washed with ethyl acetate and water to obtain organic layers. The obtained organic layers were dried over magnesium sulfate ($MgSO_4$), and dried under reduced pressure. The resulting product was purified and recrystallized by column chromatography (dichloromethane:n-hexane) to obtain Compound 91. Compound 91 was finally purified by sublimation purification. (post sublimation yield: 52%)

Molecular weights and NMR analysis results of synthesized polycyclic compounds are shown in Table 1:

TABLE 1

| Compound | H NMR (δ) | Calc. | Found |
|---|---|---|---|
| 18 | 8.82 (1H, d), 8.74 (1H, d), 7.82 (1H, s), 7.70 (1H, d), 7.61-7.44 (16H, m), 7.35-7.20 (15H, m), 6.67-6.42 (14H, m), 6.21 (1H, s), 6.15 (1H, s), 1.39 (9H, s), 1.37 (9H, s), 1.35 (18H, s) | 1387.63 | 1388.41 |
| 27 | 8.88 (1H, d), 8.78 (1H, d), 7.88-7.70 (4H, m), 7.63-7.47 (17H, m), 7.35-7.22 (13H, m), 6.89-6.52 (12H, m), 6.32 (1H, s), 6.21 (1H, s), 1.37 (18H, s), 1.34 (18H, s) | 1508.80 | 1509.36 |
| 51 | 9.02 (1H, d), 8.94 (1H, d), 7.97 (1H, s), 7.85 (2H, s), 7.78-7.70 (3H, m), 7.60-7.41 (12H, m), 7.32-7.18 (12H, m), 6.75-6.47 (13H, m), 6.32 (1H, s), 6.17 (1H, s), 1.38 (18H, s), 1.36 (18H, s) | 1415.72 | 1416.21 |
| 57 | 8.85 (1H, d), 8.80 (1H, d), 7.93 (1H, s), 7.88 (2H, s), 7.80-7.73 (3H, m), 7.71-7.53 (8H, m), 7.48-7.23 (11H, m), 7.05-6.59 (10H, m), 6.34 (1H, s), 6.27 (1H, s), 1.37 (9H, s), 1.35 (18H, s) | 1208.40 | 1209.54 |
| 81 | 8.79 (1H, d), 8.72 (1H, d), 7.90 (1H, s), 7.87 (1H, s), 7.81 (1H, s), 7.75 (1H, s), 7.61-7.46 (9H, m), 7.35-7.08 (8H, m), 6.81-6.59 (9H, m), 6.35 (1H, s), 6.28 (1H, s), 1.36 (18H, s) | 1126.29 | 1127.16 |
| 91 | 8.91 (1H, d), 8.83 (1H, d), 7.93 (1H, s), 7.87-7.75 (5H, s), 7.68-7.42 (10H, m), 7.35-7.21 (9H, m), 6.89-6.56 (11H, m), 6.39 (1H, s), 6.24 (1H, s), 1.37 (9H, s) | 1145.19 | 1146.24 |

2. Evaluation of Compound Characteristics

Lowest excited singlet energy levels (S1 levels), lowest excited triplet energy levels (T1 levels), $\Delta F_{ST}$ values, and oscillator strength (f) values of Compounds 18, 27, 51, 57, 81, and 91 which are Example Compounds, and Comparative Example Compounds C1 to C4 below are listed in Table 3. Compounds 18, 27, 51, 57, 81, and 91 and Comparative Example Compounds C1 to C4 are listed in Table 2.

TABLE 2

Compound 18

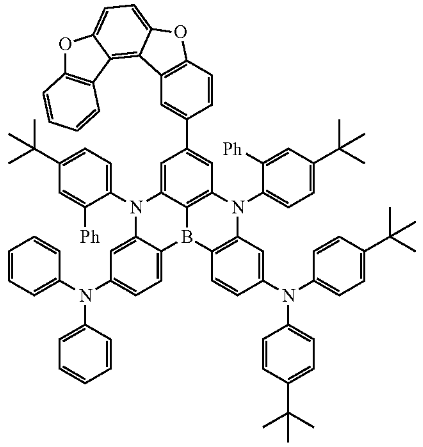

18

Compound 27

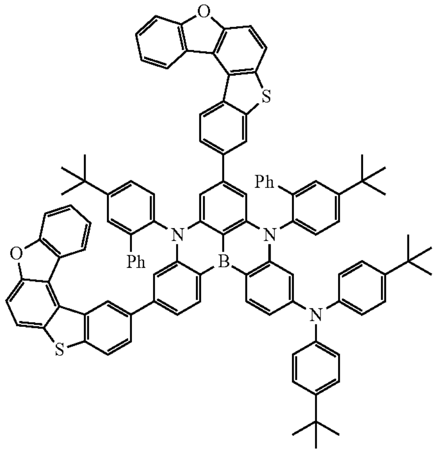

27

Compound 51

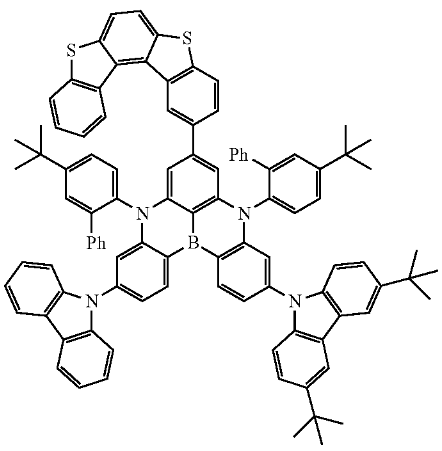

51

TABLE 2-continued
Compound 57
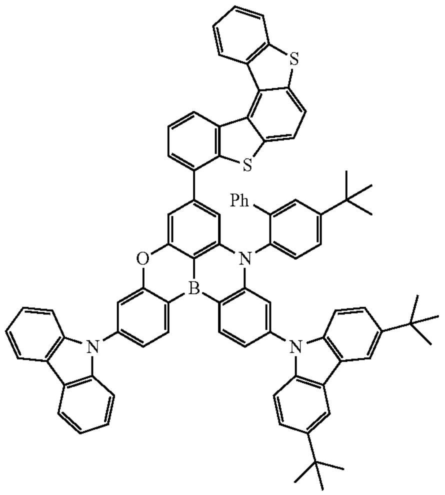
57
Compound 81
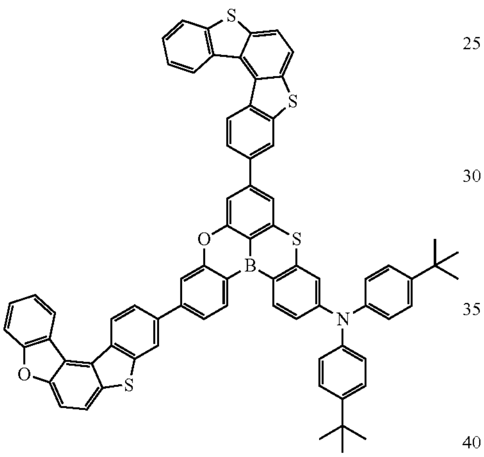
81
Compound 91
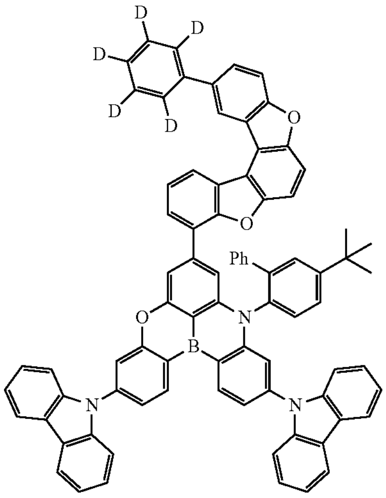
91
TABLE 2-continued
Comparative Example Compound C1
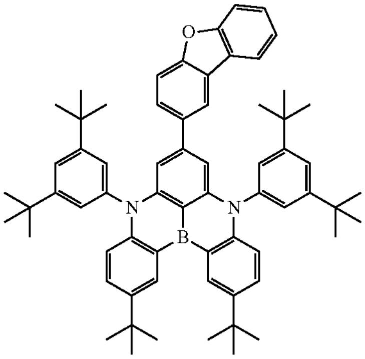
C1
Comparative Example Compound C2
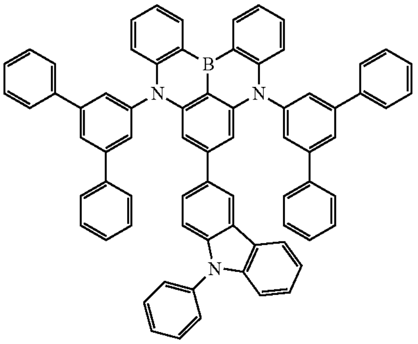
C2
Comparative Example Compound C3
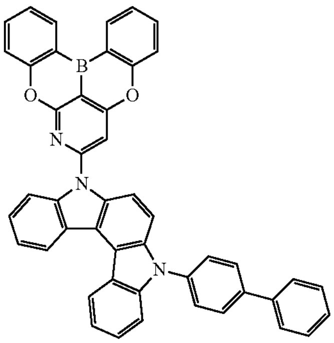
C3
Comparative Example Compound C4
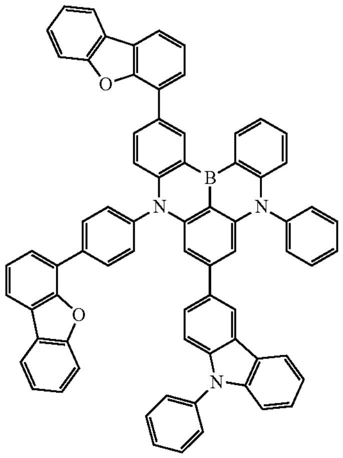
C4

The S1 levels, T1 levels, and oscillator strength (f) values were calculated by a non-empirical molecular orbital method. The value was calculated with B3LYP/6-31G(d) using Gaussian 09 from Gaussian, Inc. (Wallingford, CT, USA). $\Delta E_{ST}$ indicates the difference between the Si level and the Ti level.

TABLE 3

| Compound | S1 level (eV) | T1 level (eV) | $\Delta E_{ST}$ (eV) | Oscillator strength (f) |
|---|---|---|---|---|
| Compound 18 | 2.8845 | 2.5283 | 0.3562 | 0.2827 |
| Compound 27 | 2.7428 | 2.4085 | 0.3343 | 0.3252 |
| Compound 51 | 2.9325 | 2.5270 | 0.4055 | 0.4262 |
| Compound 57 | 2.9699 | 2.5963 | 0.3736 | 0.4380 |
| Compound 81 | 2.7483 | 2.4387 | 0.3096 | 0.5510 |
| Compound 91 | 2.9858 | 2.5679 | 0.4179 | 0.4142 |
| Comparative Example Compound C1 | 2.9608 | 2.4831 | 0.4777 | 0.2301 |
| Comparative Example Compound C2 | 2.9575 | 2.5039 | 0.4536 | 0.1815 |
| Comparative Example Compound C3 | 2.7620 | 2.5812 | 0.1808 | 0.2409 |
| Comparative Example Compound C4 | 2.9716 | 2.5419 | 0.4298 | 0.0638 |

Referring to Table 3, it may be seen that Comparative Example Compound C3 and Compounds 27, 51, 57, 81, and 91 have $\Delta E_{ST}$ values smaller than those of Comparative Example Compounds C1, C2, and C4. Compounds 27, 51, 57, 81, and 91 are the polycyclic compounds of examples, which contain, as a substituent, a pentacyclic group in which two pentagonal rings and three hexagonal rings are fused. Accordingly, it is believed that the polycyclic compounds of examples may be used as a thermally delayed fluorescence dopant material. Compounds 27, 51, 57, 81, and 91 are a multi-resonance (MR) type of delayed fluorescence material, may each have a FWHM equal to or less than about 25 nm, and may each exhibit a large value of oscillator strength due to the narrow FWHM. It may be seen that Compounds 27, 51, 57, 81, and 91, which are Example Compounds, have oscillator strengths larger than those of Comparative Example Compounds C1 to C4. It may be seen that Compounds 27, 51, 57, 81, and 91 each have an oscillator strength of about 0.25 to about 0.60. The oscillator strength indicates a degree of overlapping between the LUMO and the HOMO, and the oscillator strength value may increase with increasing the degree of overlapping between the LUMO and the HOMO. Accordingly, it is believed that the light emitting element including the polycyclic compound of an example may have an improvement in luminous efficiency.

In Table 3, it may be seen that Comparative Example Compound C3 is a donor-acceptor (DA) type of delayed fluorescence material and has a very small $\Delta E_{ST}$ value. The DA-type material has a FWHM equal to or greater than about 50 nm, which exhibits characteristics of a FWHM wider than that of the MR-type material. Comparative Example Compound C3 has an oscillator strength of less than about 0.25.

3. Manufacture and Evaluation of Light Emitting Elements 1

(1) Manufacture of Light Emitting Elements 1

Light emitting elements including the polycyclic compound of an Example or a Comparative Example Compound in the emission layer were manufactured as follows. Compounds 18, 27, 51, 57, 81 and 91 that are the polycyclic compounds of Examples were used as a dopant material of the emission layer to manufacture the light emitting elements of Examples 1-1 to 1-6, respectively. Comparative Example Compound C1 to Comparative Example Compound C4 were used as a dopant material in the emission layer to manufacture the light emitting elements of Comparative Examples 1-1 to 1-4, respectively.

A glass substrate (made by Corning Co.), on which an ITO electrode of about 15 $\Omega/cm^2$ (about 1,200 Å) is formed as an anode, was cut to a size of about 50 mm×50 mm×0.7 mm, cleansed by ultrasonic waves using isopropyl alcohol and pure water for about five minutes, and irradiated with ultraviolet rays for about 30 minutes and exposed to ozone and cleansed. The glass substrate was installed on a vacuum deposition apparatus.

NPD was deposited on the upper portion of the anode to form a 300 Å-thick hole injection layer, a hole transport layer material was deposited on the upper portion of the hole injection layer to form a 200 Å-thick hole transport layer, and CzSi was deposited on the upper portion of the hole transport layer to form a 100 Å-thick emission-auxiliary layer.

On the upper portion of the emission-auxiliary layer, a host mixture, a phosphorescent sensitizer PS1, and a dopant were co-deposited at a weight ratio of 85:14:1 to form a 200 Å-thick emission layer. The host mixture was provided by mixing HT1 and ET1 at a weight ratio of 1:1.

TSP01 was deposited on the upper portion of the emission layer to form a 50 Å-thick hole blocking layer, TPBI was deposited on the upper portion of the hole blocking layer to form a 300 Å-thick electron transport layer, LiF was deposited on the upper portion of the electron transport layer to form a 10 Å-thick electron injection layer, and A1 was deposited on the upper portion of the electron injection layer to form a 3,000 Å-thick cathode, and P4 was deposited on the upper portion of the electrode to form a 700 Å-thick capping layer, thereby manufacturing a light emitting element.

(Compounds Used to Manufacture Light Emitting Elements)

H-1-2

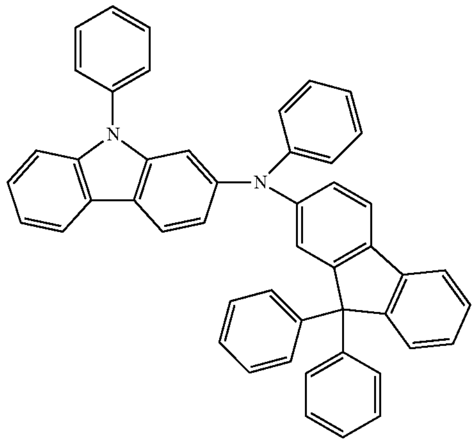

-continued
H-1-3
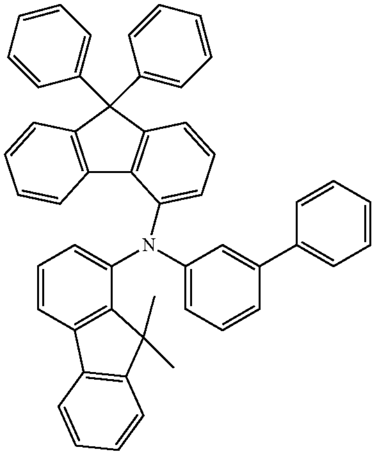
H-1-4
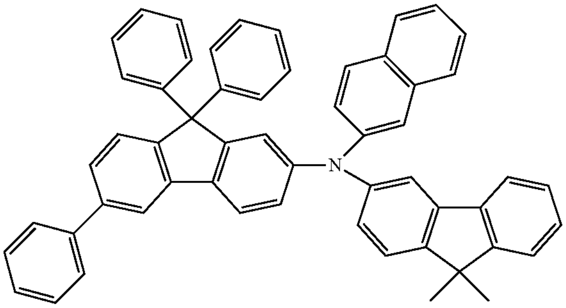
H-1-5
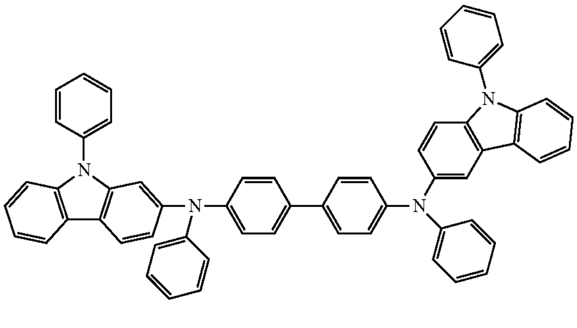
-continued
H-1-6
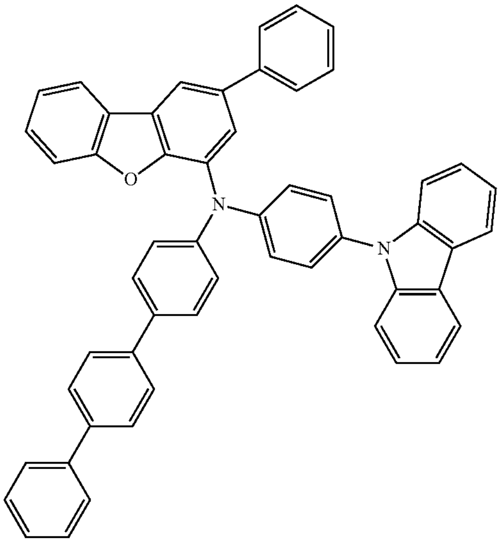
H-1-7
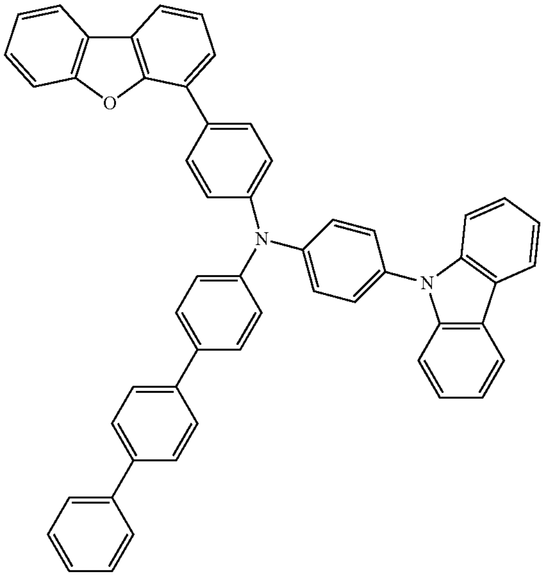
H-1-10
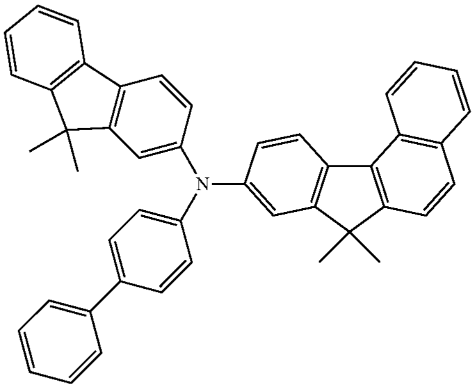

-continued

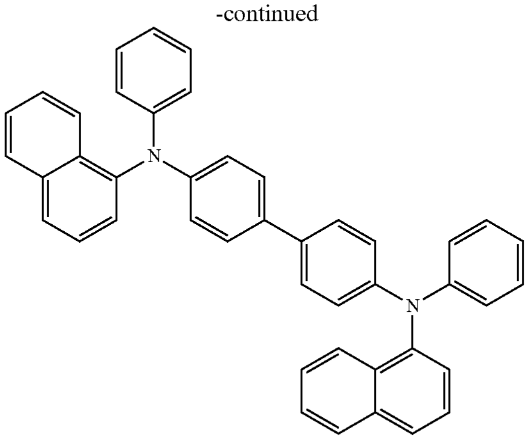

NPD

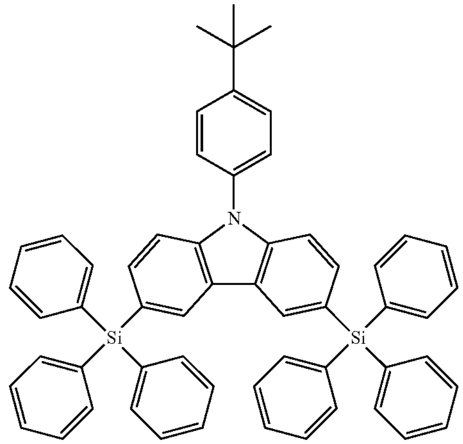

CzSi

PS1

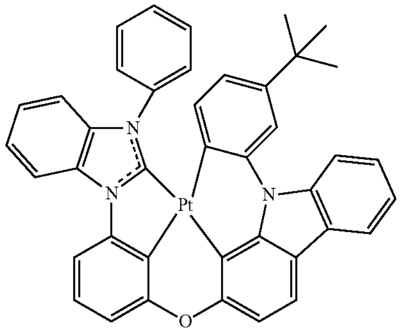

HT1

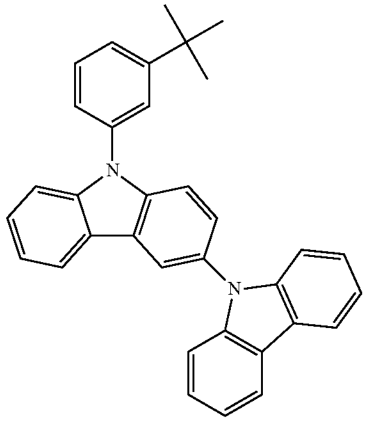

-continued

ET1

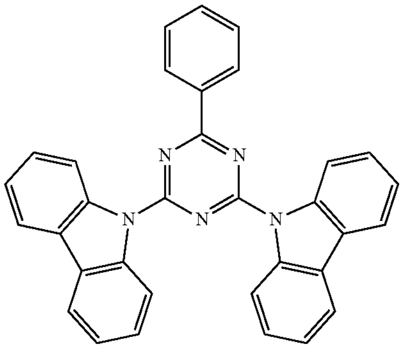

TSPO1

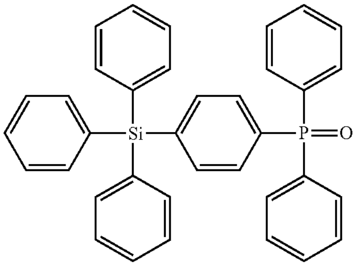

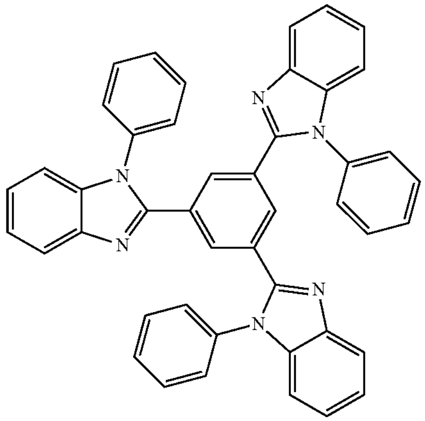

TPBi

P4

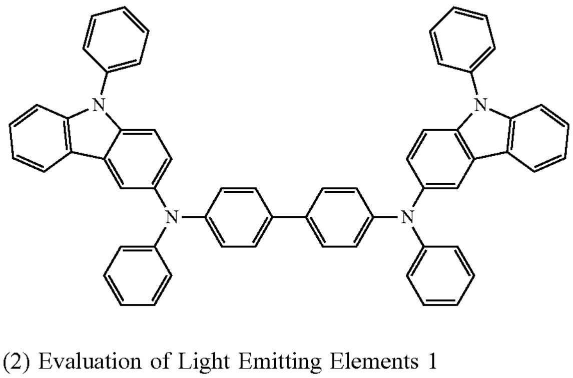

(2) Evaluation of Light Emitting Elements 1

Driving voltages (V), luminous efficiencies (cd/A), maximum external quantum efficiencies ($EQE_{max}$, %), and emission colors of the light emitting elements according to Examples 1-1 to 1-6 and Comparative Examples 1-1 to 1-4 are listed in Table 4. The driving voltages (V), luminous efficiencies (cd/A), maximum external quantum efficiencies ($EQE_{max}$, %), and emission colors of the light emitting elements were measured at a brightness of 1,000 cd/m$^2$ by using Keithley MU 236 and a luminance meter PR650.

TABLE 4

| Examples of manufactured elements | Hole transport layer material | Host | Phosphorescent sensitizer | Dopant | Driving voltage (V) | Luminous efficiency (cd/A) | Maximum external quantum efficiency ($EQE_{max}$, %) | Luminous color |
|---|---|---|---|---|---|---|---|---|
| Example 1-1 | H-1-3 | HT1/ET1 | PS1 | Compound 18 | 4.4 | 24.9 | 23.8 | Blue |
| Example 1-2 | H-1-5 | HT1/ET1 | PS1 | Compound 27 | 4.6 | 24.6 | 23.7 | Blue |
| Example 1-3 | H-1-6 | HT1/ET1 | PS1 | Compound 51 | 4.5 | 23.8 | 22.7 | Blue |
| Example 1-4 | H-1-7 | HT1/ET1 | PS1 | Compound 57 | 4.6 | 22.6 | 21.5 | Blue |
| Example 1-5 | H-1-10 | HT1/ET1 | PS1 | Compound 81 | 4.6 | 23.2 | 22.4 | Blue |
| Example 1-6 | H-1-2 | HT1/ET1 | PS1 | Compound 91 | 4.5 | 23.7 | 22.5 | Blue |
| Comparative Example 1-1 | H-1-7 | HT1/ET1 | PS1 | Comparative Example Compound C1 | 5.2 | 15.6 | 14.5 | Blue |
| Comparative Example 1-2 | H-1-4 | HT1/ET1 | PS1 | Comparative Example Compound C2 | 5.3 | 14.8 | 13.6 | Blue |
| Comparative Example 1-3 | H-1-3 | HT1/ET1 | PS1 | Comparative Example Compound C3 | 5.5 | 13.6 | 12.5 | Blue |
| Comparative Example 1-4 | H-1-2 | HT1/ET1 | PS1 | Comparative Example Compound C4 | 5.7 | 15.1 | 13.9 | Blue |

Referring to Table 4, it may be seen that the light emitting elements of Comparative Examples 1-1 to 1-4 and Examples 1-1 to 1-6 emit blue light. It may be seen that the light emitting elements of Examples 1-1 to 1-6 have low driving voltages and excellent efficiencies compared to the light emitting elements of Comparative Examples 1-1 to 1-4.

It can be seen that the light emitting element of Example 1-1 has a low driving voltage and excellent efficiency compared to the light emitting element of Comparative Example 1-3 having the same hole transport layer material. It may be seen that the light emitting element of Example 1-4 has a low driving voltage and excellent efficiency compared to the light emitting element of Comparative Example 1-1 having the same hole transport layer material. It may be seen that the light emitting element of Example 1-6 has a low driving voltage and excellent efficiency compared to the light emitting element of Comparative Example 1-4 having the same hole transport layer material.

The light emitting elements of Examples 1-1 to 1-6 include Compounds 18, 27, 51, 57, 81, and 91, respectively, which are Example Compounds. Compounds 18, 27, 51, 57, 81 and 91 are the polycyclic compounds of examples, which contain, as a substituent, a pentacyclic group in which two pentagonal rings and three benzene rings are fused. In the polycyclic compound of an example, the fused pentacyclic group is bonded to the pentacyclic fused ring containing a boron atom as a ring-forming atom. Accordingly, the light emitting element including the polycyclic compound of an example may have a decrease in the driving voltage and an improvement in the efficiency.

The light emitting elements according to Comparative Examples 1-1, 1-2, and 1-4 include Comparative Example Compounds C1, C2, and C4, respectively. Comparative Example Compounds C1, C2, and C4 include a pentacyclic fused ring containing one boron atom and two nitrogen atoms as ring-forming atoms, but a dibenzofuran group or a carbazole group is bonded to the pentacyclic fused ring as a substituent.

The light emitting element according to Comparative Example 1-3 includes Comparative Example Compound C3, and Comparative Example Compound C3 includes a pentacyclic fused ring containing one boron atom, two oxygen atoms, and one nitrogen atom as ring-forming atoms. Comparative Example Compound C3 includes four heteroatoms as ring-forming atoms in the pentacyclic fused ring.

4. Manufacture and Evaluation of Light Emitting Elements 2

(1) Manufacture of Light Emitting Elements 2

The light emitting elements of Examples 2-1 to 2-6 were manufactured in the same manner as the light emitting elements of Examples 1-1 to 1-6 except that the phosphorescent sensitizer was not used when the emission layer was formed. The light emitting elements of Comparative Examples 2-1 to 2-4 were manufactured in the same manner as the light emitting elements of Comparative Examples 1-1 to 1-4 except that the phosphorescent sensitizer was not used when the emission layer was formed. For the light emitting elements of Comparative Examples 2-1 to 2-4 and Examples 2-1 to 2-6, when the emission layer was formed, a host mixture and a dopant were provided at a weight ratio of 99:1 and co-deposited to a thickness of about 200 Å.

(2) Evaluation of Light Emitting Elements 2

Driving voltages (V), luminous efficiencies (cd/A), maximum external quantum efficiencies ($EQE_{max}$, %), and emission colors of the light emitting elements according to Examples 2-1 to 2-6 and Comparative Examples 2-1 to 2-4 are listed in Table 5. The driving voltages (V), luminous efficiencies (cd/A), maximum external quantum efficiencies ($EQE_{max}$, %), and emission colors of the light emitting elements were measured at a brightness of 1,000 cd/$m^2$ by using Keithley MU 236 and a luminance meter PR650.

TABLE 5

| Examples of manufactured elements | Hole transport layer material | Host | Dopant | Driving voltage (V) | Luminous efficiency (cd/A) | Maximum external quantum efficiency ($EQE_{max}$, %) | Luminous color |
|---|---|---|---|---|---|---|---|
| Example 2-1 | H-1-3 | HT1/ET1 | Compound 18 | 5.3 | 8.3 | 7.9 | Blue |
| Example 2-2 | H-1-5 | HT1/ET1 | Compound 27 | 5.5 | 8.2 | 7.9 | Blue |
| Example 2-3 | H-1-6 | HT1/ET1 | Compound 51 | 5.4 | 7.9 | 7.6 | Blue |
| Example 2-4 | H-1-7 | HT1/ET1 | Compound 57 | 5.5 | 7.5 | 7.2 | Blue |
| Example 2-5 | H-1-10 | HT1/ET1 | Compound 81 | 5.5 | 7.7 | 7.5 | Blue |
| Example 2-6 | H-1-2 | HT1/ET1 | Compound 91 | 5.5 | 7.9 | 7.5 | Blue |
| Comparative Example 2-1 | H-1-7 | HT1/ET1 | Comparative Example Compound C1 | 6.1 | 5.2 | 4.8 | Blue |
| Comparative Example 2-2 | H-1-4 | HT1/ET1 | Comparative Example Compound C2 | 6.2 | 4.9 | 4.5 | Blue |
| Comparative Example 2-3 | H-1-3 | HT1/ET1 | Comparative Example Compound C3 | 6.4 | 4.5 | 4.2 | Blue |
| Comparative Example 2-4 | H-1-2 | HT1/ET1 | Comparative Example Compound C4 | 6.3 | 5.0 | 4.6 | Blue |

Referring to Table 5, it may be seen that the light emitting elements of Comparative Examples 2-1 to 2-4 and Examples 2-1 to 2-6 emit blue light. It may be seen that the light emitting elements of Examples 2-1 to 2-6 have low driving voltages and excellent efficiencies compared to the light emitting elements of Comparative Examples 2-1 to 2-4.

It can be seen that the light emitting element of Example 2-1 has a low driving voltage and excellent efficiency compared to the light emitting element of Comparative Example 2-3 having the same hole transport layer material. It may be seen that the light emitting element of Example 2-4 has a low driving voltage and excellent efficiency compared to the light emitting element of Comparative Example 2-1 having the same hole transport layer material. It may be seen that the light emitting element of Example 2-6 has a low driving voltage and excellent efficiency compared to the light emitting element of Comparative Example 2-4 having the same hole transport layer material.

The light emitting elements of Examples 2-1 to 2-6 include Compounds 18, 27, 51, 57, 81, and 91, respectively, which are Example Compounds. Compounds 18, 27, 51, 57, 81 and 91 are the polycyclic compounds of examples, which contain, as a substituent, a pentacyclic group in which two pentagonal rings and three benzene rings are fused. In the polycyclic compound of an example, the fused pentacyclic group is bonded to the pentacyclic fused ring containing a boron atom as a ring-forming atom. Accordingly, the light emitting element including the polycyclic compound of an example may have a decrease in the driving voltage and an improvement in the efficiency.

The light emitting element of an example may include the first compound and at least one among the second to fourth compounds. The second compound may include a substituted or unsubstituted carbazole group, and the third compound may include a hexagonal ring group containing at least one nitrogen atom as a ring-forming atom. The fourth compound may be a platinum-containing compound.

The first compound may be a polycyclic compound of an example. The polycyclic compound of an example may contain a pentacyclic group fused to a pentacyclic fused ring containing a boron atom and two heteroatoms as ring-forming atoms. The fused pentacyclic group is that two pentagonal rings and three benzene rings are fused, and the two pentagonal rings contain N, O, or S as a ring-forming atom. The polycyclic compound of an example may exhibit a large oscillator strength value due to the steric characteristics of the fused pentacyclic group. The polycyclic compound of an example contains the fused pentacyclic group as a substituent, and thus the electron density is concentrated in the pentacyclic fused ring containing a boron atom as a ring-forming atom. As the electron density is concentrated in the pentacyclic fused ring, the polycyclic compound of an example may have multiple resonances stabilized. Accordingly, the polycyclic compound of an example may contribute to improving efficiency and reducing driving voltage of the light emitting element.

The light emitting element of an embodiment includes a first compound and at least one among second to fourth compounds, thereby exhibiting reduced driving voltage and improved efficiency characteristics.

The polycyclic compound of an embodiment may reduce the driving voltage of the light emitting element and improve the luminous efficiency.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A light emitting element comprising:

a first electrode;

a second electrode disposed on the first electrode; and an emission layer disposed between the first electrode and the second electrode, wherein the emission layer comprises:

a first compound represented by Formula 1 and having a luminescence center wavelength in a range of about 440 nm to about 480 nm; and at least one of a second compound represented by Formula HT-1, a third compound represented by Formula ET-1, or a fourth compound represented by Formula M-b:

[Formula 1]

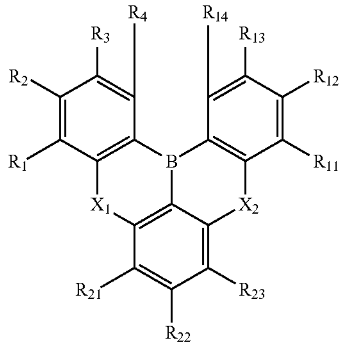

wherein in Formula 1, $X_1$ and $X_2$ are each independently $N(R_0)$, O, or S, $R_0$ is a hydrogen atom, a deuterium atom, a halogen atom, a substituted or unsubstituted alkyl group having 1 to 20 carbon atoms, a substituted or unsubstituted hydrocarbon ring group having 6 to 60 ring-forming carbon atoms, or a substituted or unsubstituted heteroaryl group having 2 to 60 ring-forming carbon atoms, at least one of $R_1$ to $R_4$, $R_{11}$ to $R_{14}$, and $R_{21}$ to $R_{23}$ is each independently a group represented by Formula 2, and the remainder of $R_1$ to $R_4$, $R_{11}$ to $R_{14}$, and $R_{21}$ to $R_{23}$ are each independently a hydrogen atom, a deuterium atom, a halogen atom, a substituted or unsubstituted amine group, a substituted or unsubstituted alkyl group having 1 to 20 carbon atoms, a substituted or unsubstituted hydrocarbon ring group having 6 to 60 ring-forming carbon atoms, or a substituted or unsubstituted heteroaryl group having 2 to 60 ring-forming carbon atoms:

[Formula 2]

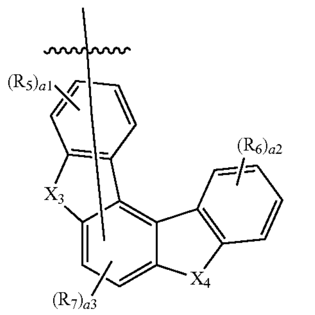

wherein in Formula 2, $X_3$ and $X_4$ are each independently $N(R_8)$, O, or S, a1 and a2 are each independently an integer from 0 to 4, a3 is an integer from 0 to 2, $R_5$ to $R_8$ are each independently a hydrogen atom, a deuterium atom, a halogen atom, a substituted or unsubstituted silyl group, a substituted or unsubstituted alkyl group having 1 to 20 carbon atoms, or a substituted or unsubstituted aryl group having 6 to 60 ring-forming carbon atoms, and

represents a binding site to a neighboring atom:

[Formula HT-1]

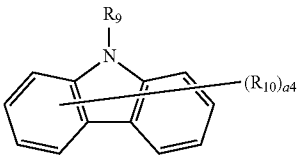

wherein in Formula HT-1, a4 is an integer from 0 to 8, and $R_9$ and $R_{10}$ are each independently a hydrogen atom, a deuterium atom, a substituted or unsubstituted aryl group having 6 to 60 ring-forming carbon atoms, or a substituted or unsubstituted heteroaryl group having 2 to 60 ring-forming carbon atoms:

[Formula ET-1]

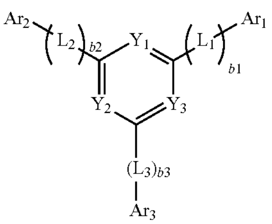

wherein in Formula ET-1, at least one of $Y_1$ to $Y_3$ is N, the remainder of $Y_1$ to $Y_3$ are each independently $C(R_a)$, $R_a$ is a hydrogen atom, a deuterium atom, a substituted or unsubstituted alkyl group having 1 to 20 carbon atoms, a substituted or unsubstituted aryl group having 6 to 60 ring-forming carbon atoms, or a substituted or unsubstituted heteroaryl group having 2 to 60 ring-forming carbon atoms, b1 to b3 are each independently an integer from 0 to 10, $L_1$ to $L_3$ are each independently a direct linkage, a substituted or unsubstituted arylene group having 6 to 30 ring-forming carbon atoms, or a substituted or unsubstituted heteroarylene group having 2 to 30 ring-forming carbon atoms, and $Ar_1$ to $Ar_3$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms:

[Formula M-b]

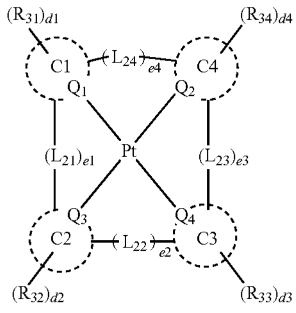

wherein in Formula M-b, $Q_1$ to $Q_4$ are each independently C or N, $C_1$ to $C_4$ are each independently a substituted or unsubstituted hydrocarbon ring group having 5 to 30 ring-forming carbon atoms, or a substituted or unsubstituted heterocyclic group having 2 to 30 ring-forming carbon atoms, e1 to e4 are each independently 0 or 1, $L_{21}$ to $L_{24}$ are each independently a direct linkage,

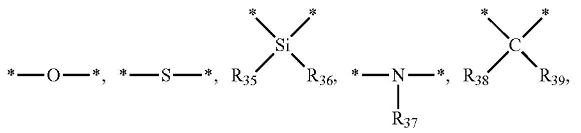

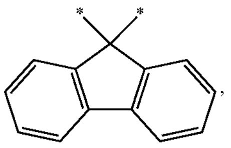

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, d1 to d4 are each independently an integer from 0 to 4, and $R_{31}$ to $R_{39}$ are each independently a hydrogen atom, a deuterium atom, a halogen atom, a cyano group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring.

2. The light emitting element of claim 1, wherein the group represented by Formula 2 is represented by one of Formula 2-1 to Formula 2-4:

[Formula 2-1]

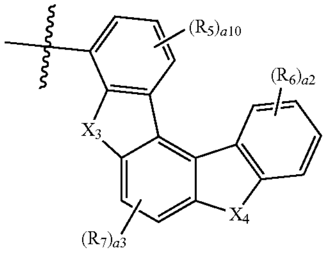

[Formula 2-2]

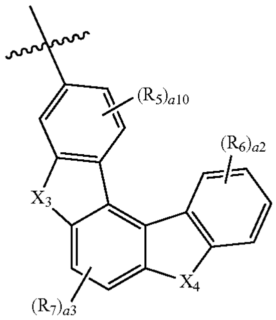

[Formula 2-3]

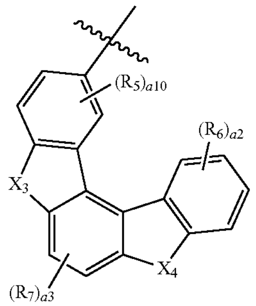

[Formula 2-4]

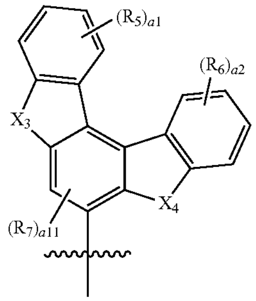

wherein in Formula 2-1 to Formula 2-3, a10 is an integer from 0 to 3, wherein in Formula 2-4, a11 is 0 or 1, and wherein in Formula 2-1 to Formula 2-4, a1 to a3, $R_5$ to $R_7$, $X_3$, and $X_4$ are each the same as defined in Formula 2, and

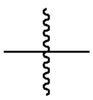

represents a binding site to a neighboring atom.

3. The light emitting element of claim 1, wherein the group represented by Formula 2 is represented by one of Formula 2-A to Formula 2-F:

[Formula 2-A]

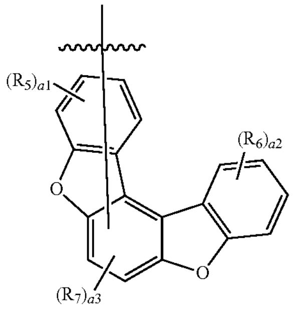

[Formula 2-B]

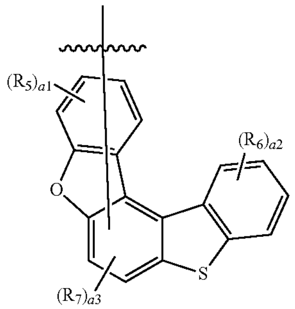

[Formula 2-C]

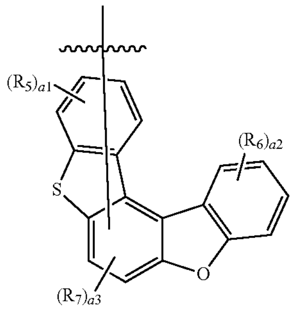

[Formula 2-D]

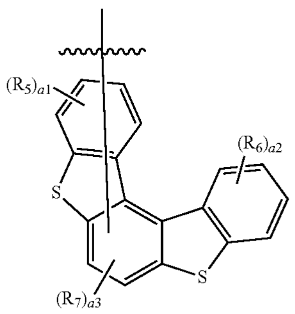

-continued

[Formula 2-E]

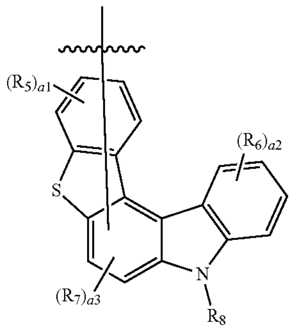

[Formula 2-F]

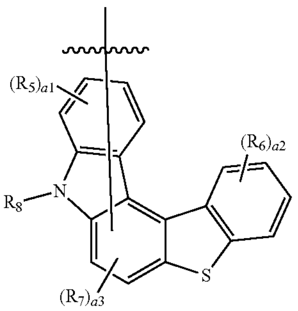

wherein in Formula 2-A to Formula 2-F, a1 to a3 and $R_5$ to $R_8$ are each the same as defined in Formula 2, and

represents a binding site to a neighboring atom.

4. The light emitting element of claim 1, wherein the first compound represented by Formula 1 is represented by one of Formula 1-1 to Formula 1-5:

[Formula 1-1]

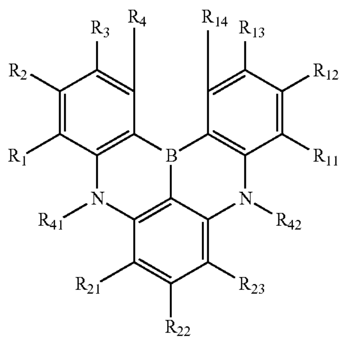

-continued

[Formula 1-2]

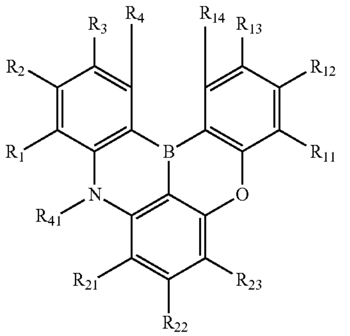

[Formula 1-3]

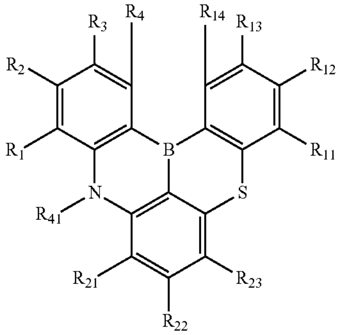

[Formula 1-4]

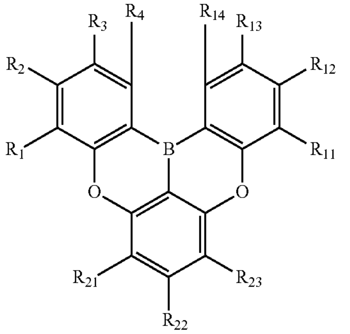

[Formula 1-5]

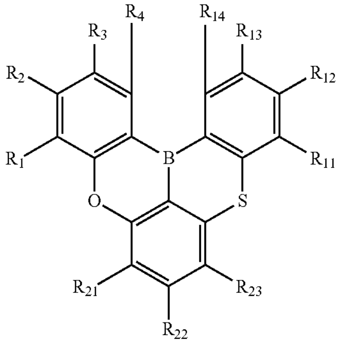

wherein in Formula 1-1 to Formula 1-3, $R_{41}$ and $R_{42}$ are each independently a hydrogen atom, a deuterium atom, a halogen atom, a substituted or unsubstituted alkyl group having 1 to 20 carbon atoms, a substituted or unsubstituted hydrocarbon ring group having 6 to 60 ring-forming carbon atoms, or a substituted or unsubstituted heteroaryl group having 2 to 60 ring-forming carbon atoms, and wherein in Formula 1-1 to Formula 1-5, $R_1$ to $R_4$, $R_{11}$ to $R_{14}$, and $R_{21}$ to $R_{23}$ are each the same as defined in Formula 1.

5. The light emitting element of claim 4, wherein $R_{41}$ and $R_{42}$ are each independently a group represented by one of R11-1 to R11-6:

R11-1

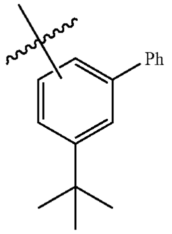

R11-2

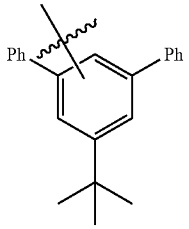

R11-3

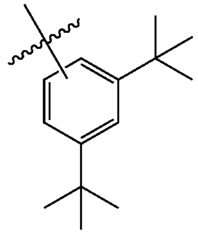

R11-4

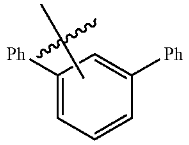

R11-5

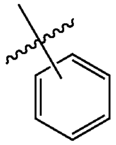

R11-6

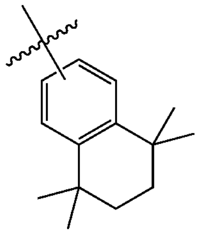

wherein in R11-1, R11-2, and R11-4,

Ph is a phenyl group, and wherein in R11-1 to R11-6,

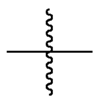

represents a binding site to a neighboring atom.

6. The light emitting element of claim 1, wherein the first compound represented by Formula 1 is represented by one of Formula 1-A to Formula 1-C:

[Formula 1-A]

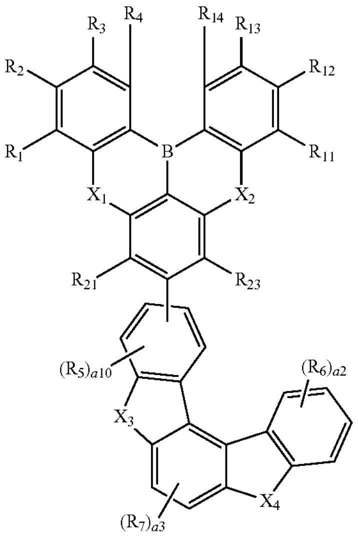

[Formula 1-B]

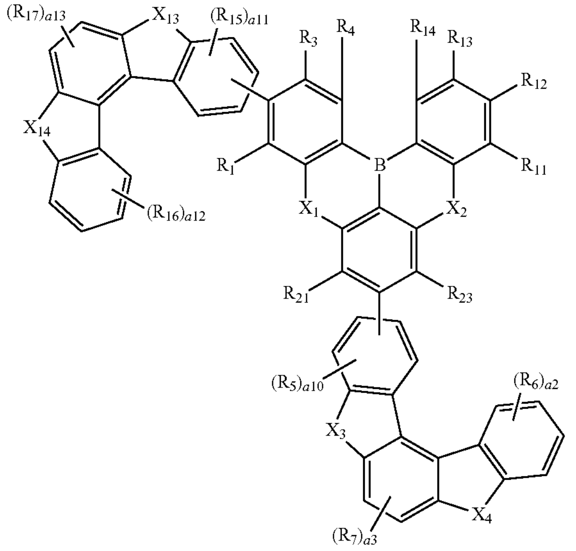

-continued

[Formula 1-C]

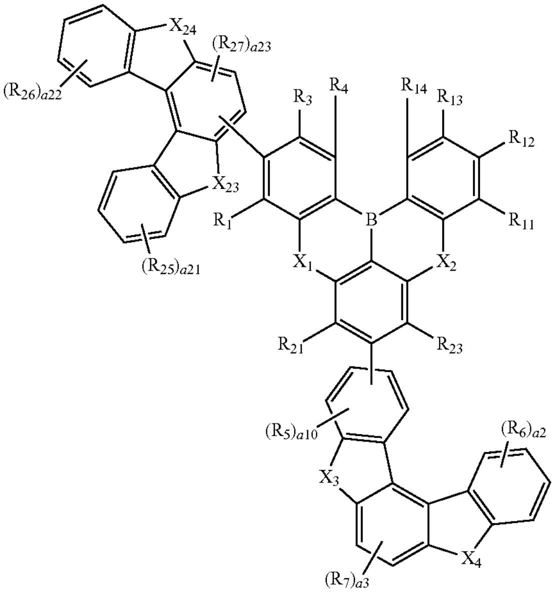

wherein in Formula 1-B, $X_{13}$ and $X_{14}$ are each independently $N(R_{18})$, O, or S, a11 is an integer from 0 to 3, a12 is an integer from 0 to 4, a13 is an integer from 0 to 2, and $R_{15}$ to $R_{18}$ are each independently a hydrogen atom, a deuterium atom, a halogen atom, a substituted or unsubstituted silyl group, a substituted or unsubstituted alkyl group having 1 to 20 carbon atoms, or a substituted or unsubstituted aryl group having 6 to 60 ring-forming carbon atoms, wherein in Formula 1-C, $X_{23}$ and $X_{24}$ are each independently $N(R_{28})$, O, or S, a21 and a22 are each independently an integer from 0 to 4, a23 is 0 or 1, and $R_{25}$ to $R_{28}$ are each independently a hydrogen atom, a deuterium atom, a halogen atom, a substituted or unsubstituted silyl group, a substituted or unsubstituted alkyl group having 1 to 20 carbon atoms, or a substituted or unsubstituted aryl group having 6 to 60 ring-forming carbon atoms, and wherein in Formula 1-A to Formula 1-C, a10 is an integer from 0 to 3, and a2, a3, $R_1$ to $R_7$, $R_{11}$ to $R_{14}$, $R_{21}$, $R_{23}$, and $X_1$ to $X_4$ are each the same as defined in Formula 1.

7. The light emitting element of claim 1, wherein $R_5$ to $R_7$ are each independently a substituted methyl group, an unsubstituted t-butyl group, an unsubstituted triphenylsilyl group, or a substituted or unsubstituted phenyl group.

8. The light emitting element of claim 1, wherein at least a remaining one of $R_1$ to $R_4$, $R_{11}$ to $R_{14}$, and $R_{21}$ to $R_{23}$ which is not a group represented by Formula 2 is each independently a group represented by one of R1-1 to R1-3:

R1-1

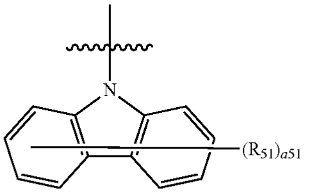

R1-2

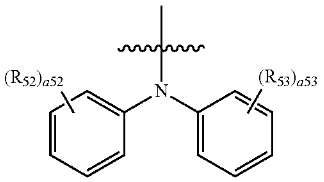

R1-3

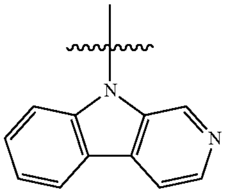

wherein in R1-1, a51 is an integer from 0 to 8, and $R_{51}$ is a hydrogen atom, a deuterium atom, a cyano group, or a substituted or unsubstituted alkyl group having 1 to 10 carbon atoms, and wherein in R1-2, a52 and a53 are each independently an integer from 0 to 5, and $R_{52}$ and $R_{53}$ each independently a hydrogen atom, a deuterium atom, a cyano group, or a substituted or unsubstituted alkyl group having 1 to 10 carbon atoms, and wherein in R1-1 to R1-3,

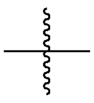

represents a binding site to a neighboring atom.

9. The light emitting element of claim 1, wherein at least one of $R_1$ to $R_4$, $R_{11}$ to $R_{14}$, and $R_{21}$ to $R_{23}$ comprises a deuterium atom.

10. The light emitting element of claim 1, further comprising a hole transport region disposed between the first electrode and the emission layer, wherein the hole transport region comprises a hole transport compound represented by Formula H-1:

[Formula H-1]

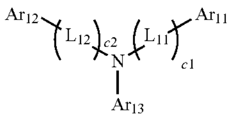

wherein in Formula H-1, c1 and c2 are each independently an integer from 0 to 10, $L_{11}$ and $L_{12}$ are each independently a direct linkage, a substituted or unsubstituted arylene group having 6 to 30 ring-forming carbon atoms, or a substituted or unsubstituted heteroarylene group having 2 to 30 ring-forming carbon atoms, $Ar_{11}$ and $Ar_{12}$ are each independently a substituted or unsubstituted aryl group having 6 to 30 ring-forming carbon atoms, or a substituted or unsubstituted heteroaryl group having 2 to 30 ring-forming carbon atoms, and $Ar_{13}$ is a substituted or unsubstituted aryl group having 6 to 30 ring-forming carbon atoms.

11. The light emitting element of claim 1, wherein the emission layer comprises the first compound, the second compound, and the third compound.

12. The light emitting element of claim 1, wherein the emission layer comprises the first compound, the second compound, the third compound, and the fourth compound.

13. The light emitting element of claim 1, wherein the first compound is selected from Compound Group 1:

[Compound Group 1]

1

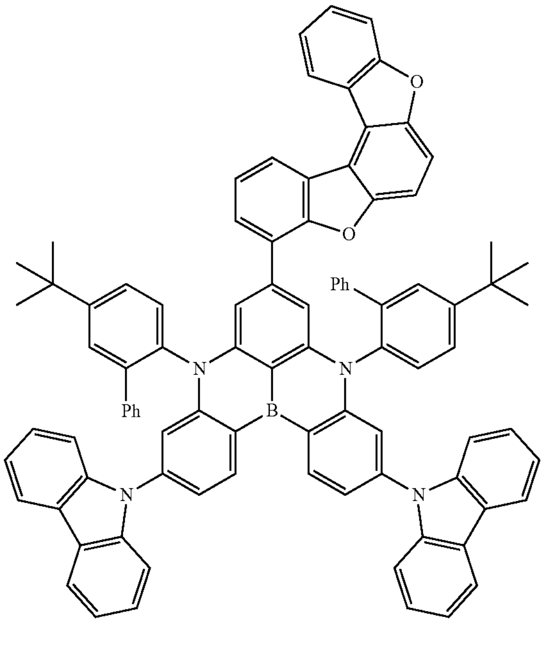

-continued
2
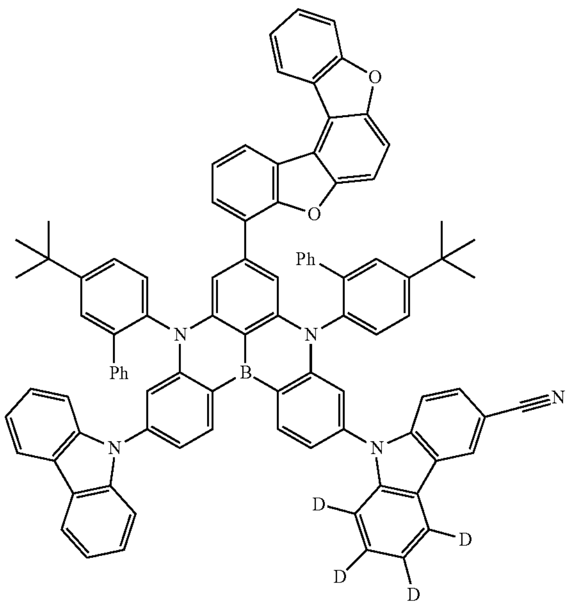
3
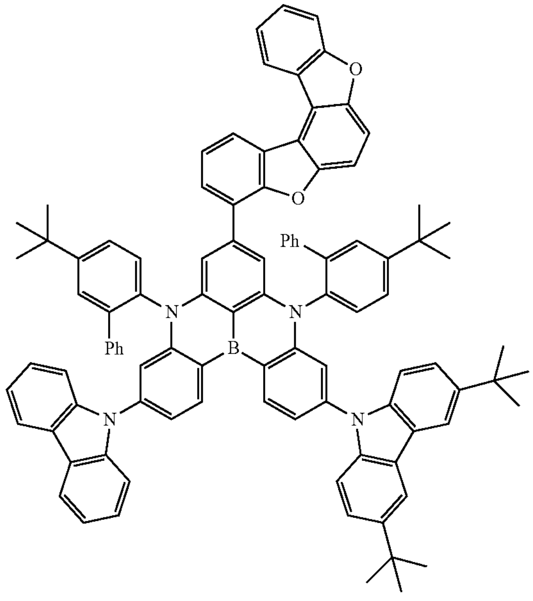
-continued
4
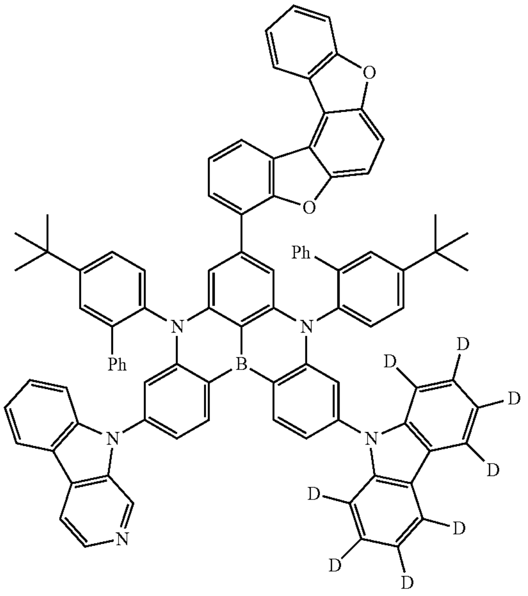
5
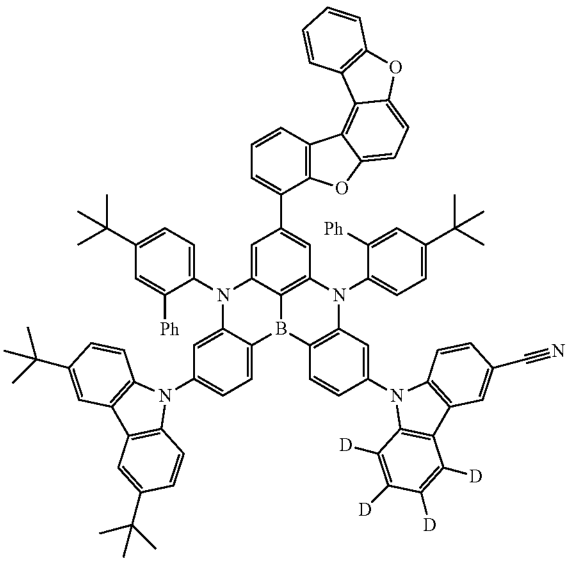

-continued
6
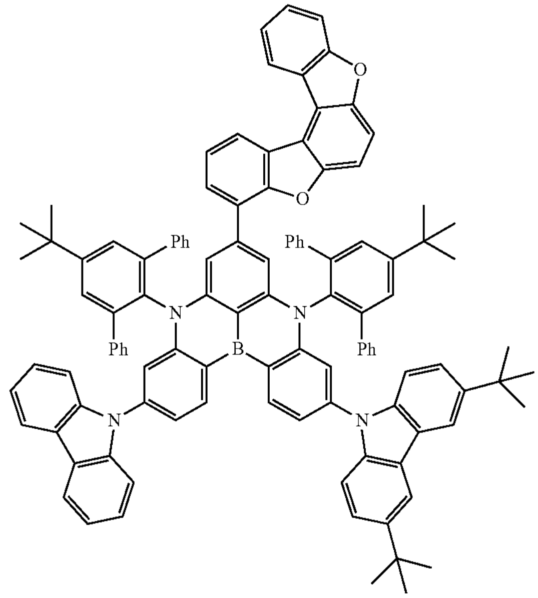
7
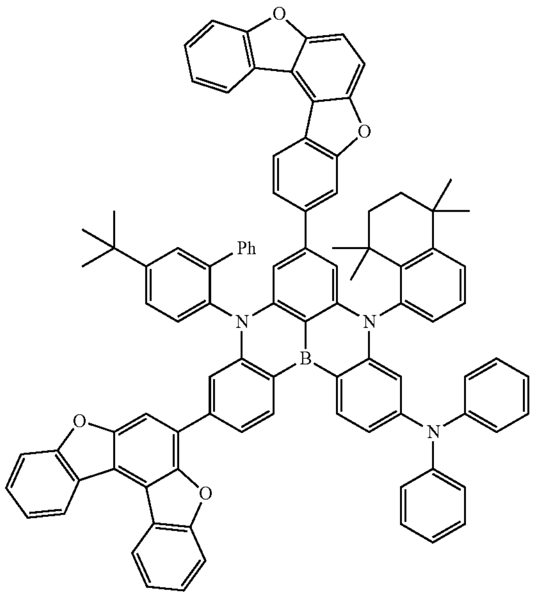
-continued
8
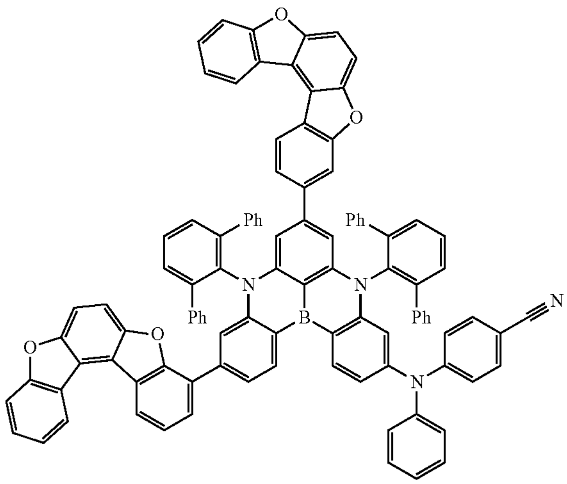
9
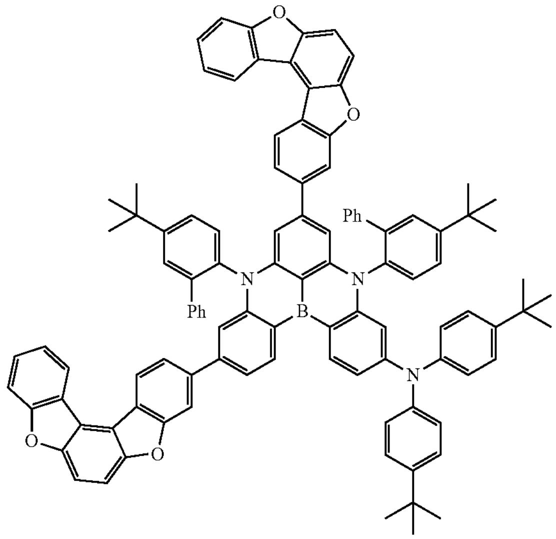
10
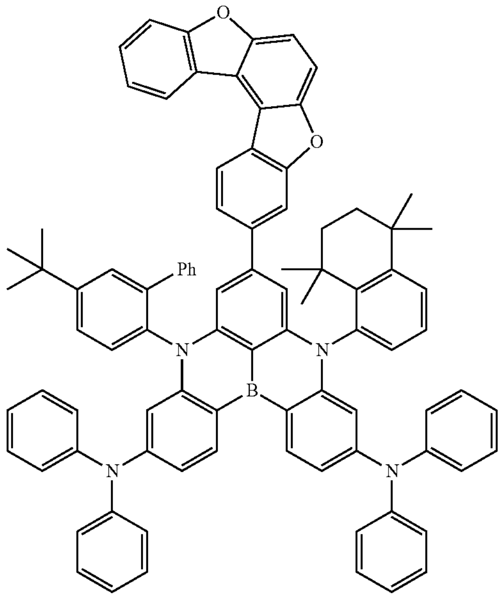

-continued
11
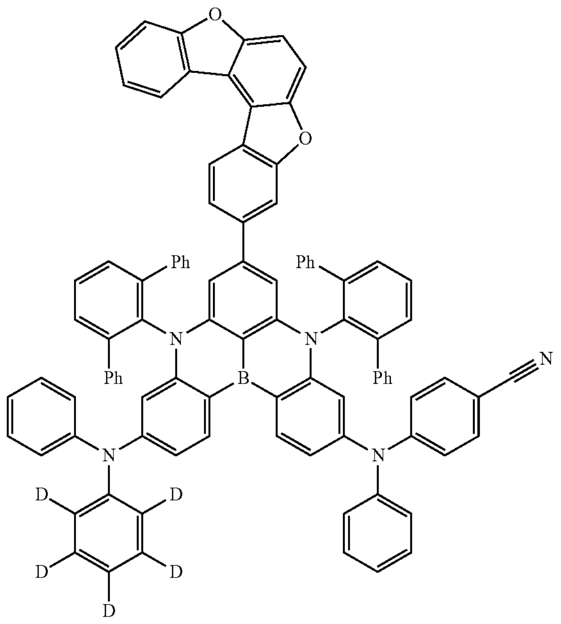
12
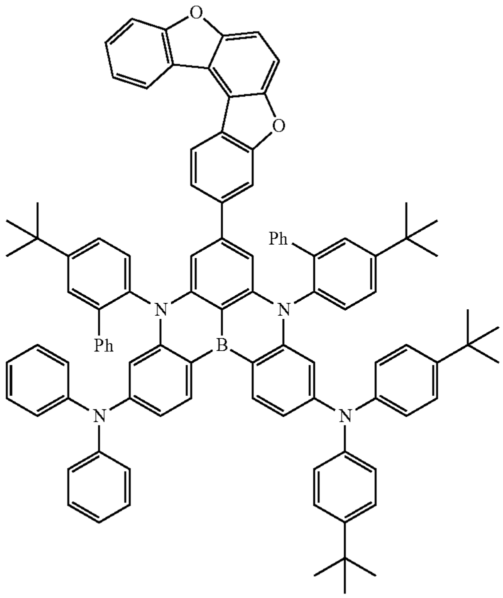
-continued
13
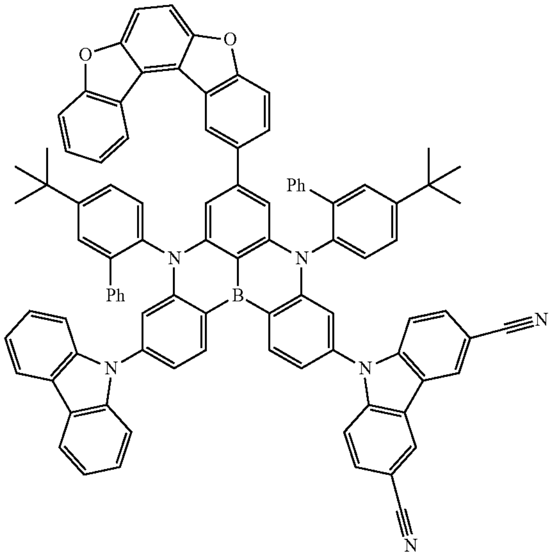
14
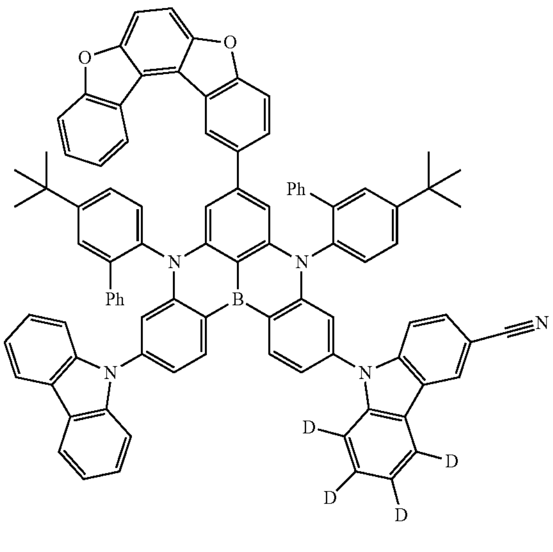

-continued
15
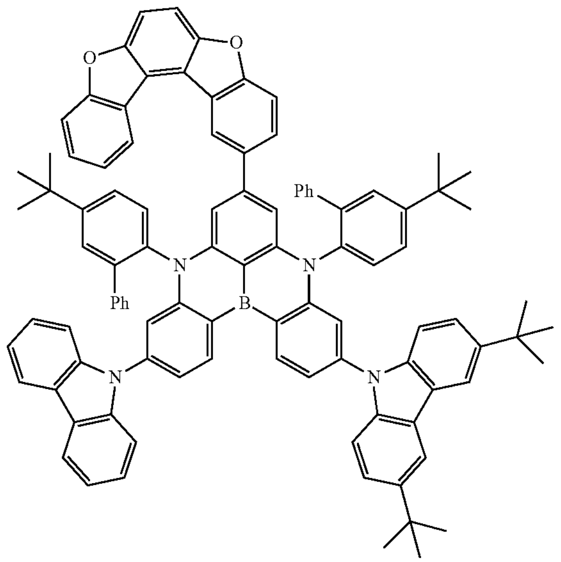
16
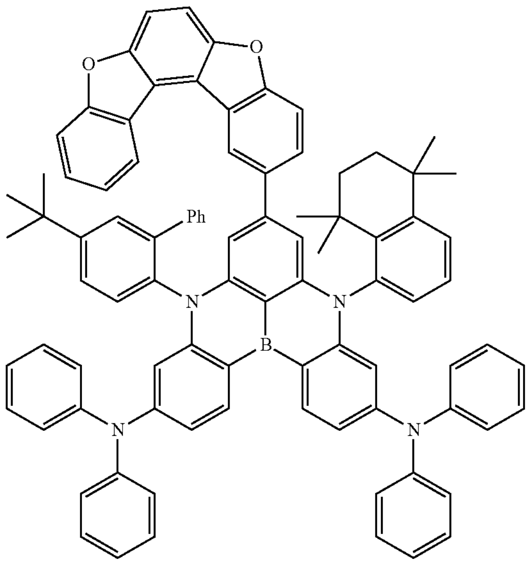
-continued
17
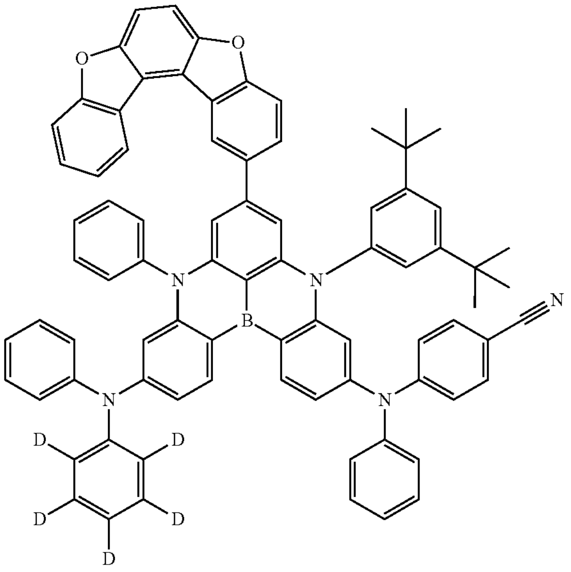
18
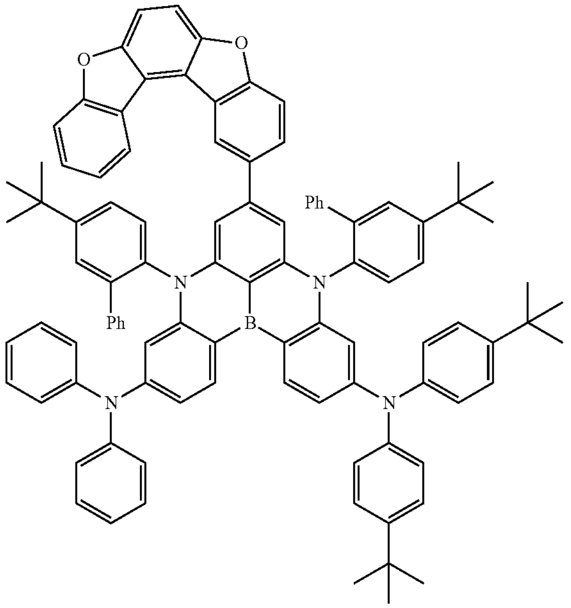

-continued
19
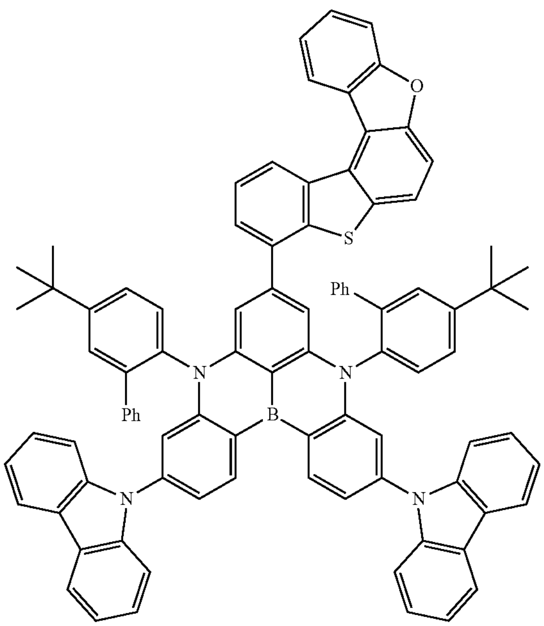
20
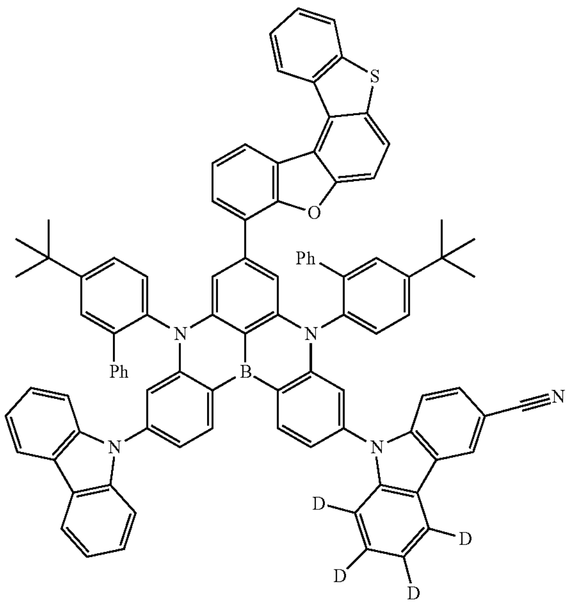
-continued
21
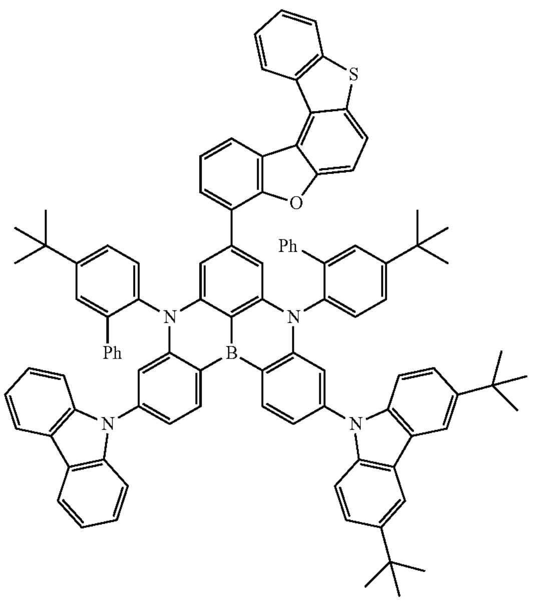
22
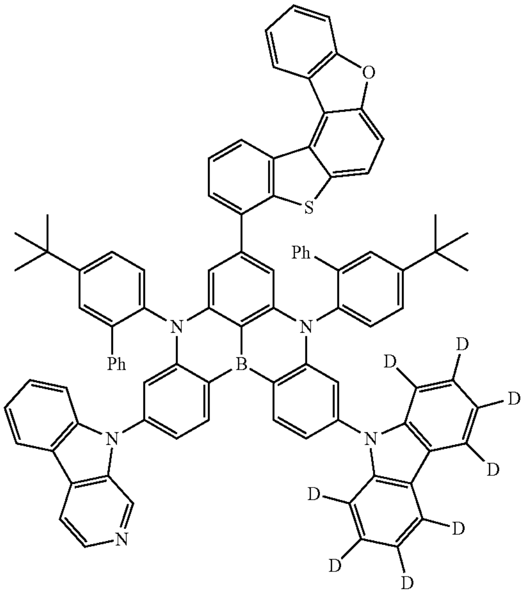

-continued
23
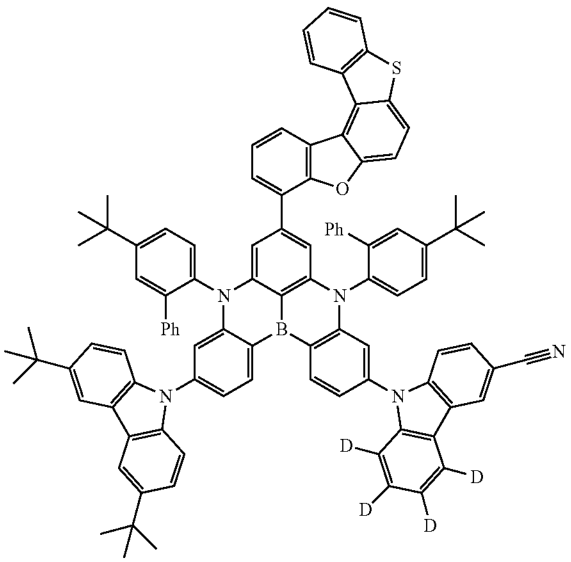
24
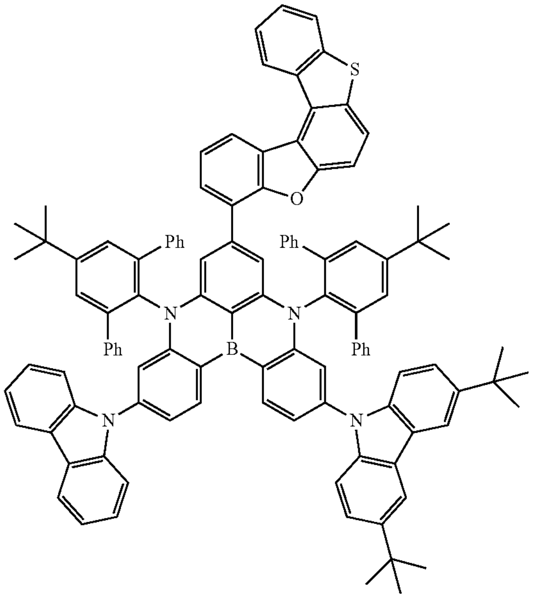
-continued
25
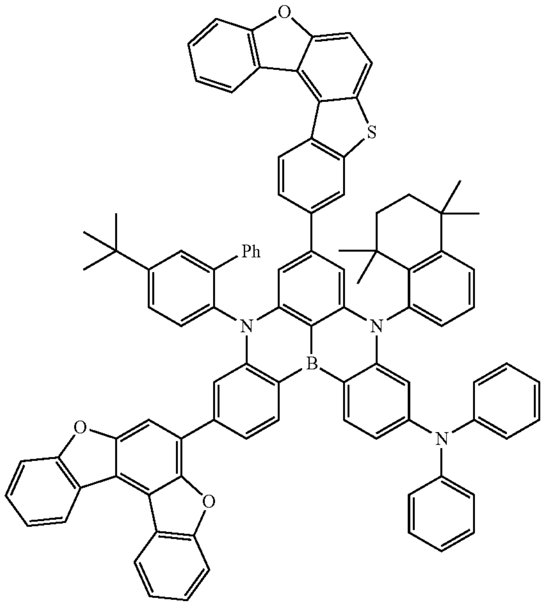
26
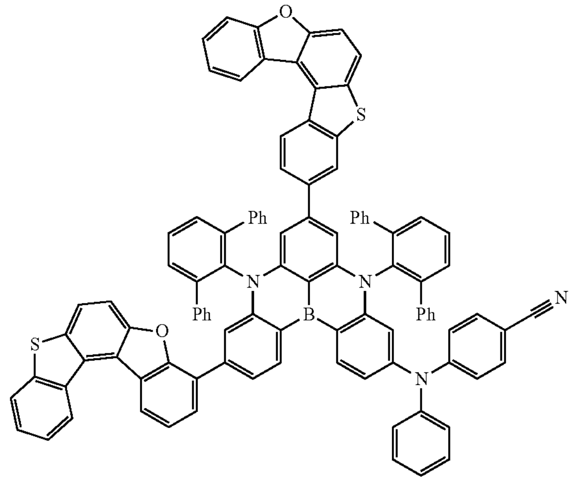

27
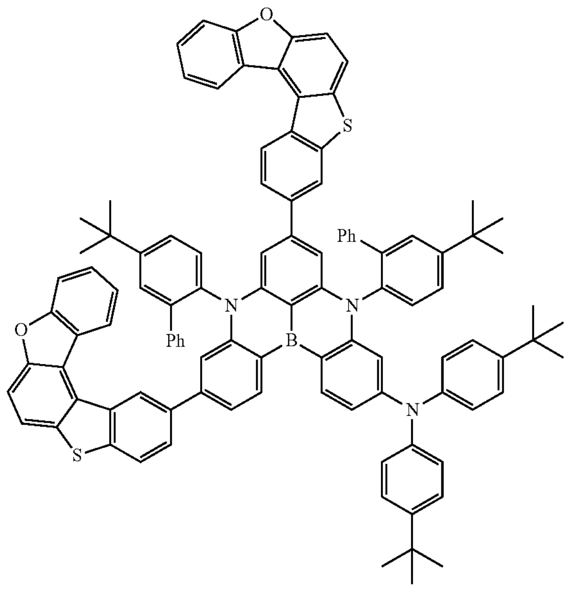
28
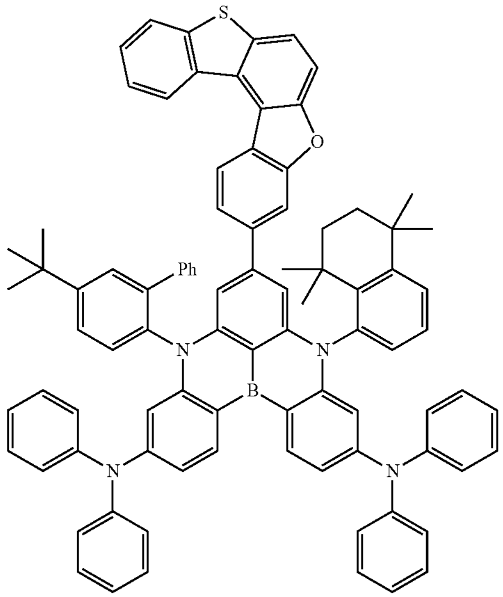
29
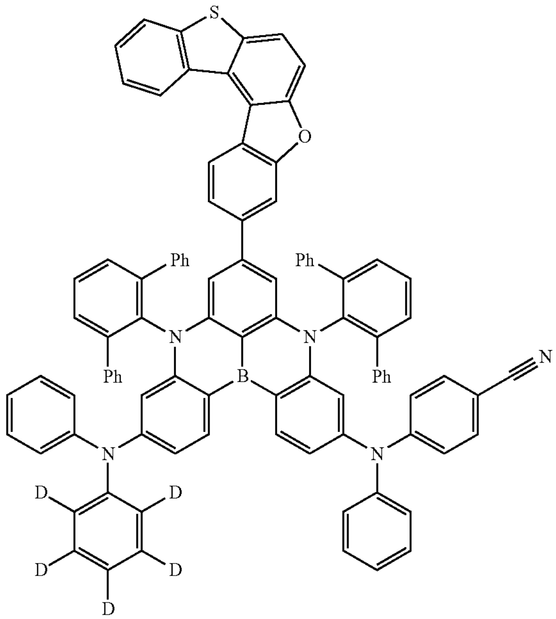
30
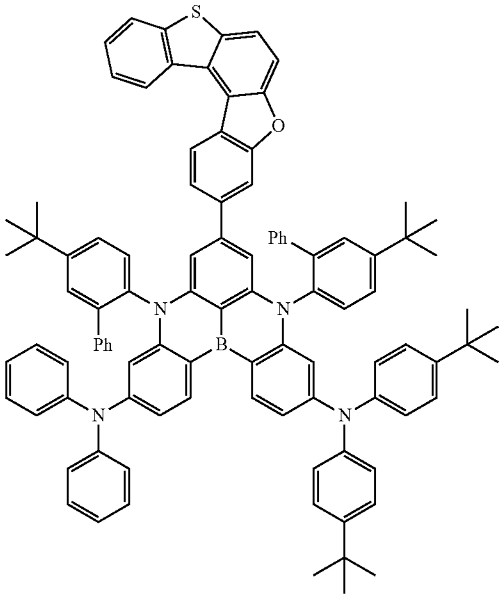

31
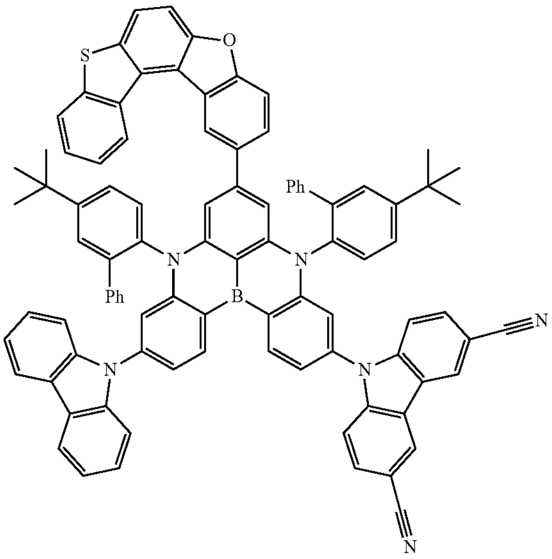
33
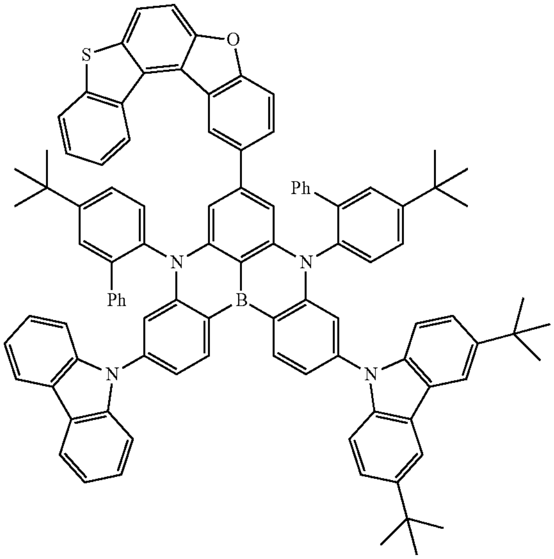
32
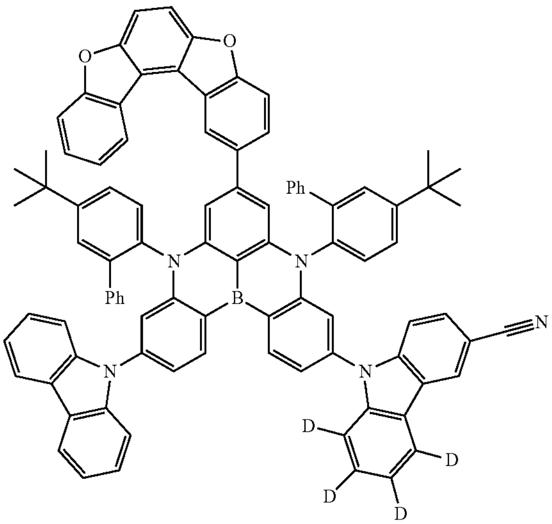
34
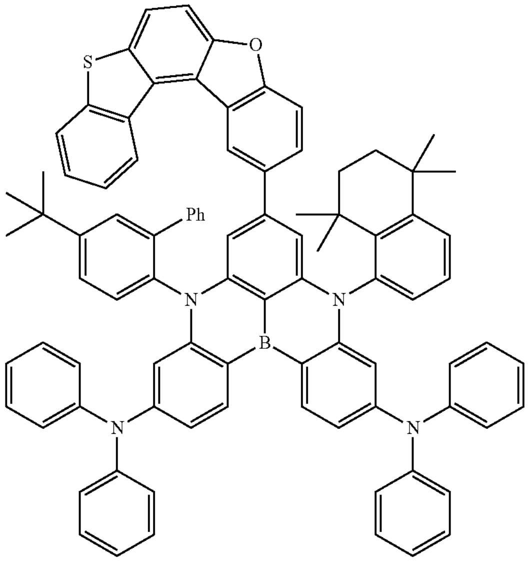

35
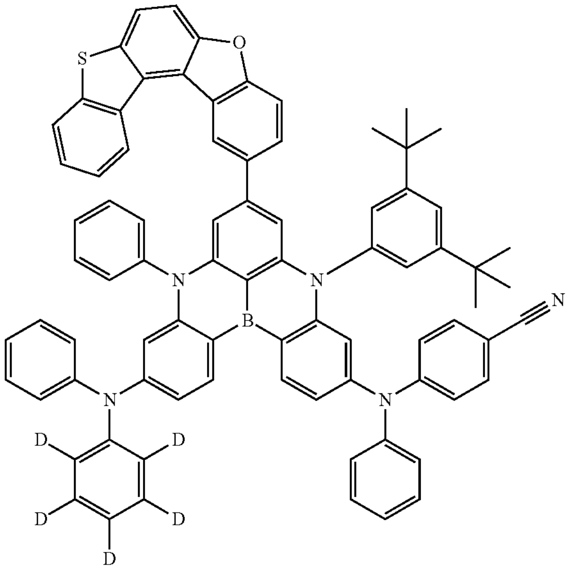
36
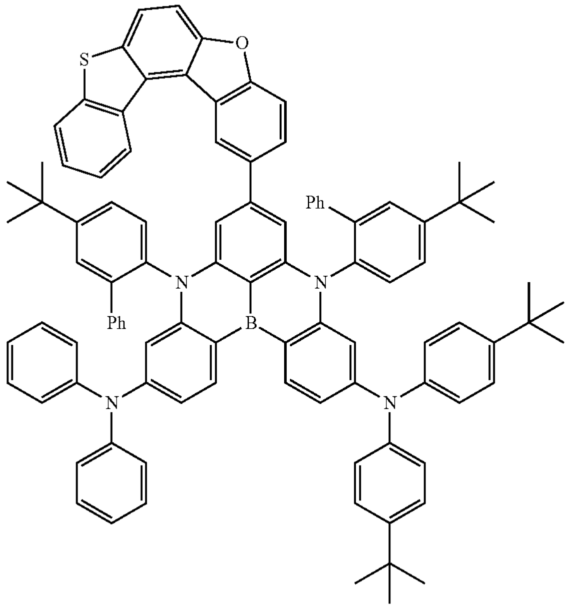
37
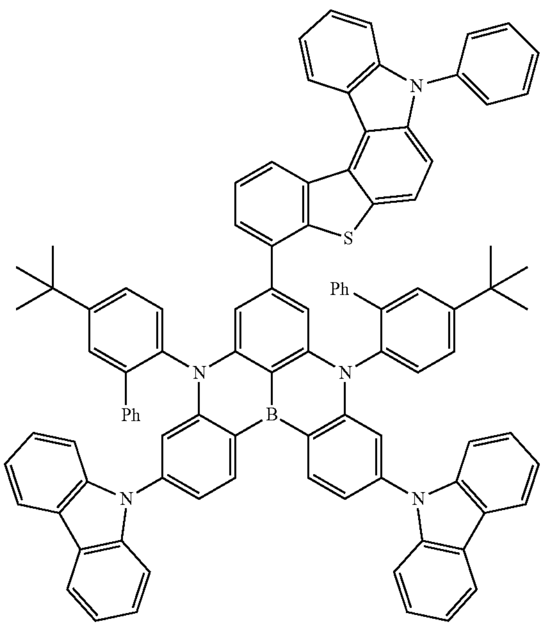
38
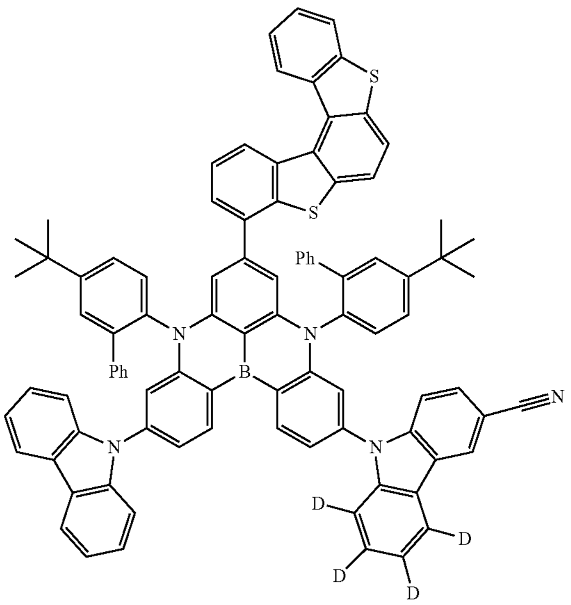

-continued
39
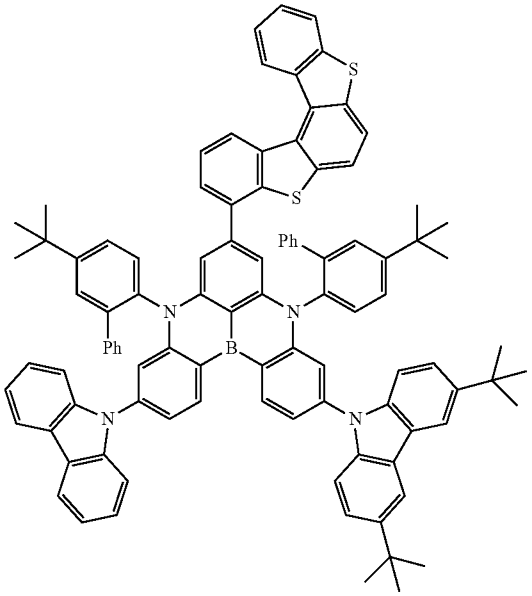
40
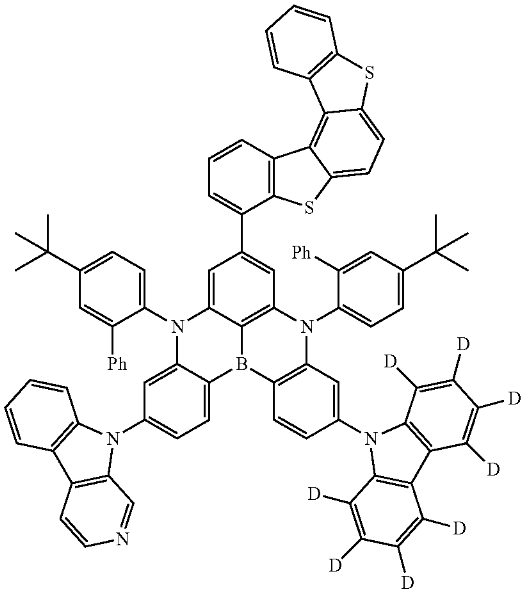
-continued
41
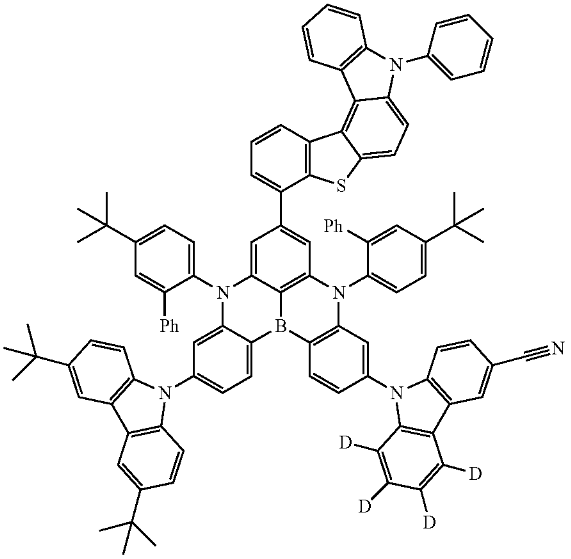
42
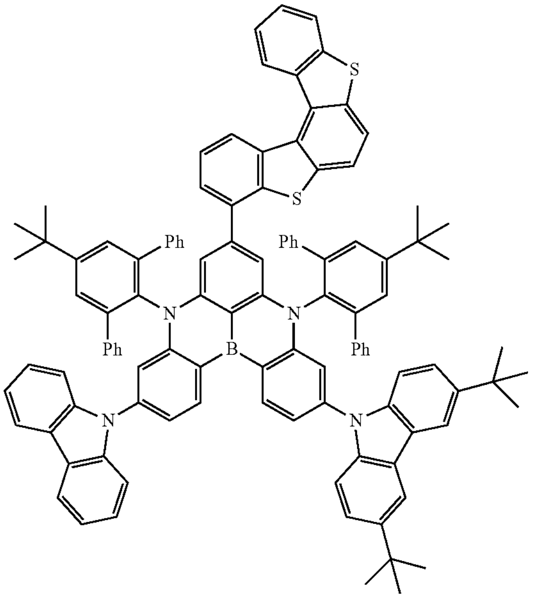

-continued
43
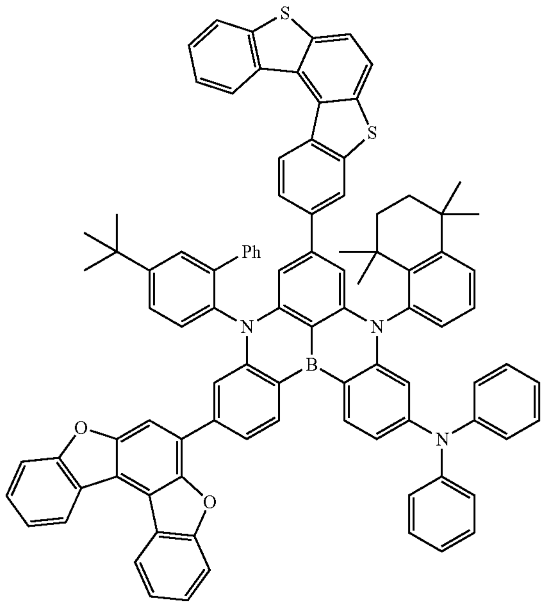
-continued
45
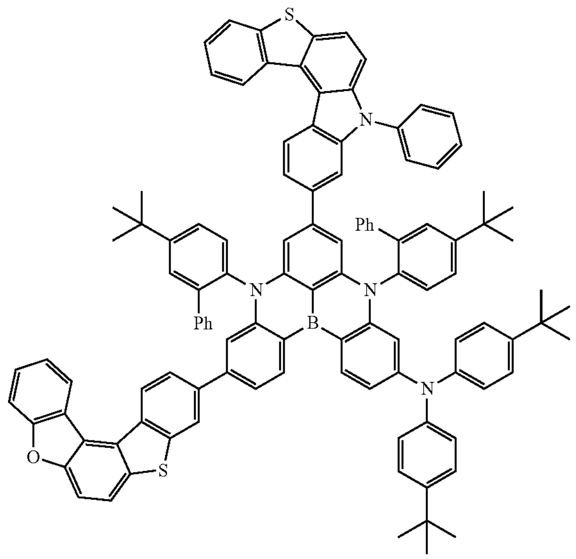
44
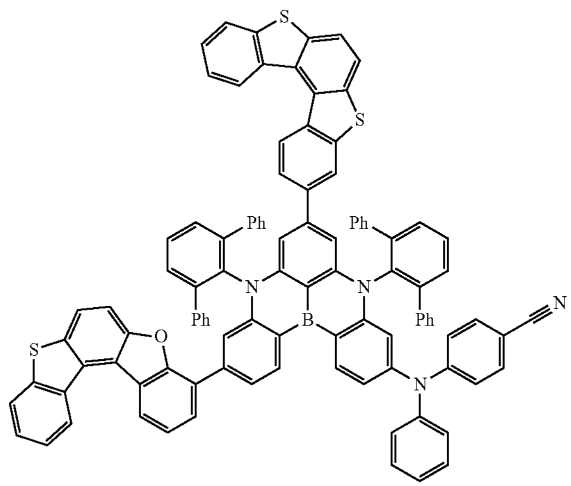
46
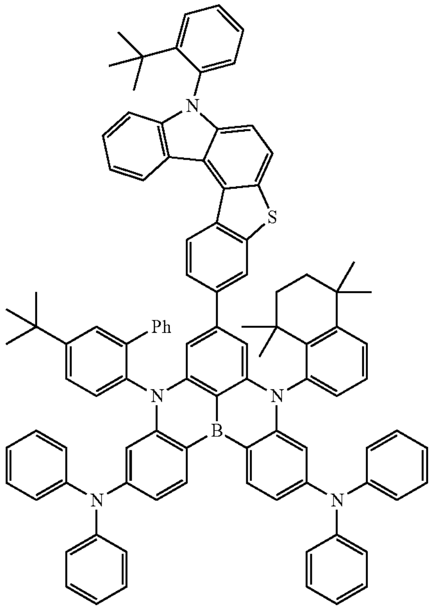

-continued
47
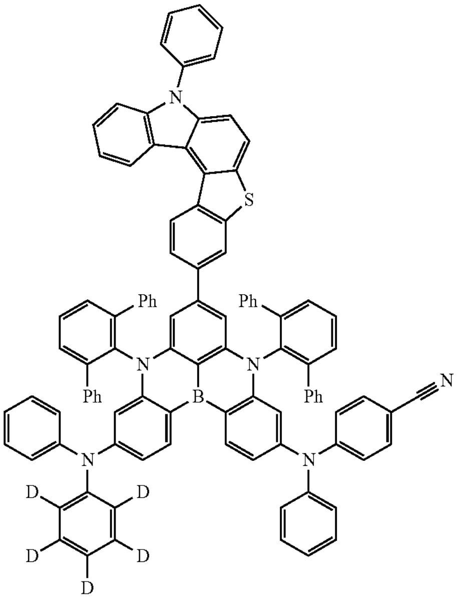
48
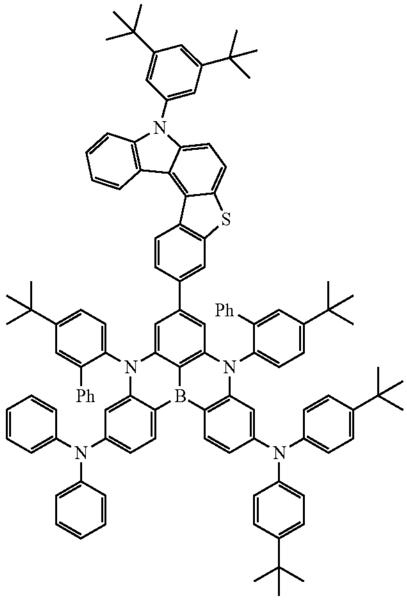
-continued
49
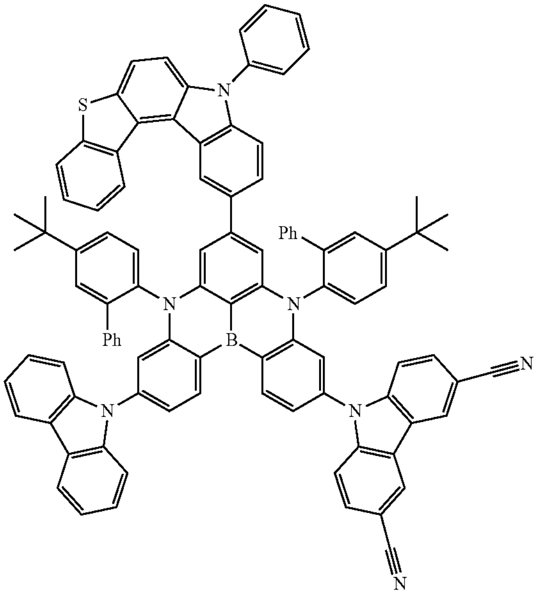
50
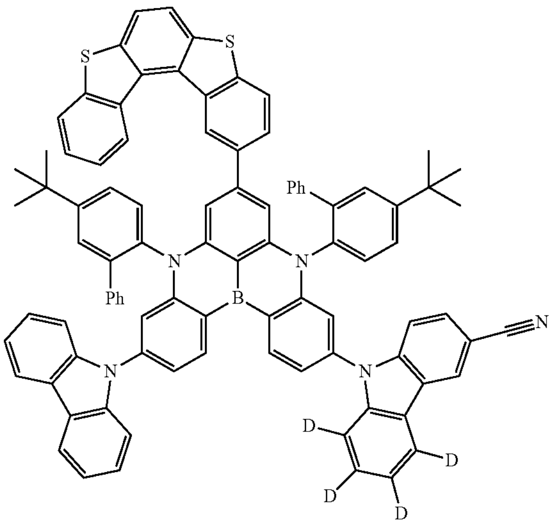

-continued
51
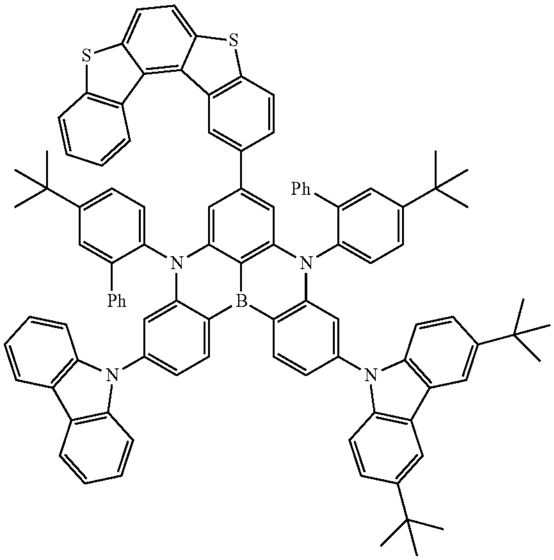
52
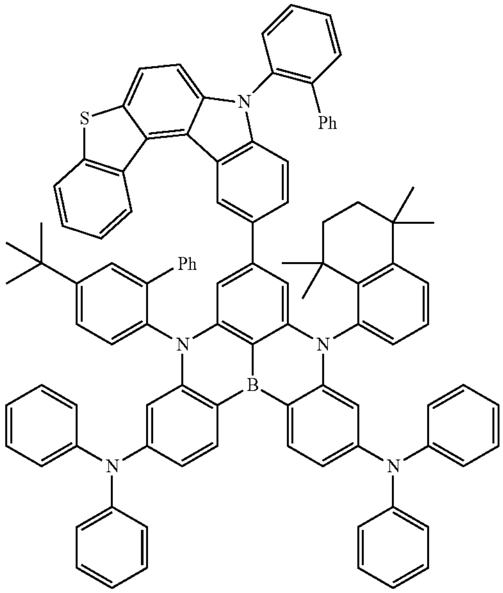
-continued
53
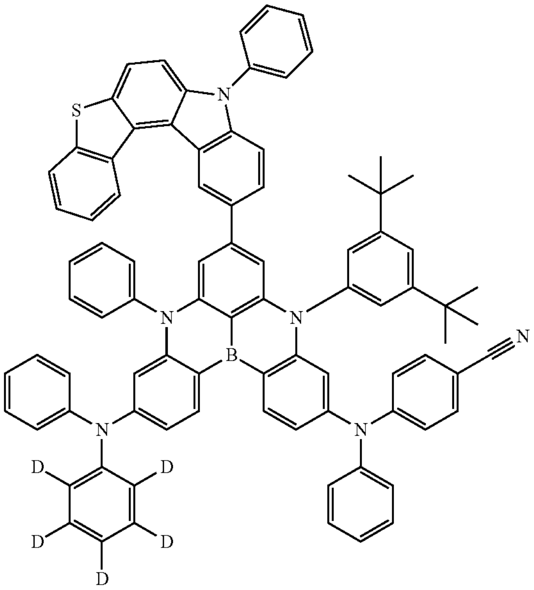
54
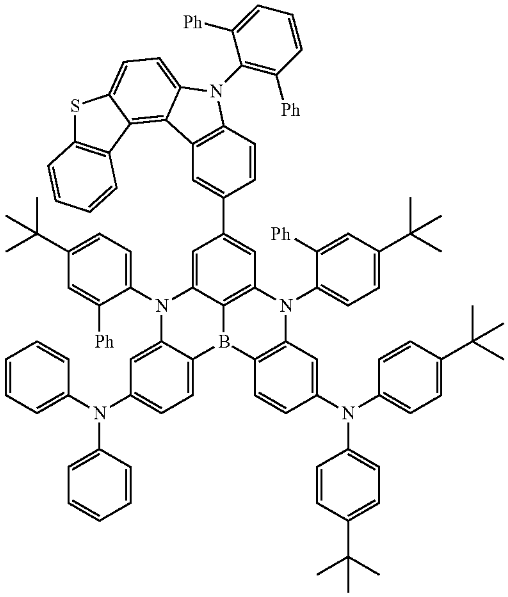

-continued
55
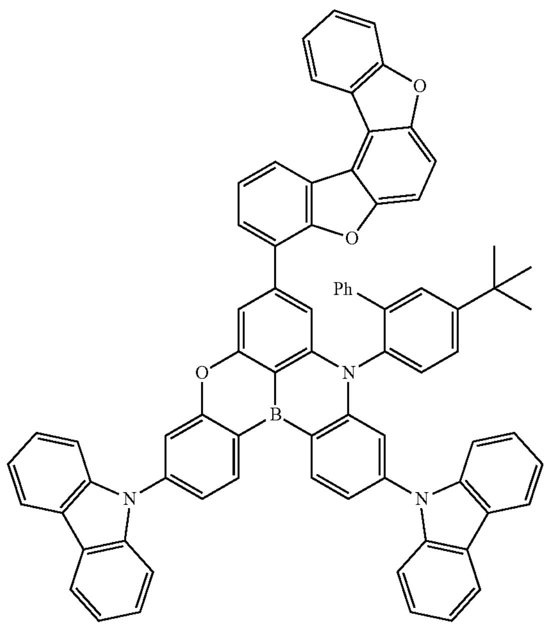
56
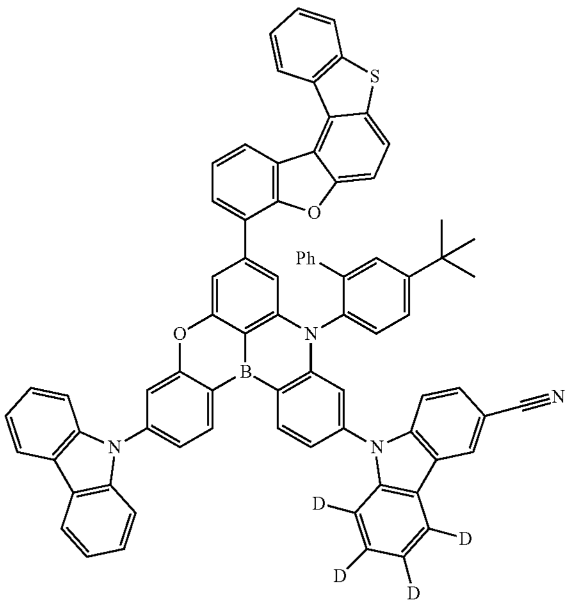
-continued
57
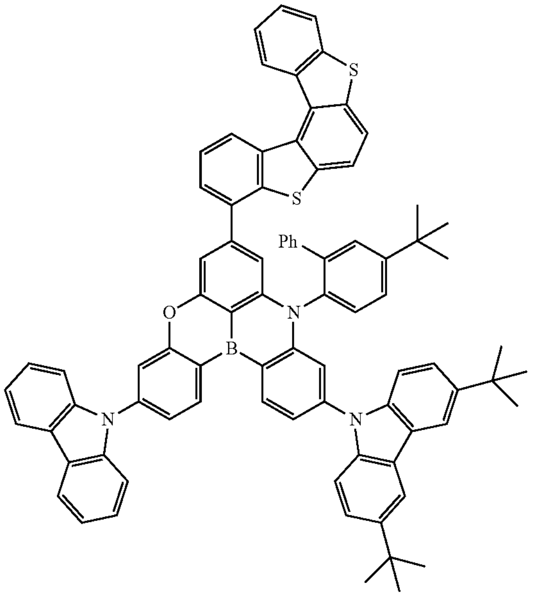
58
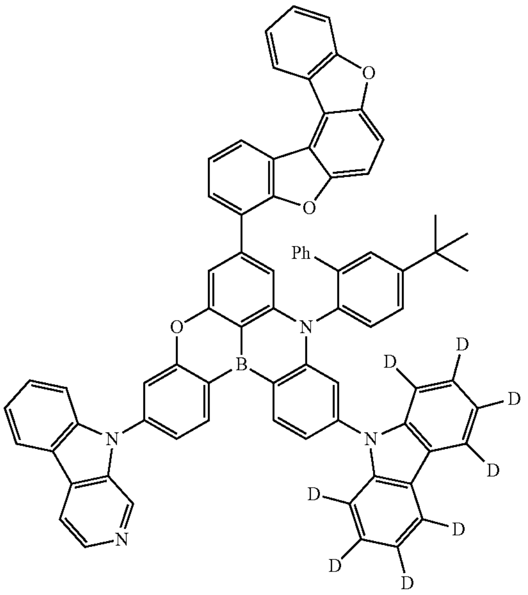

-continued
59
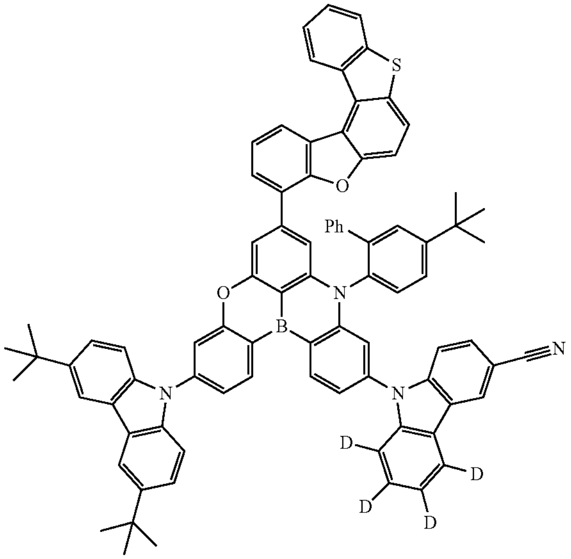
60
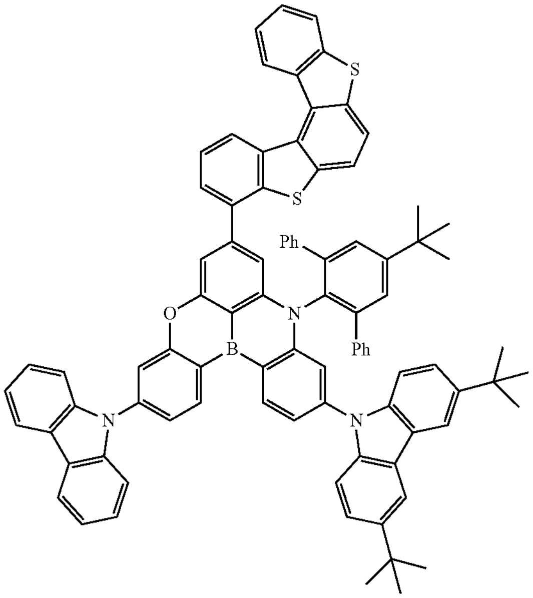
-continued
61
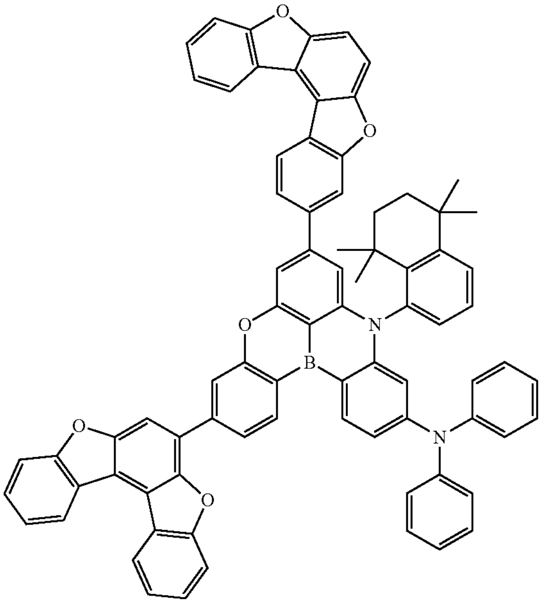
62
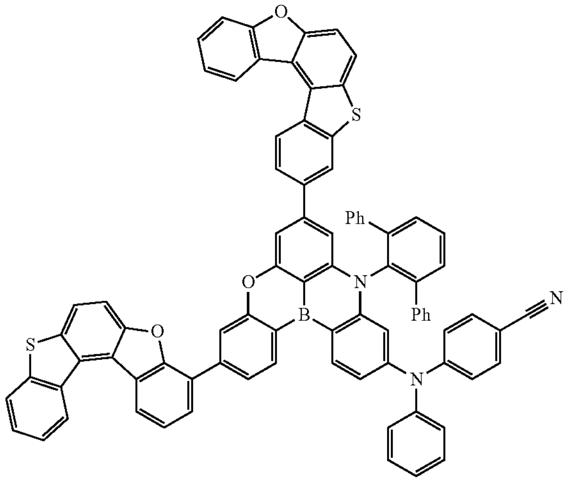

-continued
63
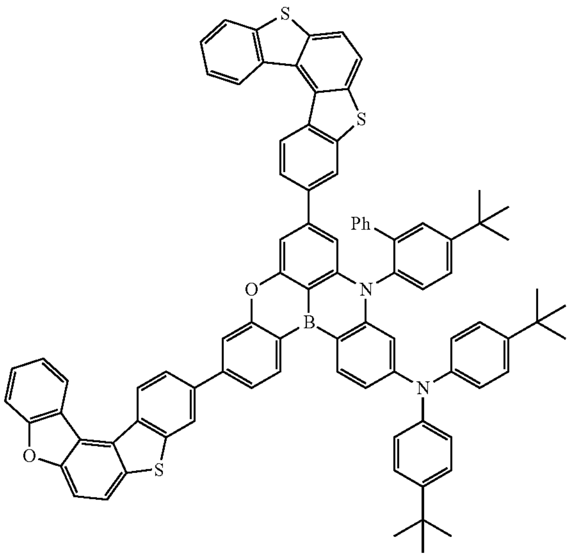
64
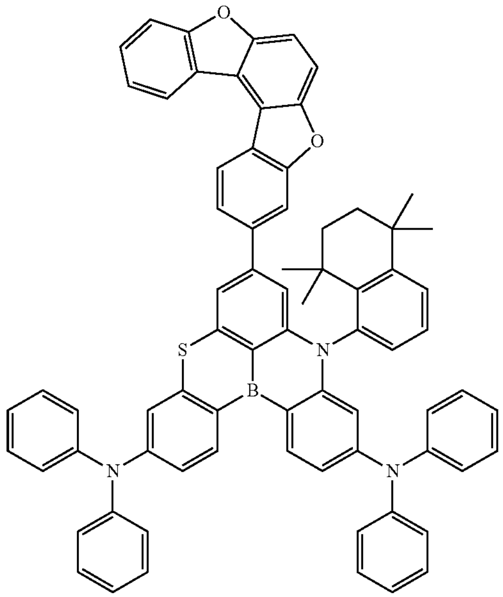
-continued
65
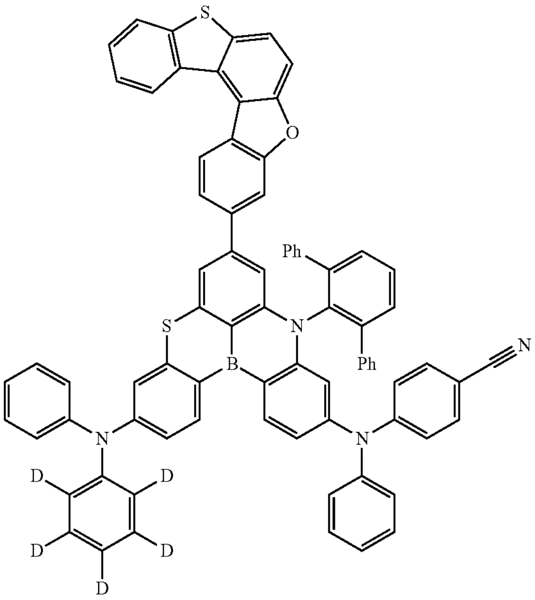
66
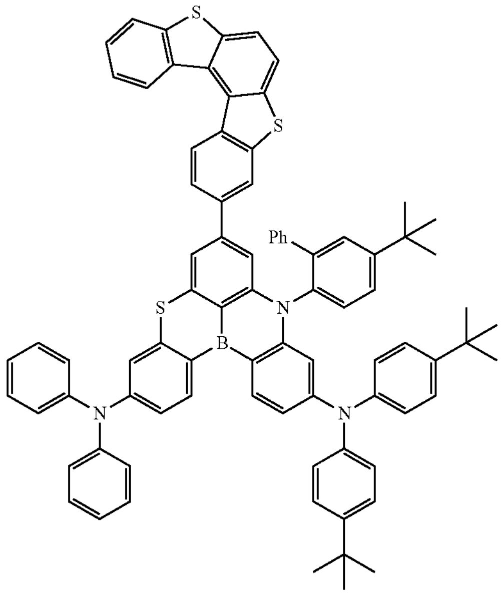

67
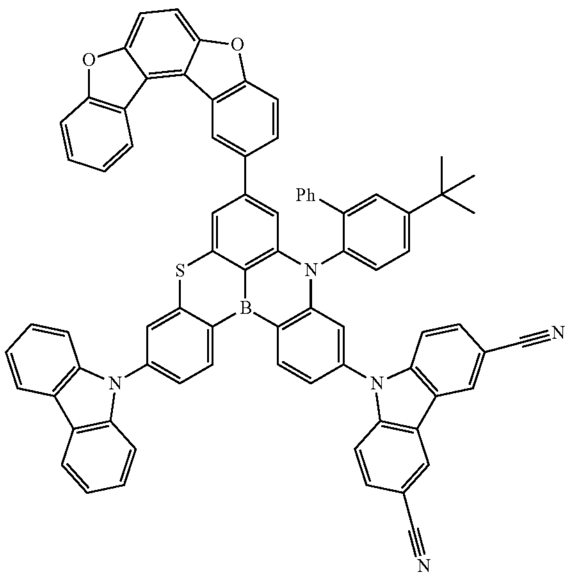
69
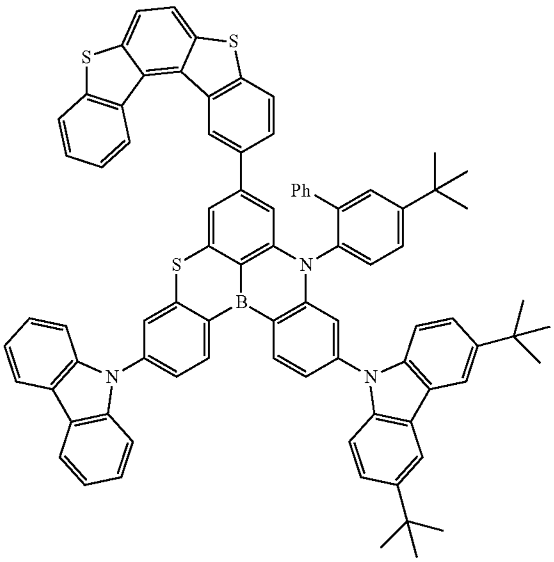
68
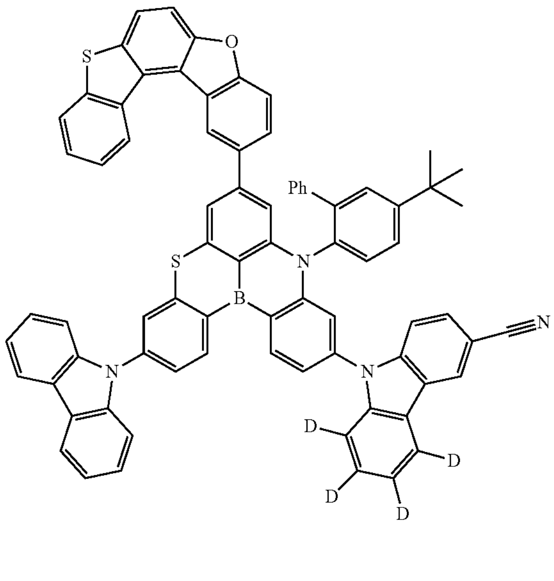
70
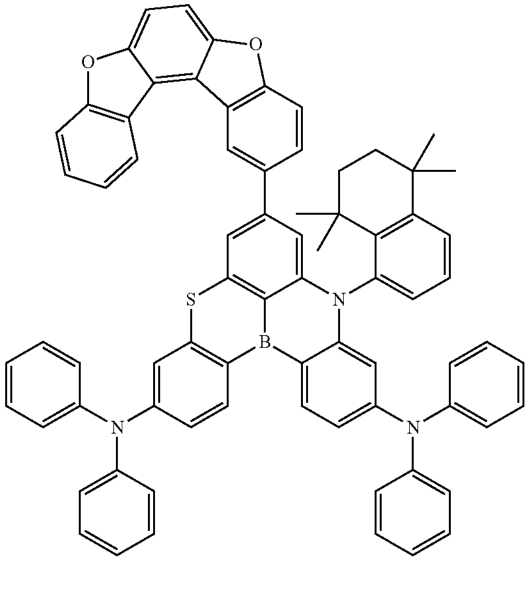

-continued
71
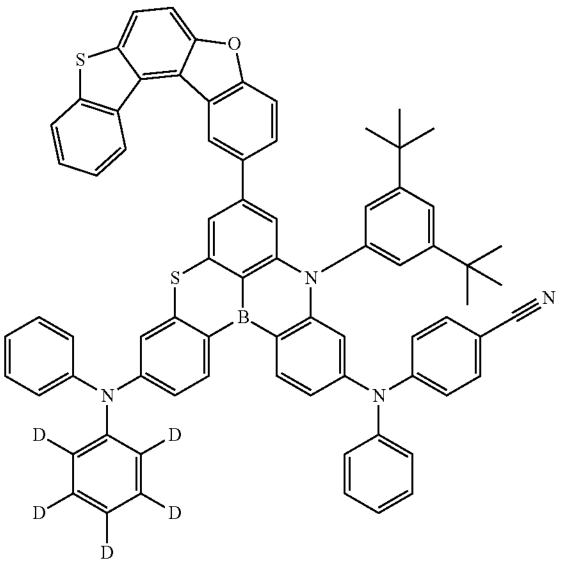
72
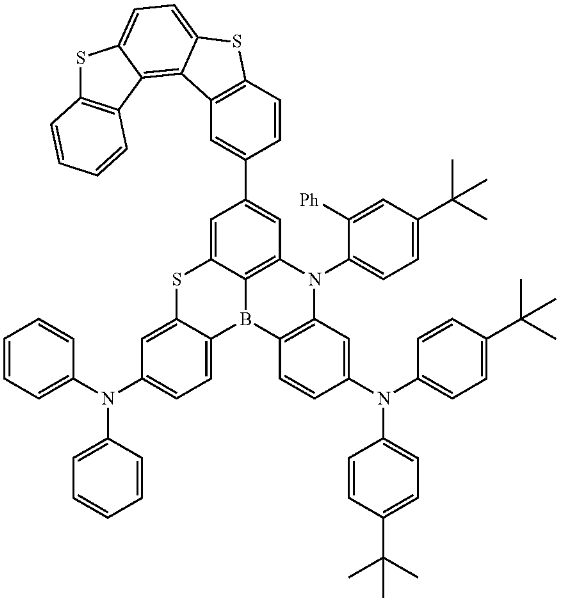
-continued
73
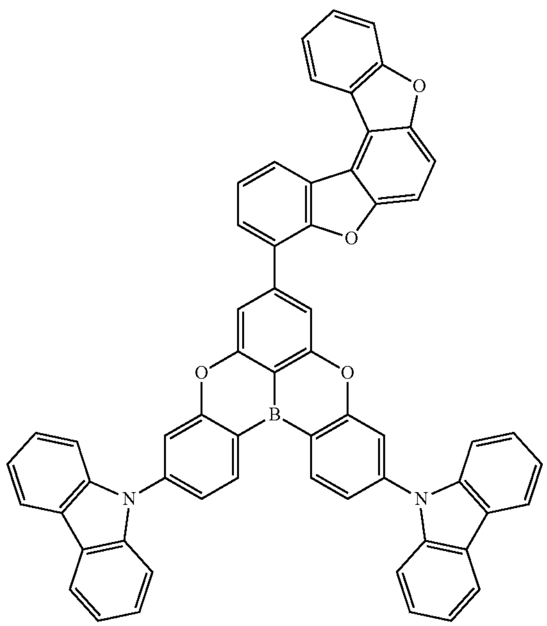
74
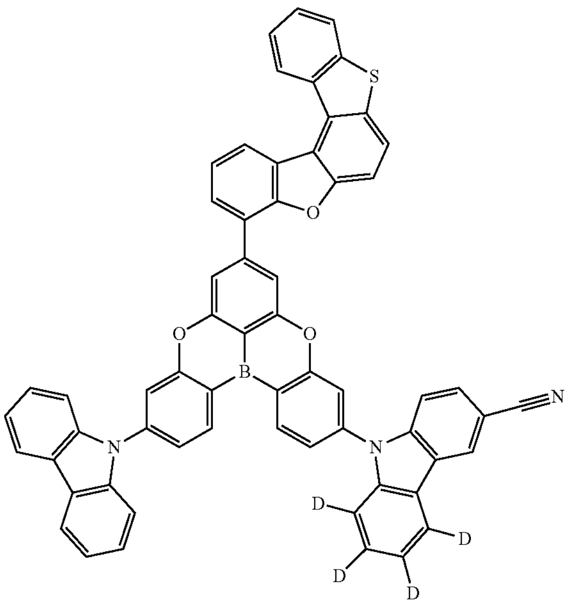

-continued
75
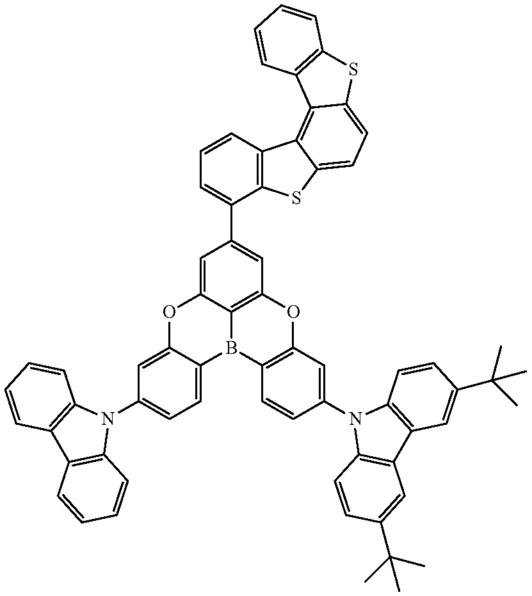
-continued
77
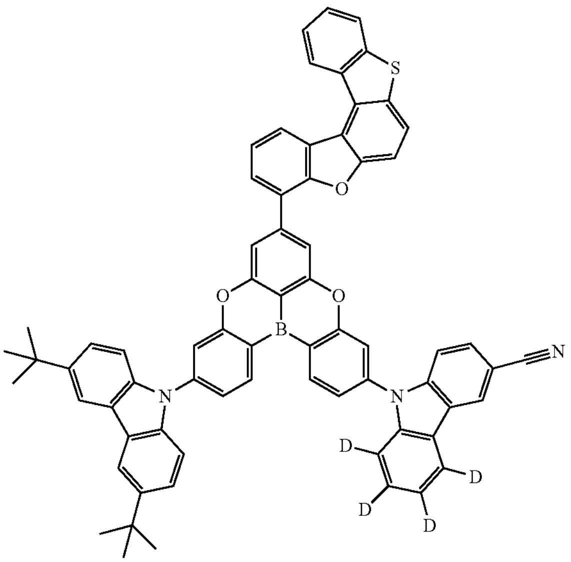
76
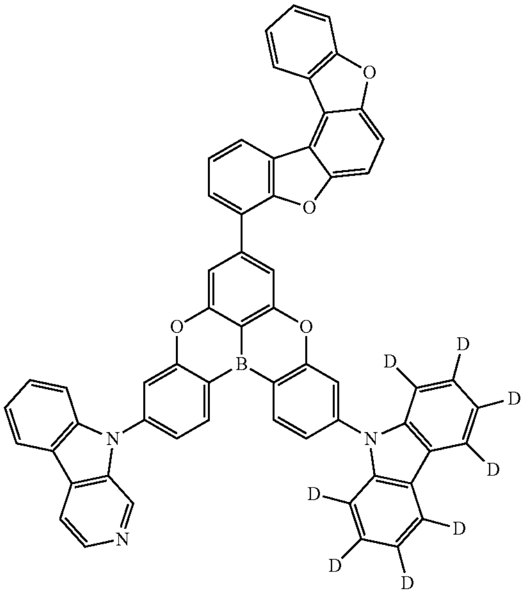
78
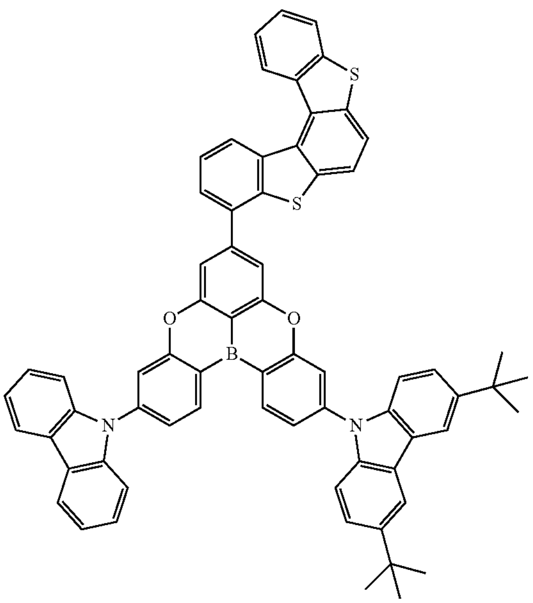

-continued
79
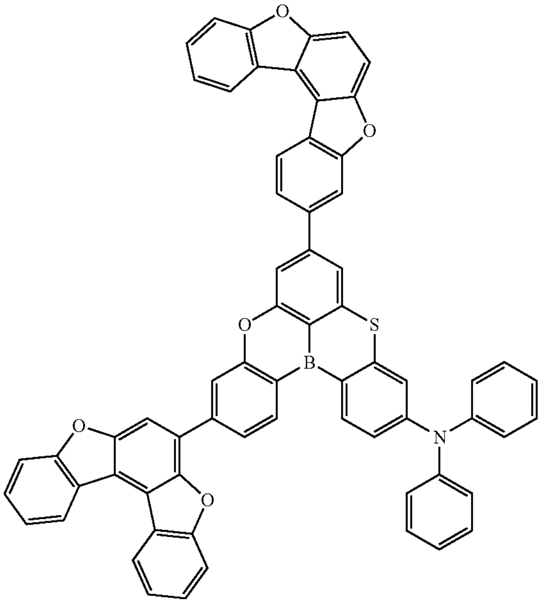
80
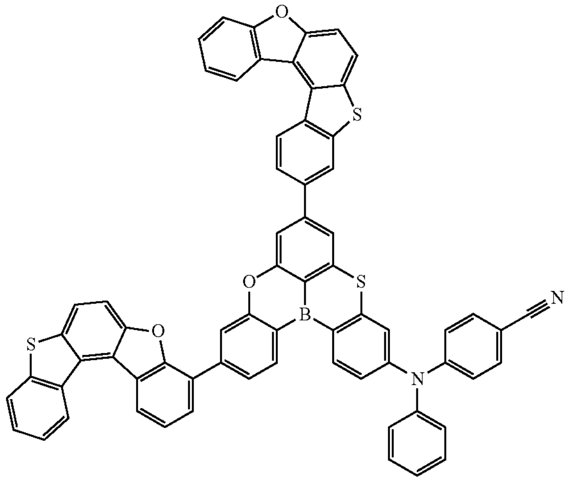
-continued
81
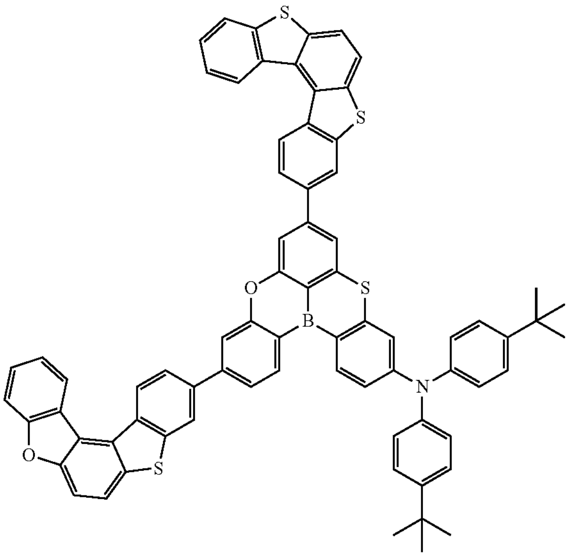
82
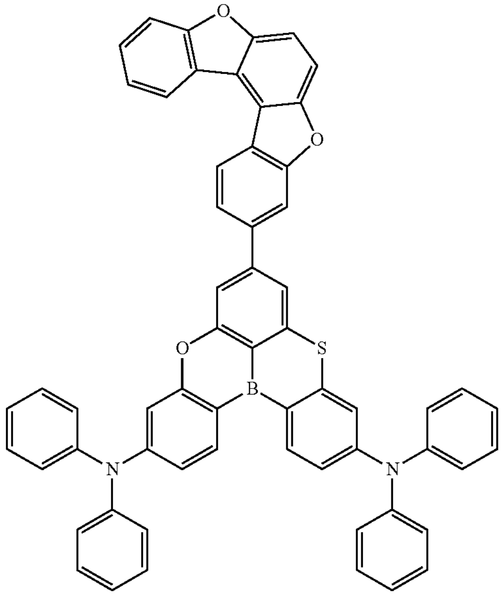

-continued
83
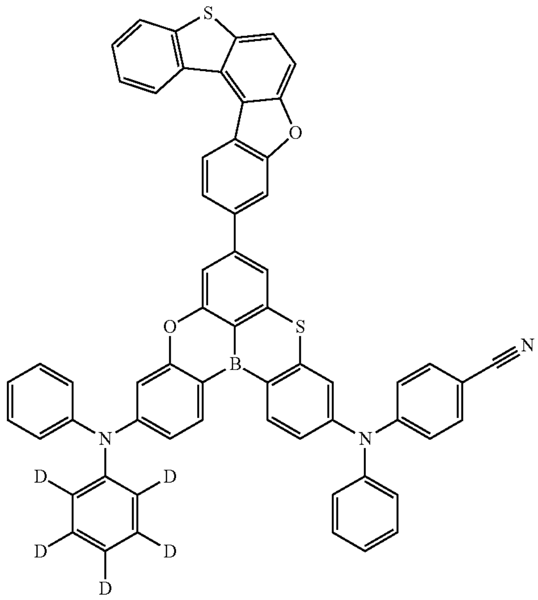
84
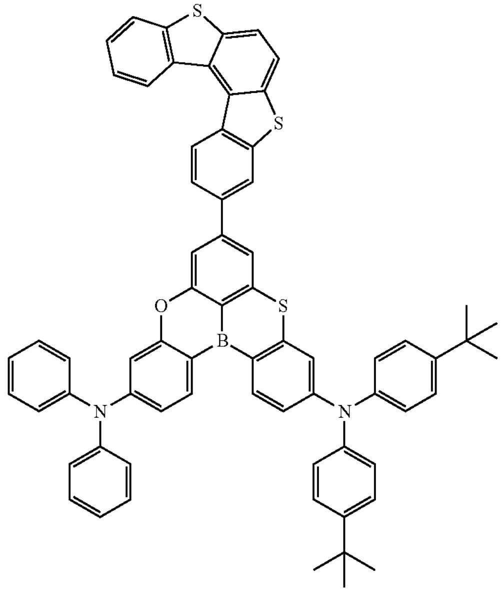
-continued
85
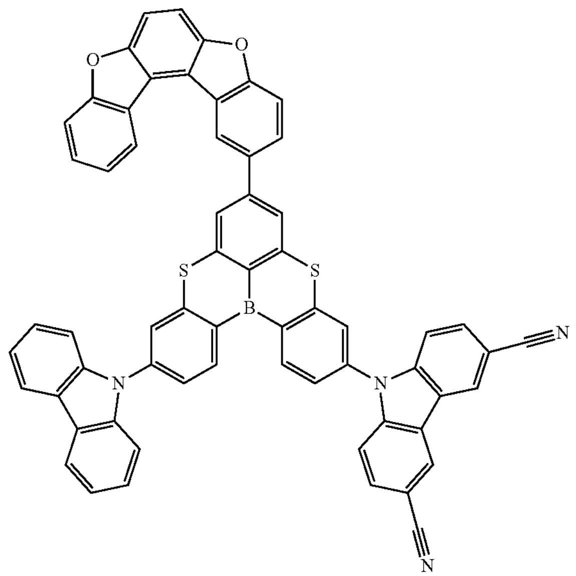
86
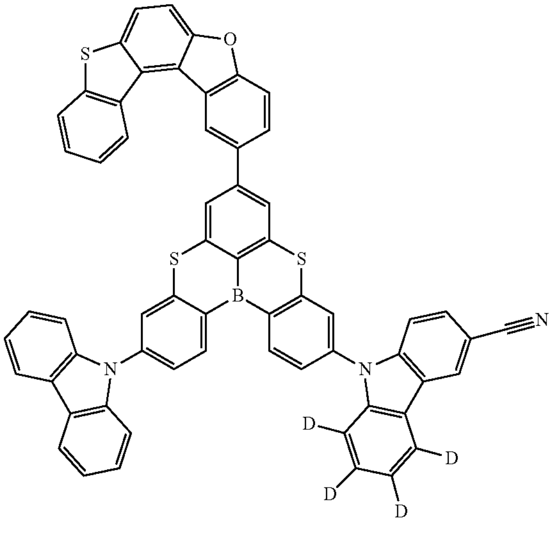

-continued
87
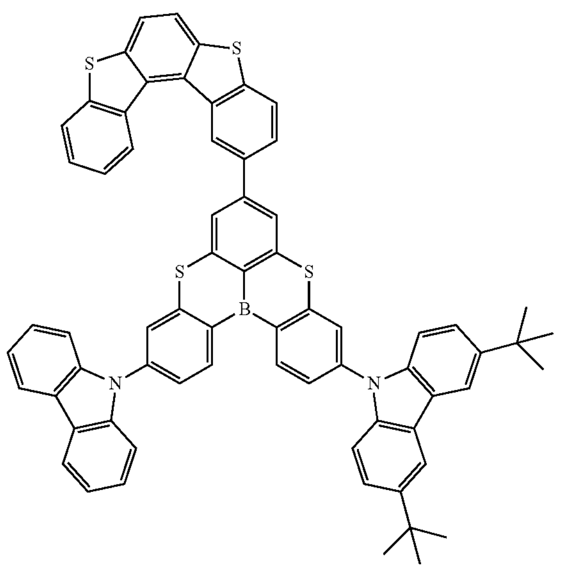
88
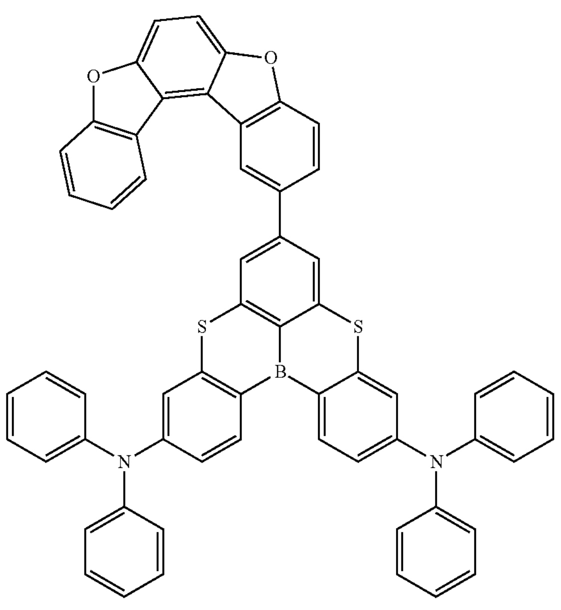
-continued
89
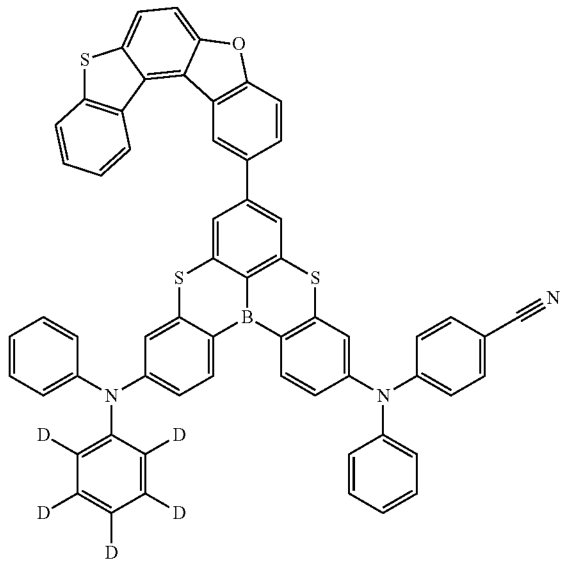
90
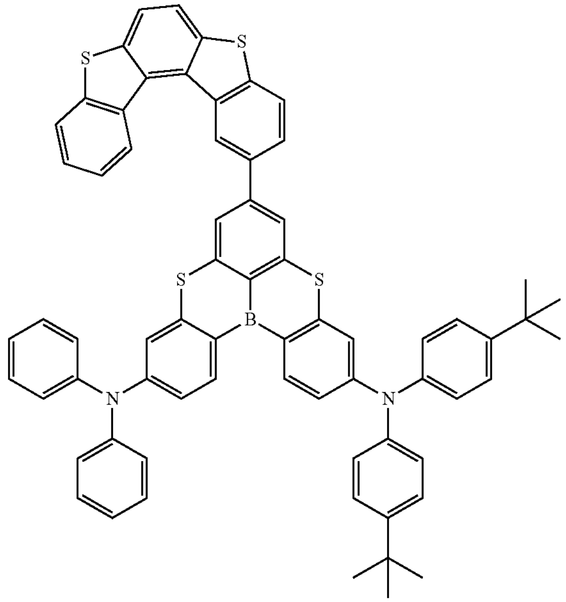

-continued
91
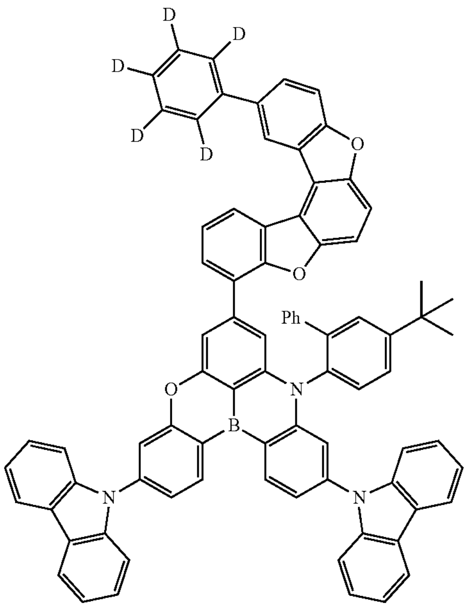
92
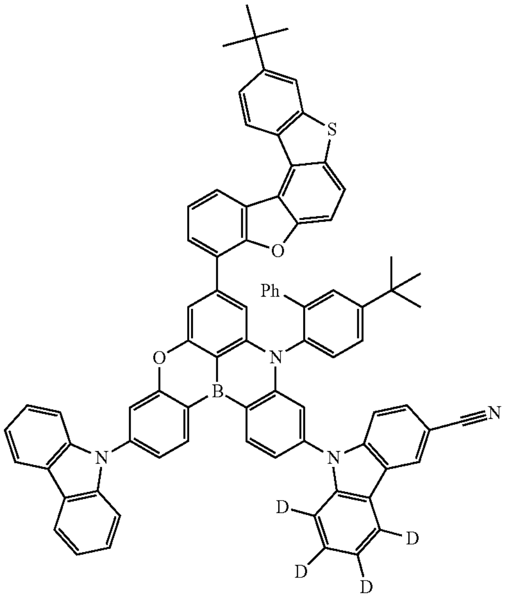
-continued
93
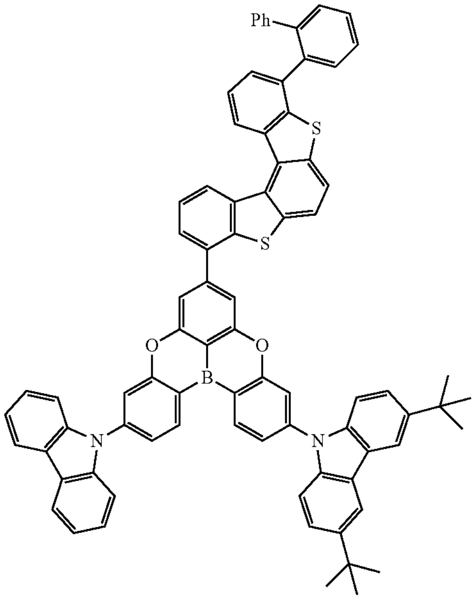
94
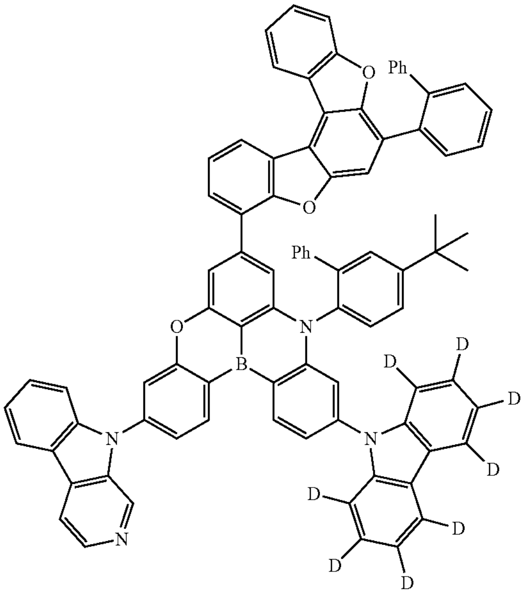

95
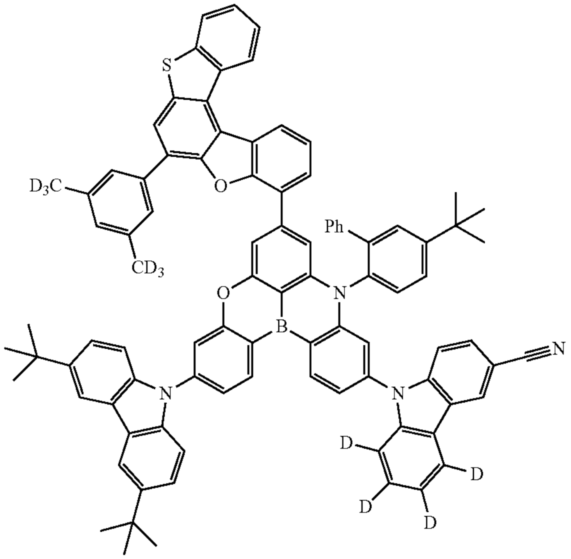
96
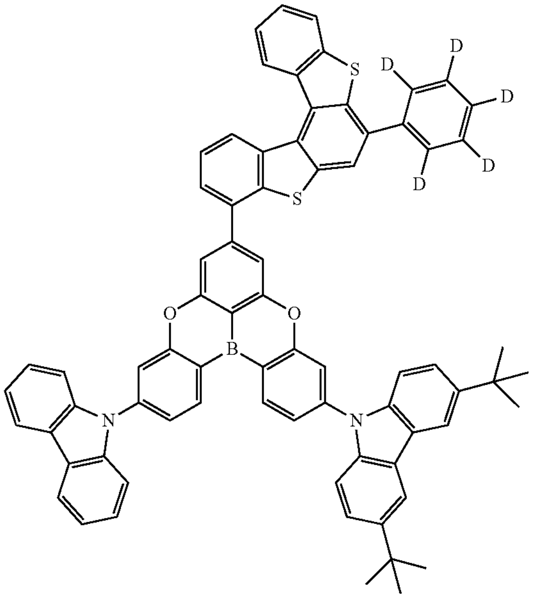
97
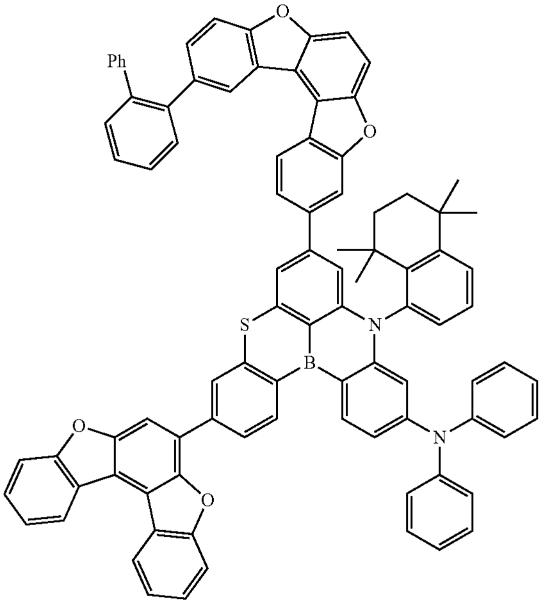
98
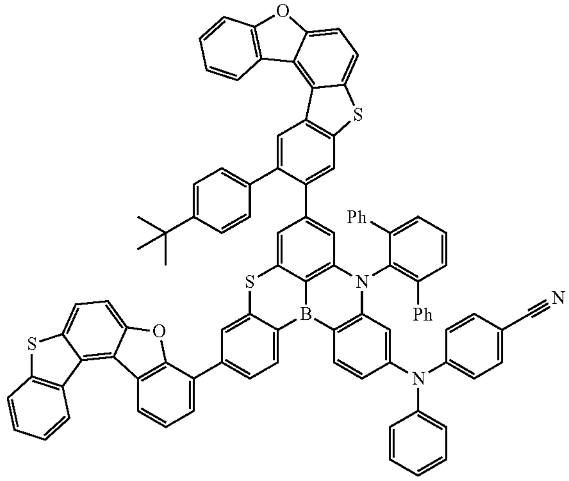

-continued
99
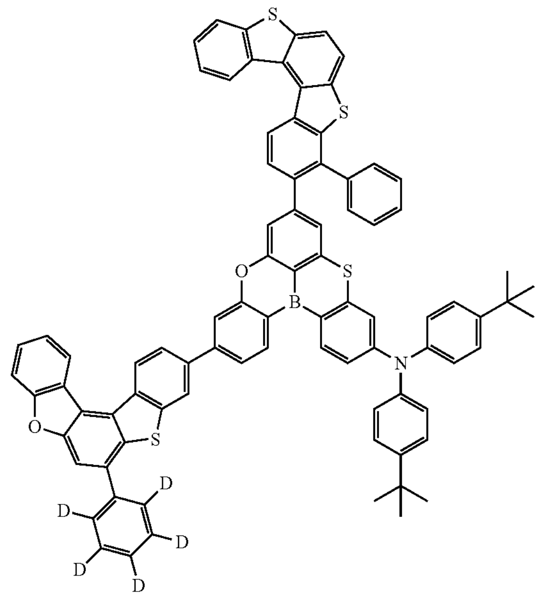
100
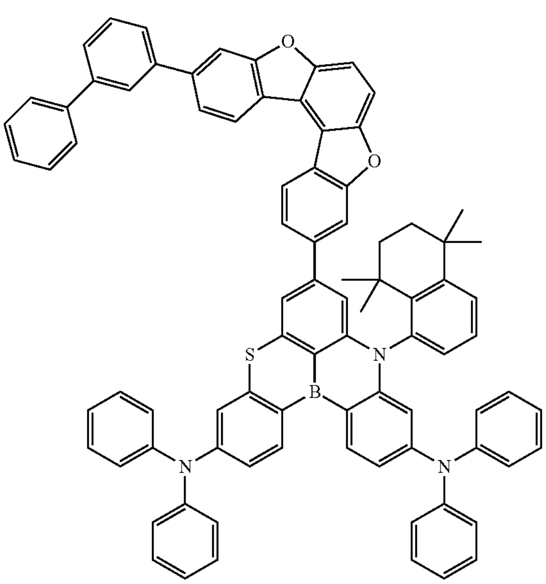
-continued
101
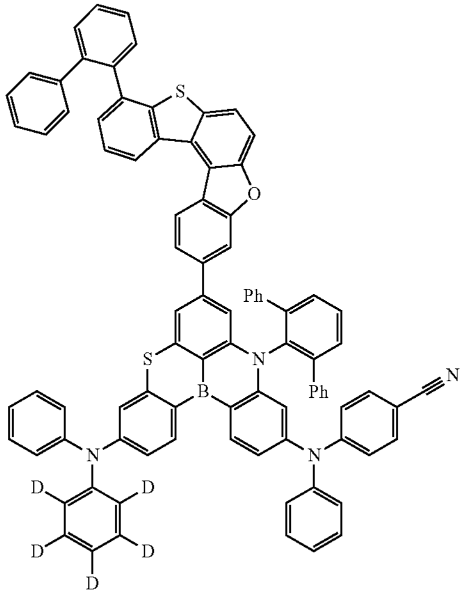
102
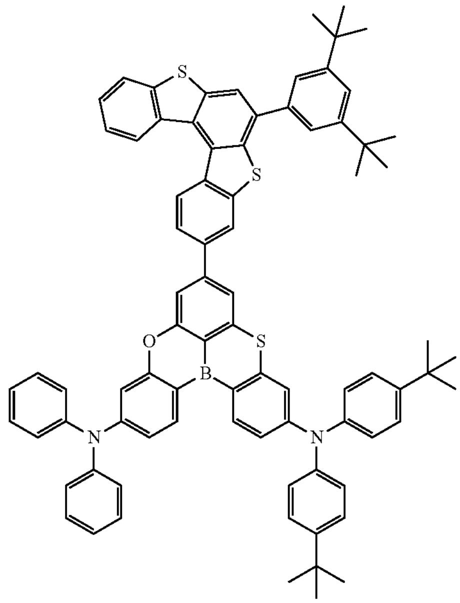

103
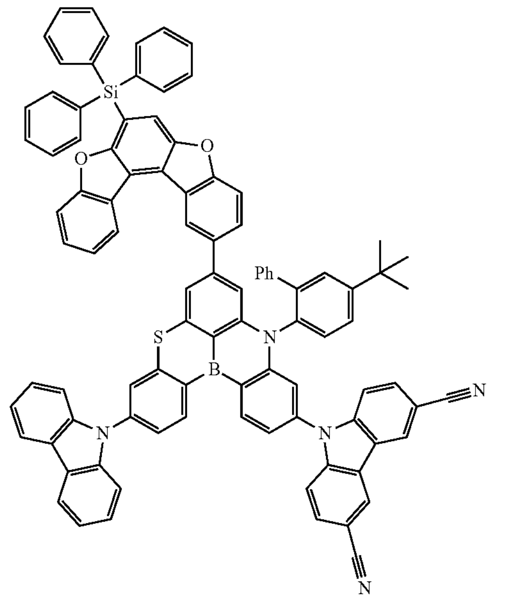
104
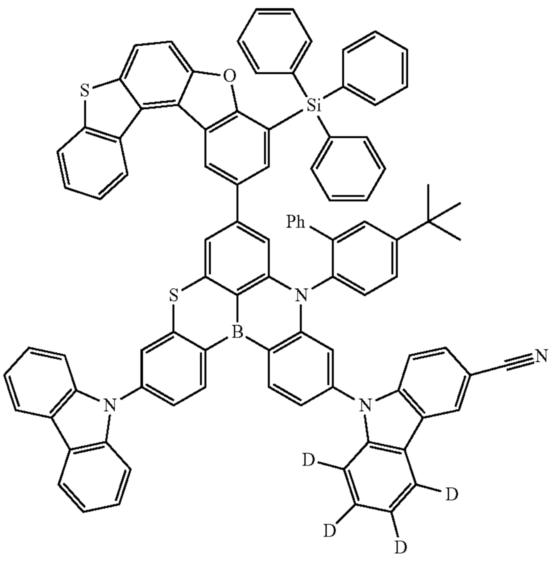
105
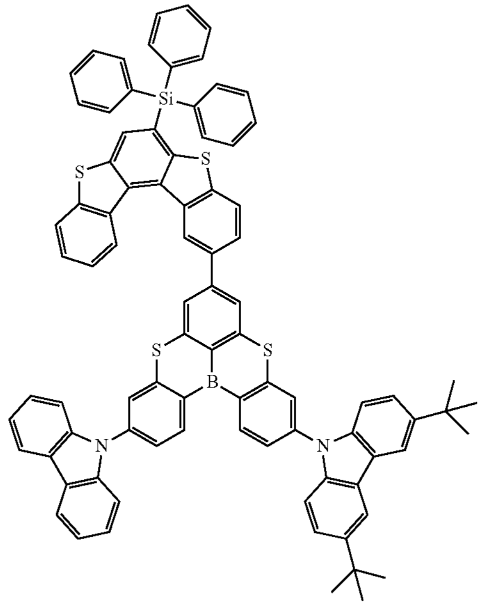
106
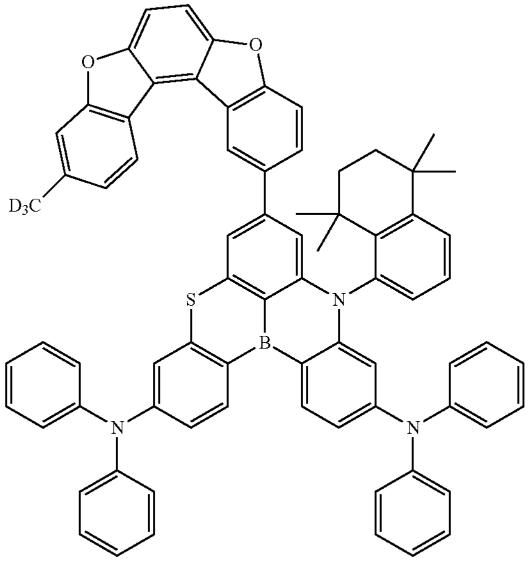

-continued
107
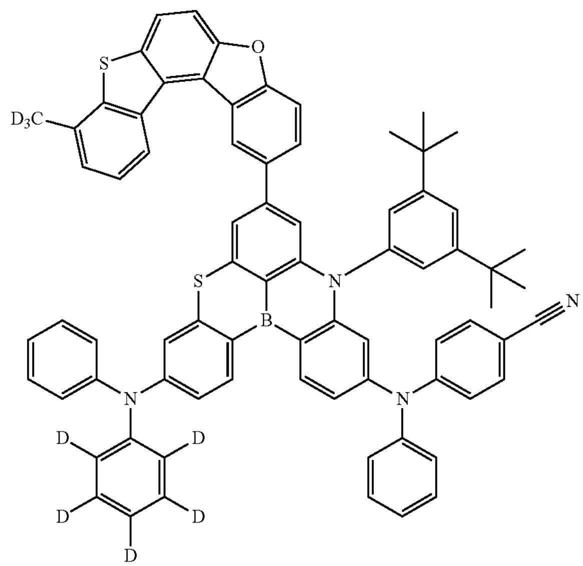
108
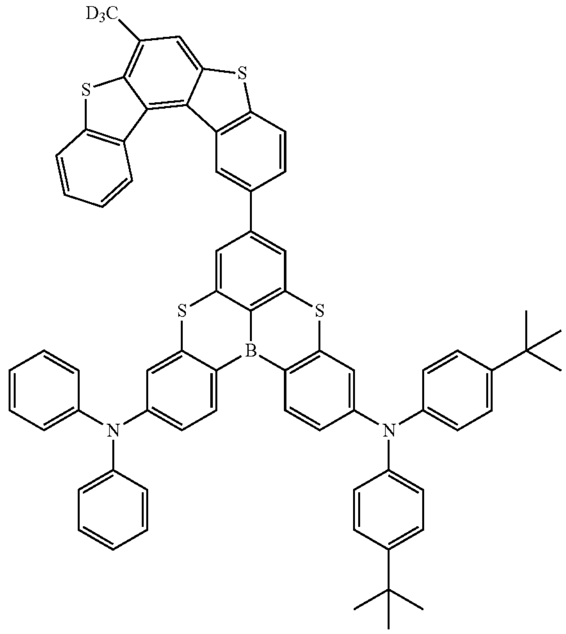
wherein in Compound Group 1,
D is a deuterium atom, and
Ph is a phenyl group.
14. The light emitting element of claim 1, wherein
the second compound is selected from Compound Group 2,
the third compound is selected from Compound Group 3, and
the fourth compound is selected from Compound Group 4:
[Compound Group 2]
HT1
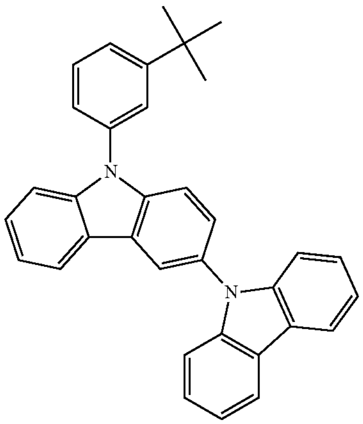
HT2
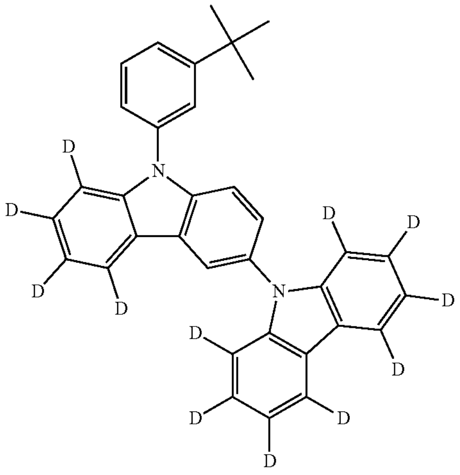
HT3
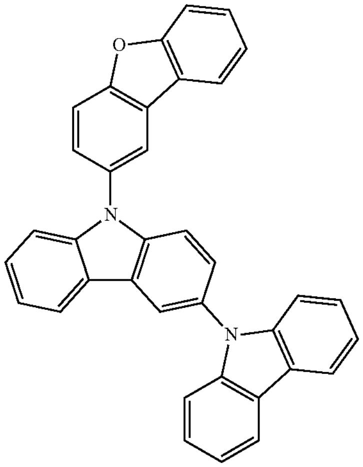

-continued
HT4
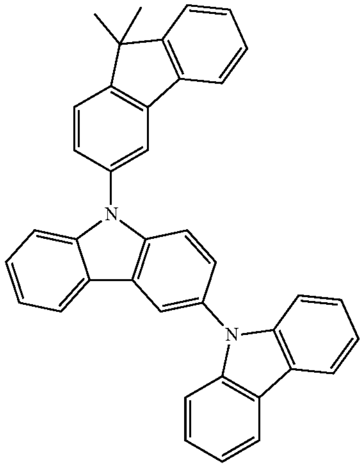
[Compound Group 3]
ET1
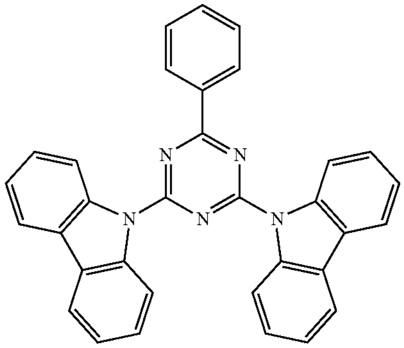
ET2
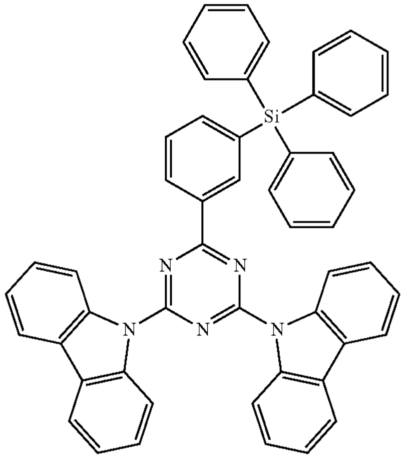
-continued
ET3
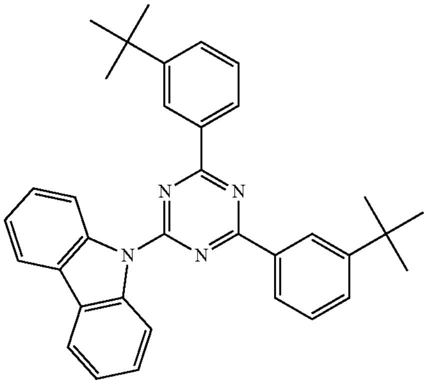
[Compound Group 4]
PS1
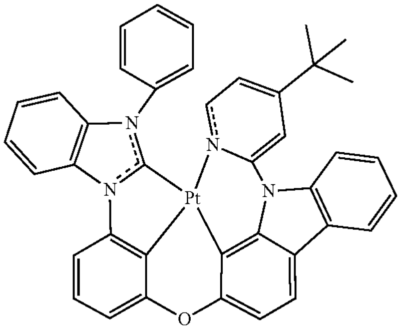
PS2
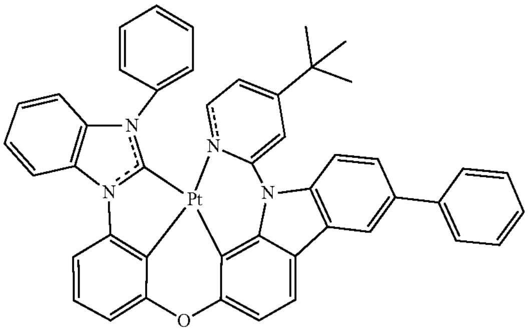
PS3
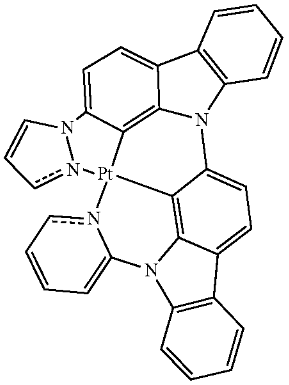

-continued
PS4
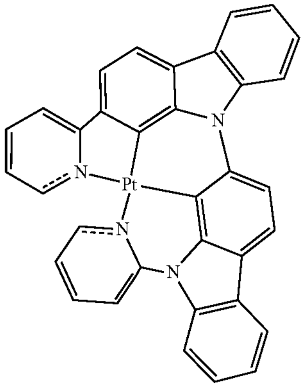
PS5
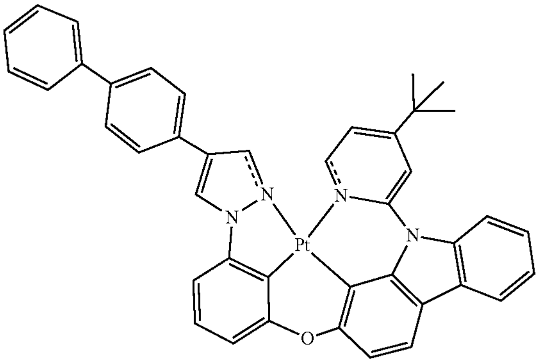
PS6
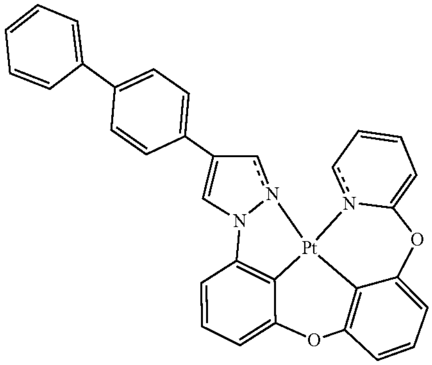
PS7
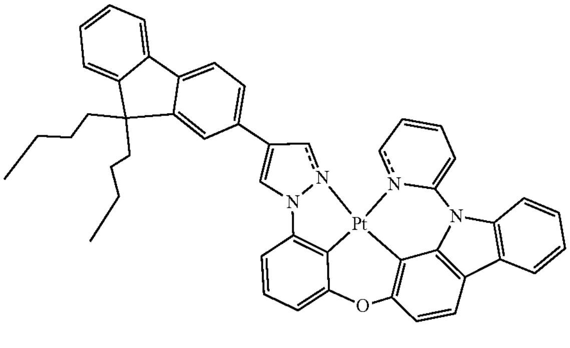
-continued
PS8
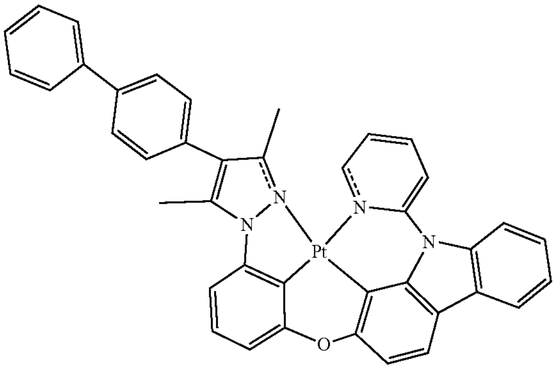
PS9
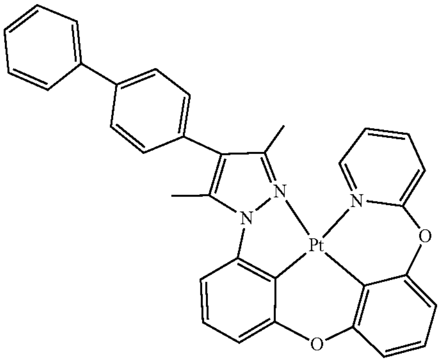
PS10
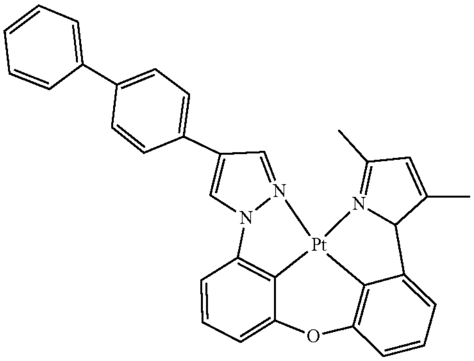
PS11
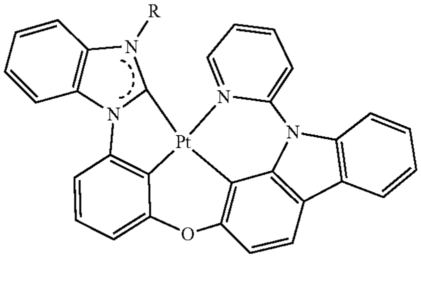

-continued

PS12

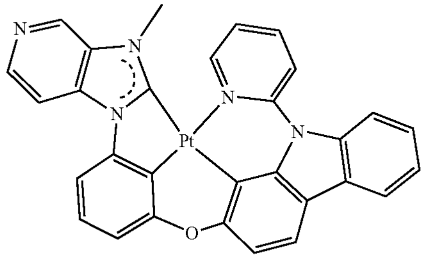

PS13

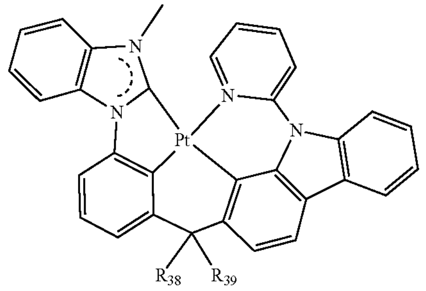

wherein in Compound Group 4,

R, $R_{38}$, and $R_{39}$ are each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

15. A polycyclic compound represented by Formula 1:

[Formula 1]

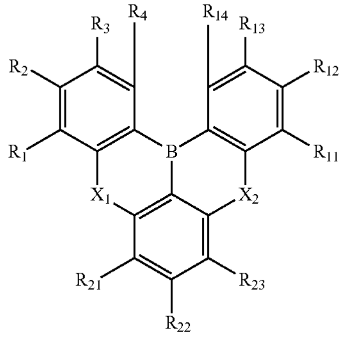

wherein in Formula 1, $X_1$ and $X_2$ are each independently $N(R_0)$, O, or S, $R_0$ is a hydrogen atom, a deuterium atom, a halogen atom, a substituted or unsubstituted alkyl group having 1 to 20 carbon atoms, a substituted or unsubstituted hydrocarbon ring group having 6 to 60 ring-forming carbon atoms, or a substituted or unsubstituted heteroaryl group having 2 to 60 ring-forming carbon atoms, at least one of $R_1$ to $R_4$, $R_{11}$ to $R_{14}$, and $R_{21}$ to $R_{23}$ is each independently a group represented by Formula 2, and the remainder of $R_1$ to $R_4$, $R_{11}$ to $R_{14}$, and $R_{21}$ to $R_{23}$ are each independently a hydrogen atom, a deuterium atom, a halogen atom, a substituted or unsubstituted amine group, a substituted or unsubstituted alkyl group having 1 to 20 carbon atoms, a substituted or unsubstituted hydrocarbon ring group having 6 to 60 ring-forming carbon atoms, or a substituted or unsubstituted heteroaryl group having 2 to 60 ring-forming carbon atoms:

[Formula 2]

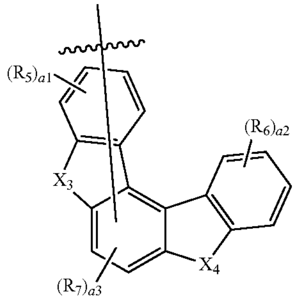

wherein in Formula 2, $X_3$ and $X_4$ are each independently $N(R_8)$, O, or S, a1 and a2 are each independently an integer from 0 to 4, a3 is an integer from 0 to 2, $R_5$ to $R_8$ are each independently a hydrogen atom, a deuterium atom, a halogen atom, a substituted or unsubstituted silyl group, a substituted or unsubstituted alkyl group having 1 to 20 carbon atoms, or a substituted or unsubstituted aryl group having 6 to 60 ring-forming carbon atoms, and

represents a binding site to a neighboring atom, and wherein the polycyclic compound has a luminescence center wavelength in a range of about 440 nm to about 480 nm.

16. The polycyclic compound of claim 15, wherein the group represented by Formula 2 is represented by one of Formula 2-1 to Formula 2-4:

[Formula 2-1]

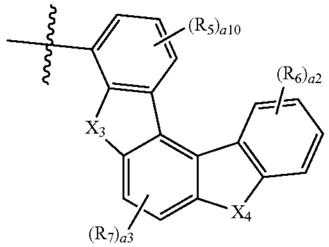

-continued

[Formula 2-2]

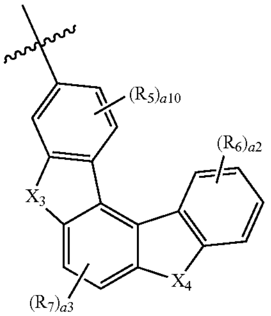

[Formula 2-3]

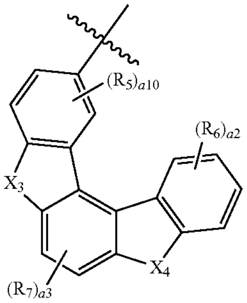

[Formula 2-4]

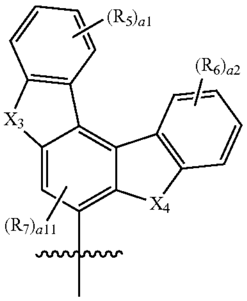

wherein in Formula 2-1 to Formula 2-3, a10 is an integer from 0 to 3, wherein in Formula 2-4, a11 is 0 or 1, and wherein in Formula 2-1 to Formula 2-4, a1 to a3, $R_5$ to $R_7$, $X_3$, and $X_4$ are each the same as defined in Formula 2, and

represents a binding site to a neighboring atom.

17. The polycyclic compound of claim 15, wherein the group represented by Formula 2 is represented by one of Formula 2-A to Formula 2-F:

[Formula 2-A]

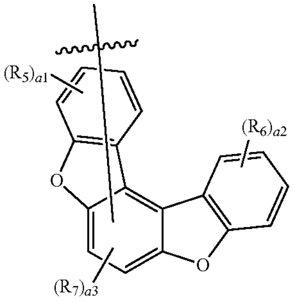

[Formula 2-B]

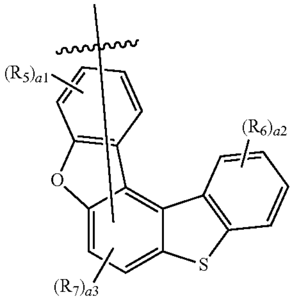

[Formula 2-C]

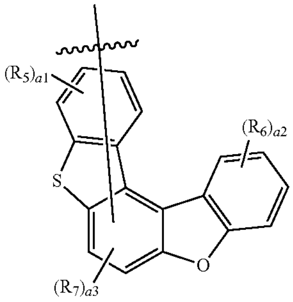

[Formula 2-D]

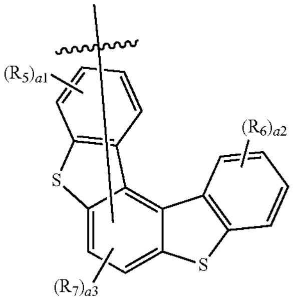

[Formula 2-E]

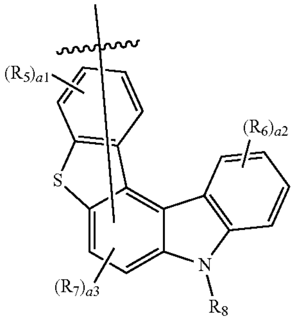

-continued

[Formula 2-F]

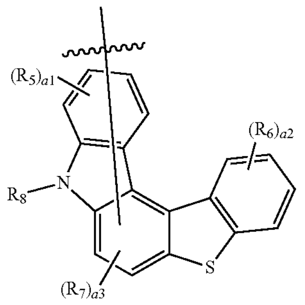

wherein in Formula 2-A to Formula 2-F, a1 to a3 and $R_5$ to $R_8$ are each the same as defined in Formula 2, and

represents a binding site to a neighboring atom.

18. The polycyclic compound of claim 15, wherein the polycyclic compound represented by Formula 1 is represented by one of Formula 1-1 to Formula 1-5:

[Formula 1-1]

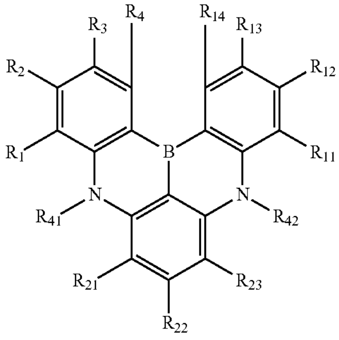

[Formula 1-2]

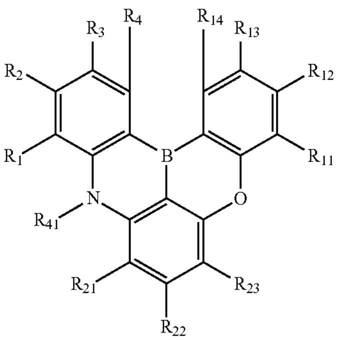

-continued

[Formula 1-3]

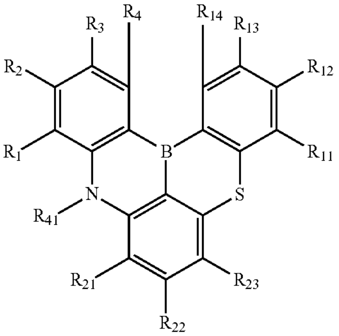

[Formula 1-4]

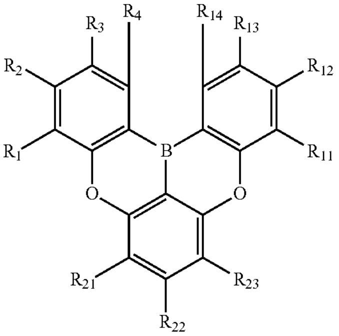

[Formula 1-5]

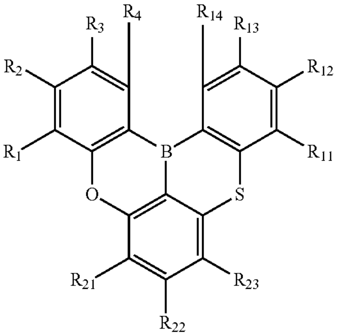

wherein in Formula 1-1 to Formula 1-3, $R_{41}$ and $R_{42}$ are each independently a hydrogen atom, a deuterium atom, a halogen atom, a substituted or unsubstituted alkyl group having 1 to 20 carbon atoms, a substituted or unsubstituted hydrocarbon ring group having 6 to 60 ring-forming carbon atoms, or a substituted or unsubstituted heteroaryl group having 2 to 60 ring-forming carbon atoms, and wherein in Formula 1-1 to Formula 1-5, $R_1$ to $R_4$, $R_{11}$ to $R_{14}$, and $R_{21}$ to $R_{23}$ are each the same as defined in Formula 1.

19. The polycyclic compound of claim 15, wherein the polycyclic compound represented by Formula 1 is represented by one of Formula 1-A to Formula 1-C:

[Formula 1-A]

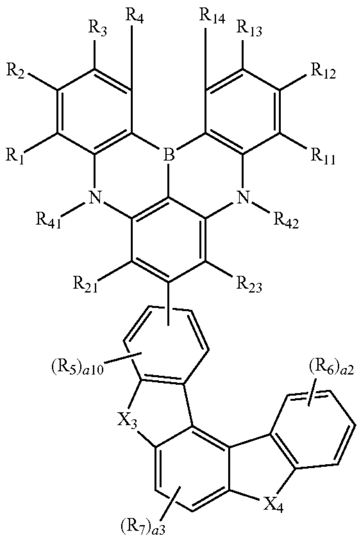

[Formula 1-B]

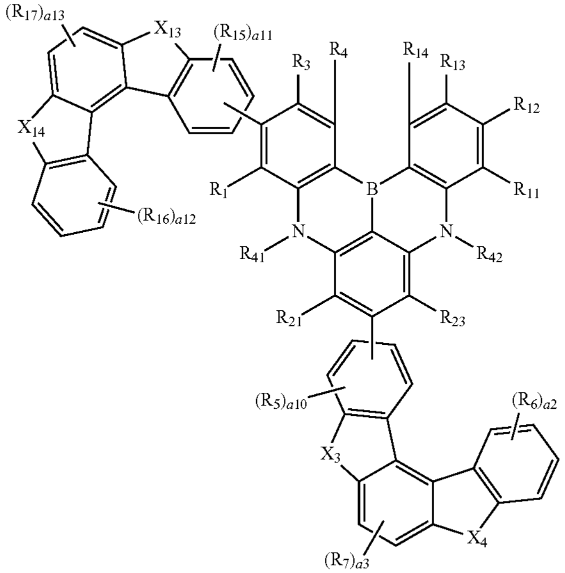

-continued

[Formula 1-C]

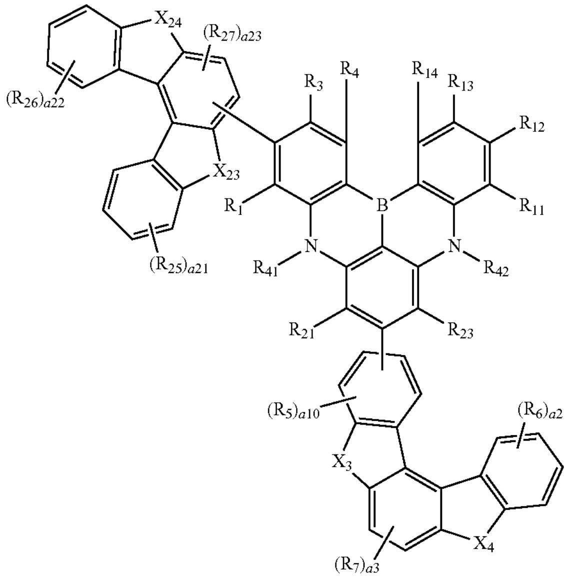

wherein in Formula 1-B, $X_{13}$ and $X_{14}$ are each independently $N(R_{18})$, O, or S, a11 is an integer from 0 to 3, a12 is an integer from 0 to 4, a13 is an integer from 0 to 2, and $R_{15}$ to $R_{18}$ are each independently a hydrogen atom, a deuterium atom, a halogen atom, a substituted or unsubstituted silyl group, a substituted or unsubstituted alkyl group having 1 to 20 carbon atoms, or a substituted or unsubstituted aryl group having 6 to 60 ring-forming carbon atoms, wherein in Formula 1-C, $X_{23}$ and $X_{24}$ are each independently $N(R_{28})$, O, or S, a21 and a22 are each independently an integer from 0 to 4, a23 is 0 or 1, and $R_{25}$ to $R_{28}$ are each independently a hydrogen atom, a deuterium atom, a halogen atom, a substituted or unsubstituted silyl group, a substituted or unsubstituted alkyl group having 1 to 20 carbon atoms, or a substituted or unsubstituted aryl group having 6 to 60 ring-forming carbon atoms, and wherein in Formula 1-A to Formula 1-C, a10 is an integer from 0 to 3, and a2, a3, $R_1$ to $R_7$, $R_{11}$ to $R_{14}$, $R_{21}$, $R_{23}$, and $X_1$ to $X_4$ are each the same as defined in Formula 1.

20. The polycyclic compound of claim 15, wherein $R_5$ to $R_7$ are each independently a substituted methyl group, an unsubstituted t-butyl group, an unsubstituted triphenylsilyl group, or a substituted or unsubstituted phenyl group.

21. The polycyclic compound of claim 15, wherein at least a remaining one of $R_1$ to $R_4$, $R_{11}$ to $R_{14}$, and $R_{21}$ to $R_{23}$ which is not a group represented by Formula 2 is each independently a group represented by one of R1-1 to R1-3:

R1-1

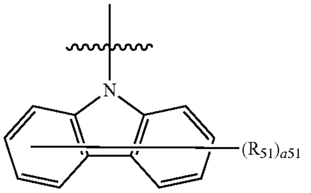

R1-2

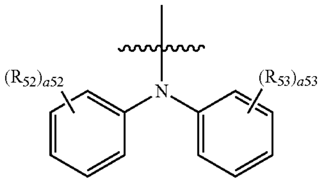

R1-3

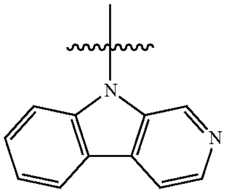

wherein in R1-1, a51 is an integer from 0 to 8, and $R_{51}$ is a hydrogen atom, a deuterium atom, a cyano group, or a substituted or unsubstituted alkyl group having 1 to 10 carbon atoms, wherein in $R_1$-2, a52 and a53 are each independently an integer from 0 to 5, and $R_{52}$ and $R_{53}$ each independently a hydrogen atom, a deuterium atom, a cyano group, or a substituted or unsubstituted alkyl group having 1 to 10 carbon atoms, and wherein in R1-1 to R1-3,

represents a binding site to a neighboring atom.

22. The polycyclic compound of claim 15, wherein the polycyclic compound represented by Formula 1 is a thermally activated delayed fluorescence material.

23. The polycyclic compound of claim 15, wherein the polycyclic compound has an oscillator strength (f) in a range of about 0.25 to about 0.60.

24. A polycyclic compound selected from Compound Group 1:

[Compound Group 1]

1

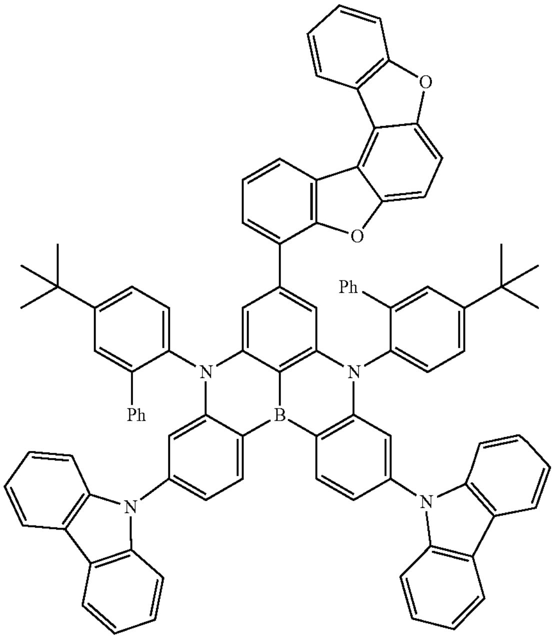

2

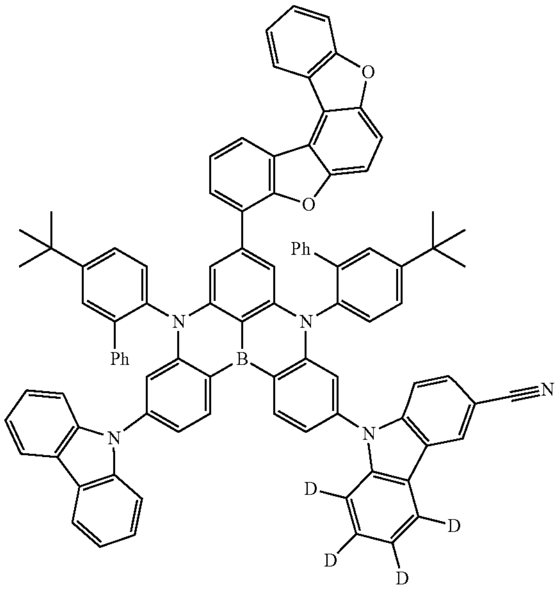

-continued
3
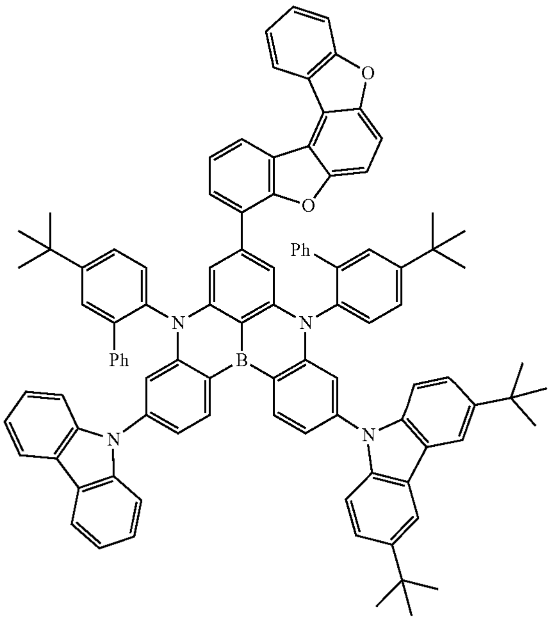
4
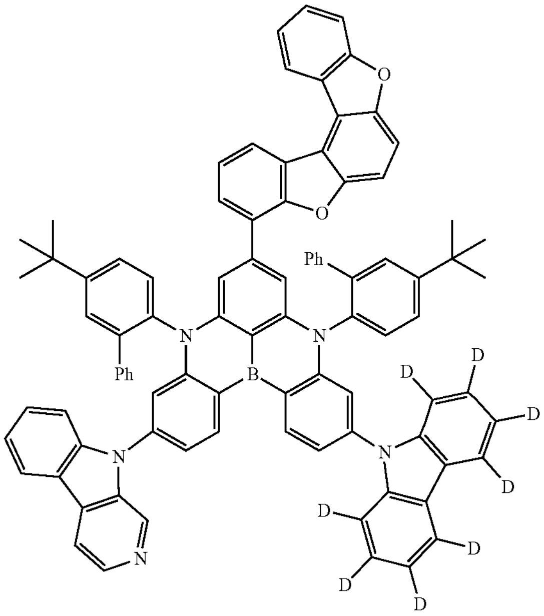
-continued
5
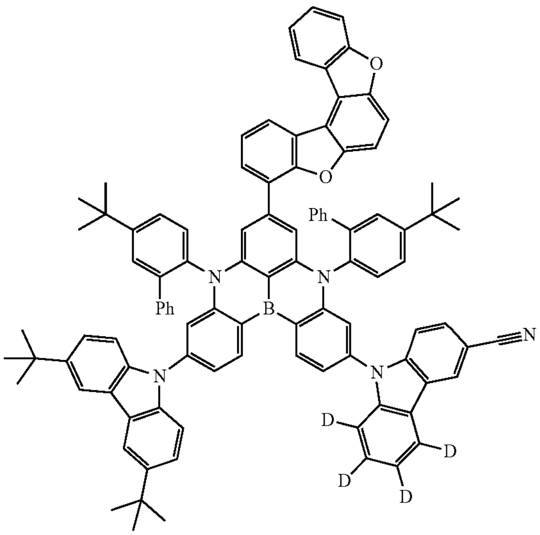
6
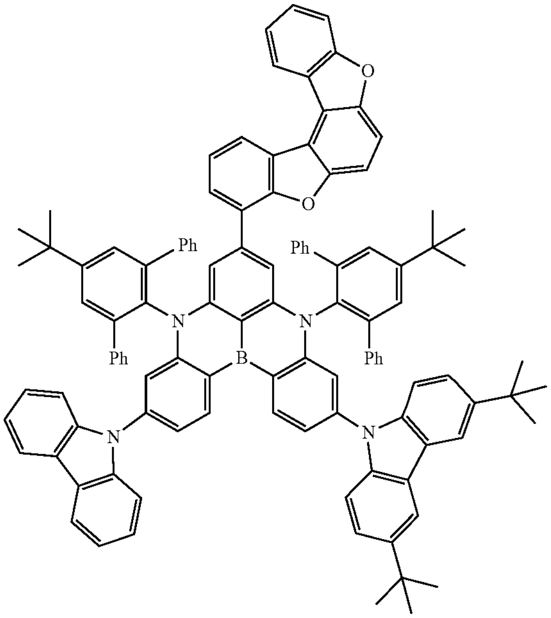

-continued
7
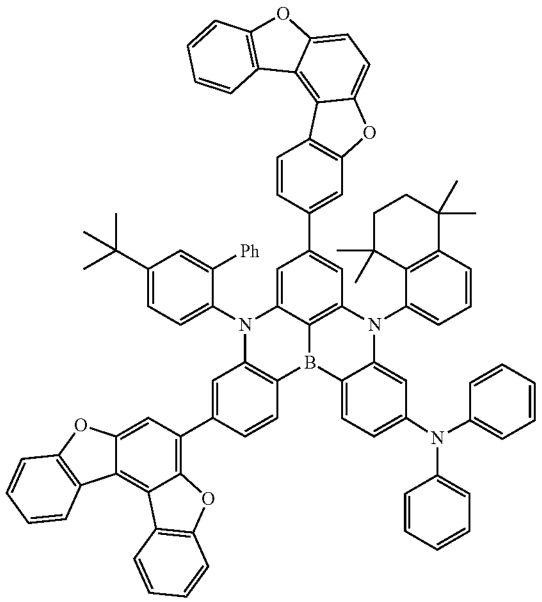
8
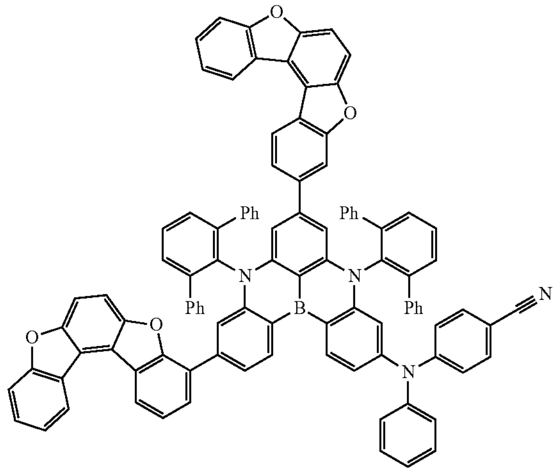
9
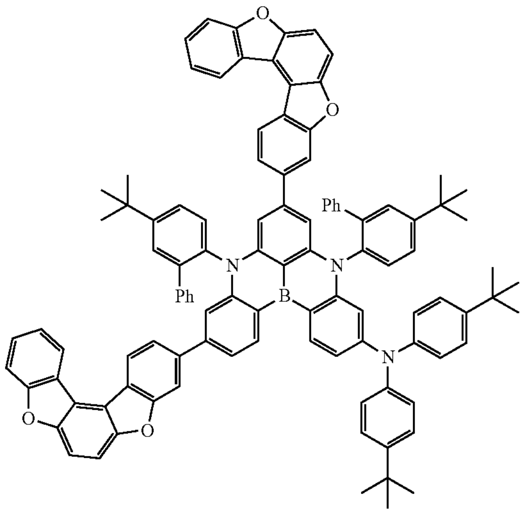
-continued
10
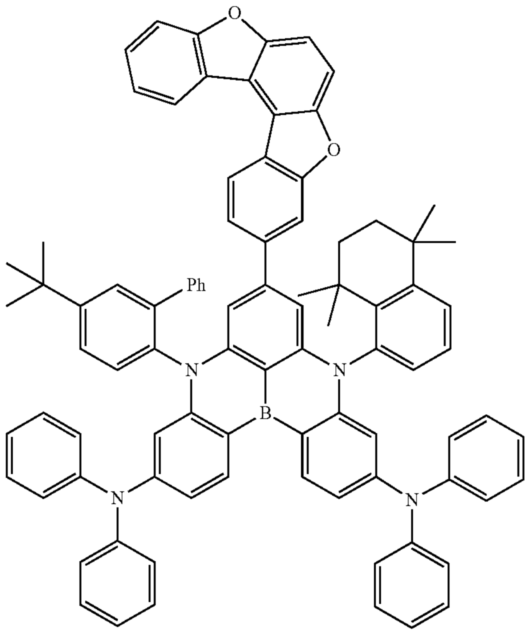
11
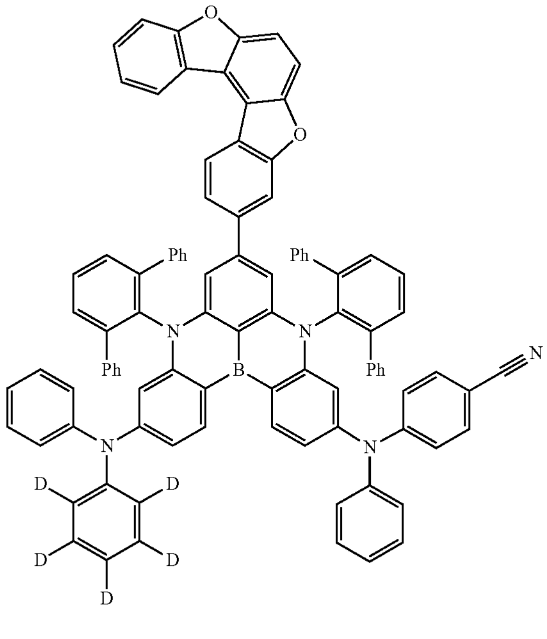

-continued
12
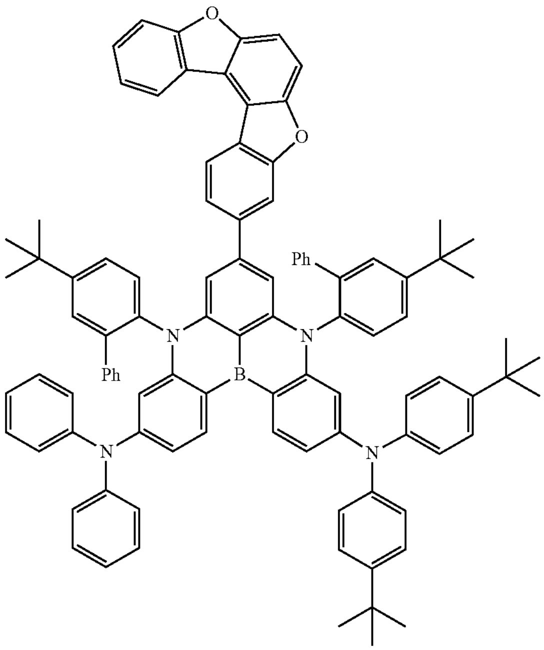
13
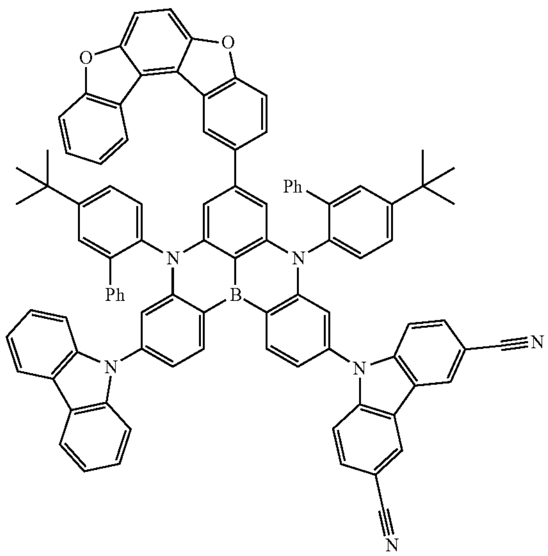
-continued
14
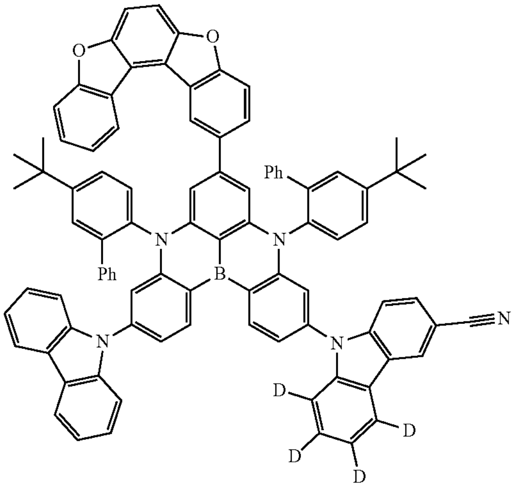
15
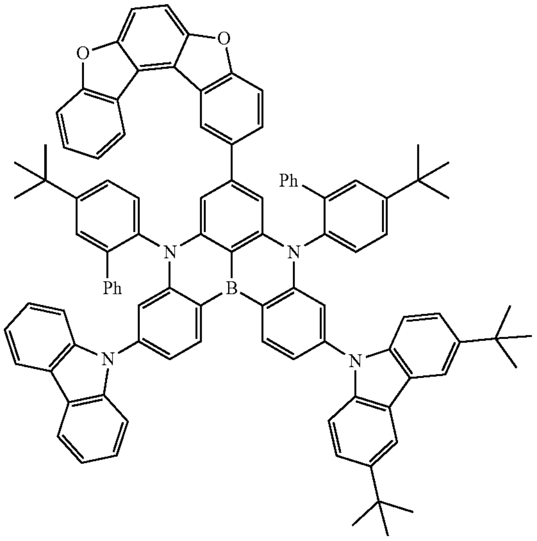
16
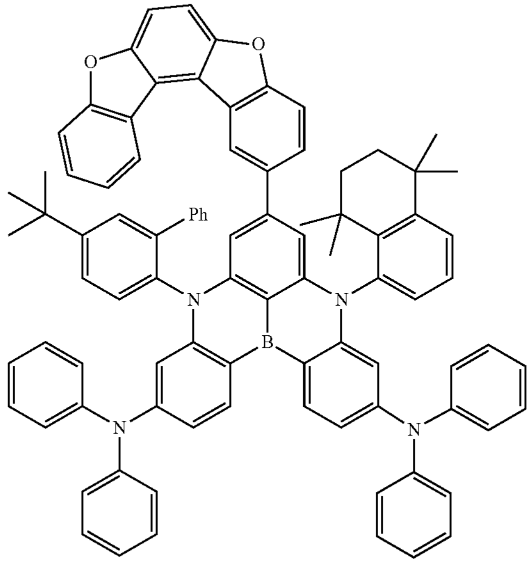

-continued
17
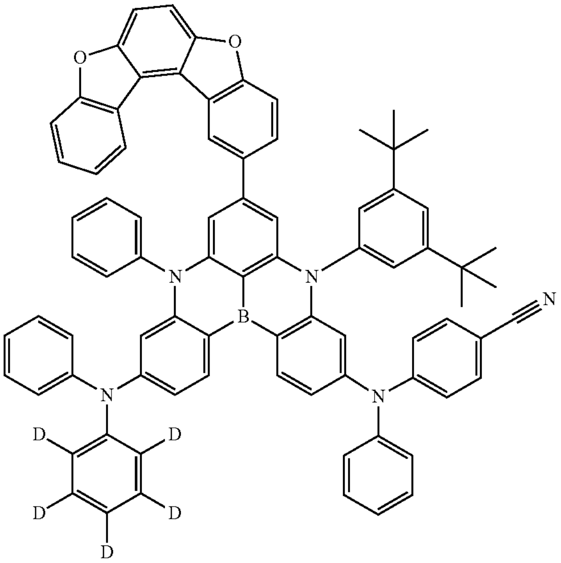
18
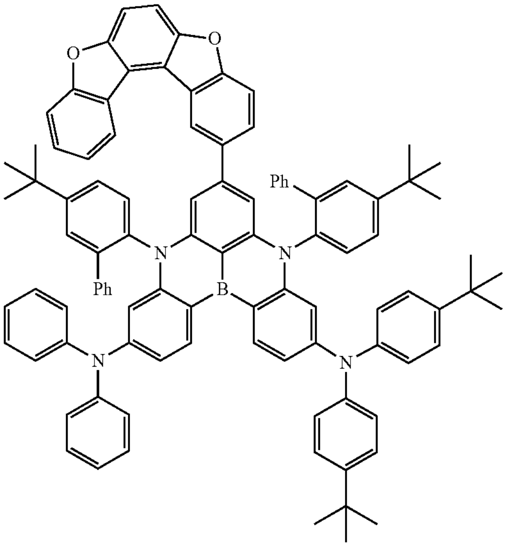
-continued
19
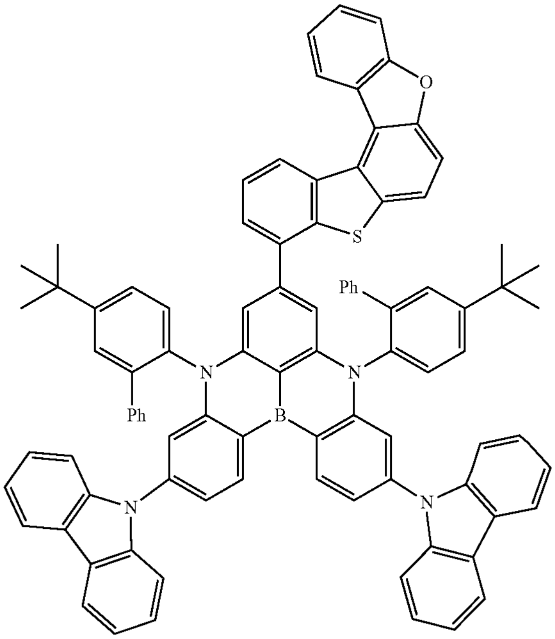
20
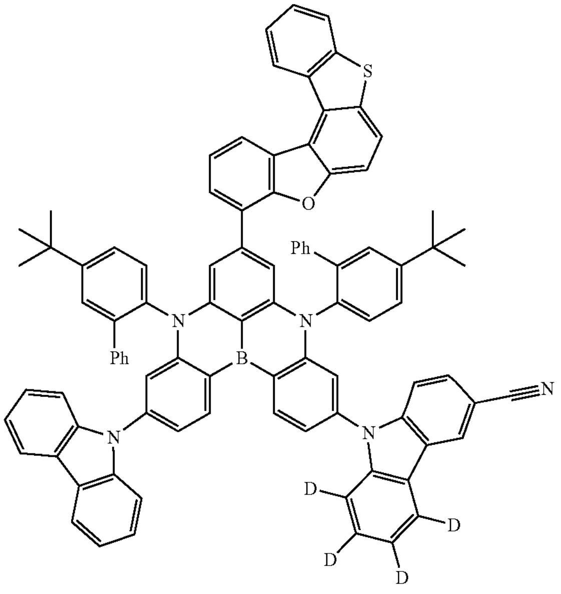

-continued
21
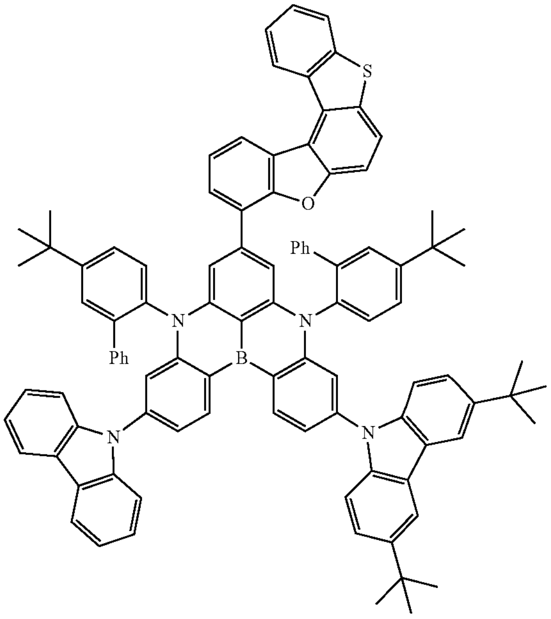
22
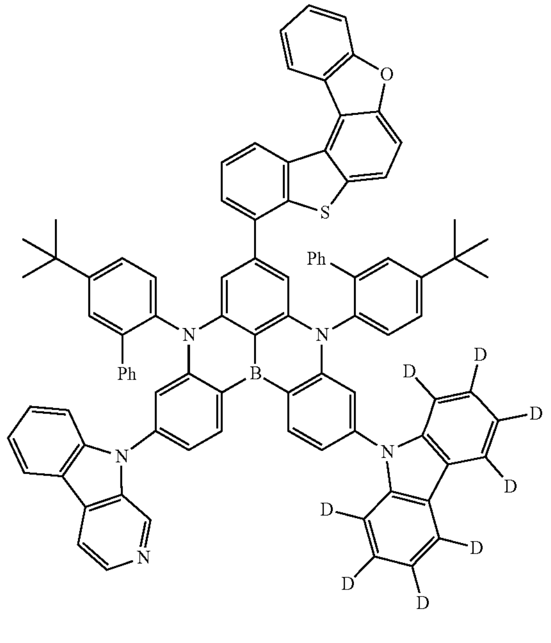
-continued
23
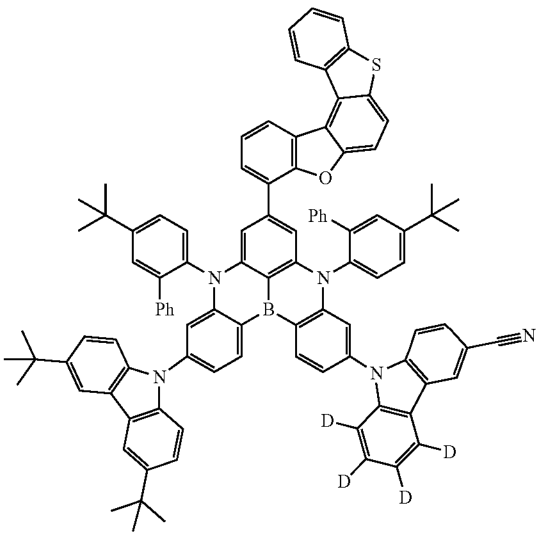
24
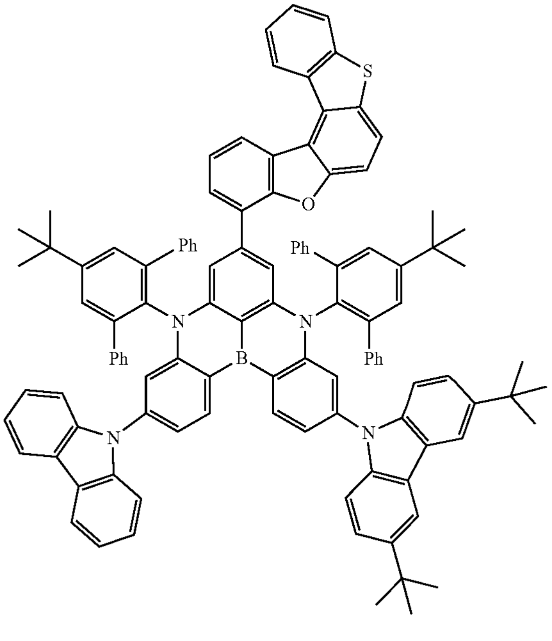

-continued
25
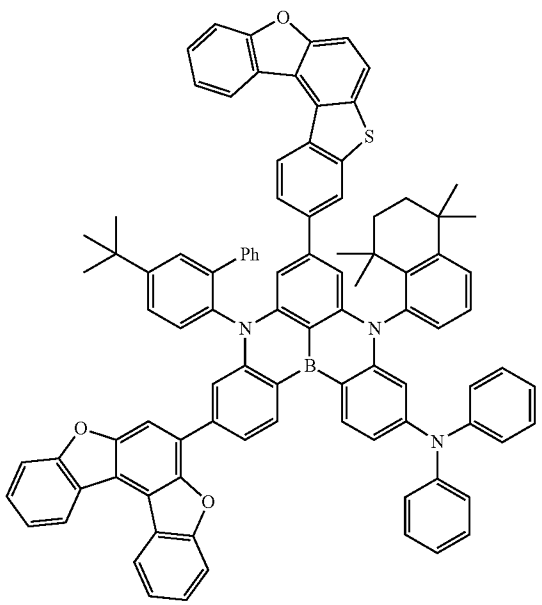
26
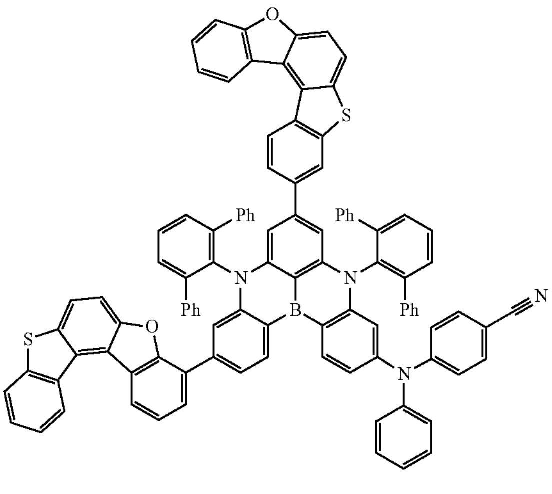
-continued
27
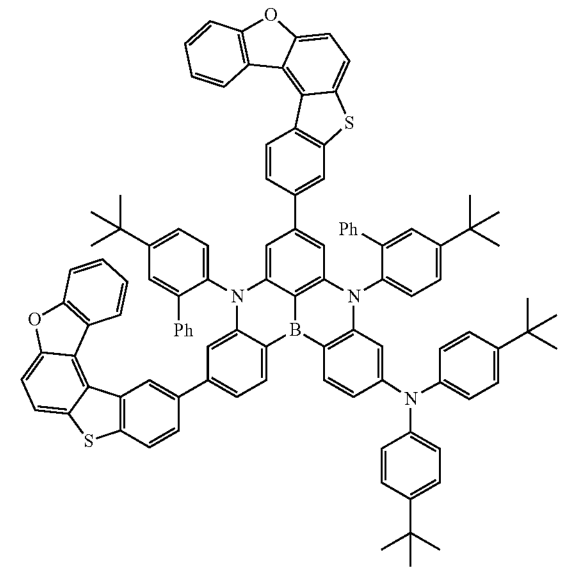
28
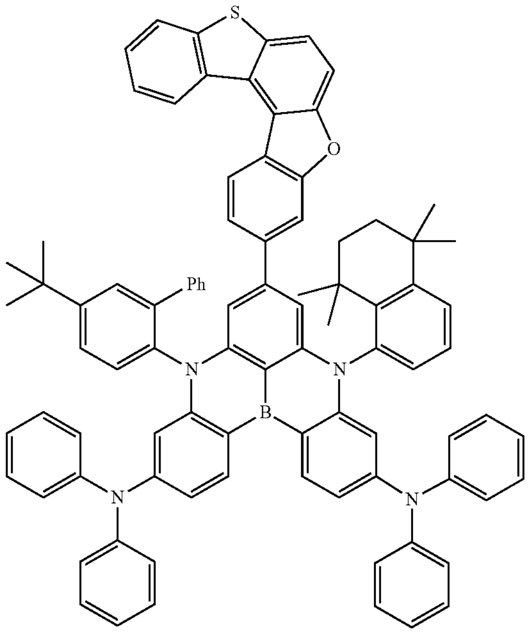

-continued
29
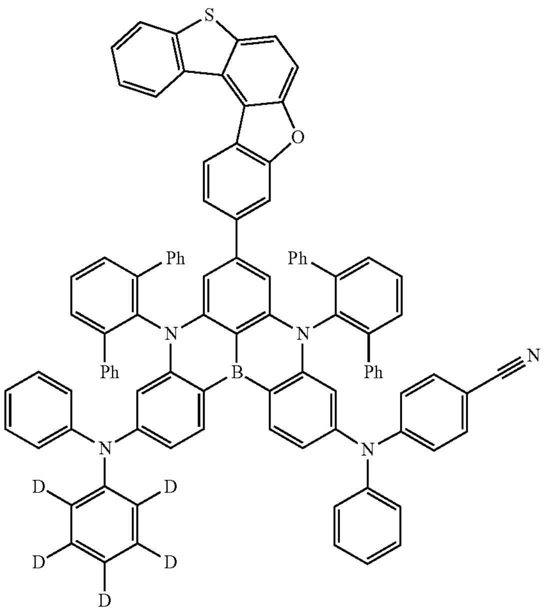
30
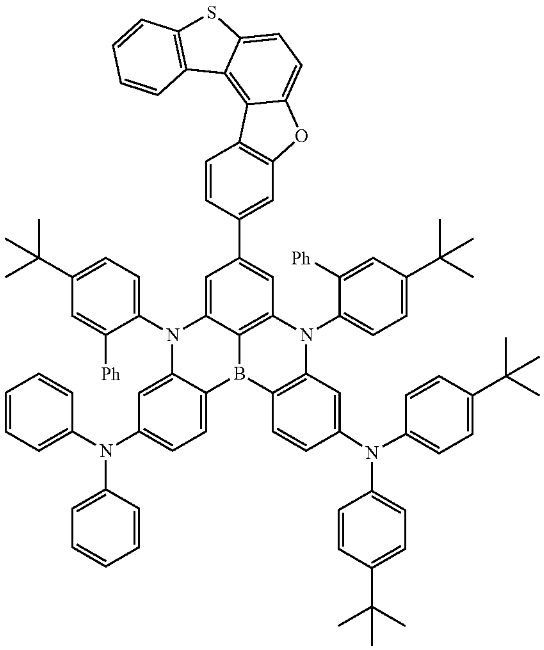
-continued
31
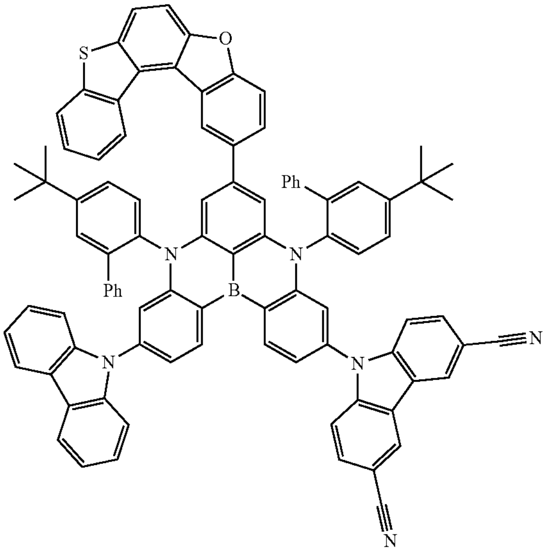
32
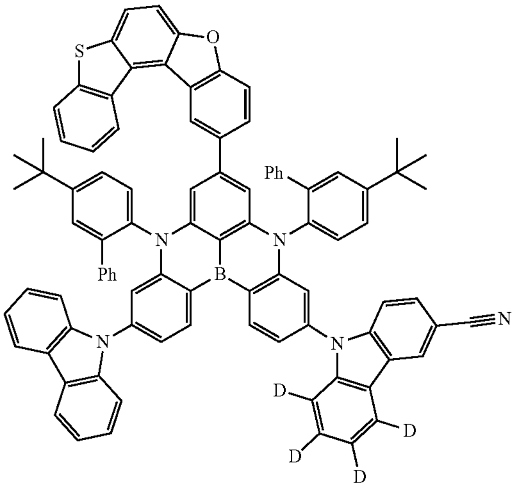
33
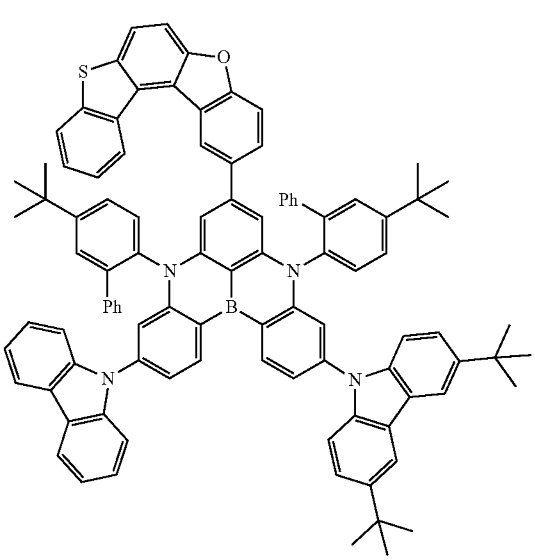

-continued
34
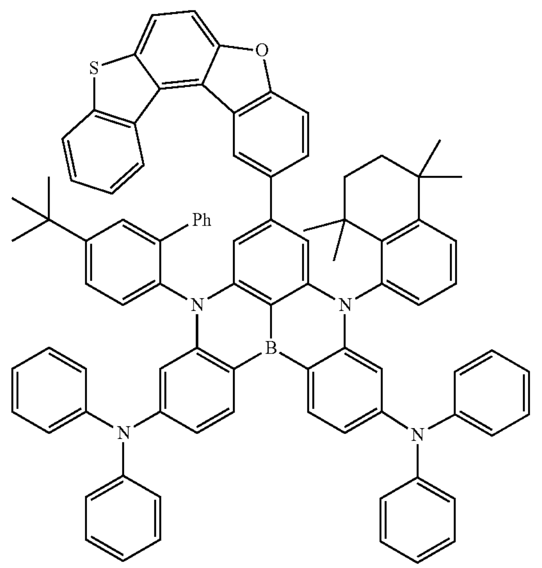
35
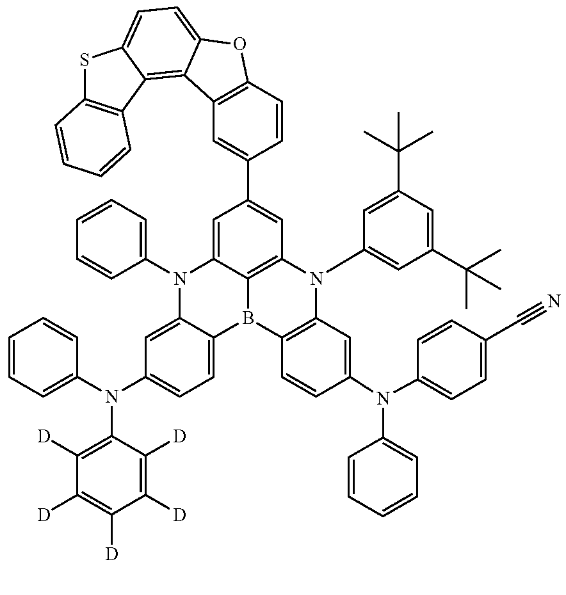
-continued
36
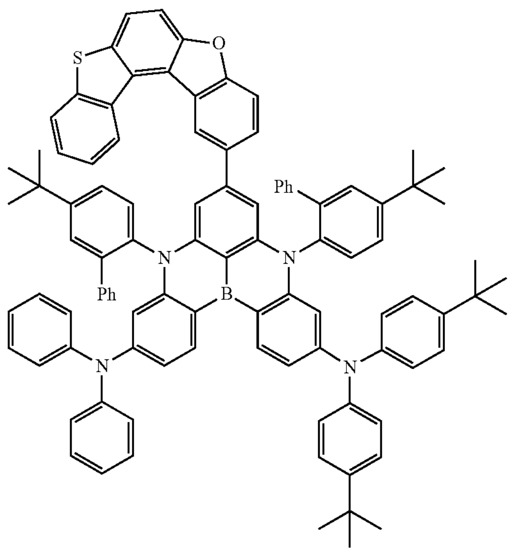
37
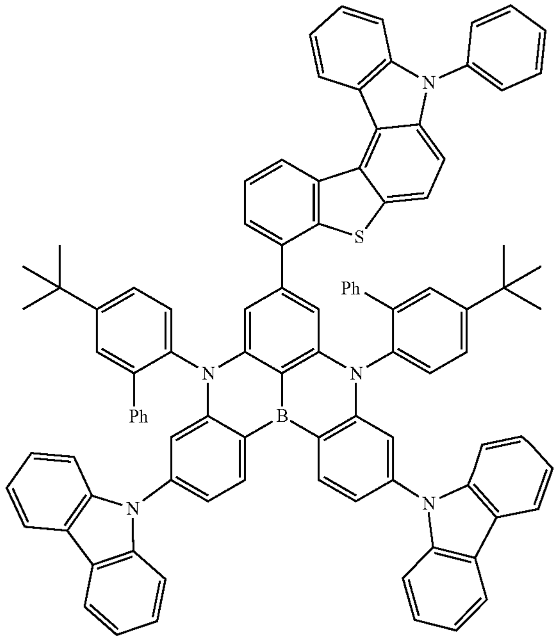

-continued
38
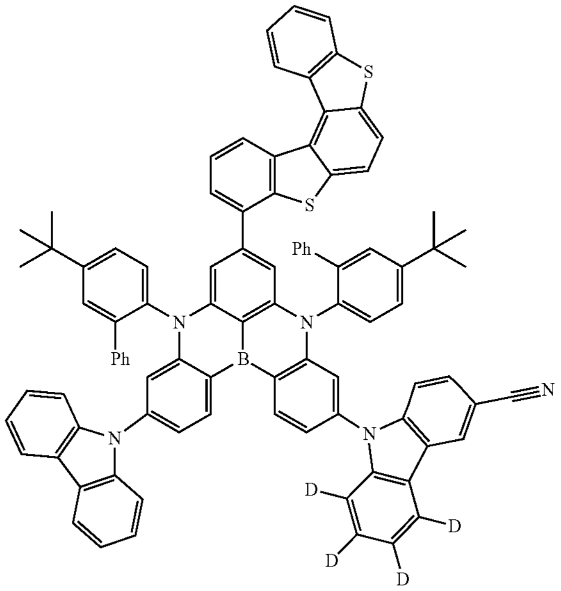
-continued
40
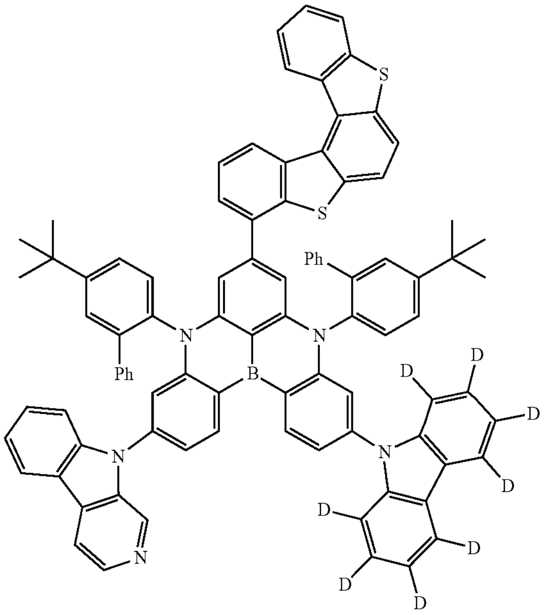
39
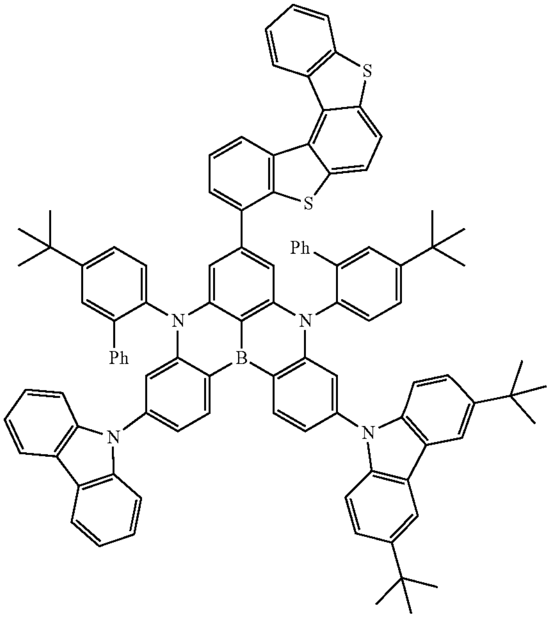
41
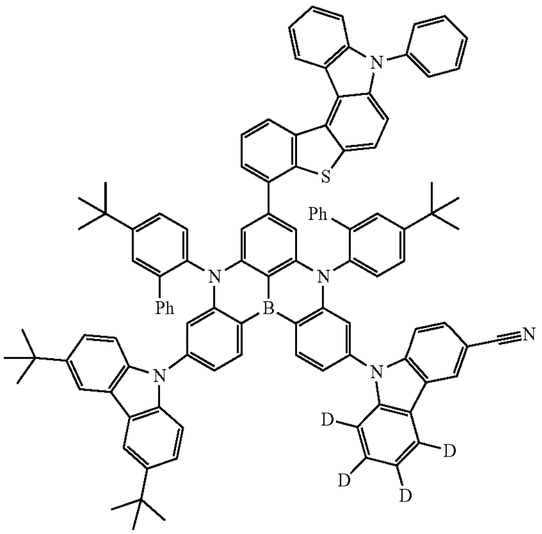

42
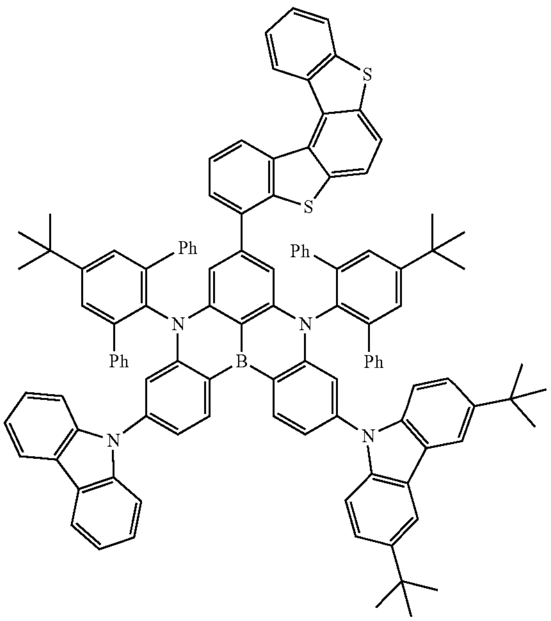
43
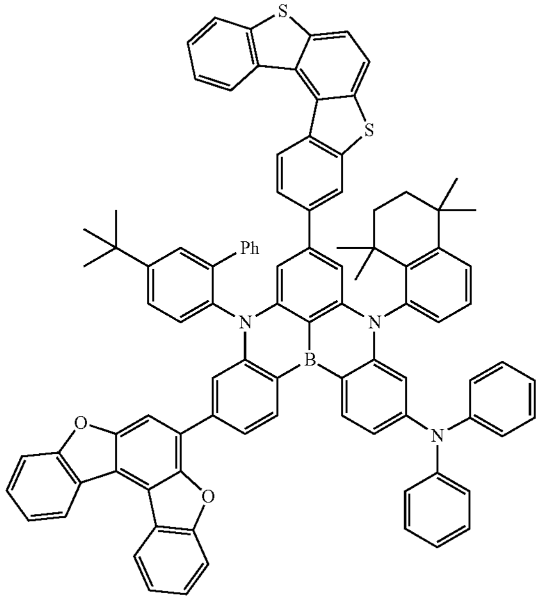
44
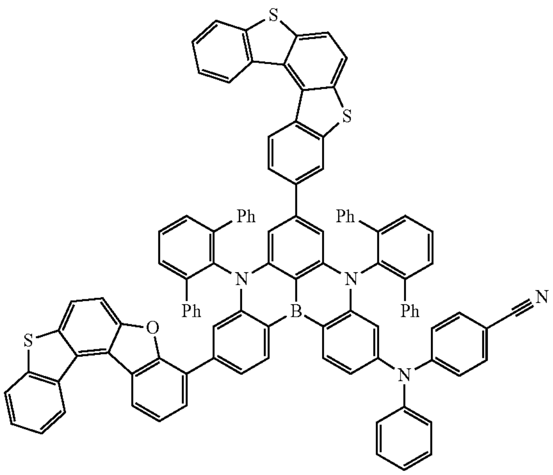
45
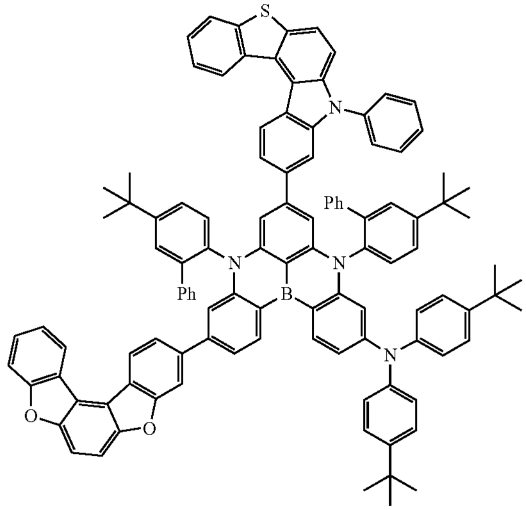

-continued
46
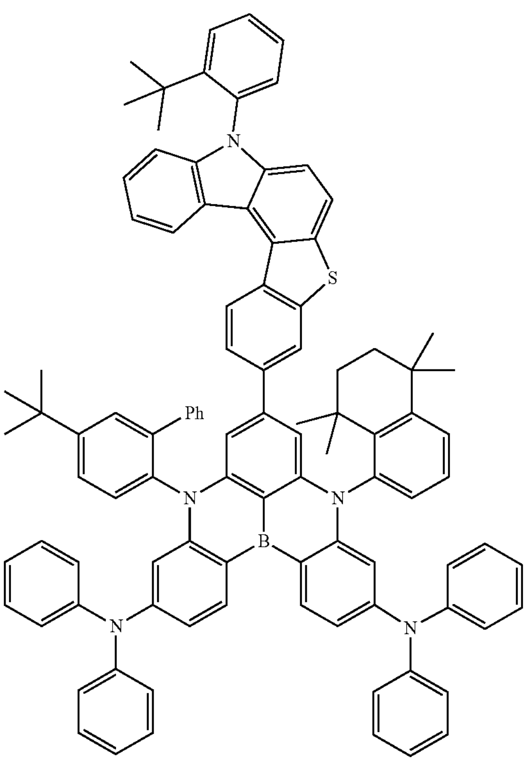
47
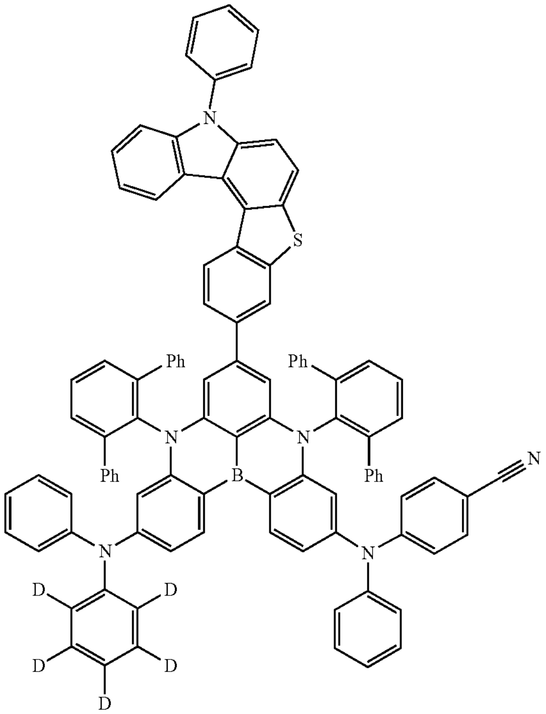
-continued
48
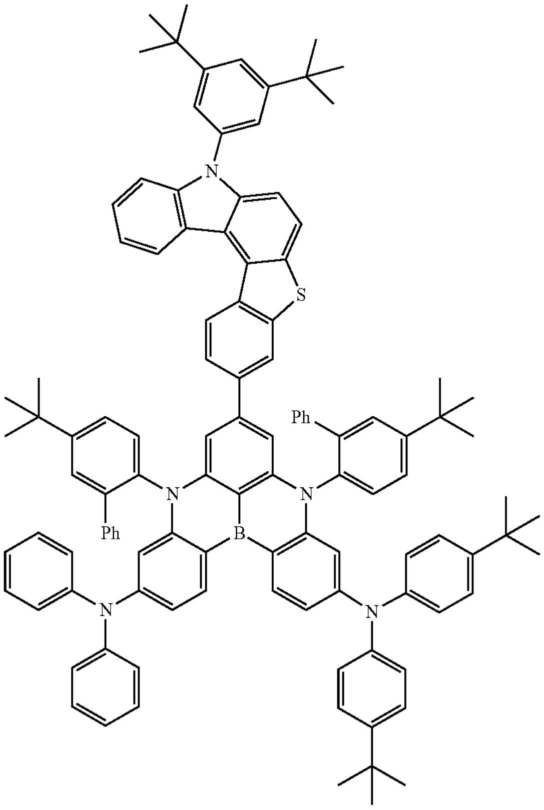
49
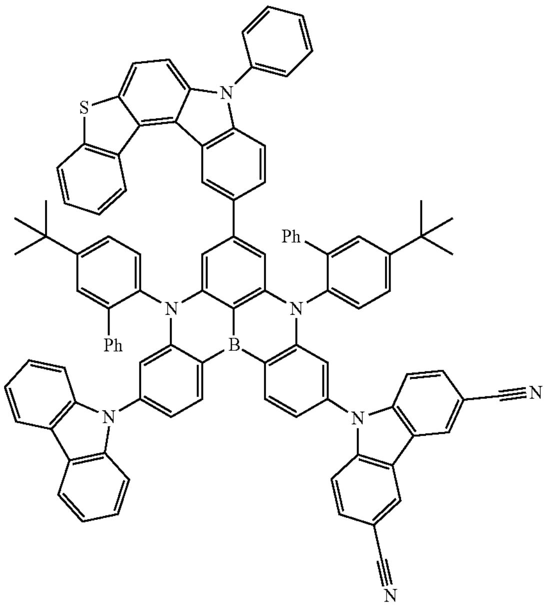

-continued
50
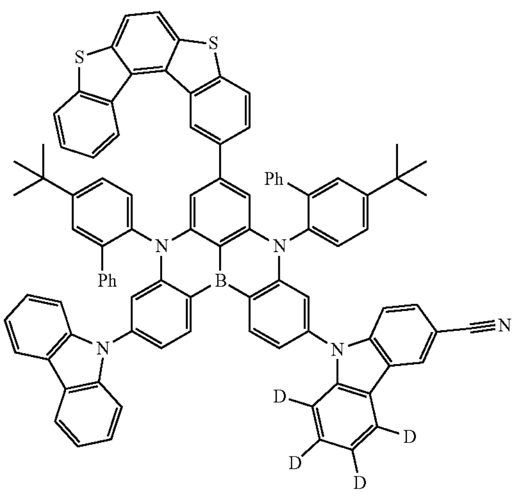
51
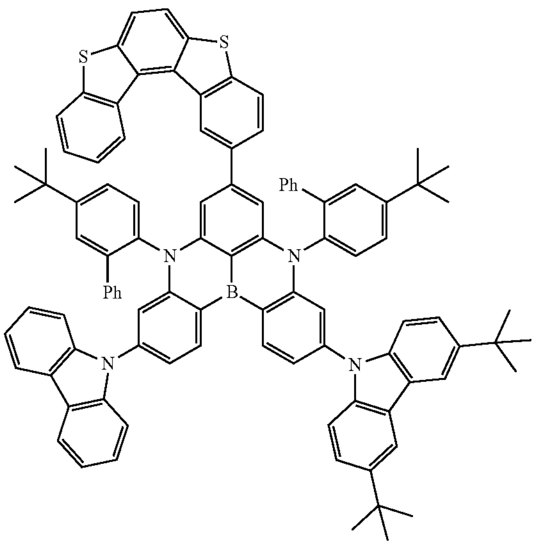
-continued
52
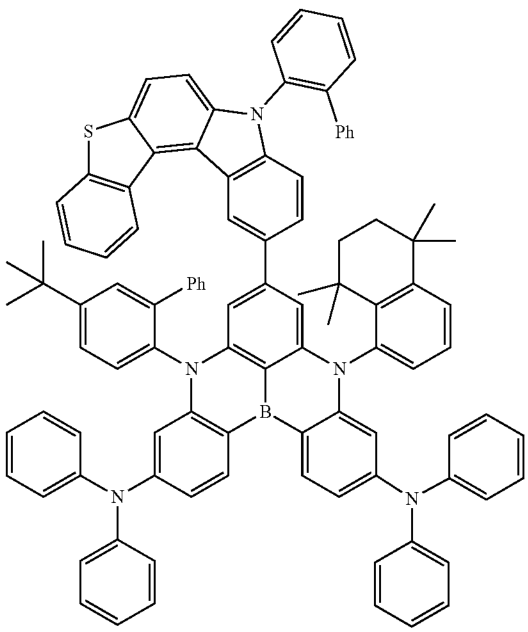
53
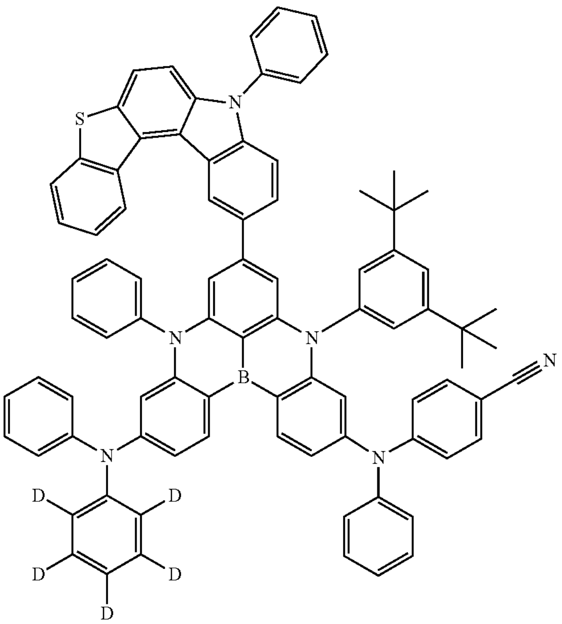

-continued
54
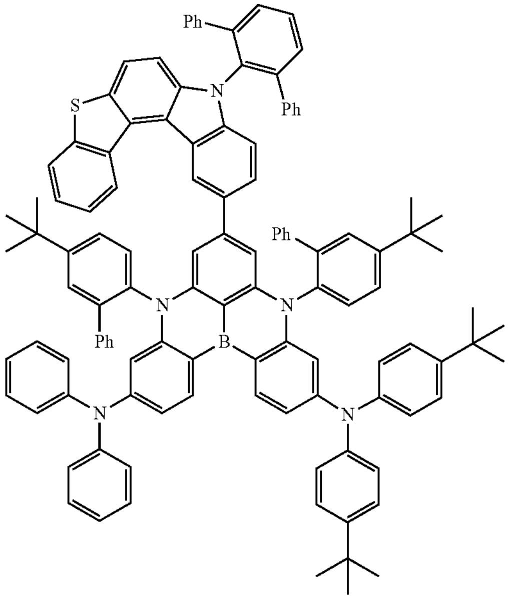
55
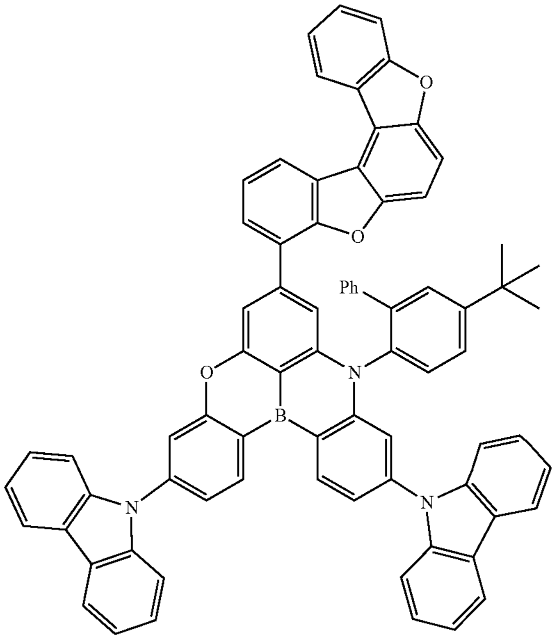
-continued
56
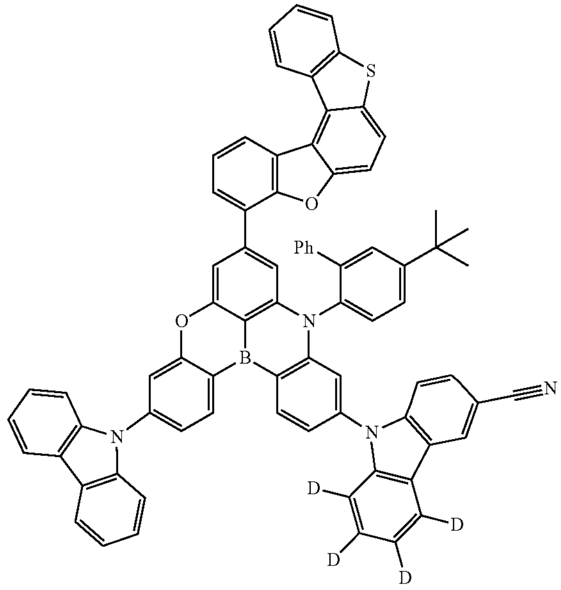
57
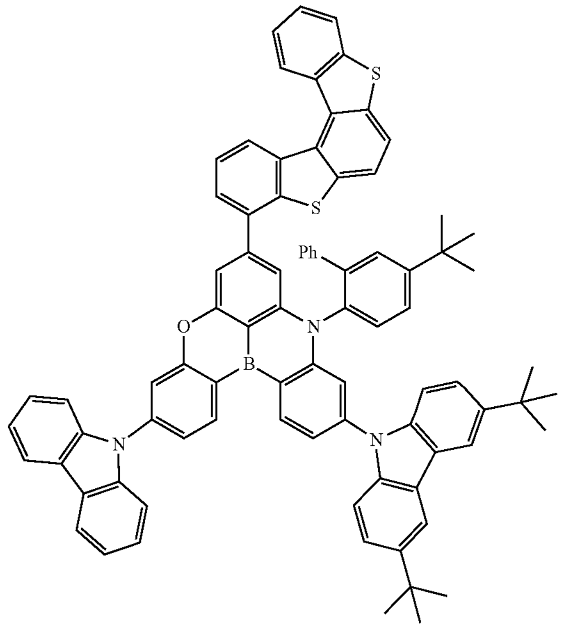

-continued
58
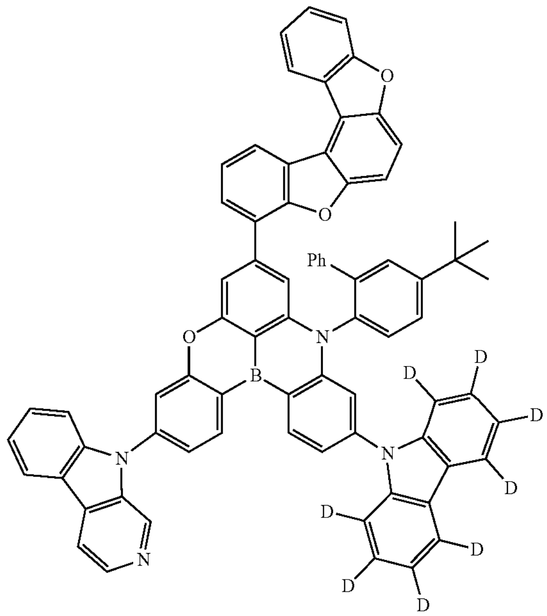
60
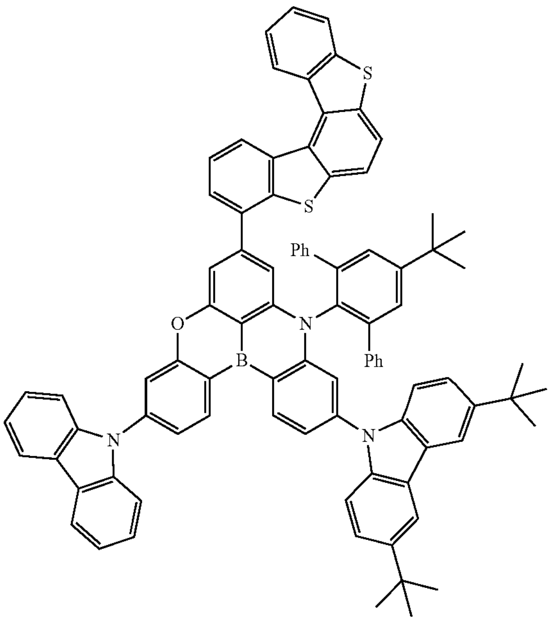
59
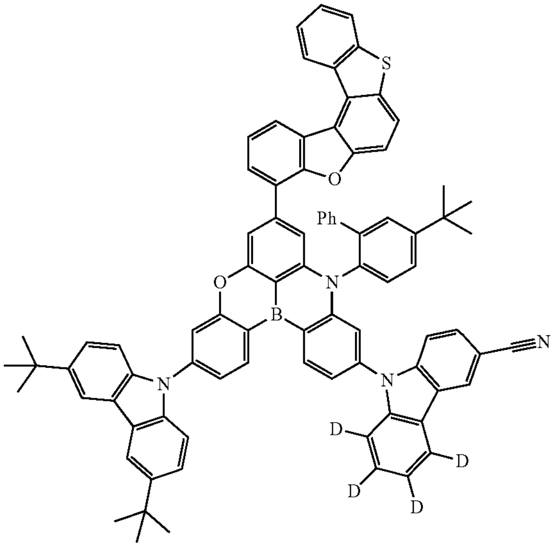
61
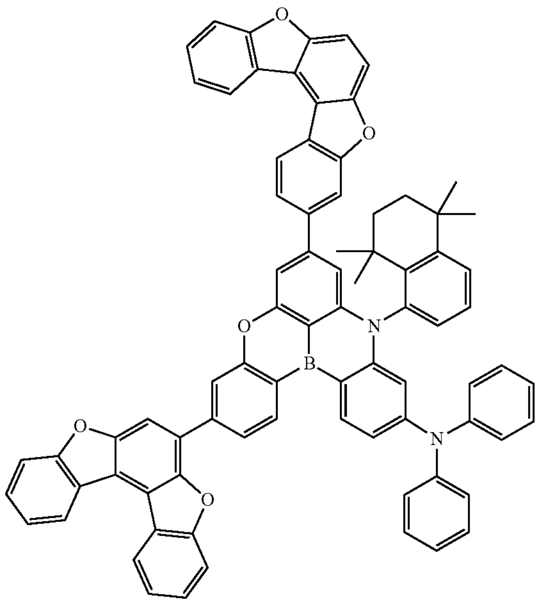

-continued
62
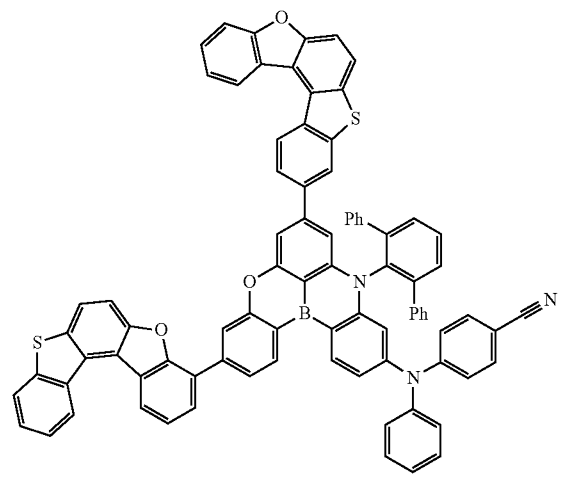
63
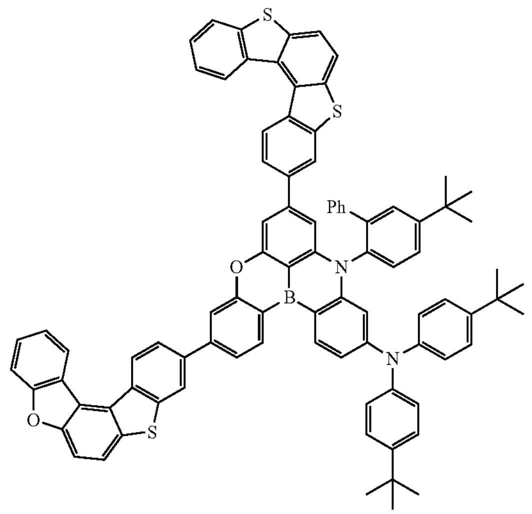
64
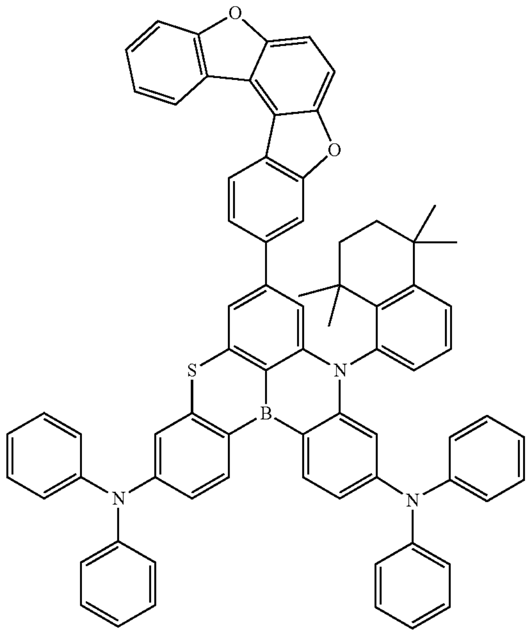
-continued
65
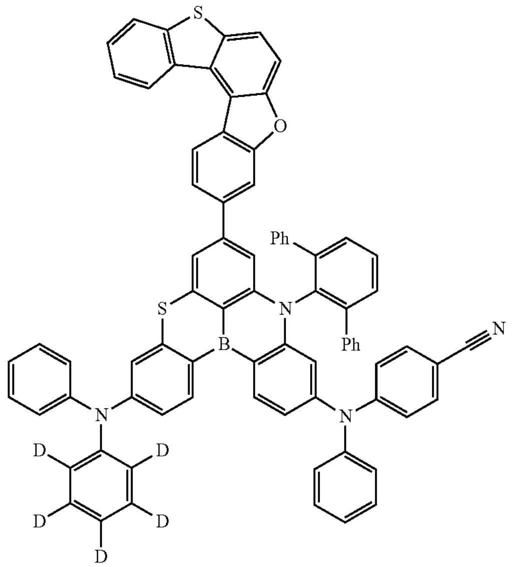
66
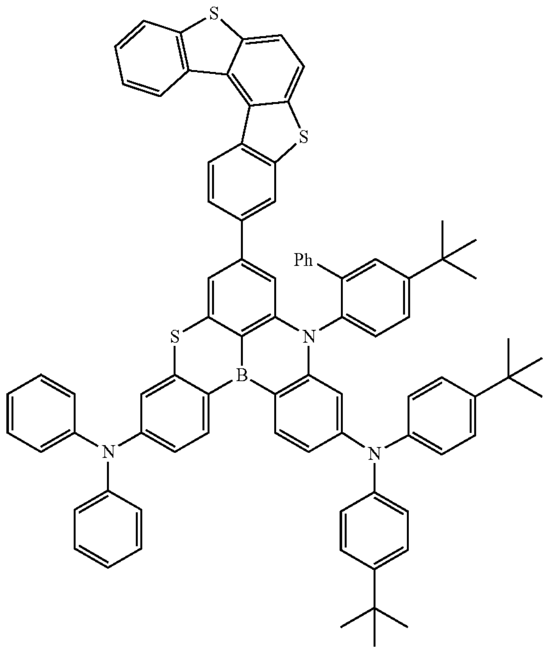

-continued
67
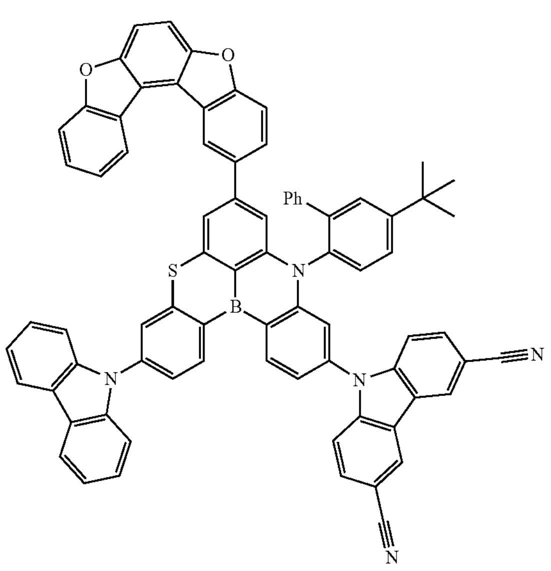
68
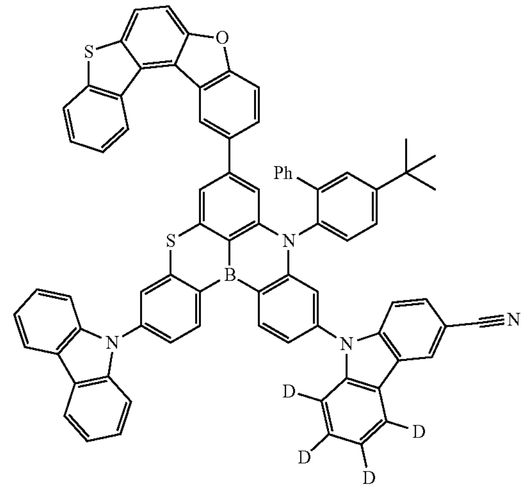
69
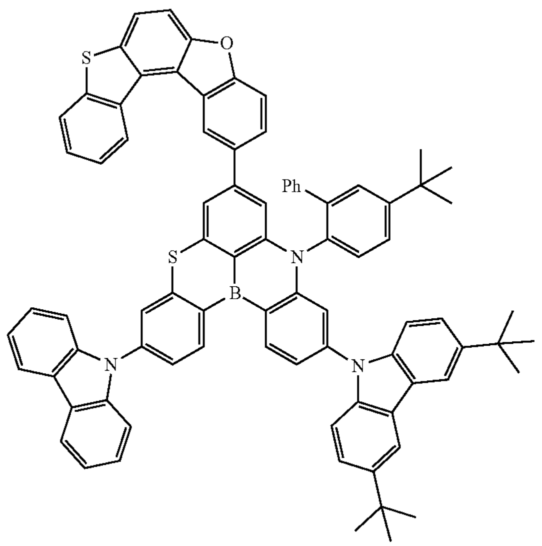
-continued
70
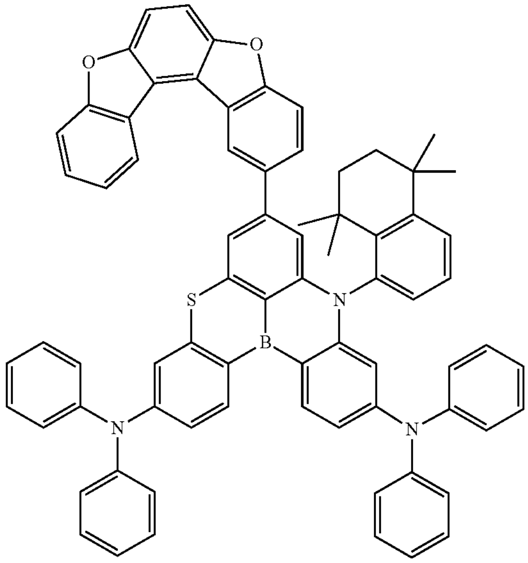
71
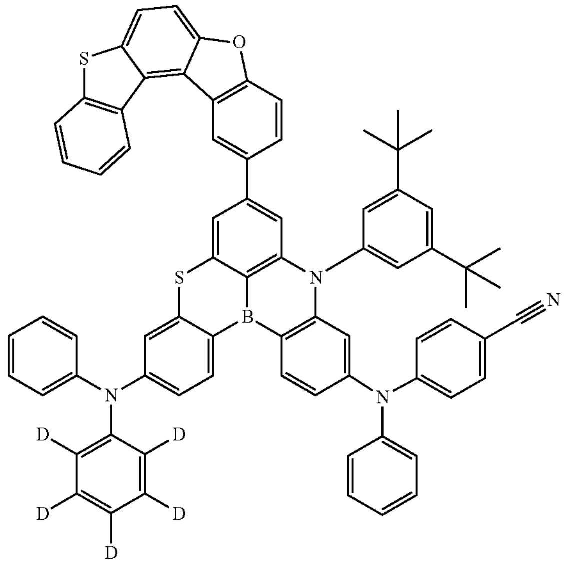

-continued
72
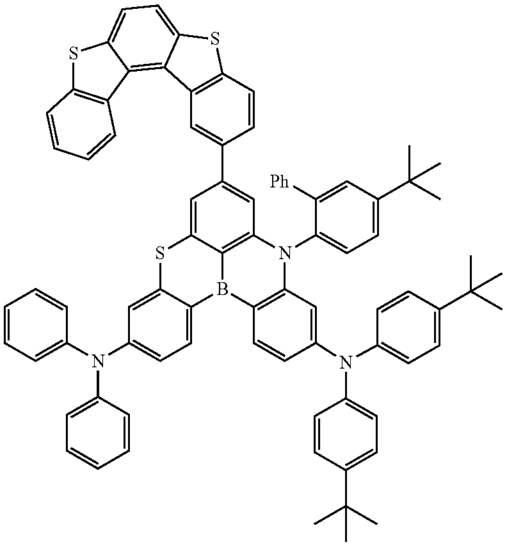
73
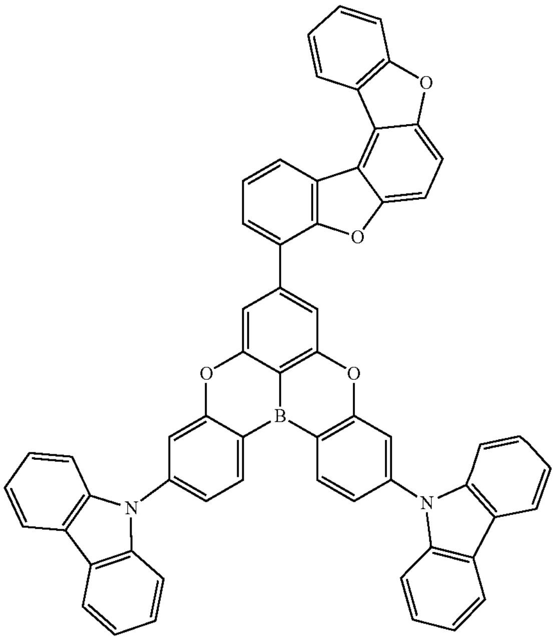
-continued
74
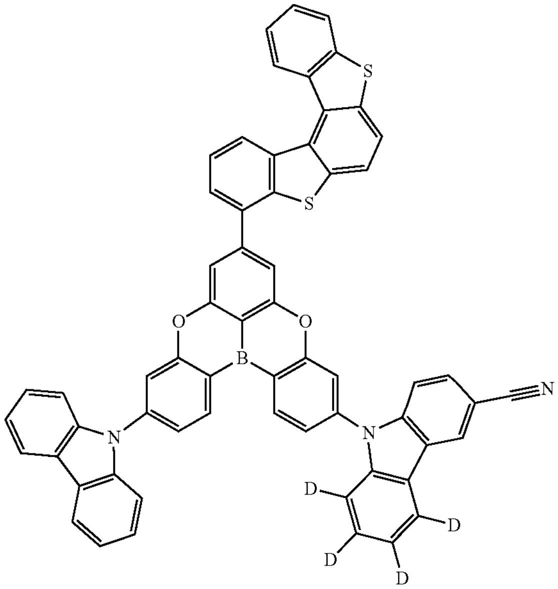
75
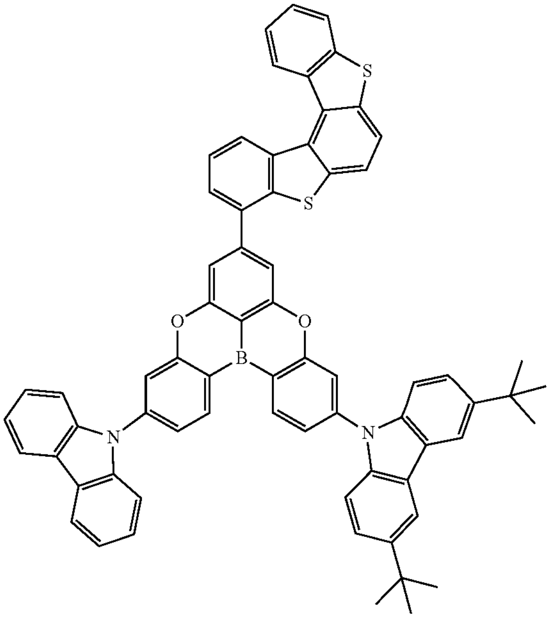

-continued
76
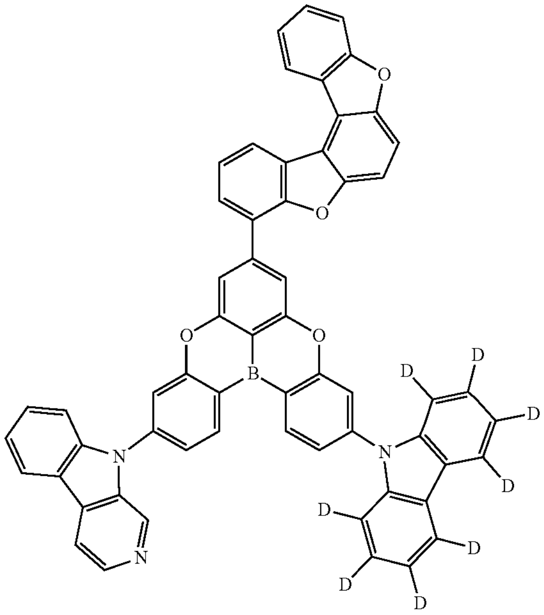
77
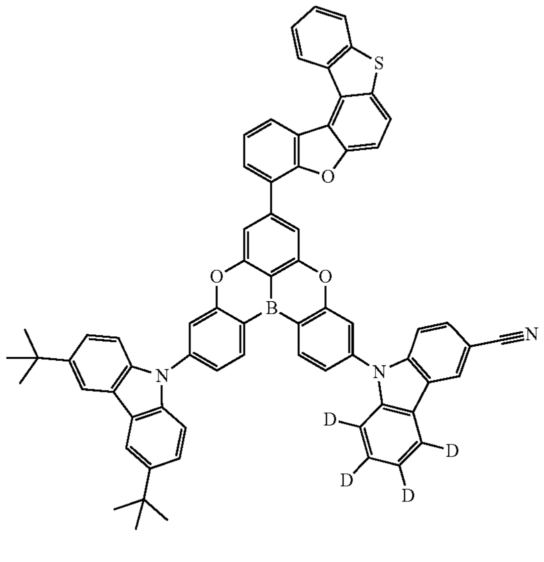
-continued
78
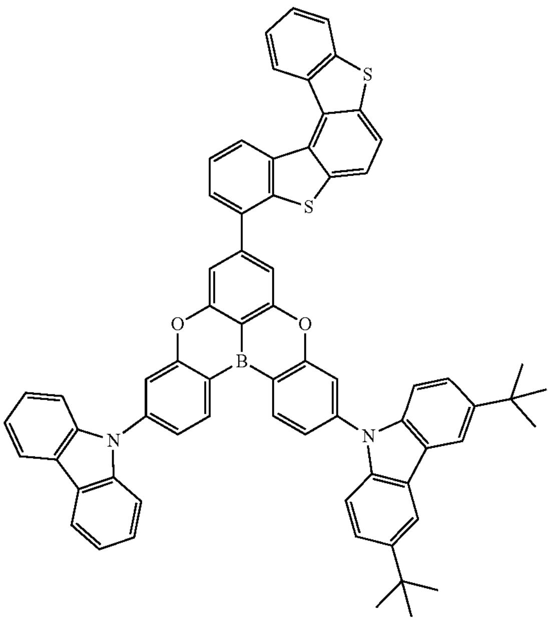
79
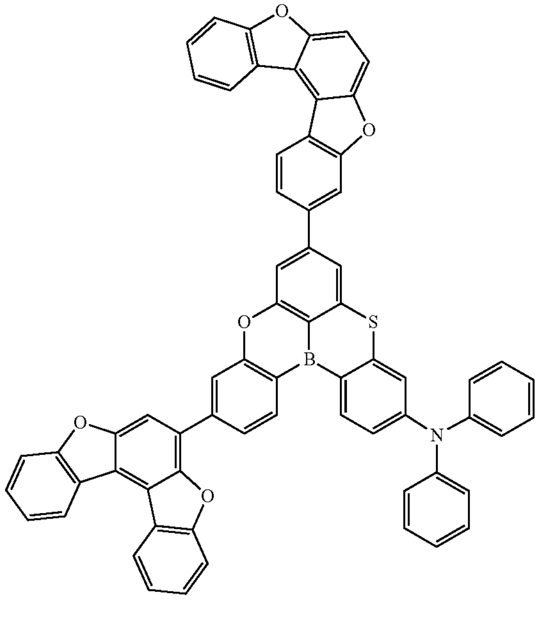

-continued
80
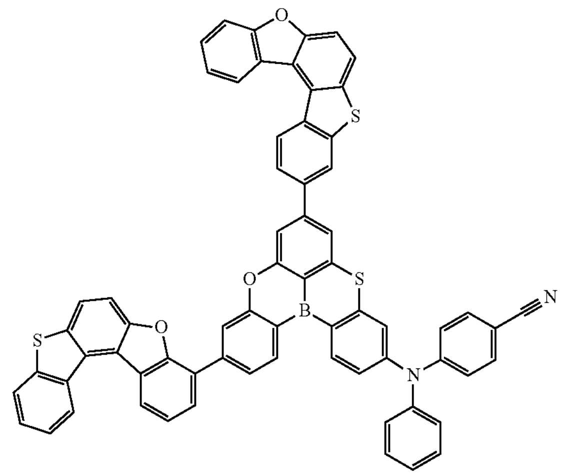
81
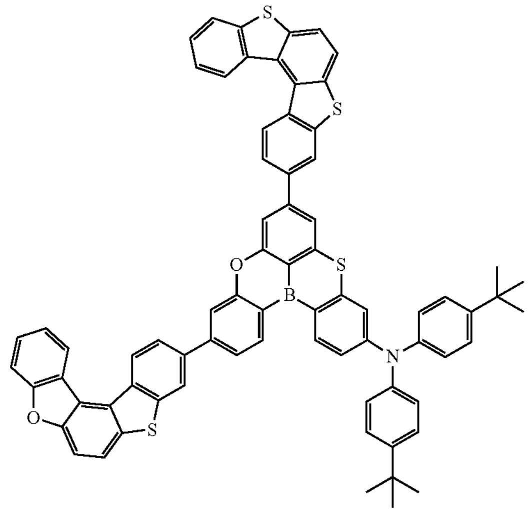
-continued
82
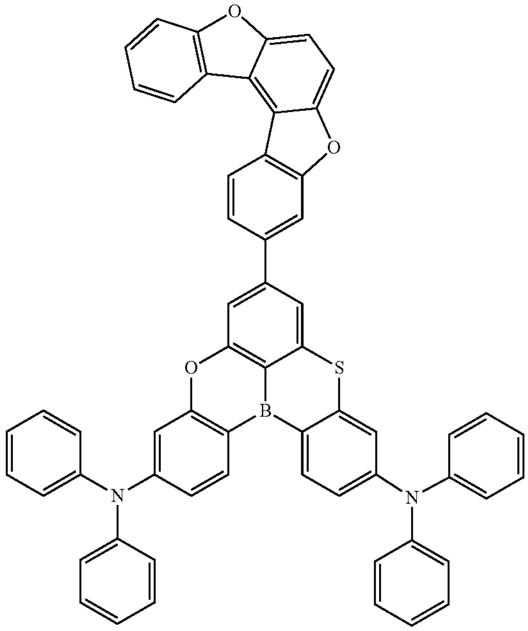
83
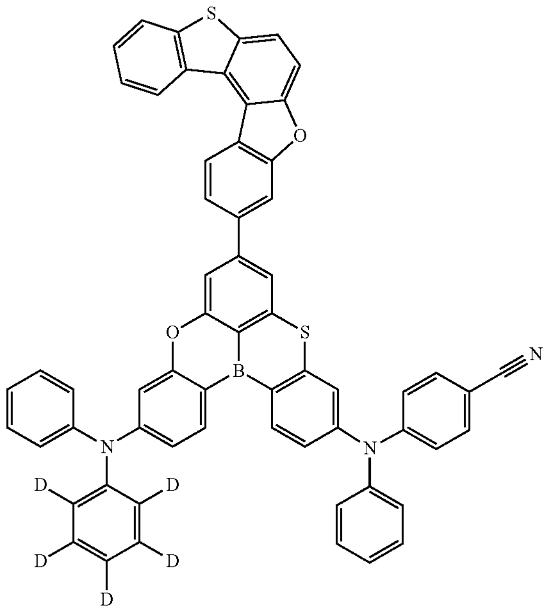

-continued
84
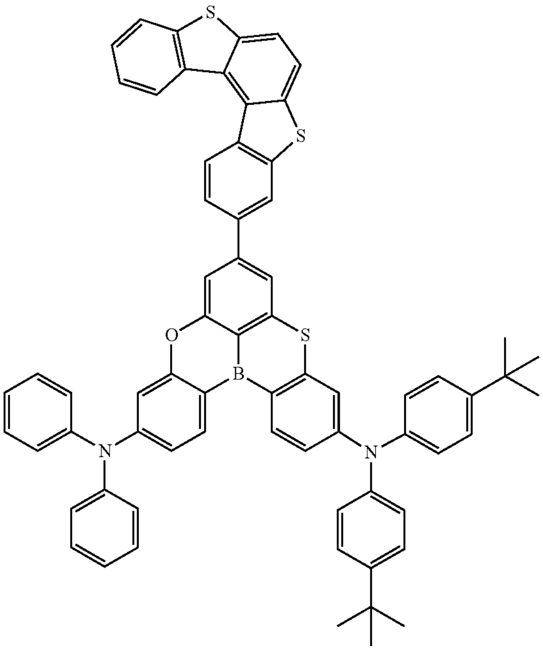
85
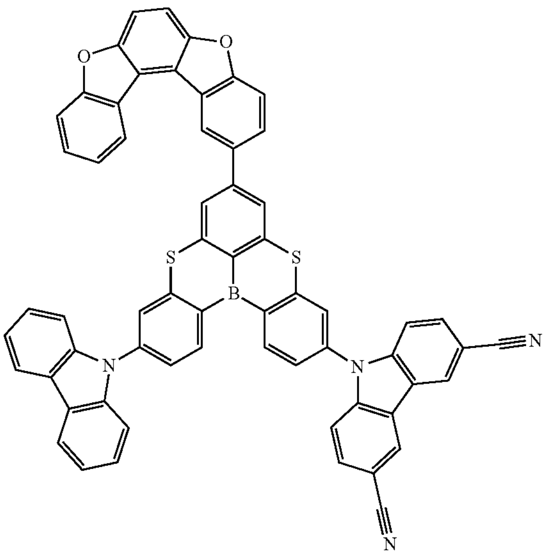
-continued
86
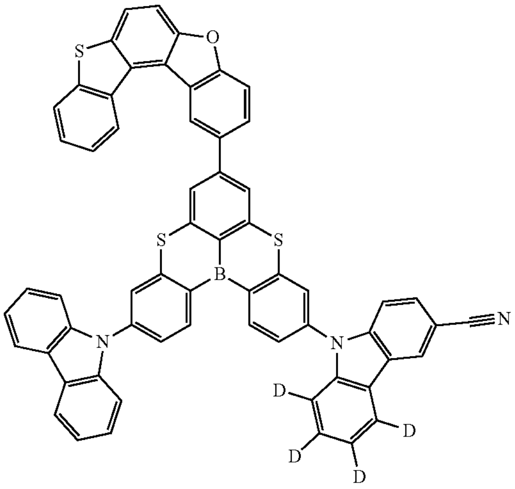
87
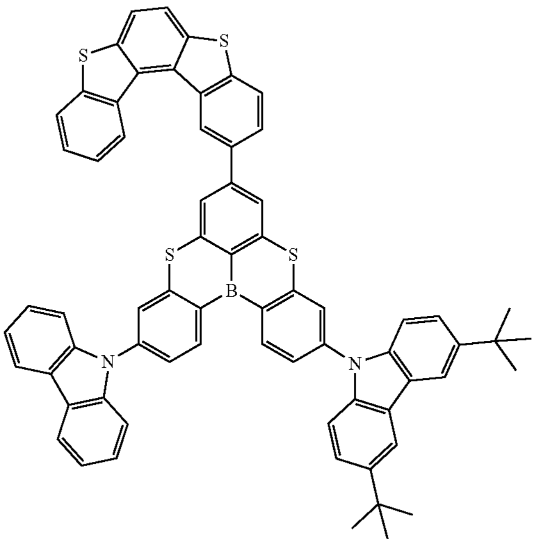
88
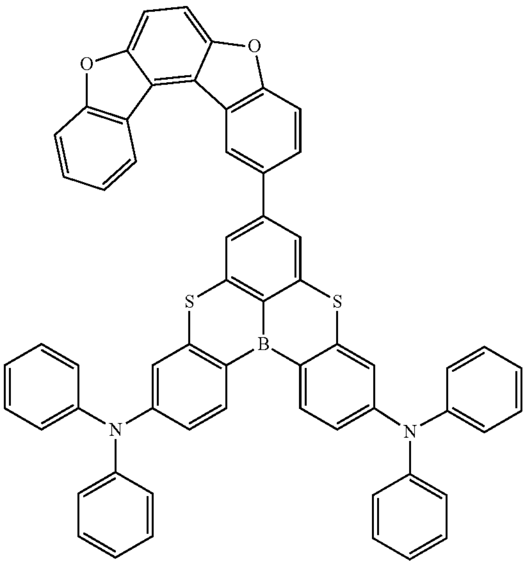

-continued
89
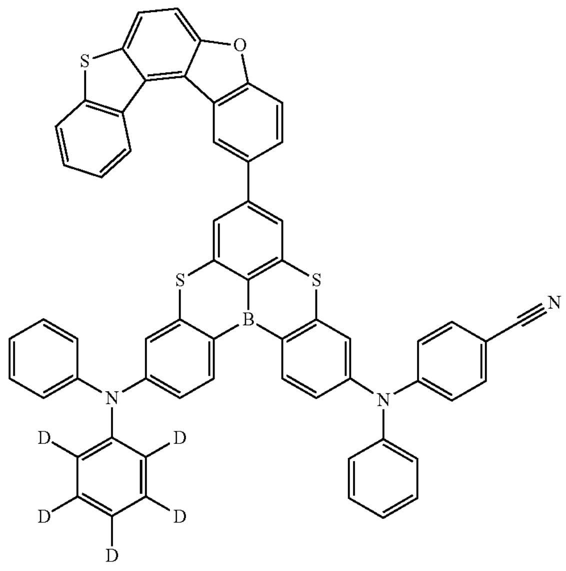
90
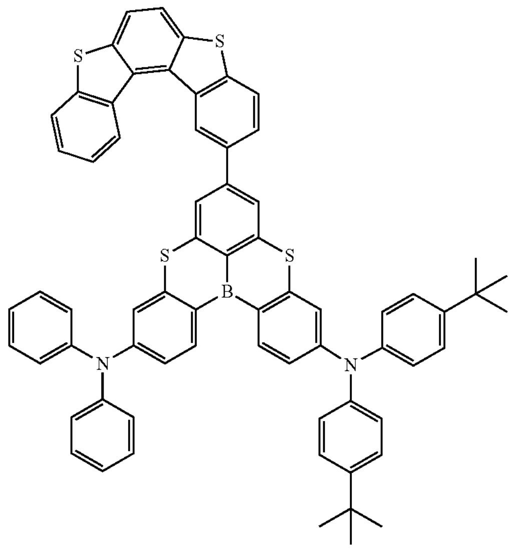
-continued
91
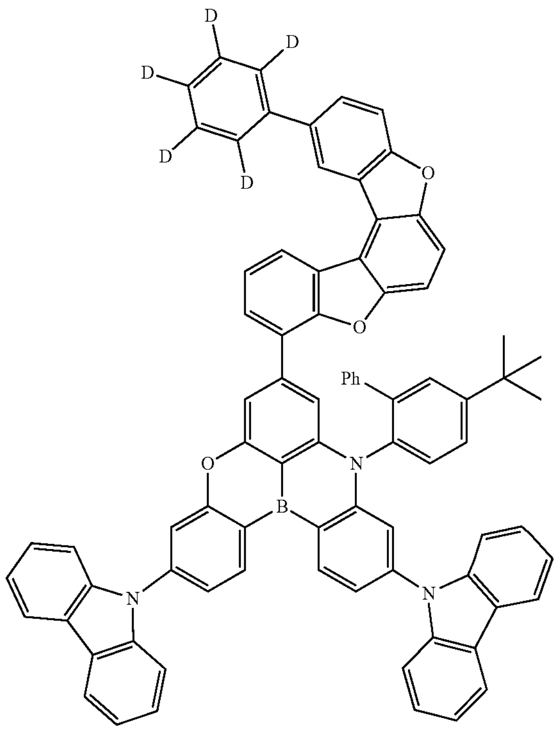
92
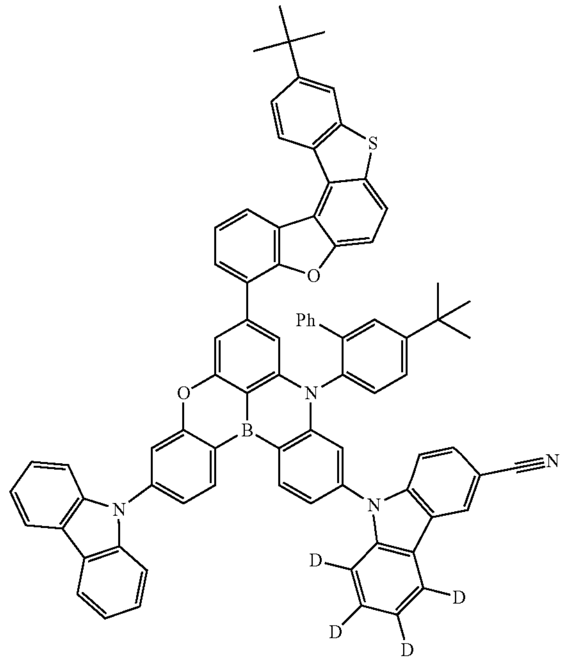

93
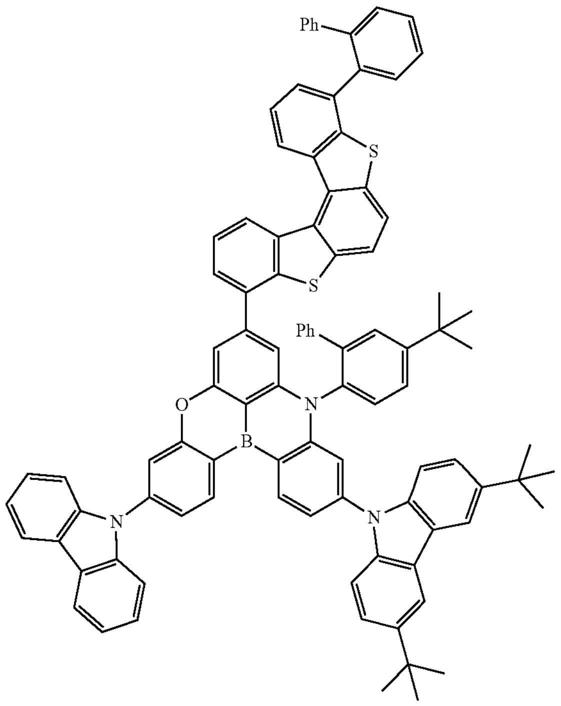
94
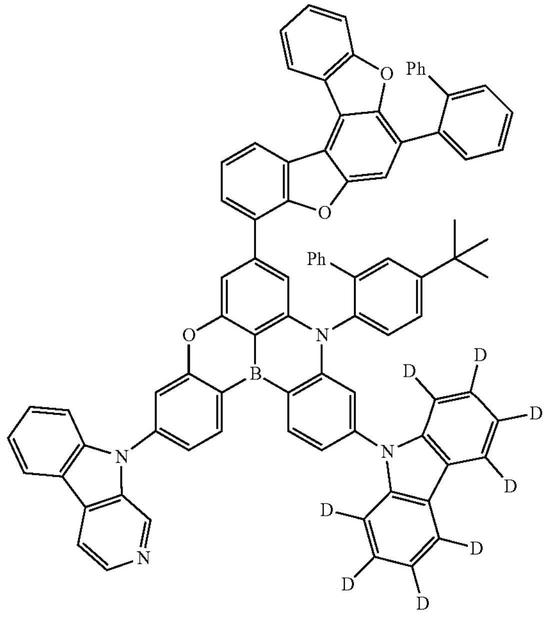
95
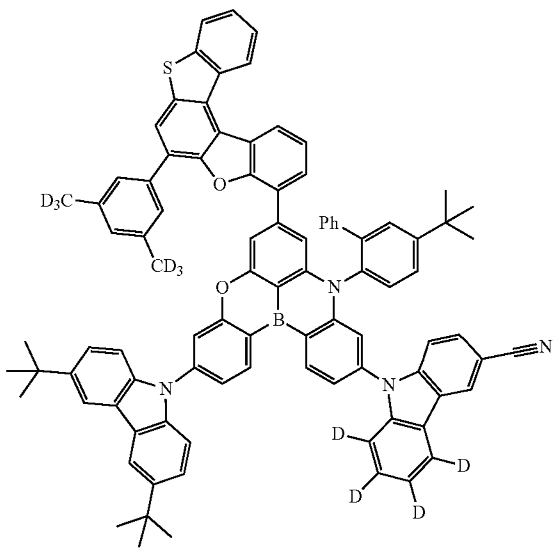
96
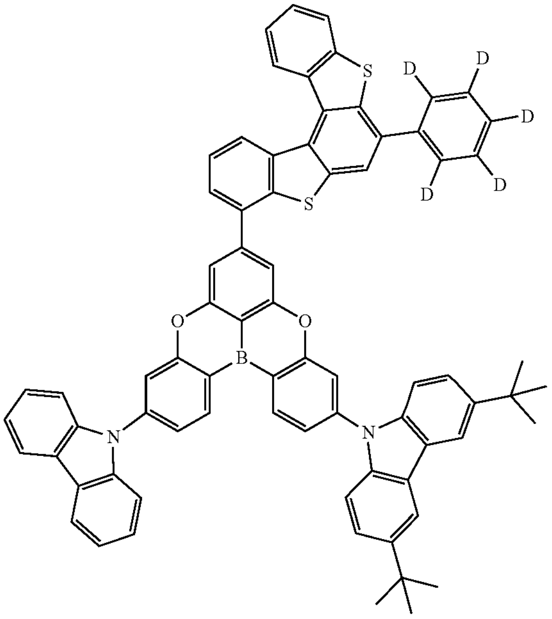

-continued
97
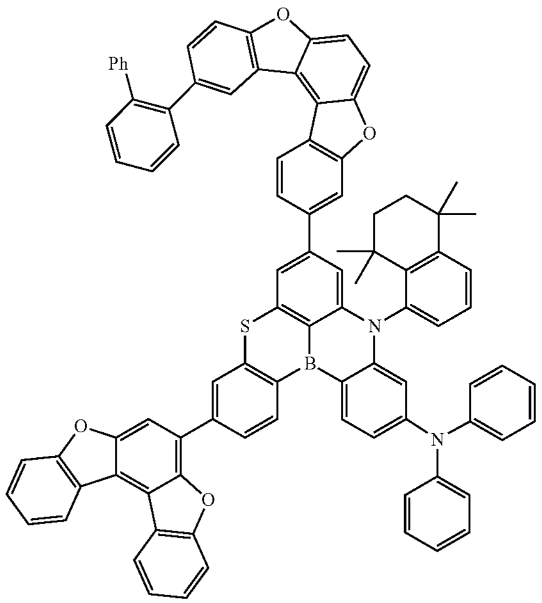
98
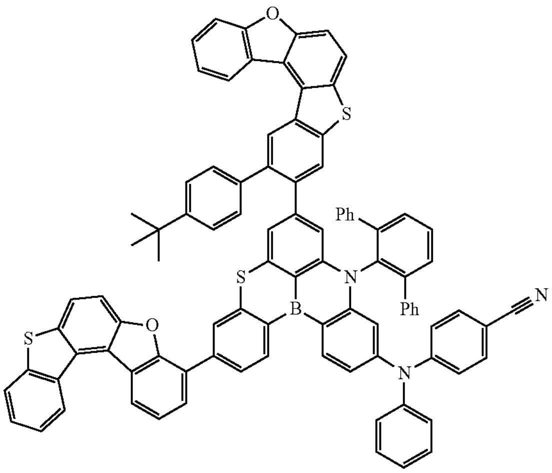
-continued
99
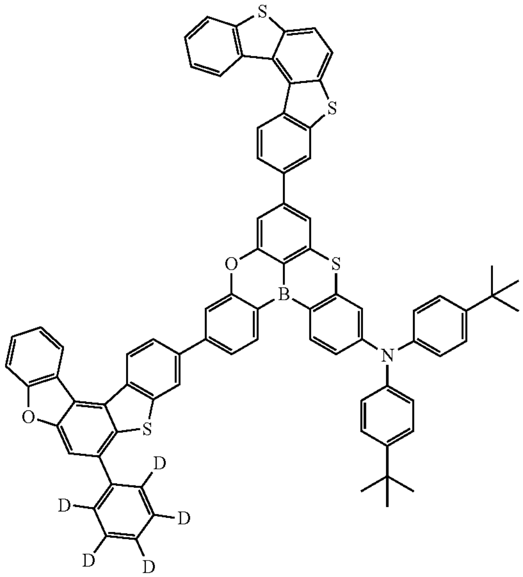
100
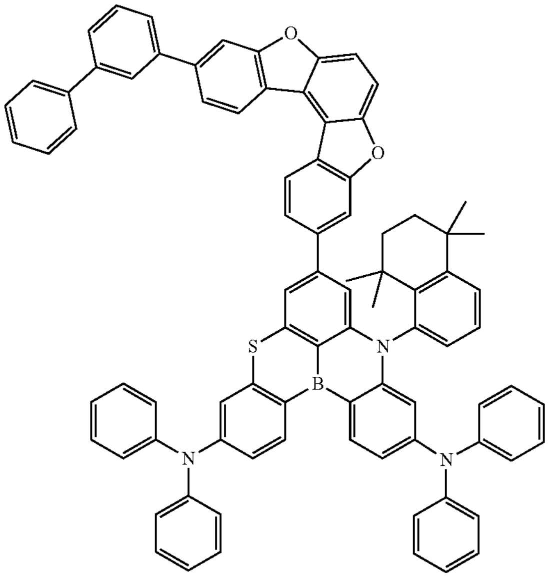

-continued
101
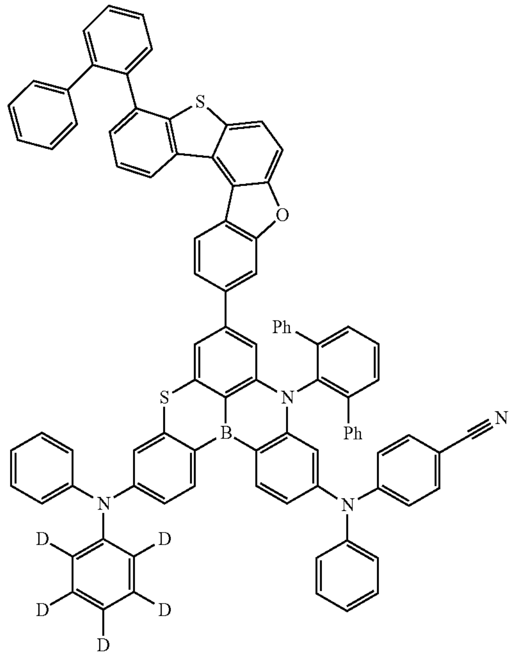
102
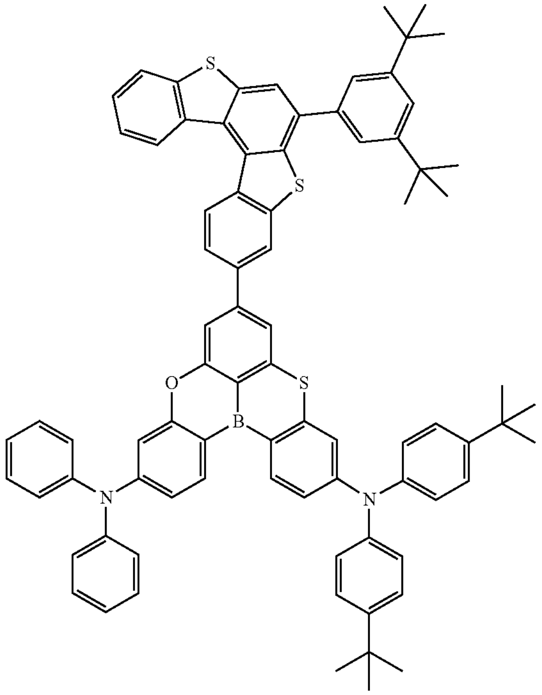
103
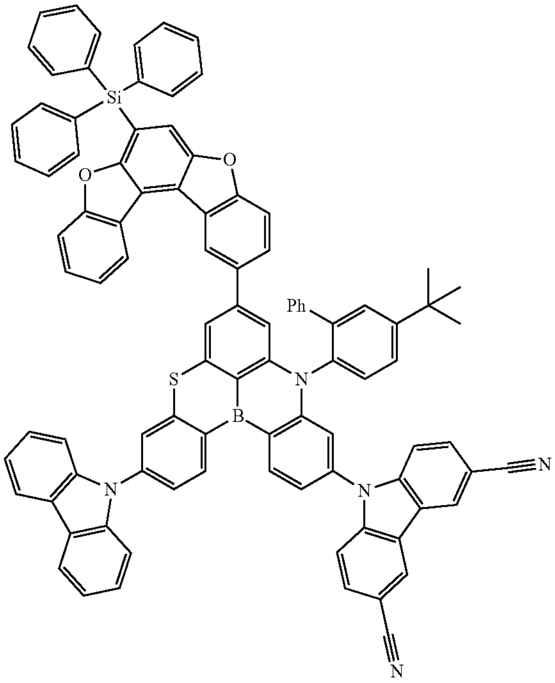
104
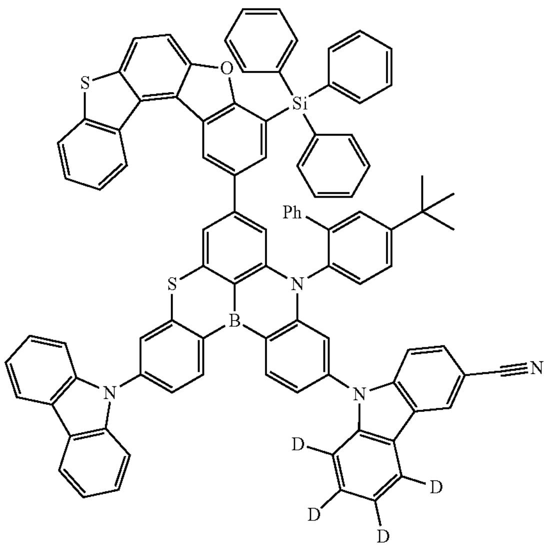

-continued
105
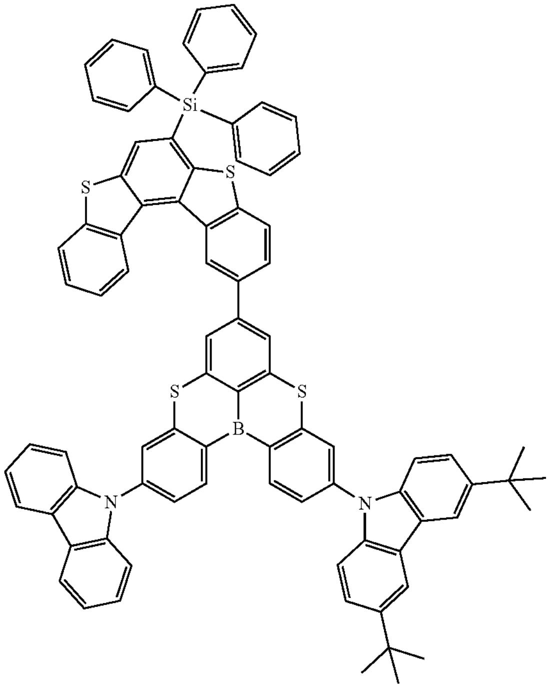
106
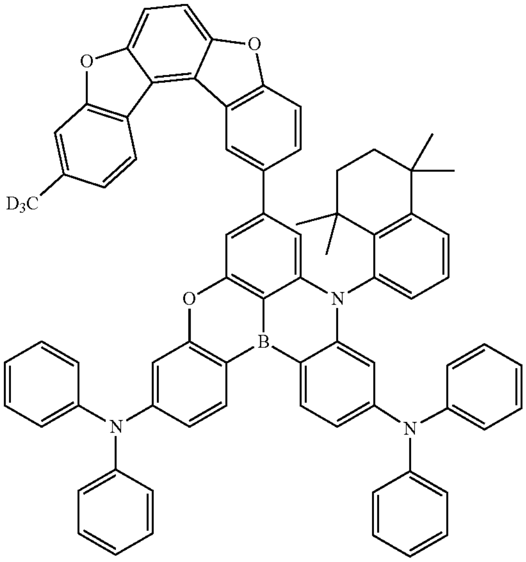
-continued
107
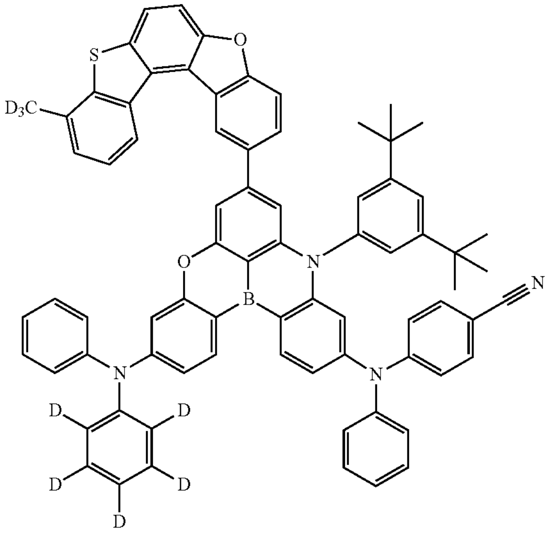
108
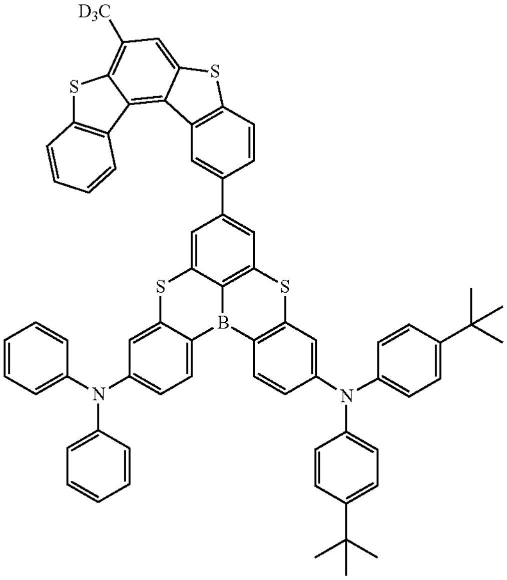
wherein in Compound Group 1, D is a deuterium atom, and Ph is a phenyl group.
* * * * *